US012527217B2

(12) United States Patent
Hong

(10) Patent No.: US 12,527,217 B2
(45) Date of Patent: Jan. 13, 2026

(54) ORGANIC LIGHT EMITTING DIODE AND ORGANIC LIGHT EMITTING DEVICE INCLUDING THE SAME

(71) Applicant: LG Display Co., Ltd., Seoul (KR)

(72) Inventor: Tae-Ryang Hong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 838 days.

(21) Appl. No.: 17/877,399

(22) Filed: Jul. 29, 2022

(65) Prior Publication Data

US 2023/0127360 A1 Apr. 27, 2023

(30) Foreign Application Priority Data

Sep. 16, 2021 (KR) ........................ 10-2021-0124009

(51) Int. Cl.

| | |
|---|---|
| ***H01L 51/54*** | (2006.01) |
| ***H10K 85/30*** | (2023.01) |
| ***H10K 85/60*** | (2023.01) |
| *H10K 50/11* | (2023.01) |

(52) U.S. Cl.

CPC ......... *H10K 85/654* (2023.02); *H10K 85/322* (2023.02); *H10K 85/657* (2023.02); *H10K 85/6572* (2023.02); *H10K 85/6574* (2023.02); *H10K 85/6576* (2023.02); *H10K 85/658* (2023.02); *H10K 50/11* (2023.02)

(58) Field of Classification Search

None

See application file for complete search history.

(56) References Cited

U.S. PATENT DOCUMENTS

2021/0050546 A1 2/2021 Li et al.

FOREIGN PATENT DOCUMENTS

| | | | | |
|---|---|---|---|---|
| CN | 111377955 | A | 7/2020 | |
| KR | 10-2020-0046740 | A | 5/2020 | |
| KR | 10-2020-0068514 | A | 6/2020 | |
| WO | WO 2019/073077 | A1 | 4/2019 | |
| WO | WO-2020135687 | A1 * | 7/2020 | ........... H10K 85/658 |

* cited by examiner

*Primary Examiner* — Andrew K Bohaty

(74) *Attorney, Agent, or Firm* — Birch, Stewart, Kolasch & Birch, LLP

(57) ABSTRACT

An organic light emitting diode includes a first electrode; a second electrode facing the first electrode; and a first emitting material layer including a first compound and a second compound and positioned between the first and second electrodes. The emission spectrum of the first compound and the absorption spectrum of the second compound has a relatively large overlapping ratio. An organic light emitting device includes the organic light emitting diode and can be a display device or a lighting device.

20 Claims, 11 Drawing Sheets

ORGANIC LIGHT EMITTING DIODE AND ORGANIC LIGHT EMITTING DEVICE INCLUDING THE SAME

CROSS-REFERENCE TO RELATED APPLICATIONS

The present application claims the priority benefit of Korean Patent Application No. 10-2021-0124009 filed in the Republic of Korea on Sep. 16, 2021, which is hereby incorporated by reference in its entirety into the present application.

BACKGROUND

Technical Field

The present disclosure relates to an organic light emitting diode, and more particularly, to an organic light emitting diode having high emitting efficiency and providing an emission of a short wavelength range and an organic light emitting device including the organic light emitting diode.

Discussion of the Related Art

Recently, requirement for flat panel display devices having small occupied area is increased. Among the flat panel display devices, a technology of an organic light emitting display device, which includes an organic light emitting diode (OLED) and can be called to as an organic electroluminescent device, is rapidly developed.

The OLED emits light by injecting electrons from a cathode as an electron injection electrode and holes from an anode as a hole injection electrode into an emitting material layer, combining the electrons with the holes, generating an exciton, and transforming the exciton from an excited state to a ground state.

A fluorescent material can be used as an emitter in the OLED. However, since only singlet exciton of the fluorescent material is involved in the emission such that there is a limitation in the emitting efficiency of the fluorescent material.

SUMMARY OF THE DISCLOSURE

Accordingly, embodiments of the present disclosure are directed to an OLED and an organic light emitting device that substantially obviate one or more of the problems associated with the limitations and disadvantages of the related art.

An object of the present disclosure is to provide an OLED and an organic light emitting device having reduced full width at half maximum (FWHM) and improved emitting efficiency by providing a first compound being a delayed fluorescent material and a second compound being a fluorescent material in a single emitting material layer or adjacent emitting material layer.

Another object of the present disclosure is to provide an OLED and an organic light emitting device having improved emitting efficiency by increasing an overlapping ratio between an emission spectrum of the first compound and an absorption spectrum of the second compound.

Additional features and aspects will be set forth in the description that follows, and in part will be apparent from the description, or can be learned by practice of the present disclosure concepts provided herein. Other features and aspects of the present disclosure concepts can be realized and attained by the structure particularly pointed out in the written description, or derivable therefrom, and the claims hereof as well as the appended drawings.

To achieve these and other advantages in accordance with the purpose of the embodiments of the present disclosure, as described herein, an aspect of the present disclosure is an organic light emitting diode including a first electrode; a second electrode facing the first electrode; and a first emitting material layer including a first compound and a second compound and positioned between the first and second electrodes, wherein the first compound is represented by Formula 1-1:

[Formula 1-1]

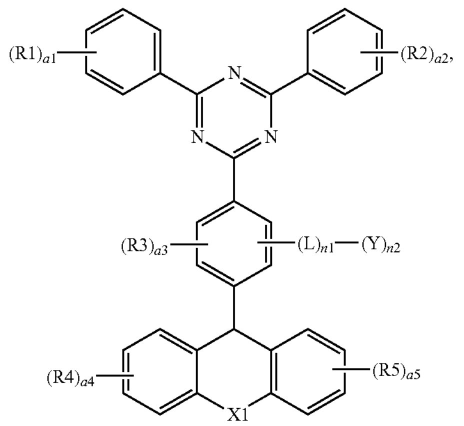

wherein X1 is one of a single bond, $C(R6)_2$, NR7, O and S, wherein Y is selected from the group consisting of a cyano group (—CN), a nitro group (—$NO_2$), halogen, a C1 to C20 alkyl group substituted with at least one of a cyano group, a nitro group and halogen, a C6 to C30 aryl group substituted with at least one of a cyano group, a nitro group and halogen and a C3 to C40 heteroaryl group substituted with at least one of a cyano group, a nitro group and halogen, wherein each of R1 to R7 is independently selected from the group consisting of deuterium, tritium, a substituted or unsubstituted C1 to C20 alkyl group, a substituted or unsubstituted C6 to C30 aryl group and a substituted or unsubstituted C3 to C40 heteroaryl group, or adjacent two of R1 to R7 are connected to form an aromatic ring or a heteroaromatic ring, wherein L is a C6 to C30 arylene group, wherein each of a1 and a2 is independently an integer of 0 to 5, wherein a3 is an integer of 0 to 3, wherein each of a4 and a5 is independently an integer of 0 to 4, wherein n1 is 1 or 2, and n2 is an integer of 1 to 5, wherein the second compound is represented by Formula 2-1:

[Formula 2-1]

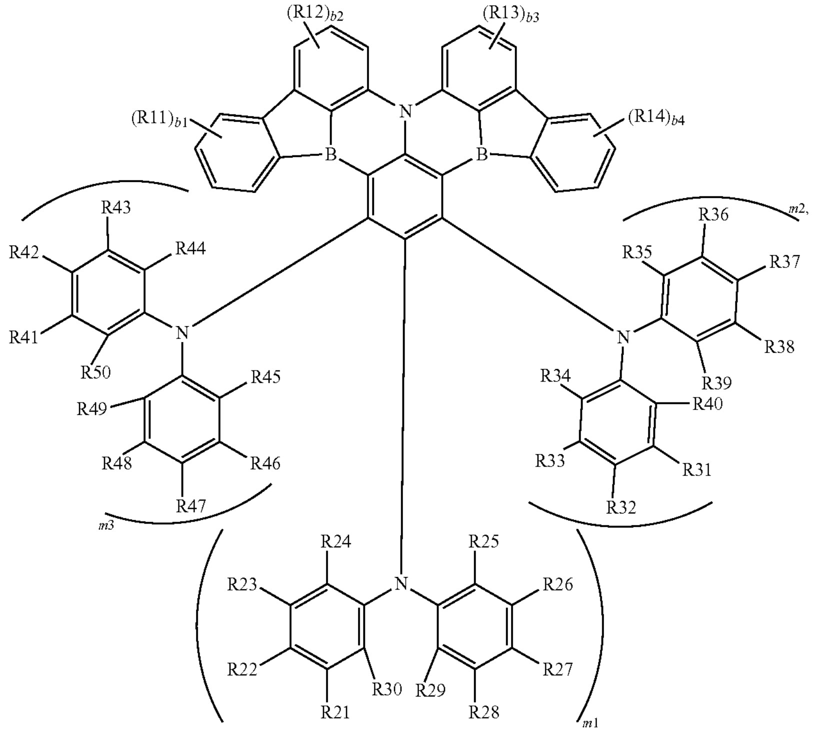

wherein each of R11 to R14 is independently selected from the group consisting of deuterium, tritium, a substituted or unsubstituted C1 to C20 alkyl group, a substituted or unsubstituted C6 to C30 aryl group and a substituted or unsubstituted C3 to C40, or adjacent two of R11 to R14 are connected to form an aromatic ring or a heteroaromatic ring, wherein each of R21 to R28, R31 to R38 and R41 to R48 is independently selected from the group consisting of hydrogen, deuterium, tritium, a substituted or unsubstituted C1 to C20 alkyl group, a substituted or unsubstituted C6 to C30 aryl group and a substituted or unsubstituted C3 to C40 heteroaryl group, wherein each of R29, R30, R39, R40, R49 and R50 is independently selected from the group consisting of hydrogen, deuterium, tritium, a substituted or unsubstituted C1 to C20 alkyl group, a substituted or unsubstituted C6 to C30 aryl group and a substituted or unsubstituted C3 to C40 heteroaryl group, or at least one of a pair of R29 and R30, a pair of R39 and R40 and a pair of R49 and R50 is connected to each other to form a ring, wherein each of m1 to m3 is independently 0 or 1, and at least one of m1 to m3 is 1, and wherein each of b1 and b4 is independently an integer of 0 to 4, and each of b2 and b3 is independently an integer of 0 to 3.

Another aspect of the present disclosure is an organic light emitting device including a substrate; the above organic light emitting diode disposed on or over the substrate; and an encapsulation film covering the organic light emitting diode.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the present disclosure and are incorporated in and constitute a part of this application, illustrate embodiments of the present disclosure and together with the description serve to explain principles of the present disclosure.

DETAILED DESCRIPTION OF THE EMBODIMENTS

Reference will now be made in detail to some of the examples and preferred embodiments, which are illustrated in the accompanying drawings.

The present disclosure relates to an OLED, in which a delayed fluorescent material and a fluorescent material are included in a single emitting material layer or adjacent emitting material layers, and an organic light emitting device including the OLED. An emission spectrum of the delayed fluorescent material and an absorption spectrum of the fluorescent material are matched. For example, the organic light emitting device can be an organic light emitting display device or an organic lighting device. As an example, an organic light emitting display device, which is a display device including the OLED of the present disclosure, will be mainly described. All the components of each OLED and each organic light emitting display device according to all embodiments of the present disclosure are operatively coupled and configured.

Figure 1:
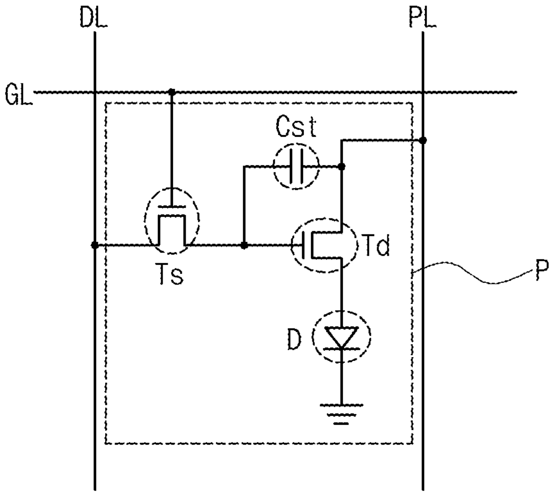
FIG. 1 is a schematic circuit diagram of an organic light emitting display device of the present disclosure.

FIG. 1 is a schematic circuit diagram of an organic light emitting display device of the present disclosure.

As shown in FIG. 1, an organic light emitting display device includes a gate line GL, a data line DL, a power line PL, a switching thin film transistor TFT Ts, a driving TFT Td, a storage capacitor Cst, and an OLED D. The gate line GL and the data line DL cross each other to define a pixel region P. The pixel region can include a red pixel region, a green pixel region and a blue pixel region.

The switching TFT Ts is connected to the gate line GL and the data line DL, and the driving TFT Td and the storage capacitor Cst are connected to the switching TFT Ts and the power line PL. The OLED D is connected to the driving TFT Td.

In the organic light emitting display device, when the switching TFT Ts is turned on by a gate signal applied through the gate line GL, a data signal from the data line DL is applied to the gate electrode of the driving TFT Td and an electrode of the storage capacitor Cst.

When the driving TFT Td is turned on by the data signal, an electric current is supplied to the OLED D from the power line PL. As a result, the OLED D emits light. In this case, when the driving TFT Td is turned on, a level of an electric current applied from the power line PL to the OLED D is determined such that the OLED D can produce a gray scale.

The storage capacitor Cst serves to maintain the voltage of the gate electrode of the driving TFT Td when the switching TFT Ts is turned off. Accordingly, even if the switching TFT Ts is turned off, a level of an electric current applied from the power line PL to the OLED D is maintained to next frame.

As a result, the organic light emitting display device displays a desired image.

Figure 2:
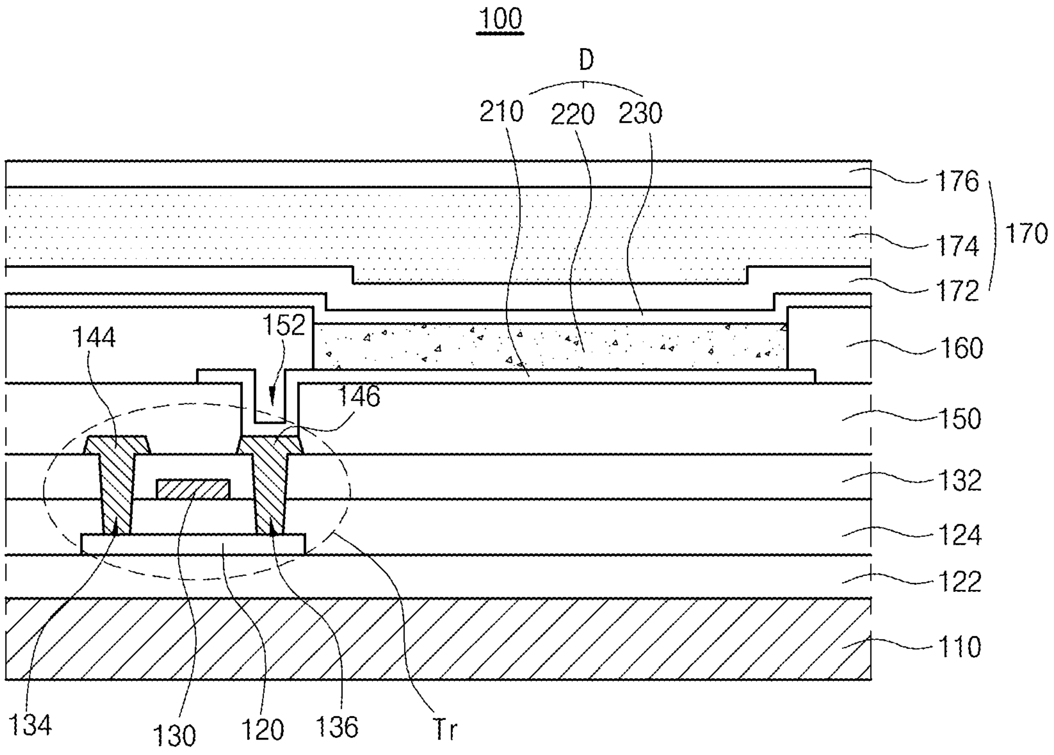
FIG. 2 is a schematic cross-sectional view of an organic light emitting display device according to a first embodiment of the present disclosure.

FIG. 2 is a schematic cross-sectional view of an organic light emitting display device according to a first embodiment of the present disclosure.

As shown in FIG. 2, the organic light emitting display device 100 includes a substrate 110, a TFT Tr and an OLED D connected to the TFT Tr.

The substrate 110 can be a glass substrate or a plastic substrate. For example, the substrate 110 can be a polyimide substrate.

A buffer layer 122 is formed on the substrate, and the TFT Tr is formed on the buffer layer 122. The buffer layer 122 can be omitted.

A semiconductor layer 120 is formed on the buffer layer 122. The semiconductor layer 120 can include an oxide semiconductor material or polycrystalline silicon.

When the semiconductor layer 120 includes the oxide semiconductor material, a light-shielding pattern can be formed under the semiconductor layer 120. The light to the semiconductor layer 120 is shielded or blocked by the light-shielding pattern such that thermal degradation of the semiconductor layer 120 can be prevented. On the other hand, when the semiconductor layer 120 includes polycrystalline silicon, impurities can be doped into both sides of the semiconductor layer 120.

A gate insulating layer 124 is formed on the semiconductor layer 120. The gate insulating layer 124 can be formed of an inorganic insulating material such as silicon oxide or silicon nitride.

A gate electrode 130, which is formed of a conductive material, e.g., metal, is formed on the gate insulating layer 124 to correspond to a center of the semiconductor layer 120.

In FIG. 2, the gate insulating layer 124 is formed on an entire surface of the substrate 110. Alternatively, the gate insulating layer 124 can be patterned to have the same shape as the gate electrode 130.

An interlayer insulating layer 132, which is formed of an insulating material, is formed on the gate electrode 130. The interlayer insulating layer 132 can be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 120. The first and second contact holes 134 and 136 are positioned at both sides of the gate electrode 130 to be spaced apart from the gate electrode 130.

The first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 144 and a drain electrode 146, which are formed of a conductive material, e.g., metal, are formed on the interlayer insulating layer 132.

The source electrode 144 and the drain electrode 146 are spaced apart from each other with respect to the gate electrode 130 and respectively contact both sides of the semiconductor layer 120 through the first and second contact holes 134 and 136.

The semiconductor layer 120, the gate electrode 130, the source electrode 144 and the drain electrode 146 constitute the TFT Tr. The TFT Tr serves as a driving element. Namely, the TFT Tr is the driving TFT Td (of FIG. 1).

In the TFT Tr, the gate electrode 130, the source electrode 144, and the drain electrode 146 are positioned over the semiconductor layer 120. Namely, the TFT Tr has a coplanar structure.

Alternatively, in the TFT Tr, the gate electrode can be positioned under the semiconductor layer, and the source and drain electrodes can be positioned over the semiconductor layer such that the TFT Tr can have an inverted staggered structure. In this instance, the semiconductor layer can include amorphous silicon.

The gate line and the data line cross each other to define the pixel region, and the switching TFT is formed to be connected to the gate and data lines. The switching TFT is connected to the TFT Tr as the driving element. In addition, the power line, which can be formed to be parallel to and spaced apart from one of the gate and data lines, and the storage capacitor for maintaining the voltage of the gate electrode of the TFT Tr in one frame can be further formed.

A planarization layer 150 is formed on an entire surface of the substrate 110 to cover the source and drain electrodes 144 and 146. The planarization layer 150 provides a flat top surface and has a drain contact hole 152 exposing the drain electrode 146 of the TFT Tr.

The OLED D is disposed on the planarization layer 150 and includes a first electrode 210, which is connected to the drain electrode 146 of the TFT Tr, an light emitting layer 220 and a second electrode 230. The light emitting layer 220 and the second electrode 230 are sequentially stacked on the first electrode 210. The OLED D is positioned in each of the red, green and blue pixel regions and respectively emits the red, green and blue light.

The first electrode 210 is separately formed in each pixel region. The first electrode 210 can be an anode and can be formed of a conductive material, e.g., a transparent conductive oxide (TCO), having a relatively high work function. For example, the first electrode 210 can be formed of indium-tin-oxide (ITO), indium-zinc-oxide (IZO), indium-tin-zinc-oxide (ITZO), tin oxide (SnO), zinc oxide (ZnO), indium-copper-oxide (ICO) or aluminum-zinc-oxide (Al:ZnO, AZO).

When the organic light emitting display device 100 of the present disclosure is operated in a bottom-emission type, the first electrode 210 can have a single-layered structure of a transparent conductive oxide layer of the transparent conductive oxide. Alternatively, when the organic light emitting display device 100 of the present disclosure is operated in a top-emission type, a reflection electrode or a reflection layer can be formed on and/or under the transparent conductive oxide layer. For example, the reflection electrode or the reflection layer can be formed of silver (Ag) or aluminum-palladium-copper (APC) alloy. In the top-emission type OLED, the first electrode 210 can have a structure of ITO/Ag/ITO or ITO/APC/ITO.

In addition, a bank layer 160 is formed on the planarization layer 150 to cover an edge of the first electrode 210. Namely, the bank layer 160 is positioned at a boundary of the pixel region and exposes a center of the first electrode 210 in the pixel region.

The light emitting layer 220 as an emitting unit is formed on the first electrode 210. The light emitting layer 220 can have a single-layered structure of an emitting material layer (EML) including an emitting material. Alternatively, the light emitting layer 220 can further include at least one of a hole injection layer (HIL), a hole transporting layer (HTL), an electron blocking layer (EBL), a hole blocking layer (HBL), an electron transporting layer (ETL) and an electron injection layer (EIL) to have a multi-layered structure. In addition, two or more light emitting layers can be disposed to be spaced apart from each other such that the OLED D can have a tandem structure.

The second electrode 230 is formed over the substrate 110 where the light emitting layer 220 is formed. The second electrode 230 covers an entire surface of the display area and can be formed of a conductive material having a relatively low work function to serve as a cathode. For example, the second electrode 230 can be formed of aluminum (Al), magnesium (Mg), calcium (Ca), silver (Ag) or their alloy, e.g., Mg—Ag alloy (MgAg). In the top-emission type organic light emitting display device 100, the second electrode 230 can have a thin profile to be transparent (or semi-transparent).

The organic light emitting display device 100 can include a color filter corresponding to the red, green and blue pixel regions. For example, when the OLED D, which has the tandem structure and emits the white light, is formed to all of the red, green and blue pixel regions, a red color filter pattern, a green color filter pattern and a blue color filter pattern can be formed in the red, green and blue pixel regions, respectively, such that a full-color display is provided.

When the organic light emitting display device 100 is operated in a bottom-emission type, the color filter can be disposed between the OLED D and the substrate 110, e.g., between the interlayer insulating layer 132 and the planarization layer 150. Alternatively, the organic light emitting display device 100 is operated in a top-emission type, the color filter can be disposed over the OLED D, e.g., over the second electrode 230.

An encapsulation film (or an encapsulation layer) 170 is formed on the second electrode 230 to prevent penetration of moisture into the OLED D. The encapsulation film 170 includes a first inorganic insulating layer 172, an organic insulating layer 174 and a second inorganic insulating layer 176 sequentially stacked, but it is not limited thereto.

The organic light emitting display device 100 can further include a polarization plate for reducing an ambient light reflection. For example, the polarization plate can be a circular polarization plate. In the bottom-emission type organic light emitting display device 100, the polarization plate can be positioned under the substrate 110. Alternatively, in the top-emission type organic light emitting display device 100, the polarization plate can be positioned on or over the encapsulation film 170.

In addition, in the top-emission type organic light emitting display device 100, a cover window can be attached to the encapsulation film 170 or the polarization plate. In this instance, the substrate 110 and the cover window have a flexible property such that a flexible organic light emitting display device can be provided.

Figure 3:
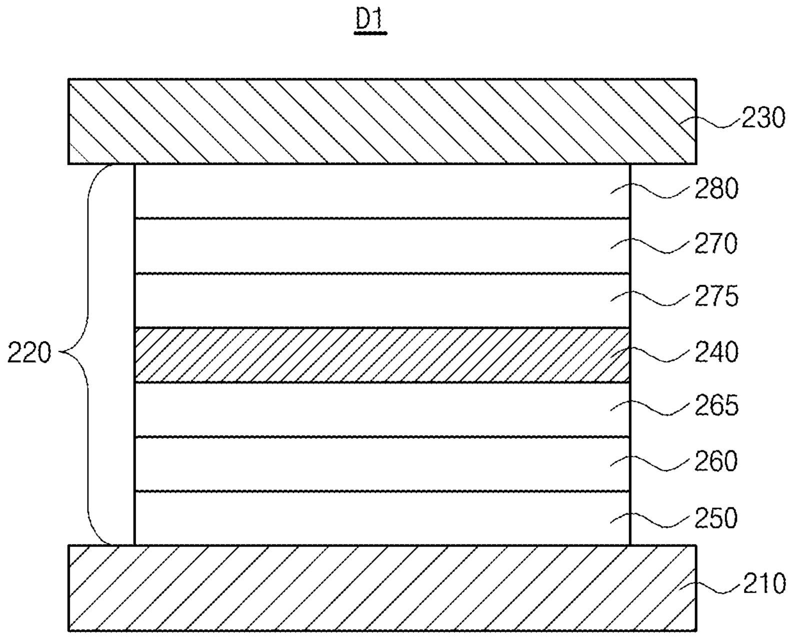
FIG. 3 is a schematic cross-sectional view of an OLED according to a second embodiment of the present disclosure.

FIG. 3 is a schematic cross-sectional view of an OLED according to a second embodiment of the present disclosure.

As shown in FIG. 3, the OLED D1 includes the first and second electrodes 210 and 230, which face each other, and the light emitting layer 220 therebetween. The light emitting layer 220 includes an emitting material layer (EML) 240. The organic light emitting display device 100 (of FIG. 2) can include a red pixel region, a green pixel region and a blue pixel region, and the OLED D1 is positioned in the green pixel region.

The first electrode 210 can be anode, and the second electrode 230 can be a cathode. One of the first and second electrodes 210 and 230 can be a transparent electrode (or a semi-transparent electrode), and the other one of the first and second electrodes 210 and 230 can be a reflection electrode.

The light emitting layer 220 further include at least one of a hole transporting layer (HTL) 260 between the first electrode 210 and the EML 240 and an electron transporting layer (ETL) 270 between the second electrode 230 and the EML 240.

In addition, the light emitting layer 220 can further include at least one of a hole injection layer (HIL) 250 between the first electrode 210 and the HTL 260 and an electron injection layer (EIL) 280 between the second electrode 230 and the ETL 270.

Moreover, the light emitting layer 220 can further include at least one of an electron blocking layer (EBL) 265 between the HTL 260 and the EML 240 and a hole blocking layer (HBL) 275 between the EML 240 and the ETL 270.

For example, the HIL 250 can include at least one compound selected from the group consisting of 4,4',4"-tris(3-methylphenylamino)triphenylamine (MTDATA), 4,4',4"-tris(N,N-diphenyl-amino)triphenylamine (NATA), 4,4',4"-tris(N-(naphthalene-1-yl)-N-phenyl-amino)triphenylamine (1T-NATA), 4,4',4"-tris(N-(naphthalene-2-yl)-N-phenyl-amino)triphenylamine (2T-NATA), copper phthalocyanine (CuPc), tris(4-carbazoyl-9-yl-phenyl)amine (TCTA), N,N'-diphenyl-N,N'-bis(1-naphthyl)-1,1'-biphenyl-4,4"-diamine (NPB or NPD), 1,4,5,8,9,11-hexaazatriphenylenehexacarbonitrile (dipyrazino[2,3-f:2'3'-h]quinoxaline-2,3,6,7,10,11-hexacarbonitrile (HAT-CN)), 1,3,5-tris[4-(diphenylamino)phenyl]benzene (TDAPB), poly(3,4-ethylenedioxythiophene)polystyrene sulfonate (PEDOT/PSS), and N-(biphenyl-4-yl)-9,9-dimethyl-N-(4-(9-phenyl-9H-carbazol-3-yl)phenyl)-9H-fluoren-2-amine, but it is not limited thereto.

The HTL 260 can include at least one compound selected from the group consisting of N,N'-diphenyl-N,N'-bis(3-methylphenyl)-1,1'-biphenyl-4,4'-diamine (TPD), NPB (NPD), 4,4'-bis(N-carbazolyl)-1,1'-biphenyl (CBP), poly[N,N'-bis(4-butylphenyl)-N,N'-bis(phenyl)-benzidine](poly-TPD), (poly[(9,9-dioctylfluorenyl-2,7-diyl)-co-(4,4'-(N-(4-sec-butylphenyl)diphenylamine))](TFB), di-[4-(N,N-di-p-tolyl-amino)-phenyl]cyclohexane (TAPC), 3,5-di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, and N-(biphenyl-4-yl)-N-(4-(9-phenyl-9H-carbazol-3-yl)phenyl)biphenyl-4-amine, but it is not limited thereto.

The ETL 270 can include at least one of an oxadiazole-based compound, a triazole-based compound, a phenanthroline-based compound, a benzoxazole-based compound, a benzothiazole-based compound, a benzimidazole-based compound, and a triazine-based compound. For example, the ETL 270 can include at least one compound selected from the group consisting of tris-(8-hydroxyquinoline aluminum ($Alq_3$), 2-biphenyl-4-yl-5-(4-t-butylphenyl)-1,3,4-oxadiazole (PBD), spiro-PBD, lithium quinolate (Liq), 1,3,5-tris(N-phenylbenzimidazol-2-yl)benzene (TPBi), bis(2-methyl-8-quinolinolato-N1,O8)-(1,1'-biphenyl-4-olato)aluminum (BAlq), 4,7-diphenyl-1,10-phenanthroline (Bphen), 2,9-bis(naphthalene-2-yl)-4,7-diphenyl-1,10-phenanthroline (NBphen), 2,9-dimethyl-4,7-diphenyl-1,10-phenanthroline (BCP), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 1,3,5-tri(p-pyrid-3-yl-phenyl)benzene (TpPyPB), 2,4,6-tris(3'-(pyridin-3-yl)biphenyl-3-yl)1,3,5-triazine (TmPPPyTz), Poly[9,9-bis(3'-((N,N-dimethyl)-N-ethylammonium)-propyl)-2,7-fluorene]-alt-2,7-(9,9-dioctylfluorene)](PFNBr), tris(phenylquinoxaline) (TPQ), and diphenyl-4-triphenylsilyl-phenylphosphine oxide (TSPO1), but it is not limited thereto.

The EIL 280 can include at least one of an alkali halide compound, such as LiF, CsF, NaF, or $BaF_2$, and an organo-metallic compound, such as Liq, lithium benzoate, or sodium stearate, but it is not limited thereto.

The EBL 265, which is positioned between the HTL 260 and the EML 240 to block the electron transfer from the EML 240 into the HTL 260, can include at least one compound selected from the group consisting of TCTA, tris[4-(diethylamino)phenyl]amine, N-(biphenyl-4-yl)-9,9-dimethyl-N-(4-(9-phenyl-9H-carbazol-3-yl)phenyl)-9H-fluoren-2-amine, TAPC, MTDATA, 1,3-bis(carbazol-9-yl)benzene (mCP), 3,3'-bis(N-carbazolyl)-1,1'-biphenyl (mCBP), CuPc, N,N'-bis[4-[bis(3-methylphenyl)amino]phenyl]-N,N'-diphenyl-[1,1'-biphenyl]-4,4'-diamine (DNTPD), TDAPB, DCDPA, and 2,8-bis(9-phenyl-9H-carbazol-3-yl)dibenzo[b,d]thiophene), but it is not limited thereto.

The HBL 275, which is positioned between the EML 240 and the ETL 270 to block the hole transfer from the EML 240 into the ETL 270, can include the above material of the ETL 270. For example, the material of the HBL 275 has a HOMO energy level being lower than a material of the EML 240 and can be at least one compound selected from the group consisting of BCP, BAlq, Alq3, PBD, spiro-PBD, Liq, bis-4,6-(3,5-di-3-pyridylphenyl)-2-methylpyrimidine (B3PYMPM), bis[2-(diphenylphosphino)phenyl]ether oxide (DPEPO), 9-(6-9H-carbazol-9-yl)pyridine-3-yl)-9H-3,9'-bicarbazole, and TSPO1, but it is not limited thereto.

The EML 240 includes a first compound being a delayed fluorescent material (or a delayed fluorescent compound) and a second compound being a fluorescent material (or a fluorescent compound). The EML 240 including the first and second compounds providing a green emission, and the OLED D1 is positioned in the green pixel region.

The first compound is represented by Formula 1-1.

[Formula 1-1]

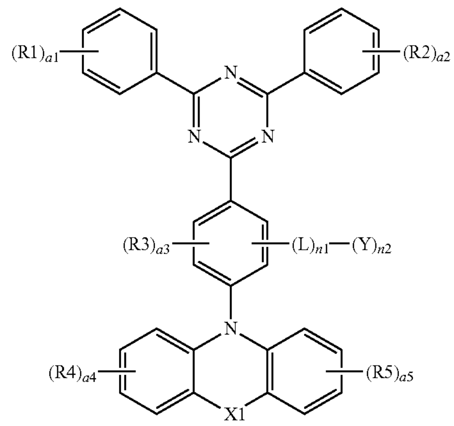

In Formula 1-1, X1 is one of a single bond (or a direct bond), $C(R6)_2$, NR7, O and S, and Y is selected from the group consisting of a cyano group (—CN), a nitro group (—$NO_2$), halogen, a C1 to C20 alkyl group substituted with at least one of a cyano group, a nitro group and halogen, a C6 to C30 aryl group substituted with at least one of a cyano group, a nitro group and halogen and a C3 to C40 heteroaryl group substituted with at least one of a cyano group, a nitro group and halogen. Each of R1 to R7 is independently selected from the group consisting of deuterium, tritium, a substituted or unsubstituted C1 to C20 alkyl group, a substituted or unsubstituted C6 to C30 aryl group and a substituted or unsubstituted C3 to C40 heteroaryl group, or adjacent two of R1 to R7 are connected (combined, joined or linked) to form an aromatic ring or a heteroaromatic ring. L is a C6 to C30 arylene group. Each of a1 and a2 is independently an integer of 0 to 5, a3 is an integer of 0 to 3, and each of a4 and a5 is independently an integer of 0 to 4. In addition, n1 is 1 or 2, and n2 is an integer of 1 to 5.

For example, a1 to a3 can be 0, and n1 and n2 can be 1.

In the present disclosure, the C6 to C30 aryl group (or C6 to C30 arylene group) can be selected from the group consisting of phenyl, biphenyl, terphenyl, naphthyl, anthracenyl, pentaenyl, indenyl, indenoindenyl, heptalenyl, biphenylenyl, indacenyl, phenanthrenyl, benzophenanthrenyl, dibenzophenanthrenyl, azulenyl, pyrenyl, fluoranthenyl, triphenylenyl, chrysenyl, tetraphenyl, tetrasenyl, picenyl, pentaphenyl, pentacenyl, fluorenyl, indenofluorenyl and spiro-fluorenyl.

In the present disclosure, the C3 to C40 heteroaryl group can be selected from the group consisting of pyrrolyl, pyridinyl, pyrimidinyl, pyrazinyl, pyridazinyl, triazinyl, tetrazinyl, imidazolyl, pyrazolyl, indolyl, isoindolyl, indazolyl, indolizinyl, pyrrolizinyl, carbazolyl, benzocarbazolyl, dibenzocarbazolyl, indolocarbazolyl, indenocarbazolyl, benzofurocarbazolyl, benzothienocarbazolyl, quinolinyl, isoquinolinyl, phthalazinyl, quinoxalinyl, cinnolinyl, quinazolinyl, quinazolinyl, quinolinyl, purinyl, phthalazinyl, quinoxalinyl, benzoquinolinyl, benzoisoquinolinyl, benzoquinazolinyl, benzoquinoxalinyl, acridinyl, phenanthrolinyl, perimidinyl, phenanthridinyl, pteridinyl, cinnolinyl, naphthridinyl, furanyl, oxazinyl, oxazolyl, oxadiazolyl, triazolyl, dioxinyl, benzofuranyl, dibenzofuranyl, thiopyranyl, xanthenyl, chromanyl, isochromanyl, thiazinyl, thiophenyl, benzothiophenyl, dibenzothiophenyl, difluoropyrazine, benzofurodibenzofuranyl, benzothienobenzothiophenyl, benzothienodibenzothiophenyl, benzothienobenzofuranyl, and benzothienodibenzofuranyl.

In the present disclosure, when the alkyl group, the aryl group and/or the heteroaryl group are substituted, the substituent can be selected from the group consisting of deuterium, tritium, a cyano group, halogen and a C1 to C20 alkyl group.

For example, in Formula 1-1, L can be phenylene, and n1 can be 1. Namely, Formula 1-1 can be represented by Formula 1-2.

[Formula 1-2]

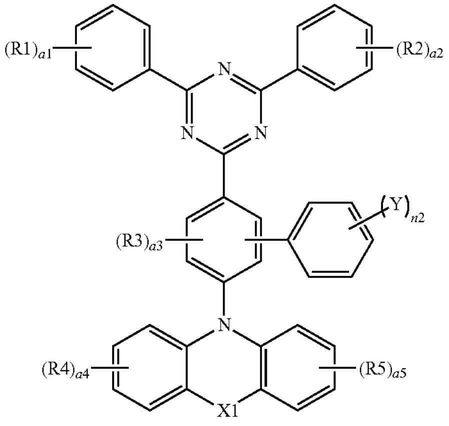

In Formula 1-2, X1 can be the single bond, adjacent two of R5 can be connected to form the heteroaromatic ring, and n2 can be 1. Namely, Formula 1-2 can be represented by Formula 1-3.

[Formula 1-3]

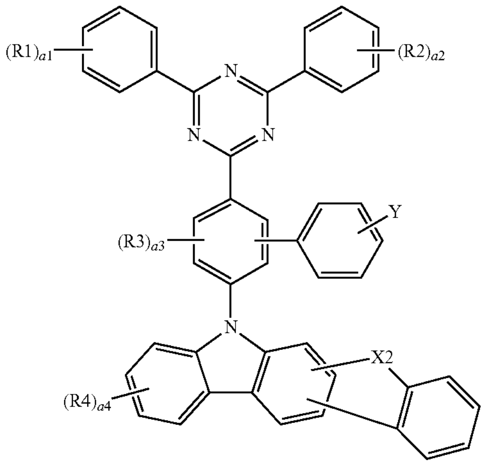

In Formula 1-3, X2 is one of NR8, O and S, and R8 is selected from the group consisting of hydrogen, deuterium, tritium, a substituted or unsubstituted C1 to C20 alkyl group, a substituted or unsubstituted C6 to C30 aryl group and a substituted or unsubstituted C3 to C40 heteroaryl group.

The first compound represented by one of Formulas 1-1 to 1-3 can one of the compounds in Formula 1-4.

[Formula 1-4]

1-1

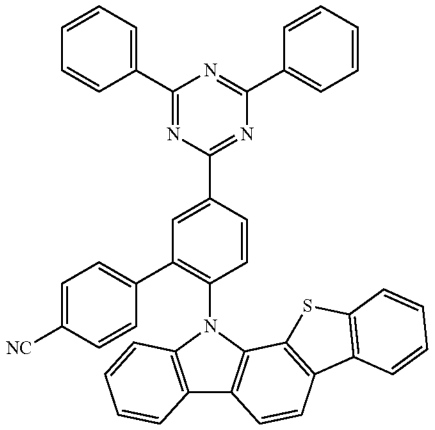

1-2

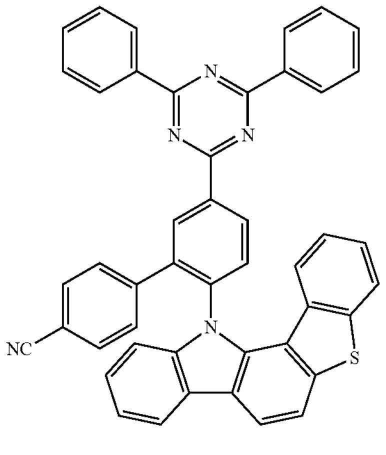

-continued
1-3
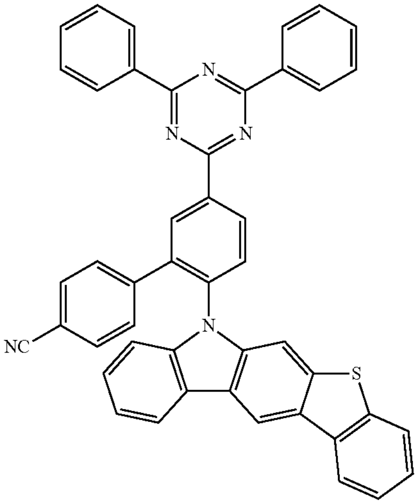
1-4
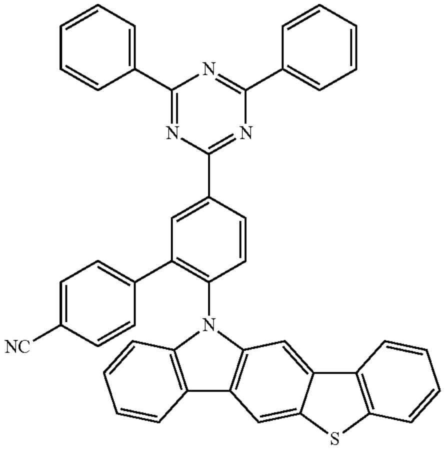
1-5
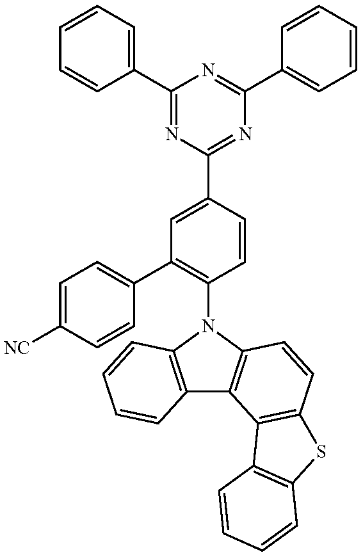
-continued
1-6
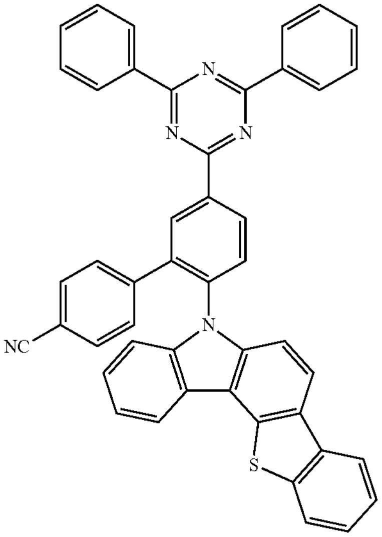
1-7
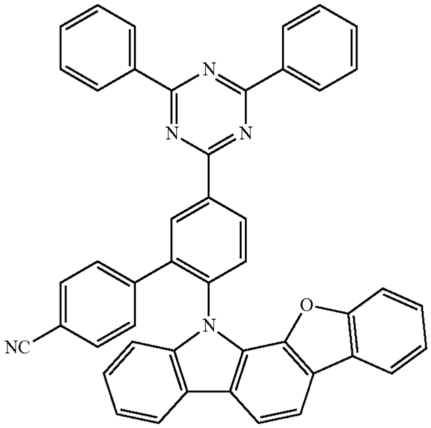
1-8
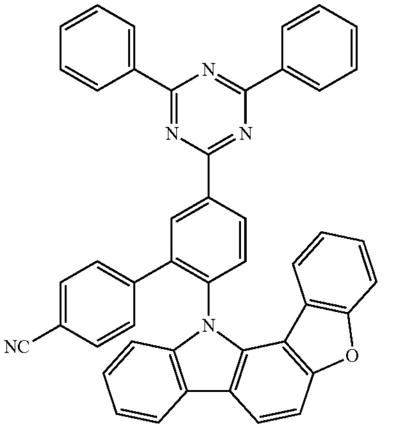

-continued
1-9
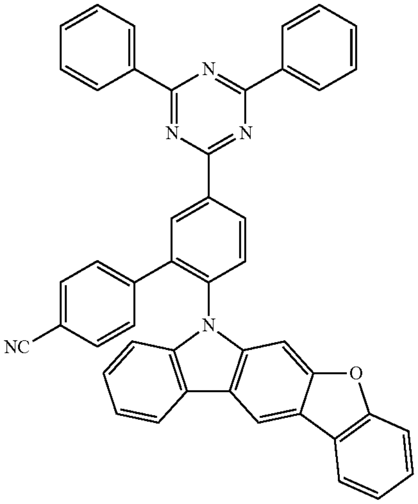
1-10
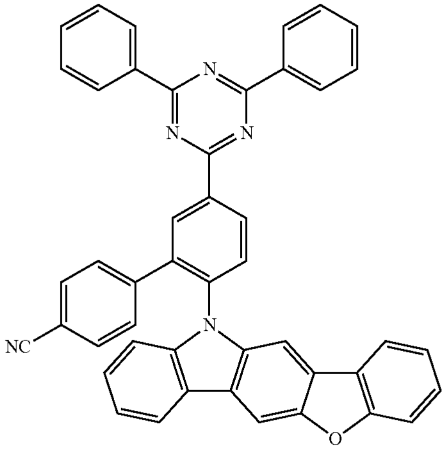
1-11
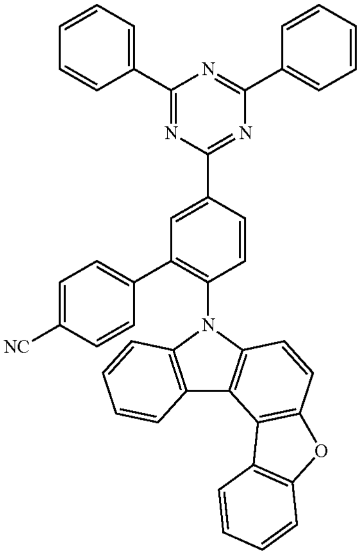
-continued
1-12
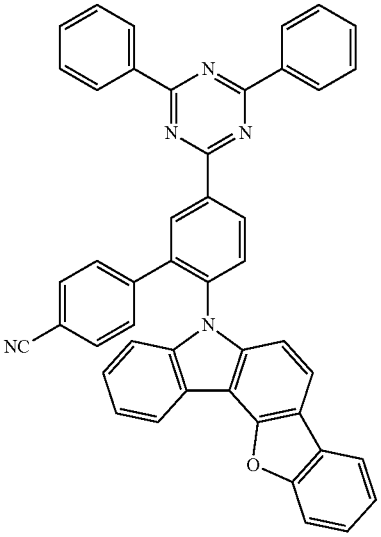
1-13
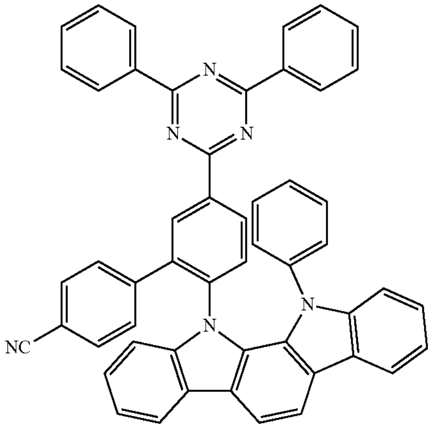
1-14
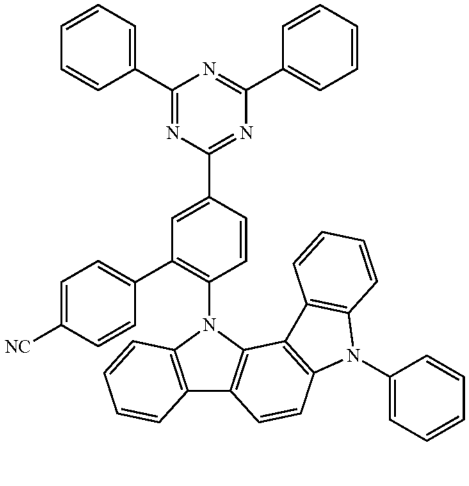

-continued
1-15
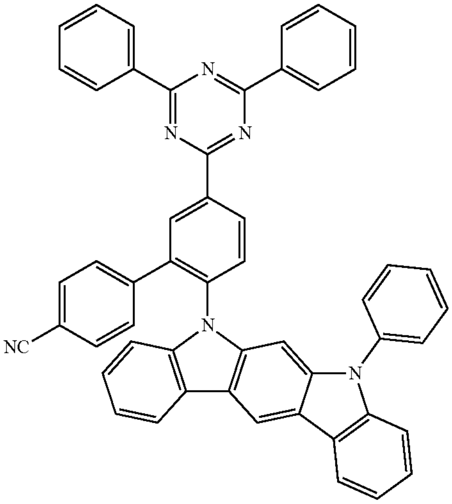
1-16
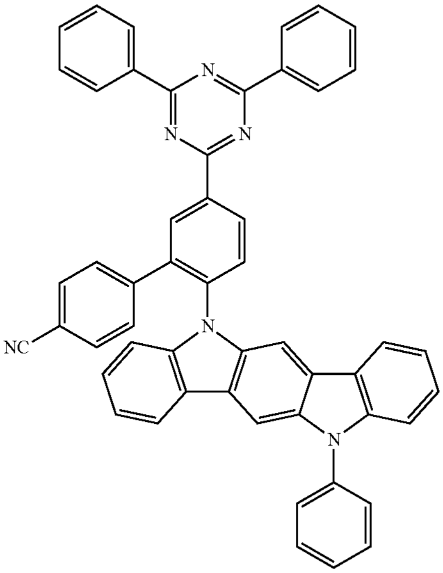
1-17
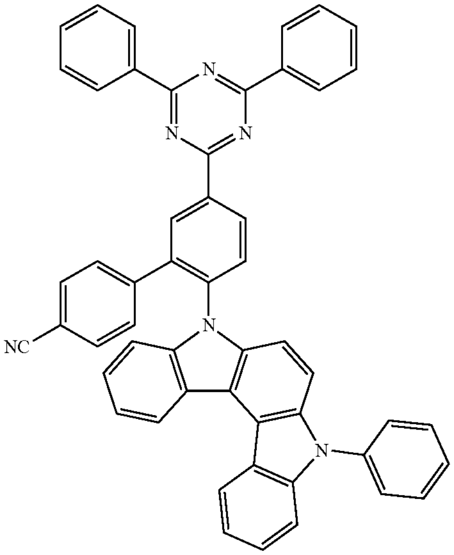
-continued
1-18
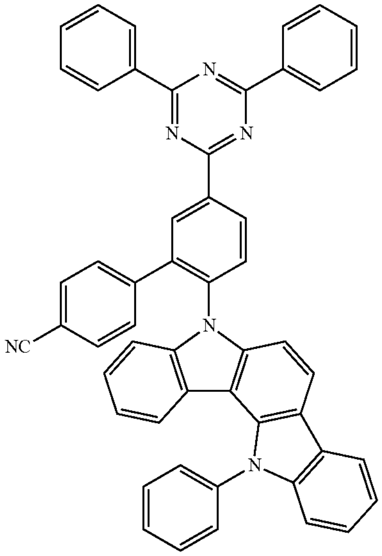
1-19
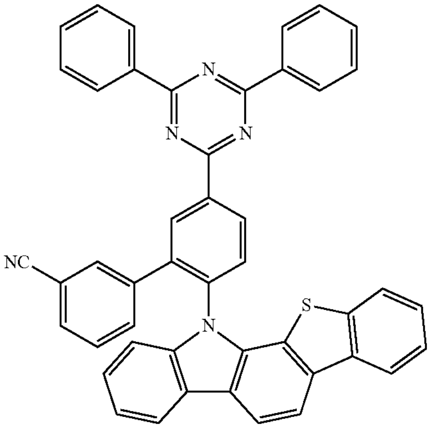
1-20
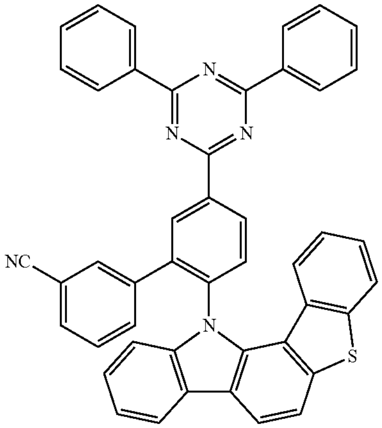

-continued
1-21
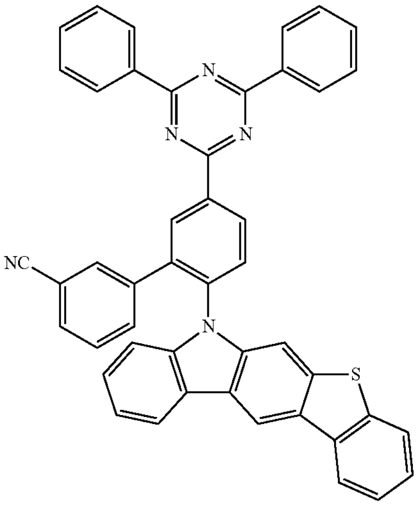
1-22
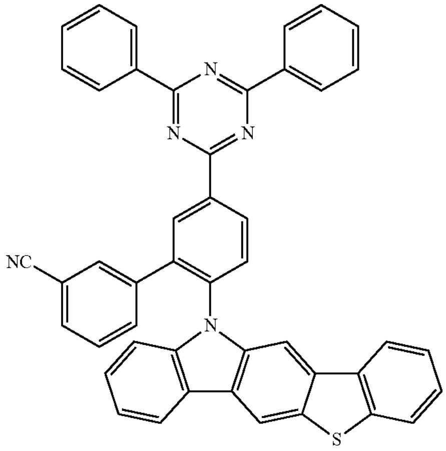
1-23
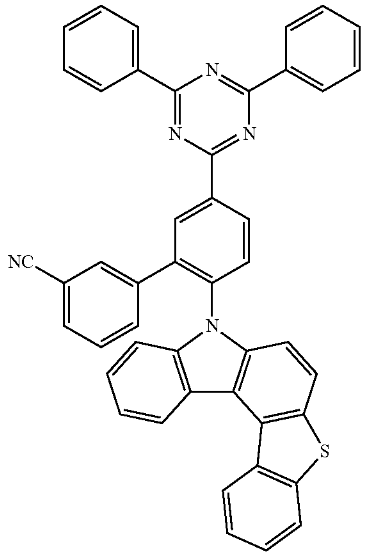
-continued
1-24
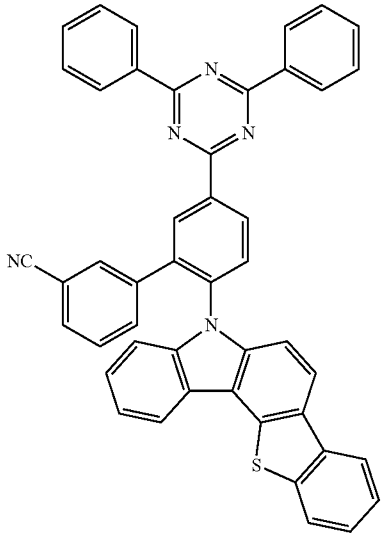
1-25
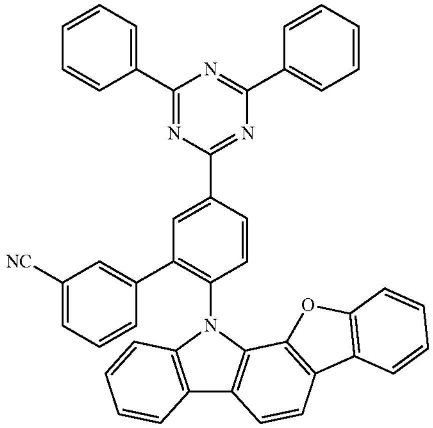
1-26
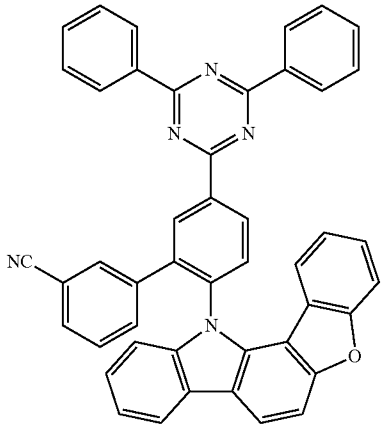

-continued
1-27
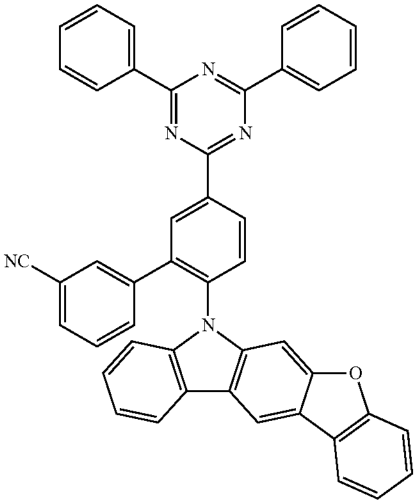
1-28
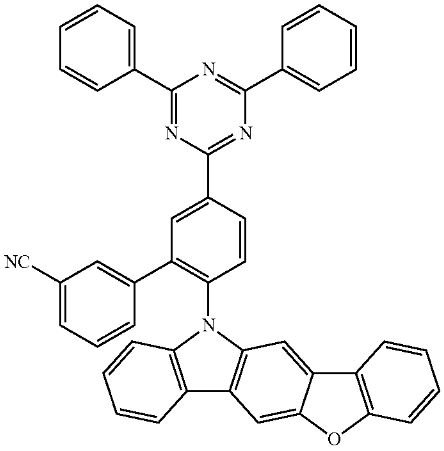
1-29
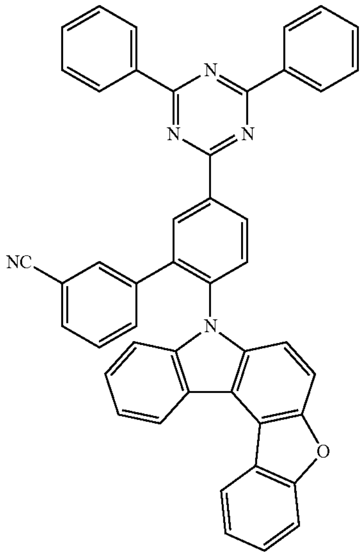
-continued
1-30
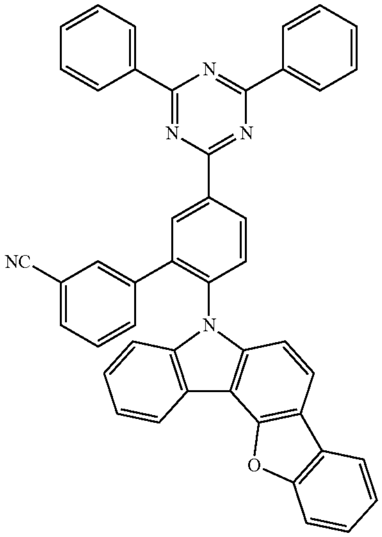
1-31
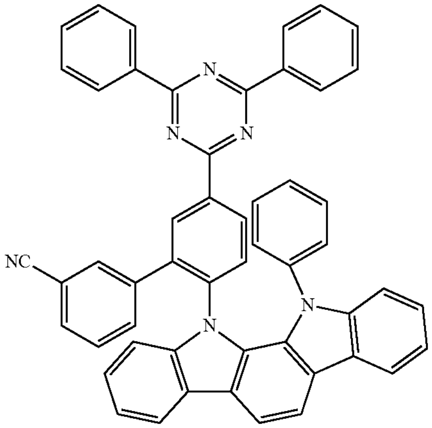
1-32
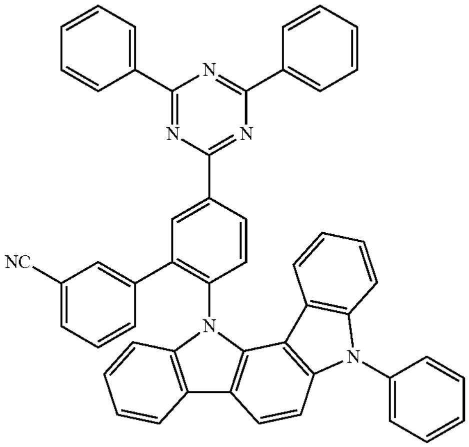

-continued
1-33
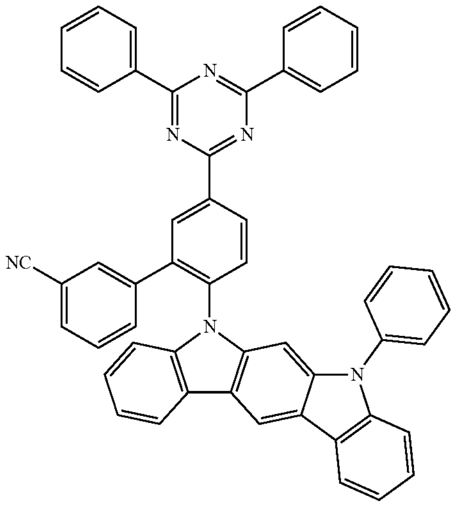
1-34
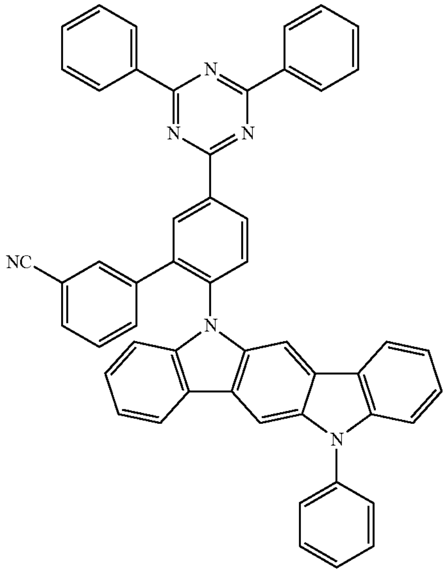
1-35
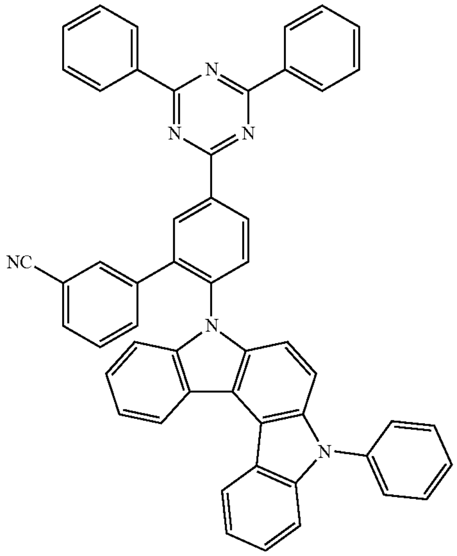
-continued
1-36
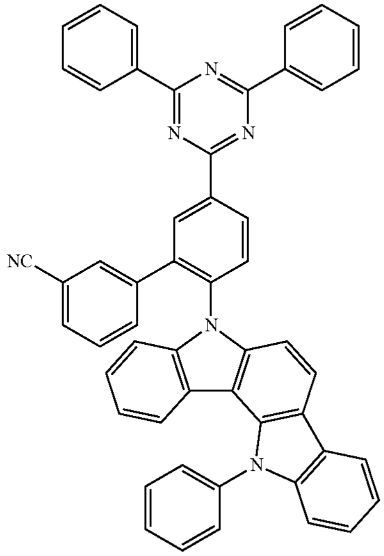
1-37
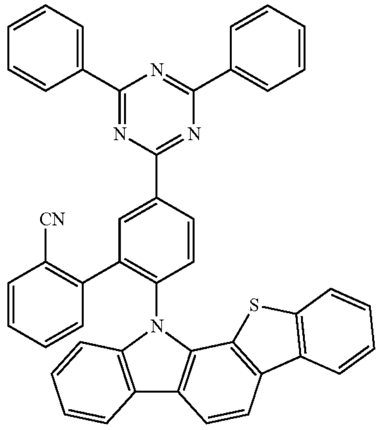
1-38
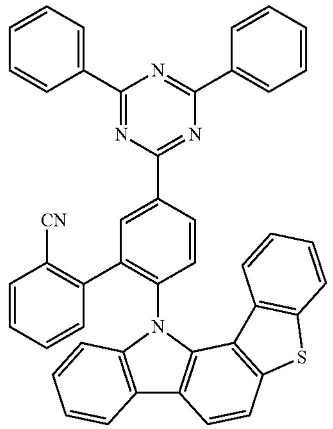

-continued
1-39
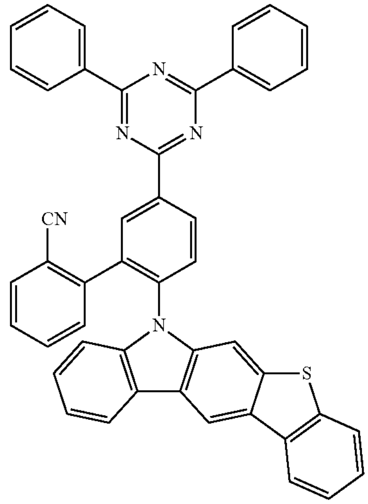
1-40
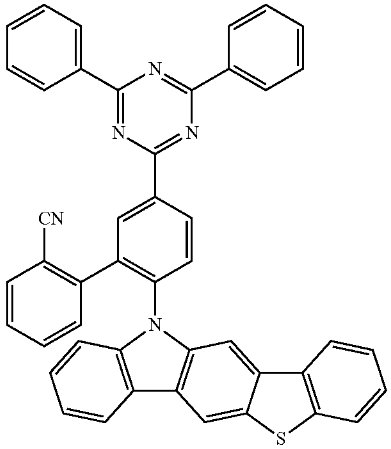
1-41
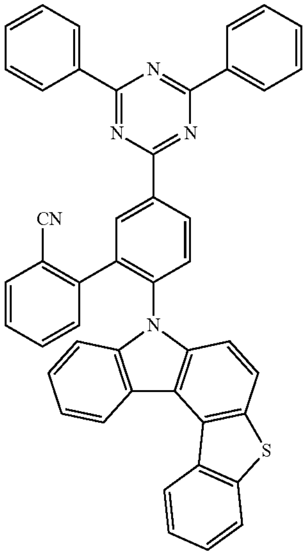
-continued
1-42
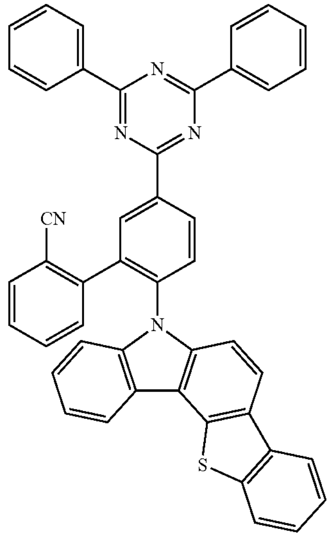
1-43
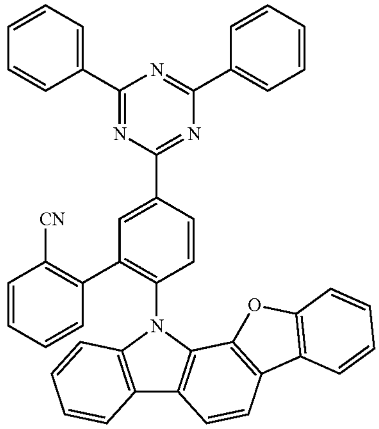
1-44
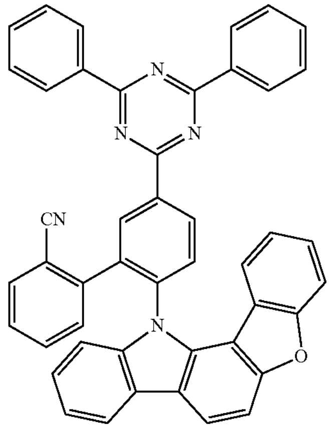

1-45
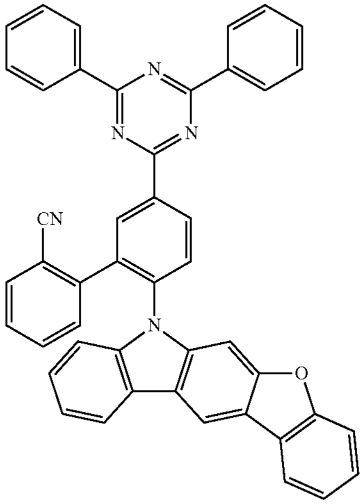
1-46
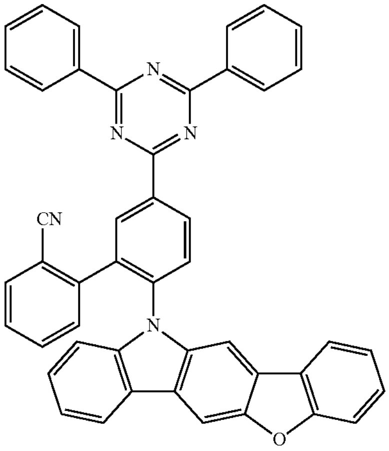
1-47
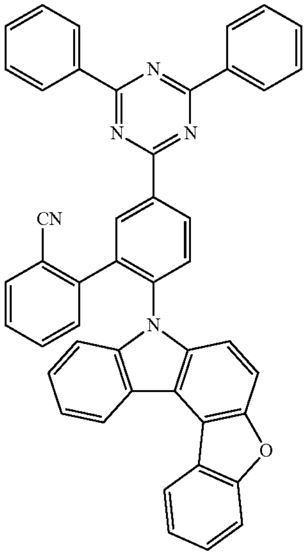
1-48
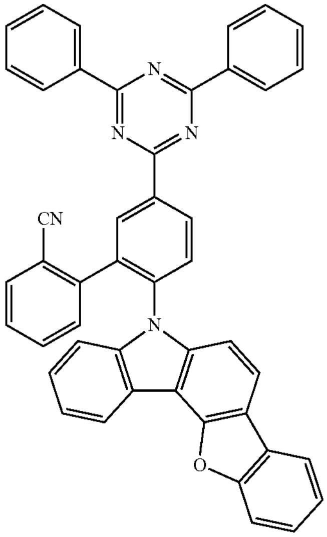
1-49
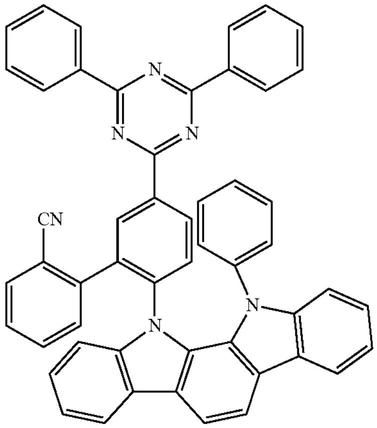
1-50
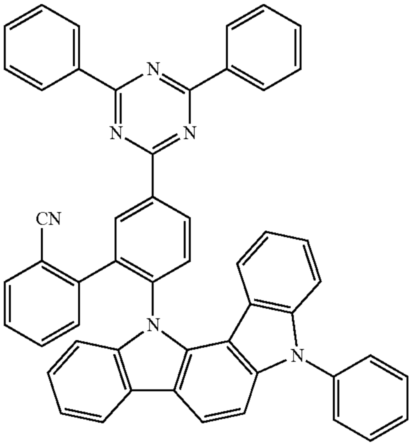

-continued
1-51
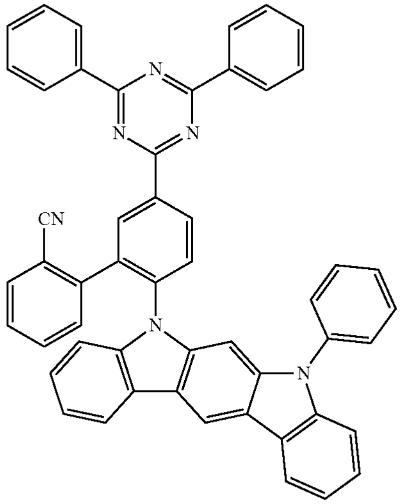
1-52
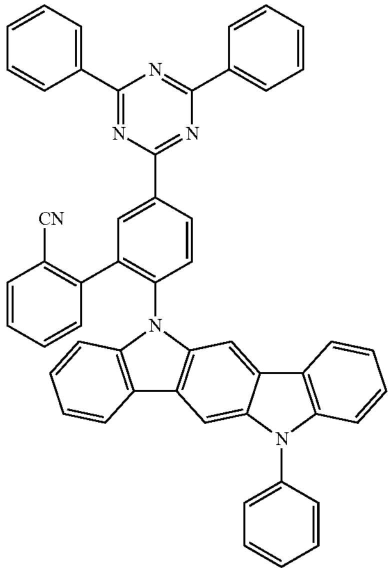
1-53
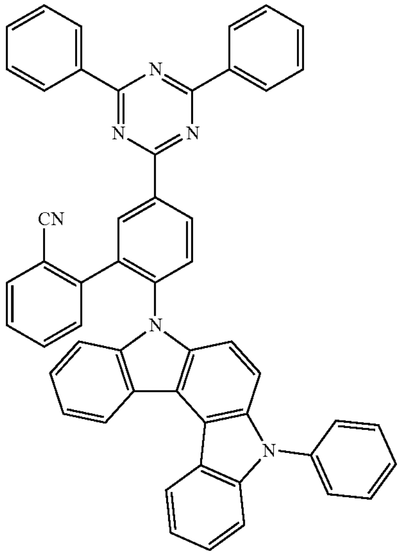
-continued
1-54
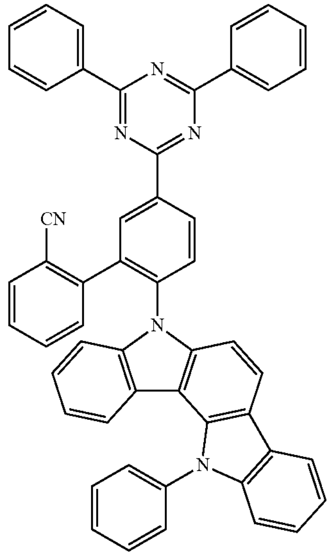
1-55
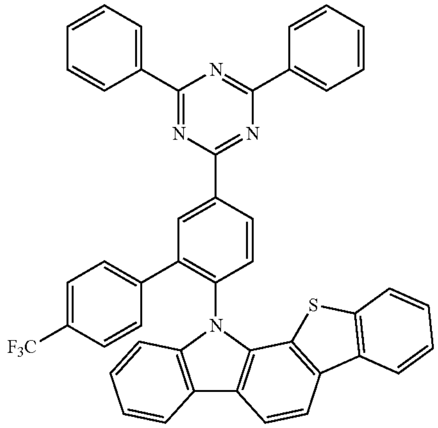
1-56
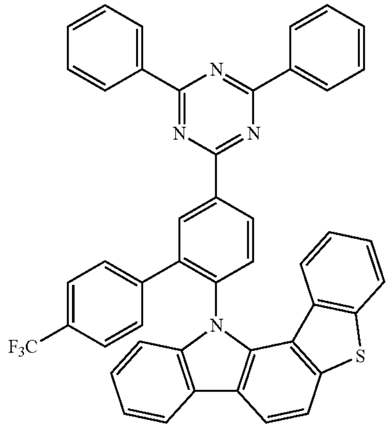

-continued
1-57
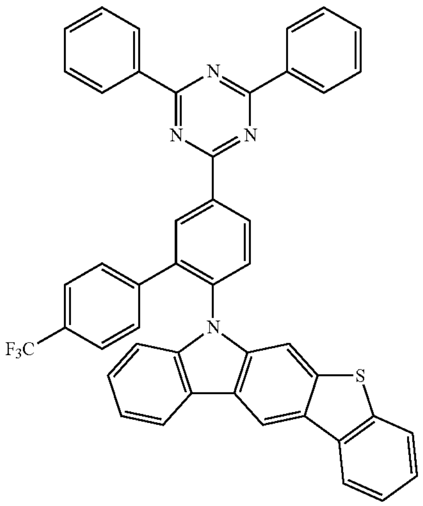
1-58
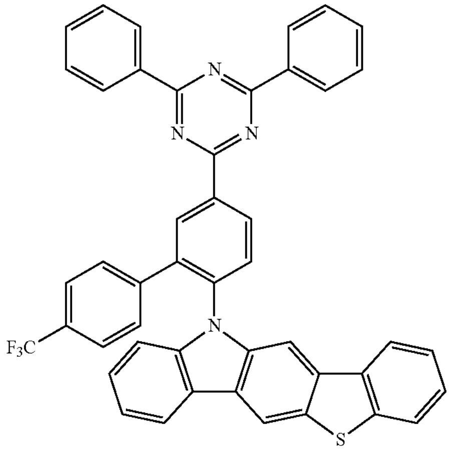
1-59
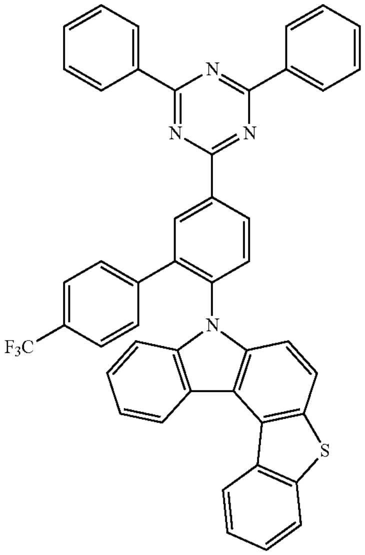
-continued
1-60
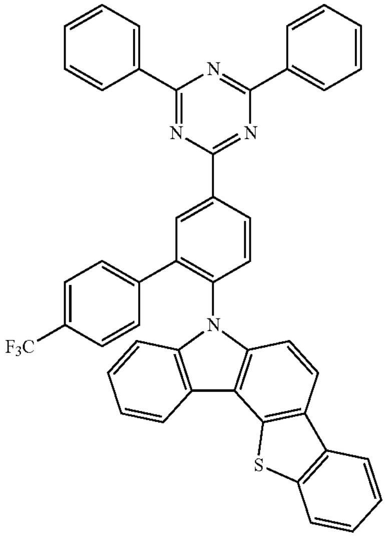
1-61
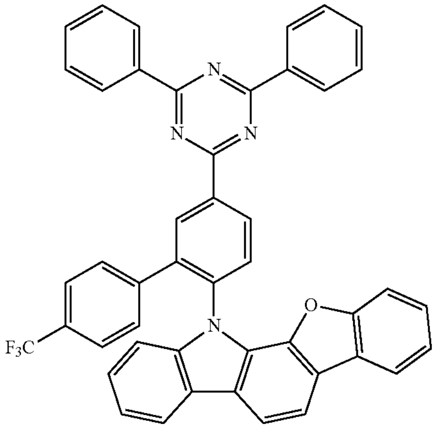
1-62
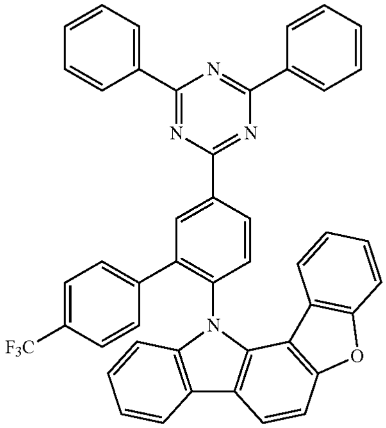

-continued
1-63
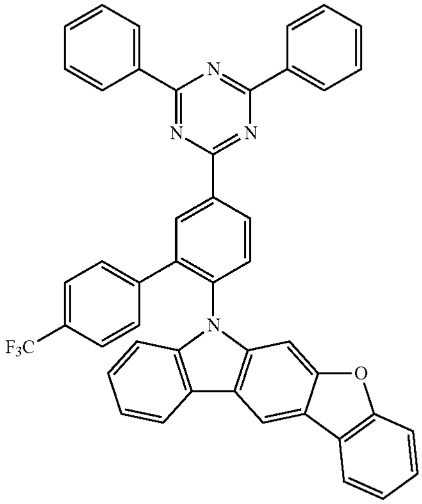
1-64
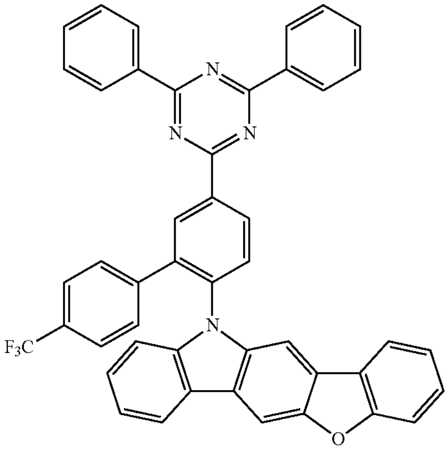
1-65
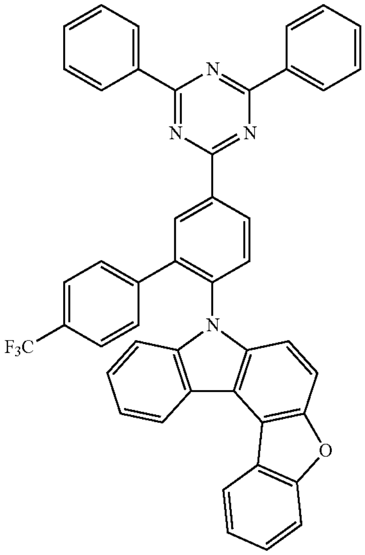
-continued
1-66
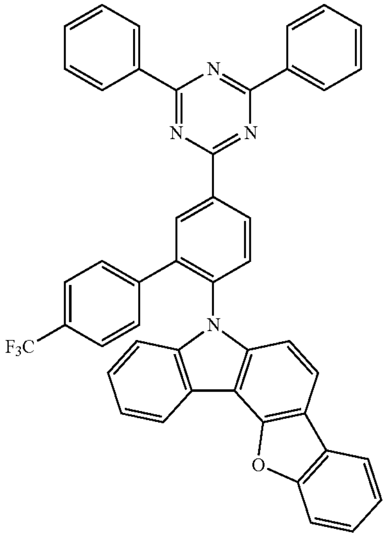
1-67
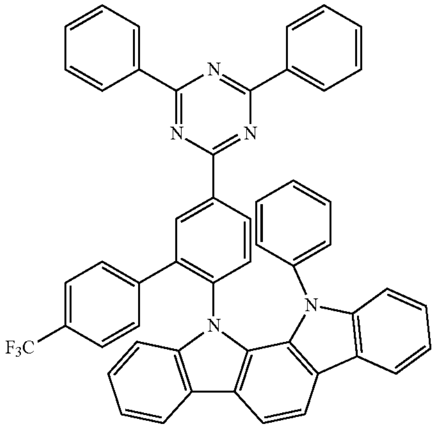
1-68
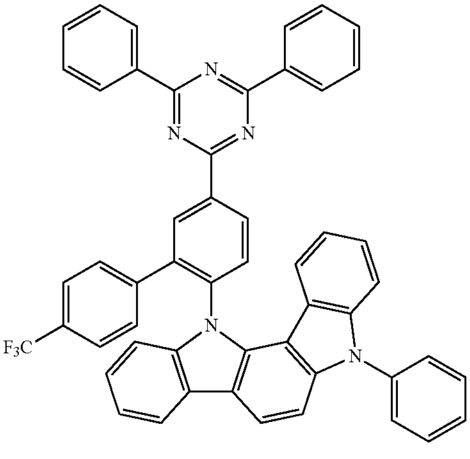

-continued
1-69
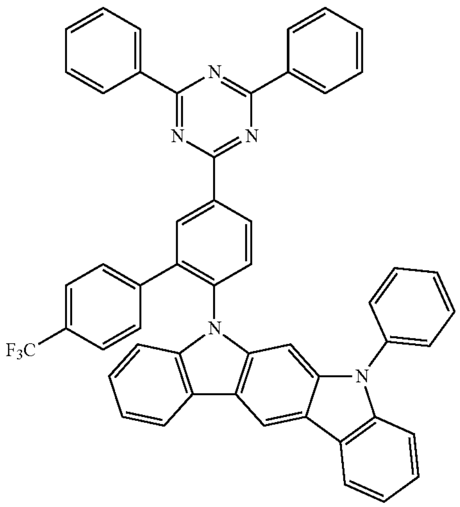
1-70
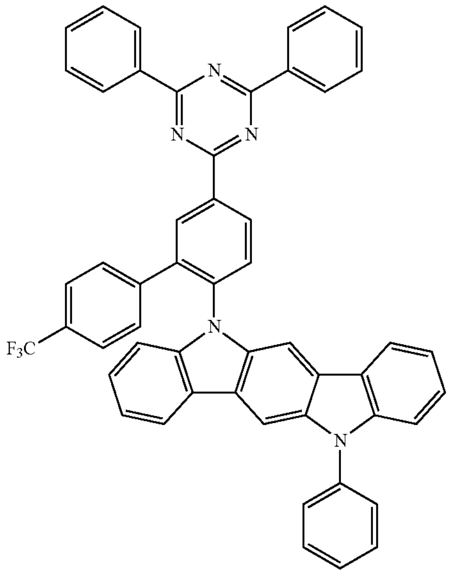
1-71
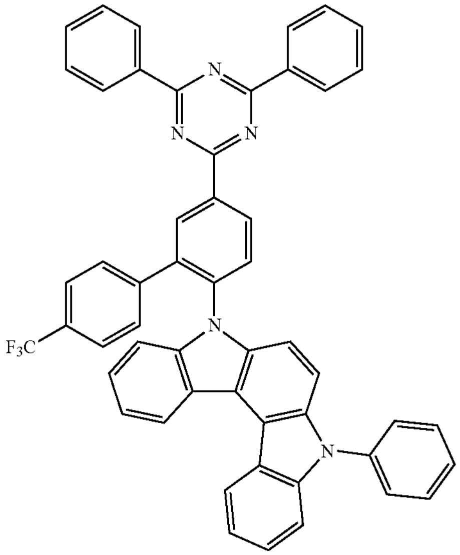
-continued
1-72
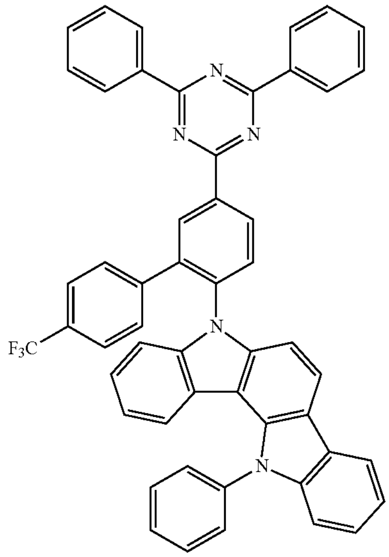
1-73
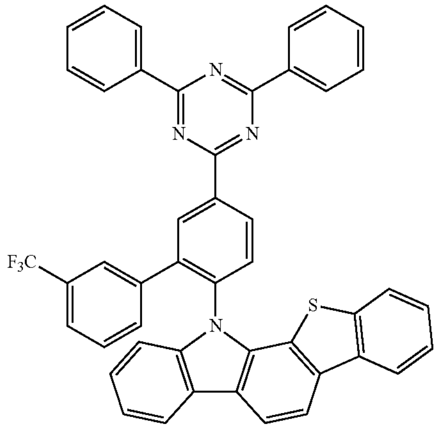
1-74
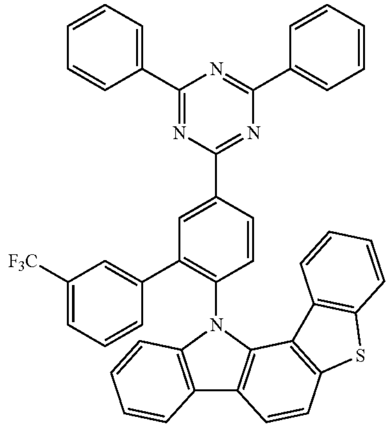

-continued
1-75
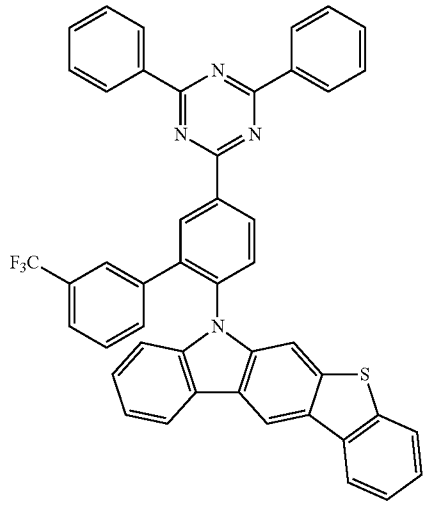
1-76
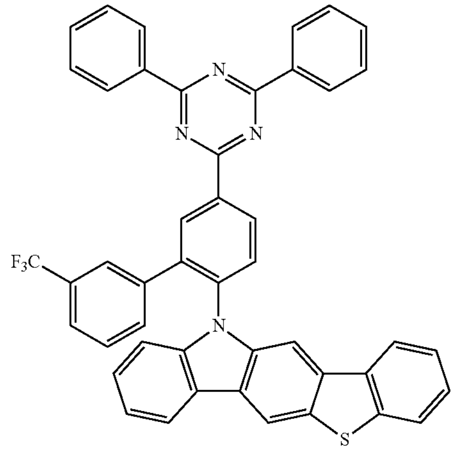
1-77
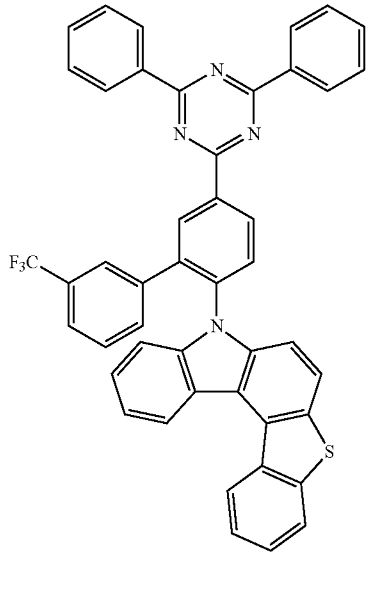
-continued
1-78
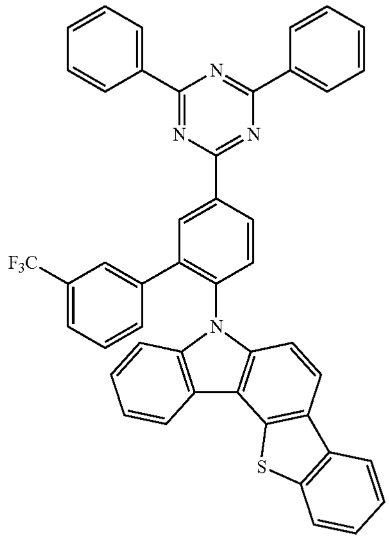
1-79
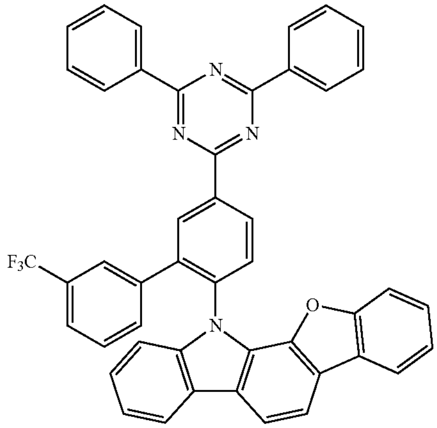
1-80
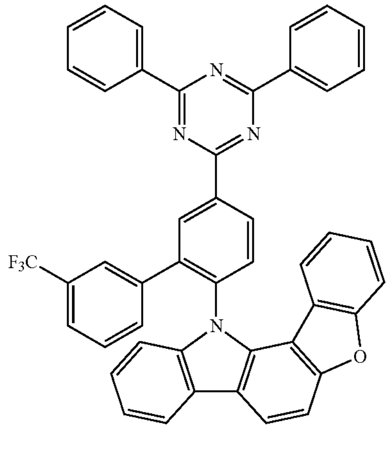

-continued
1-81
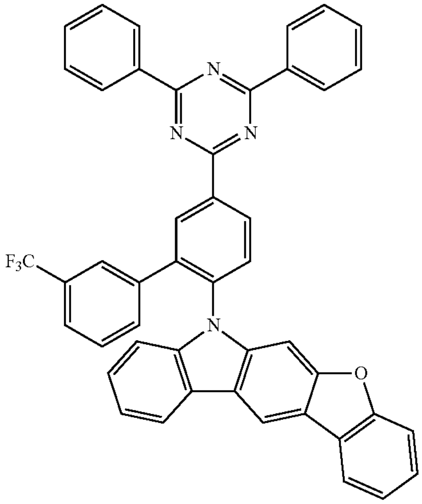
1-82
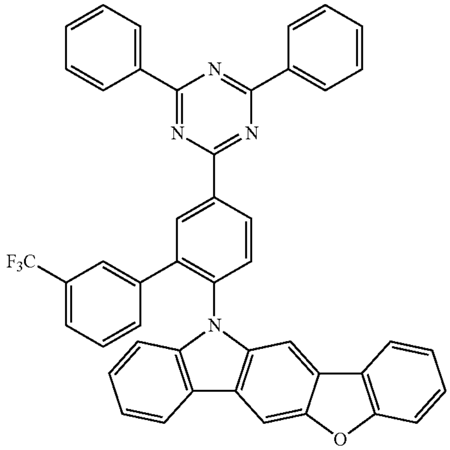
1-83
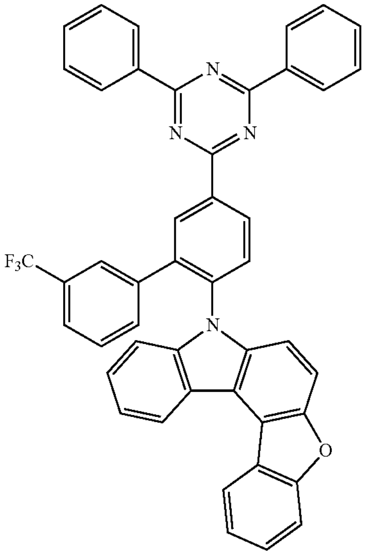
-continued
1-84
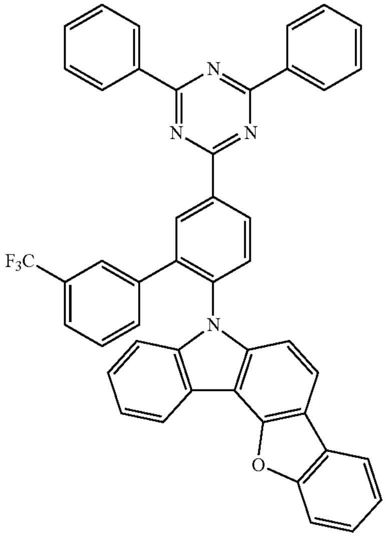
1-85
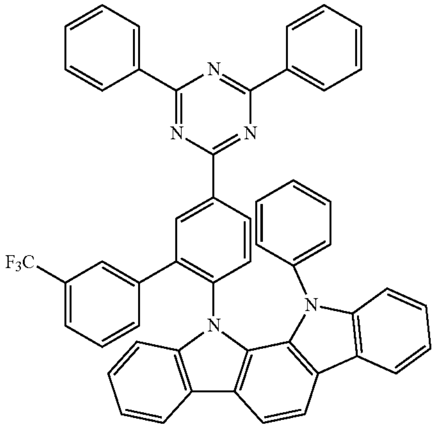
1-86
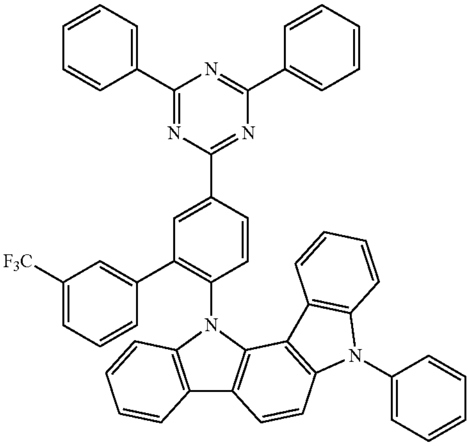

-continued
1-87
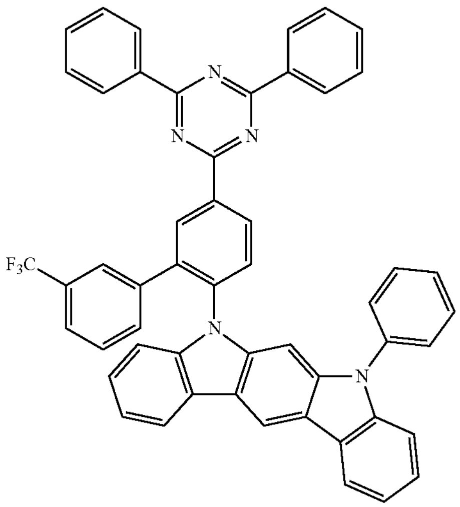
1-88
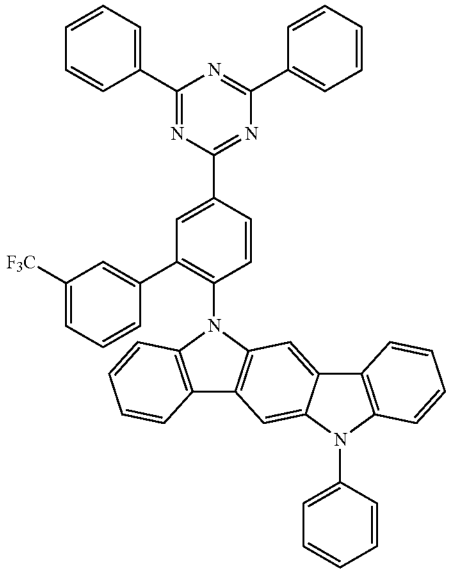
1-89
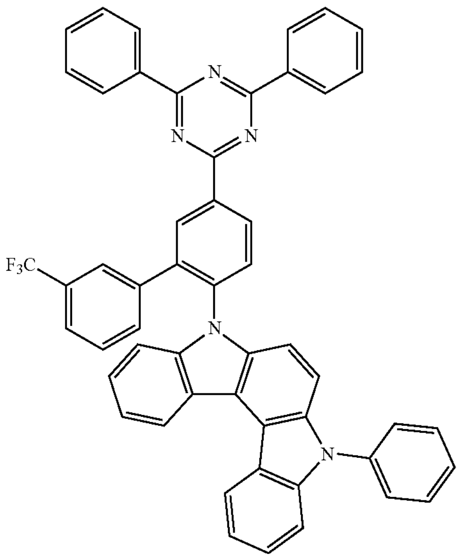
-continued
1-90
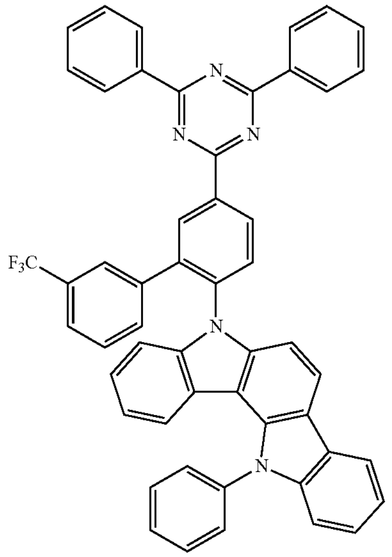
1-91
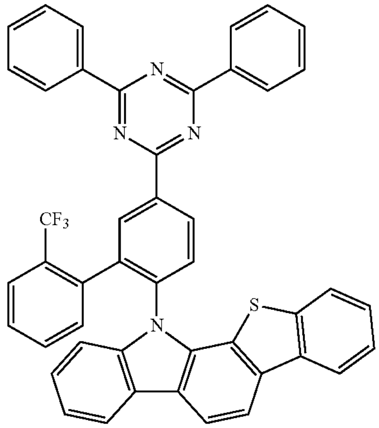
1-92
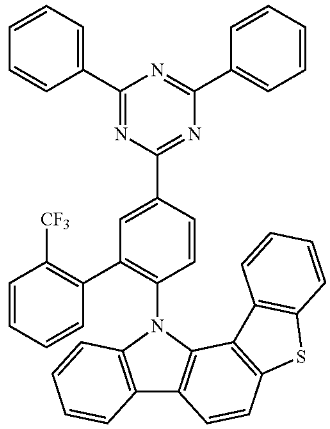

-continued
1-93
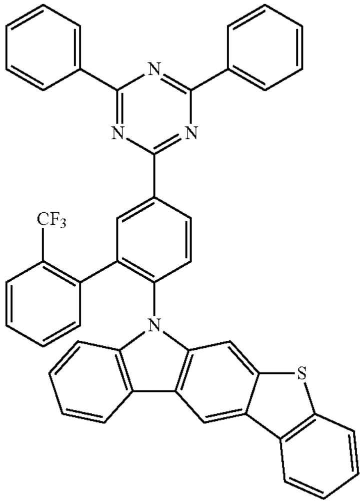
1-94
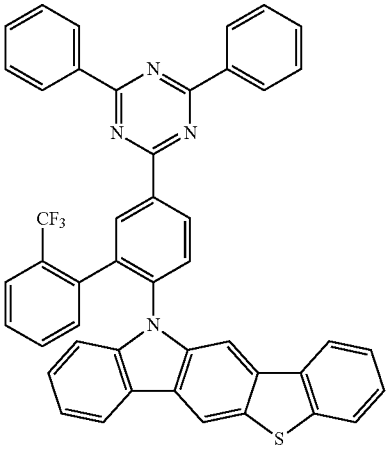
1-95
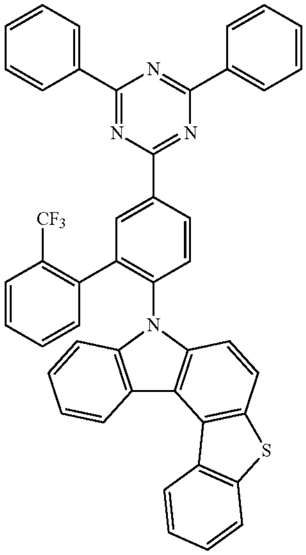
-continued
1-96
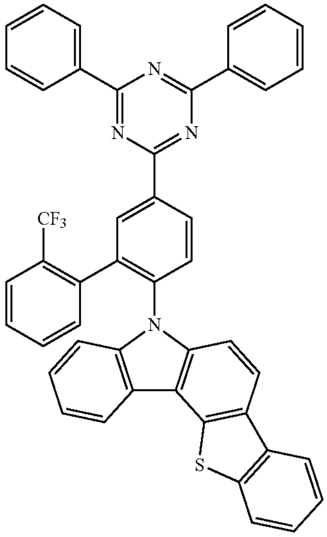
1-97
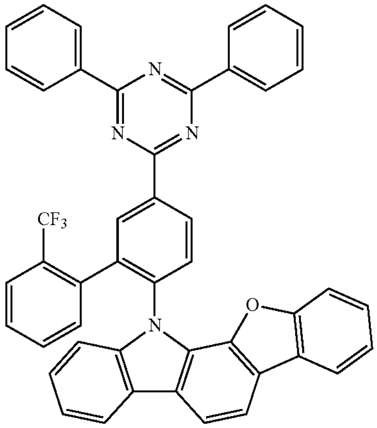
1-98
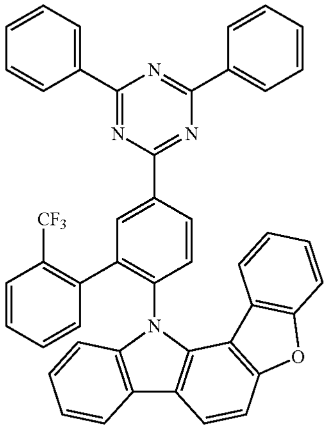

-continued
1-99
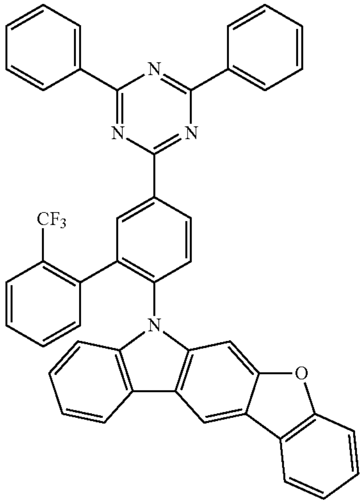
1-100
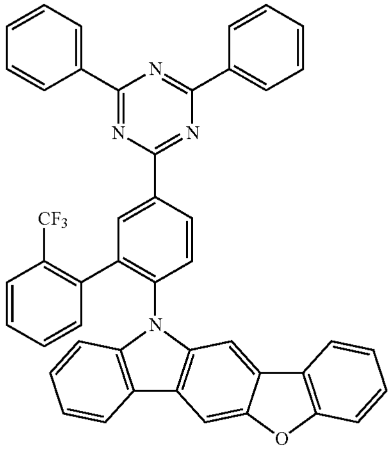
1-101
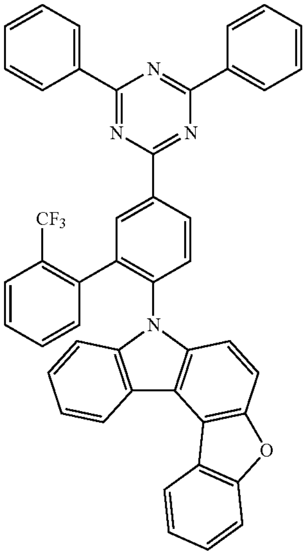
-continued
1-102
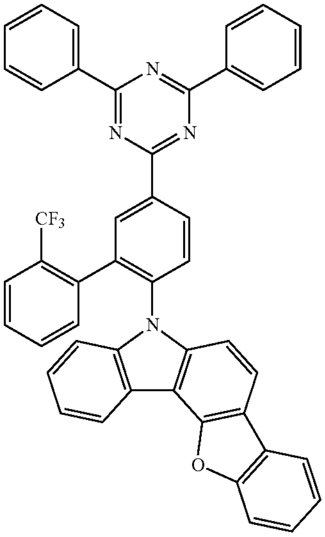
1-103
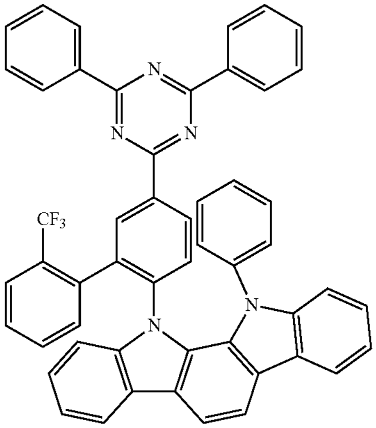
1-104
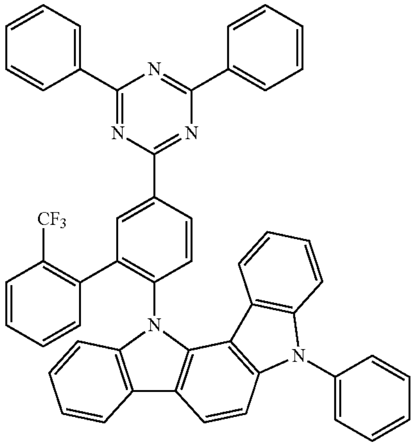

-continued
1-105
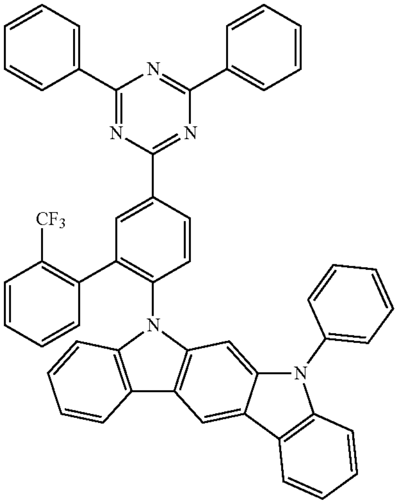
1-106
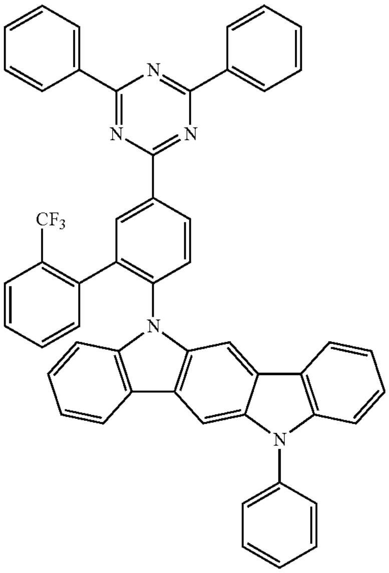
1-107
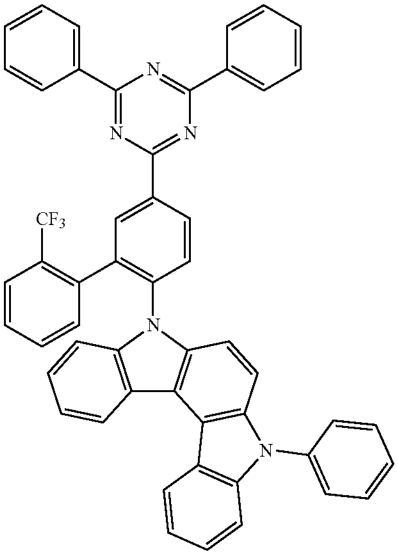
-continued
1-108
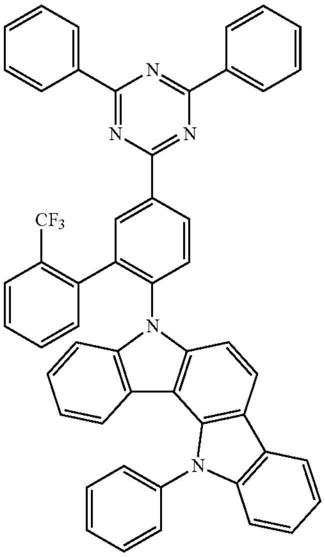
1-109
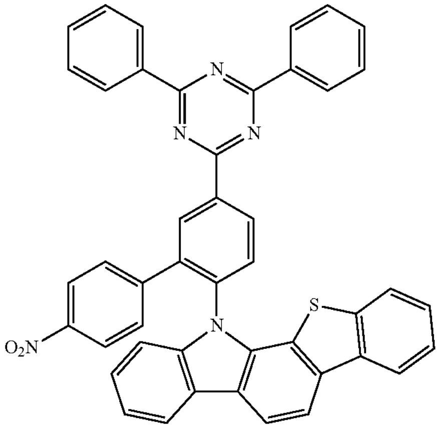
1-110
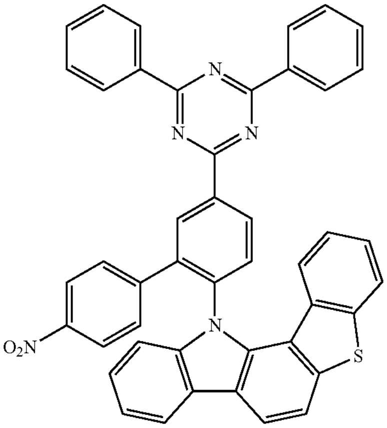

-continued
1-111
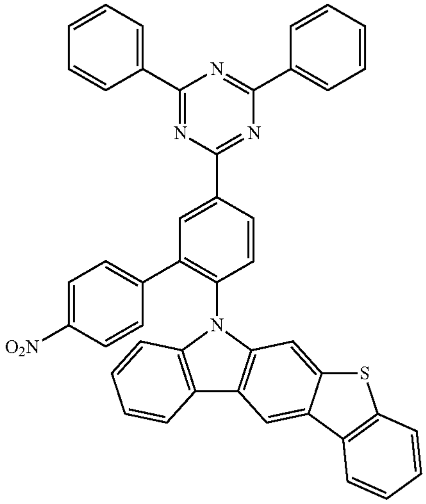
1-112
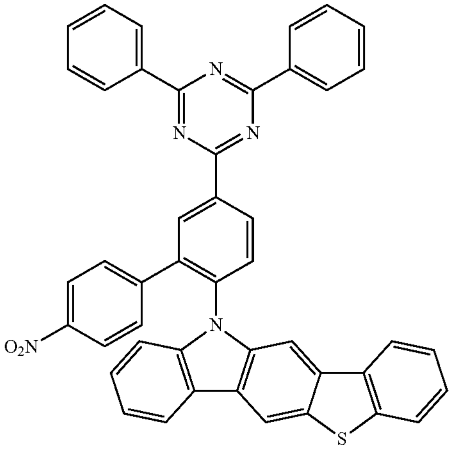
1-113
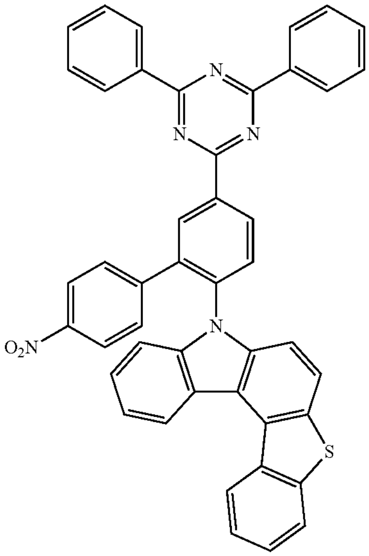
-continued
1-114
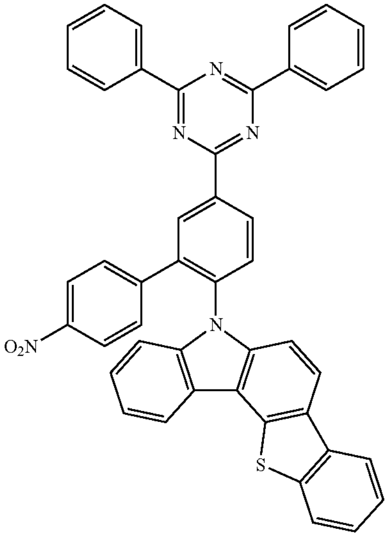
1-115
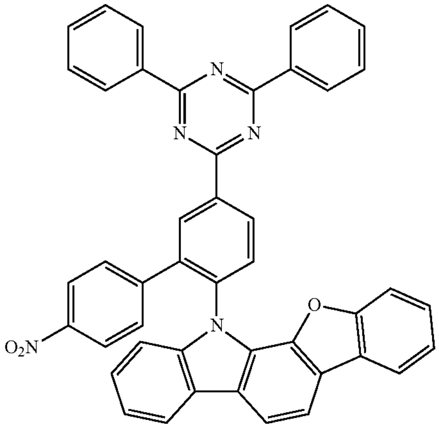
1-116
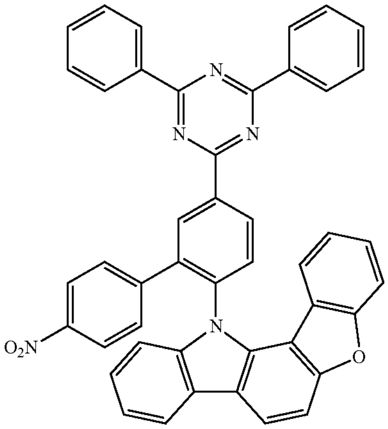

-continued
1-117
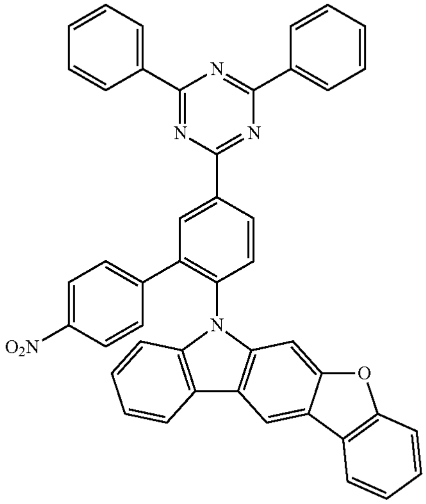
1-118
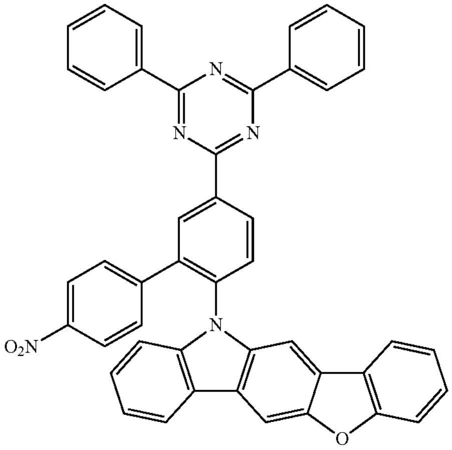
1-119
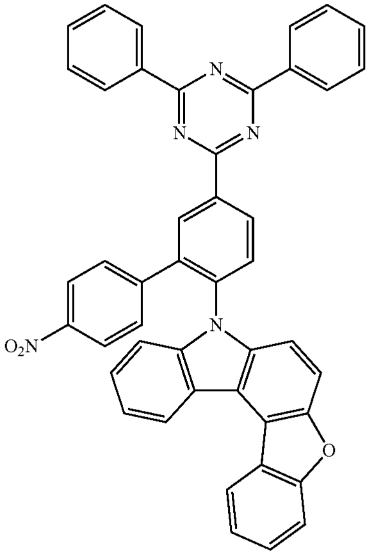
-continued
1-120
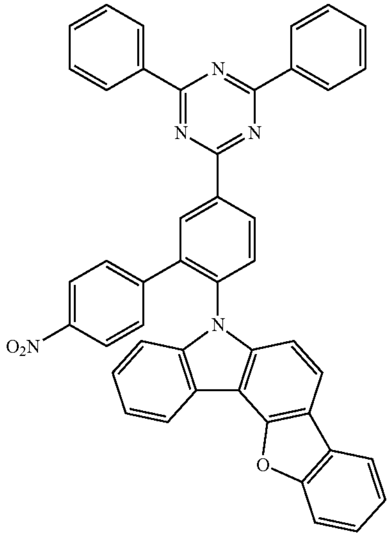
1-121
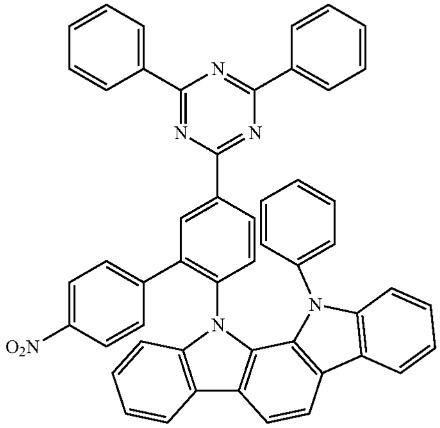
1-122
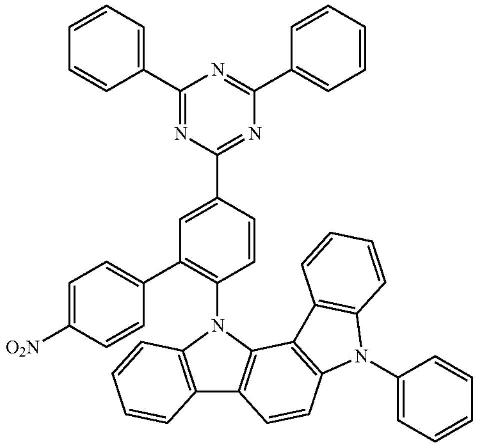

-continued
1-123
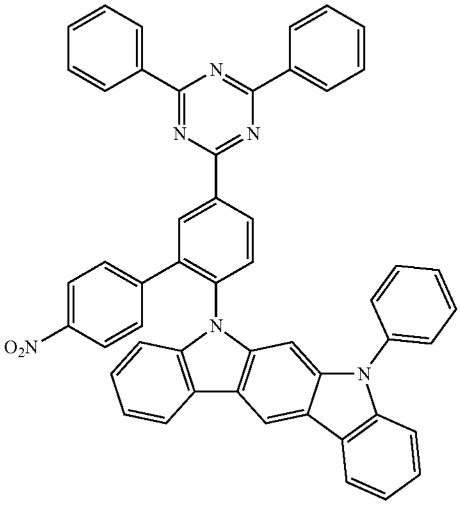
1-124
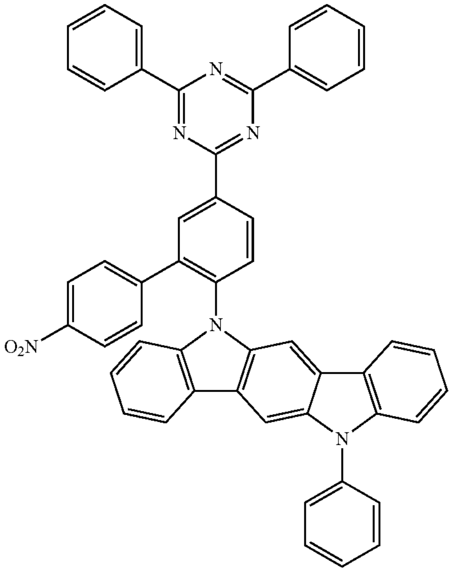
1-125
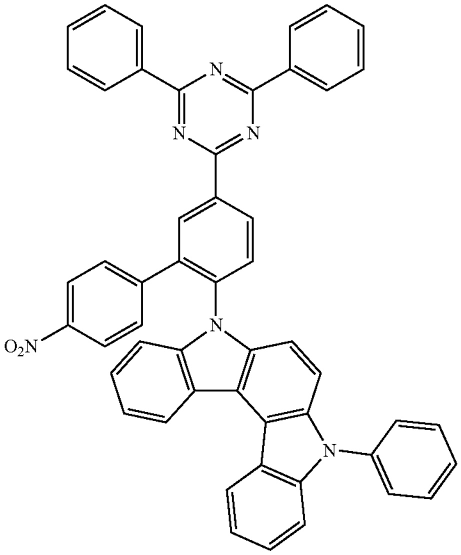
-continued
1-126
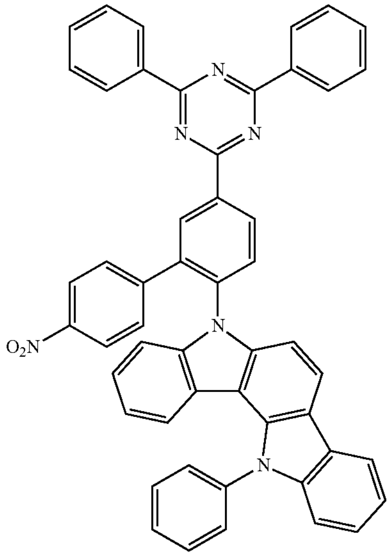
1-127
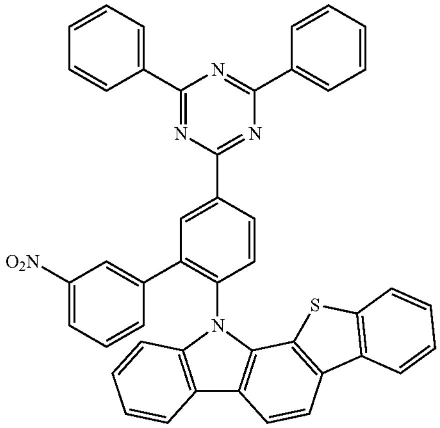
1-128
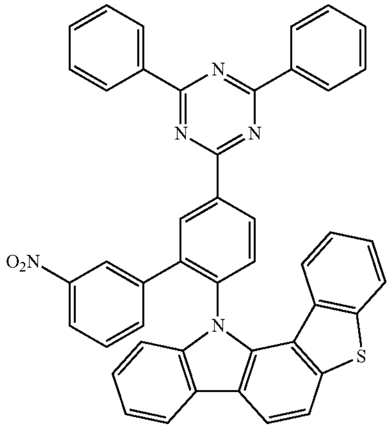

-continued
1-129
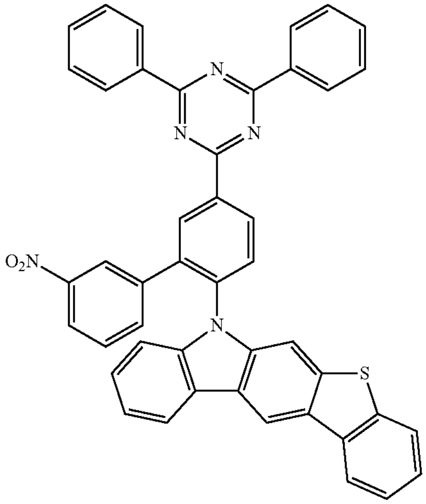
1-130
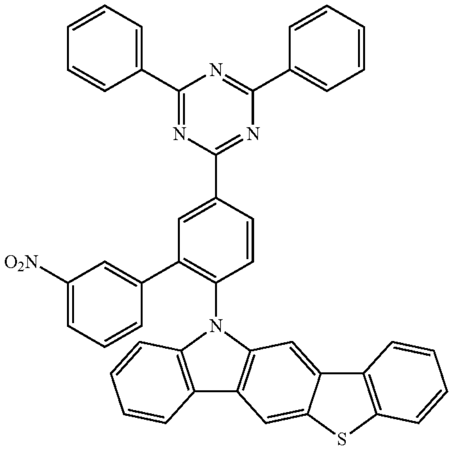
1-131
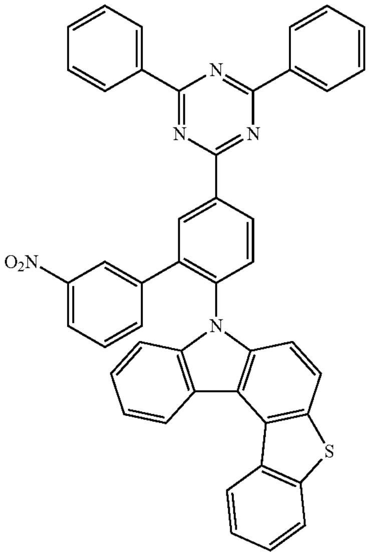
-continued
1-132
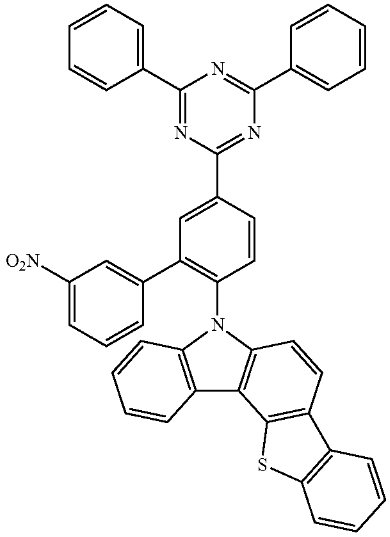
1-133
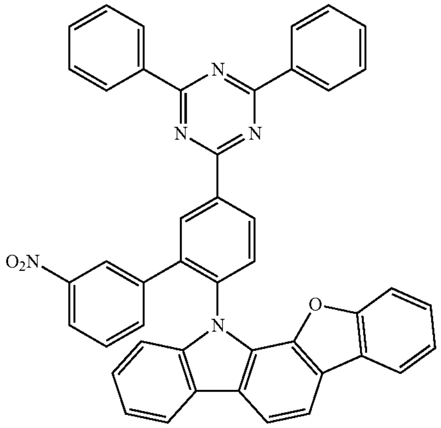
1-134
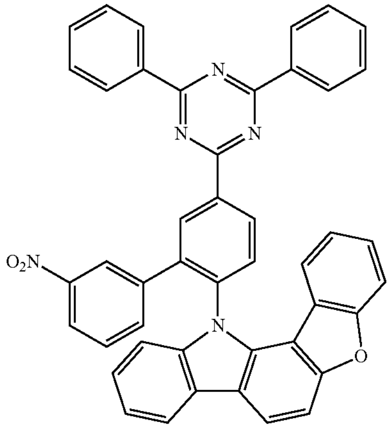

-continued
1-135
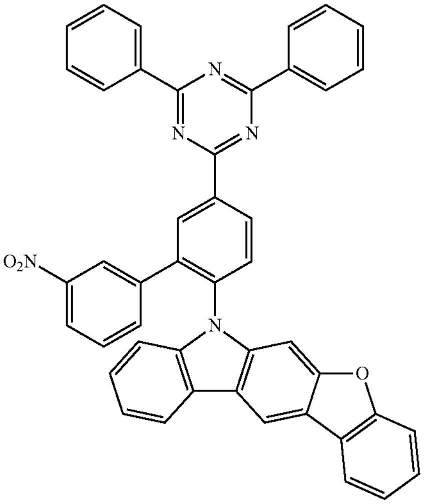
1-136
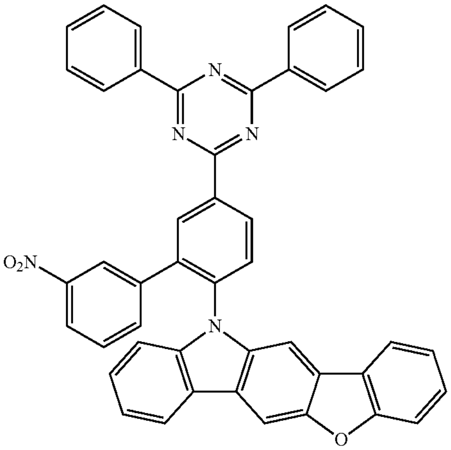
1-137
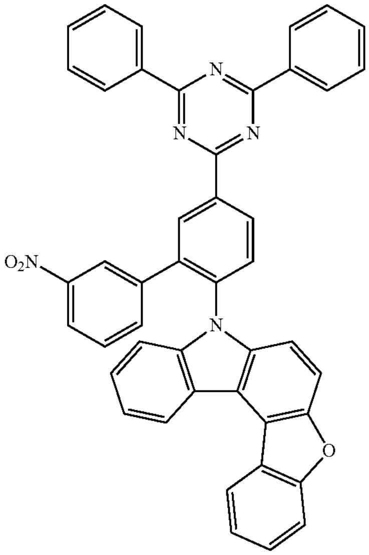
-continued
1-138
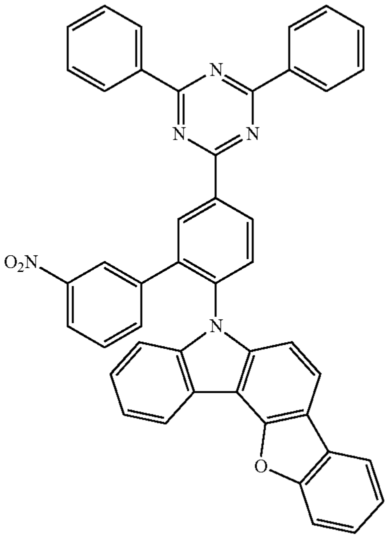
1-139
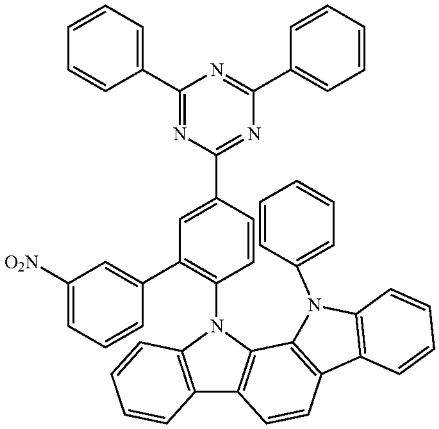
1-140
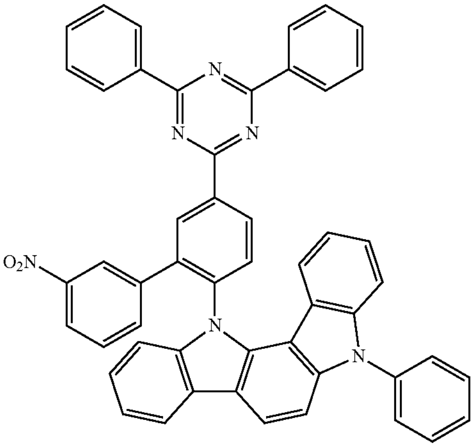

-continued
1-141
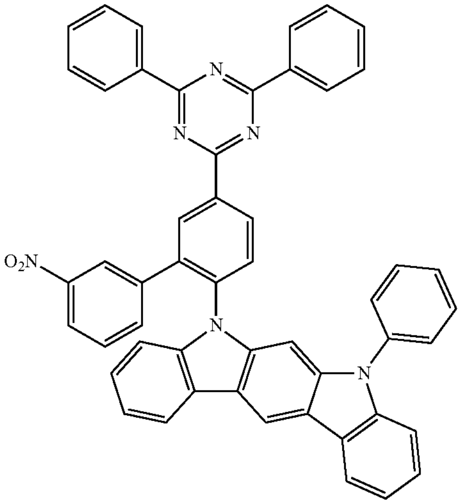
1-142
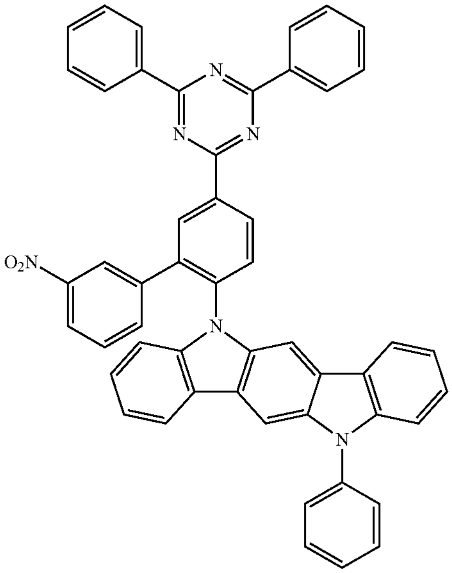
1-143
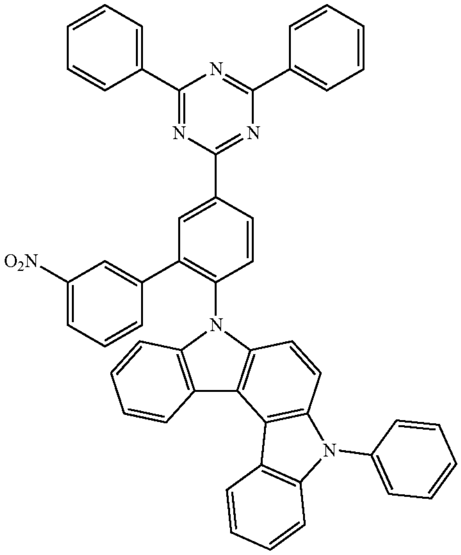
-continued
1-144
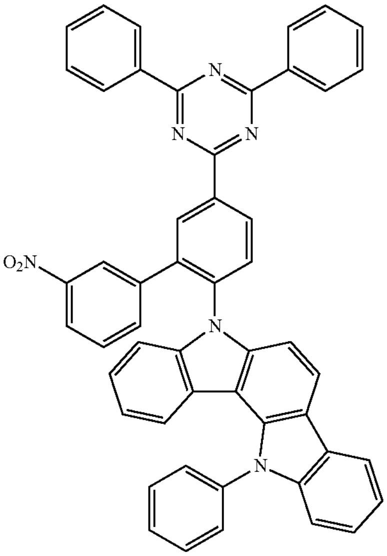
1-145
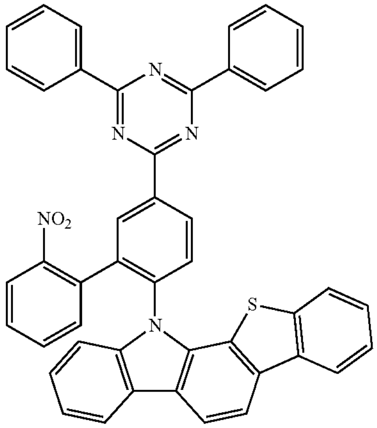
1-146
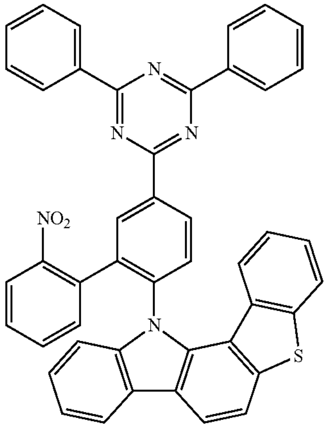

-continued
1-147
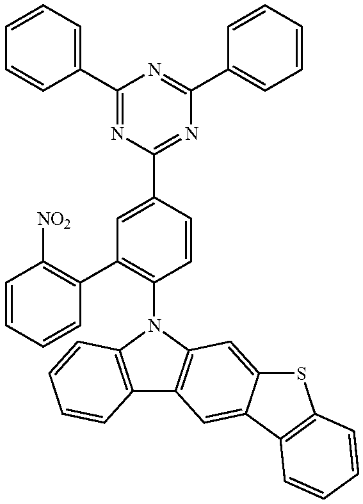
1-148
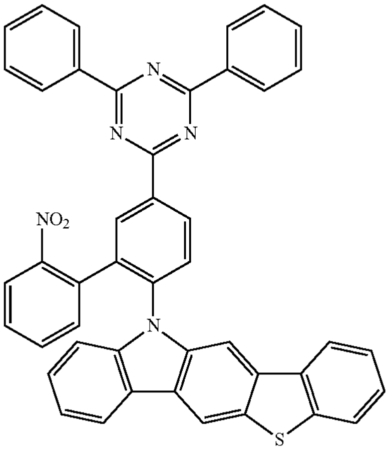
1-149
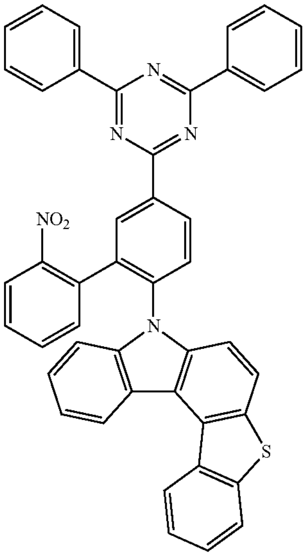
-continued
1-150
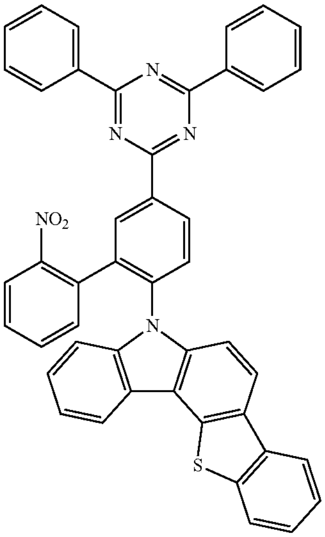
1-151
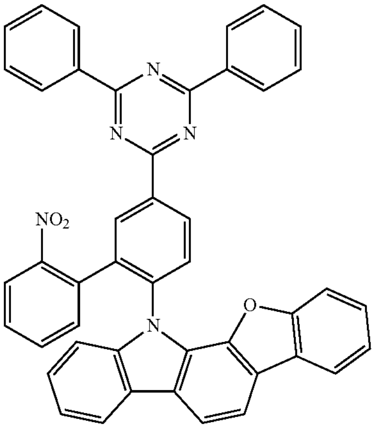
1-152
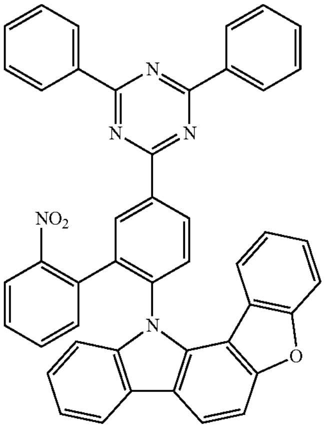

-continued
1-153
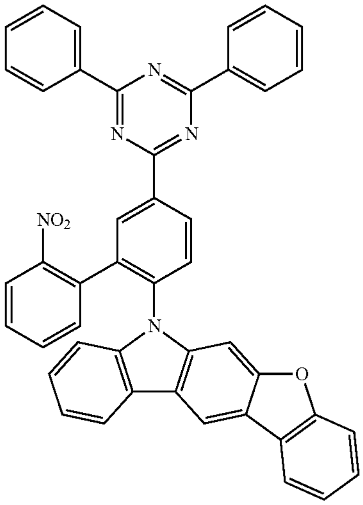
1-154
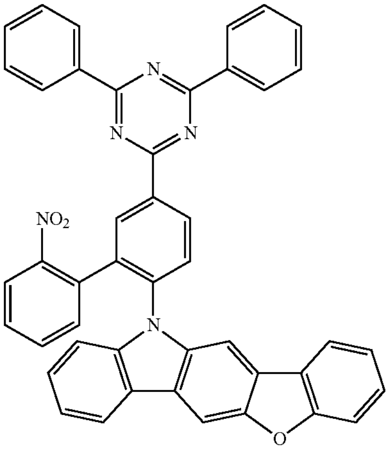
1-155
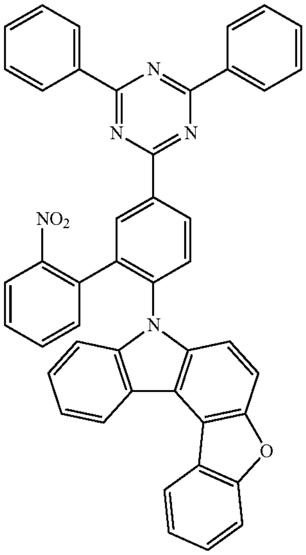
-continued
1-156
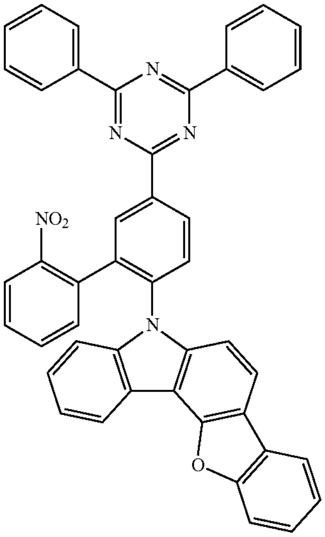
1-157
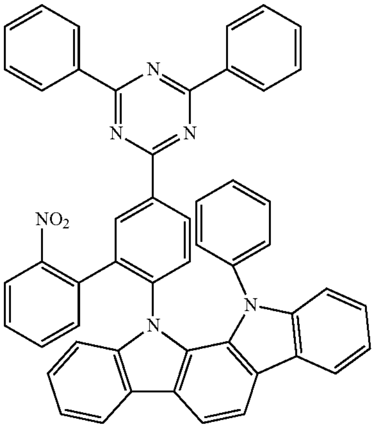
1-158
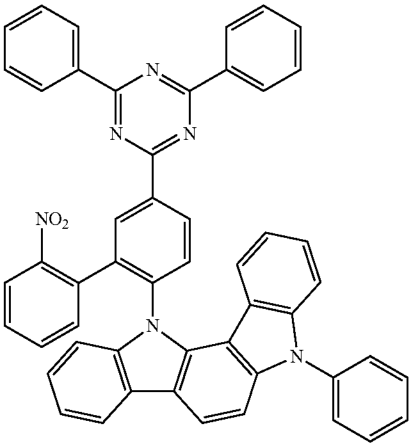

-continued
1-159
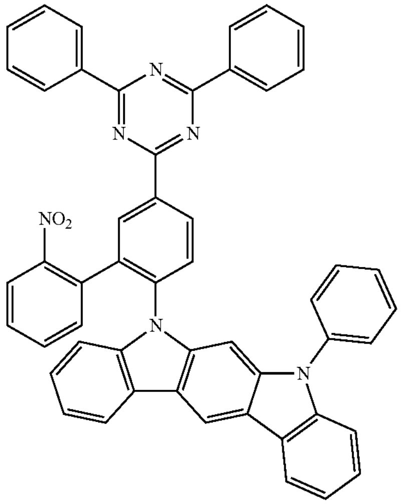
1-160
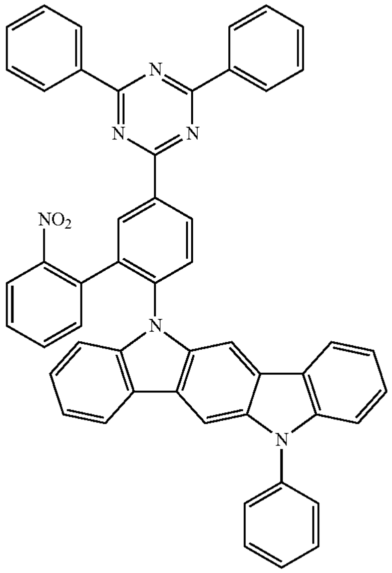
1-161
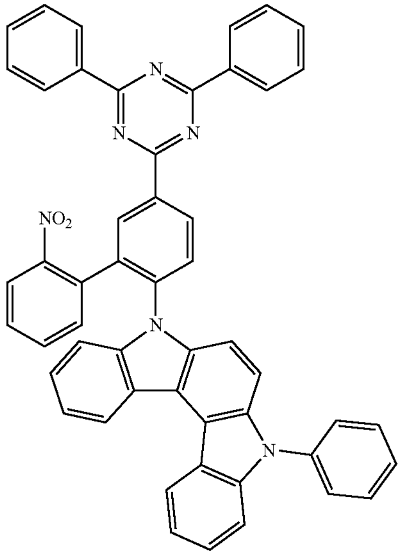
-continued
1-162
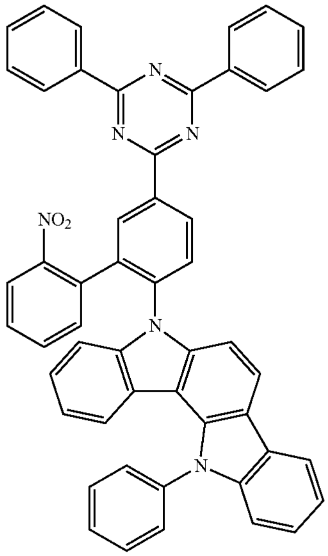
1-163
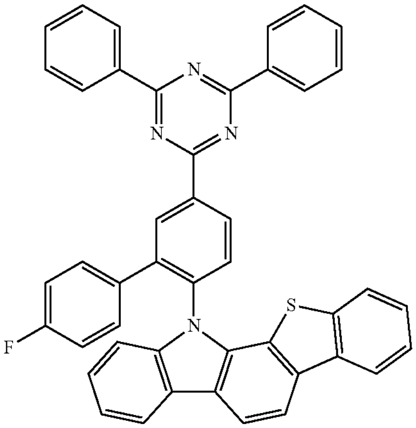
1-164
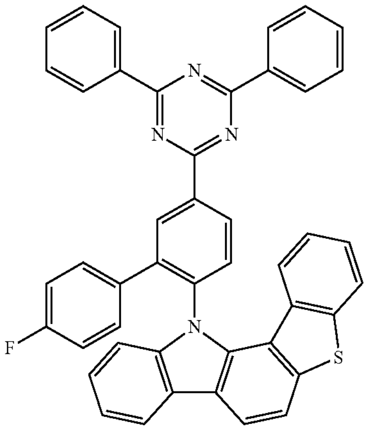

-continued
1-165
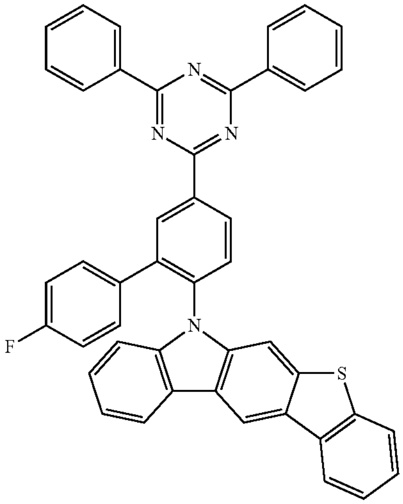
1-166
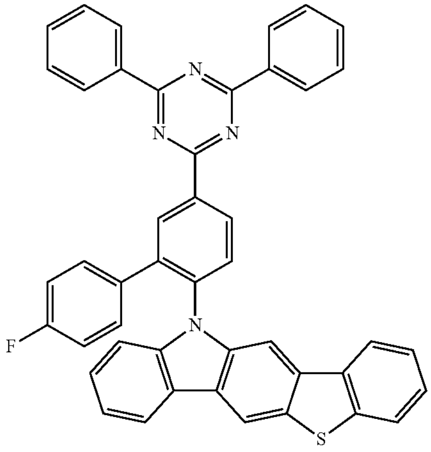
1-167
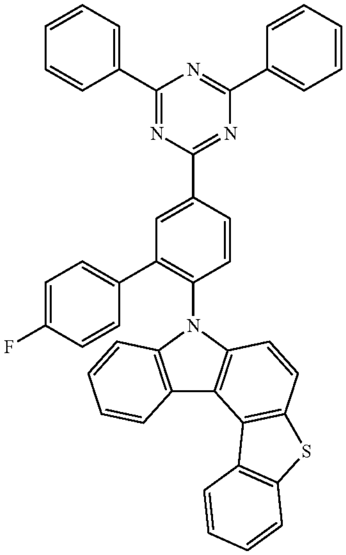
-continued
1-168
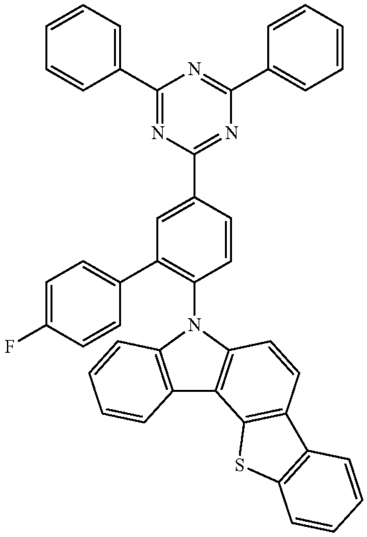
1-169
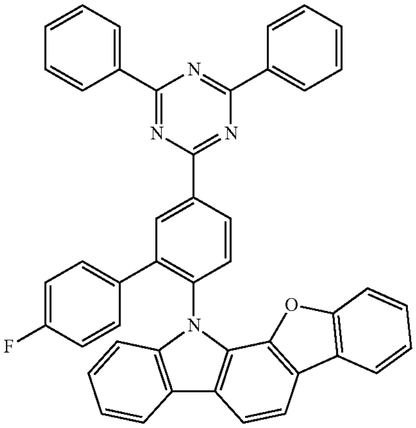
1-170
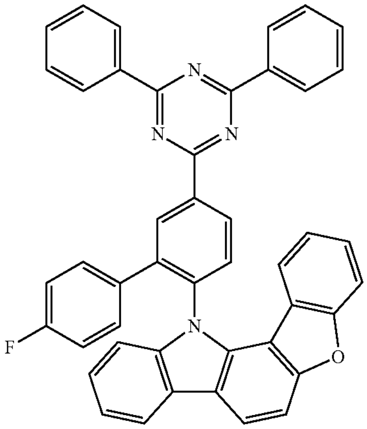

-continued
1-171
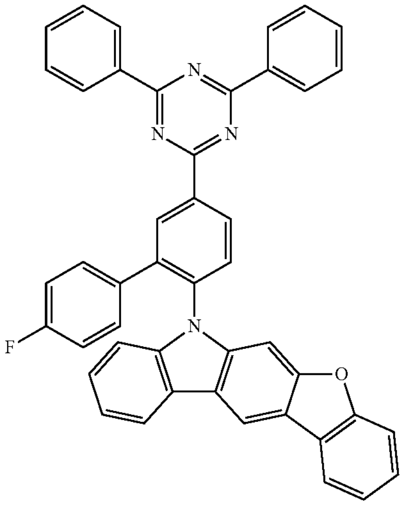
1-172
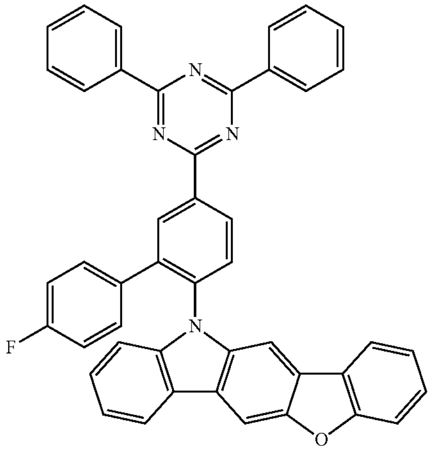
1-173
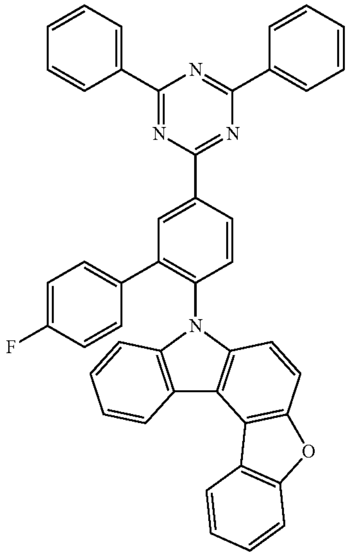
-continued
1-174
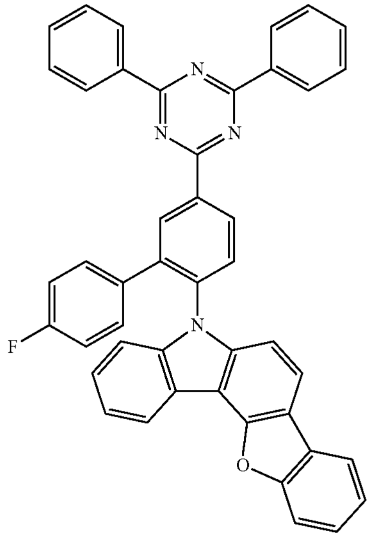
1-175
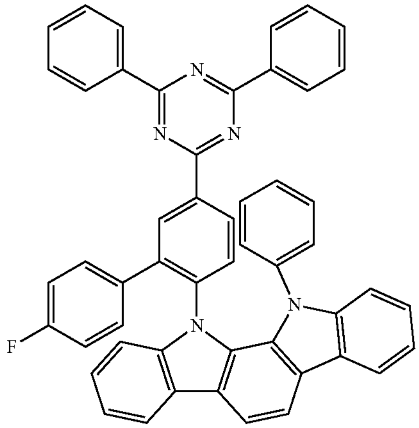
1-176
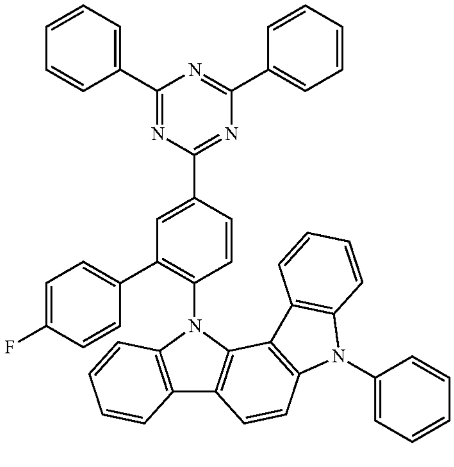

-continued
1-177
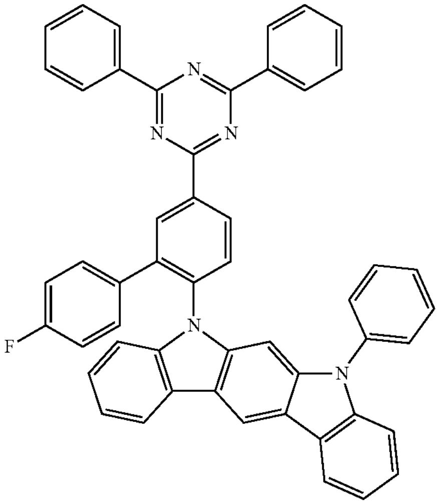
1-178
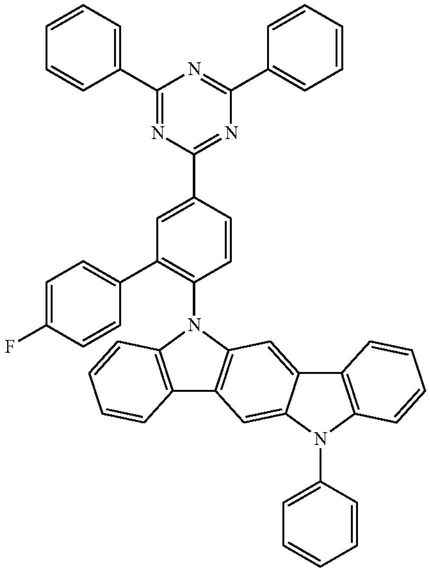
1-179
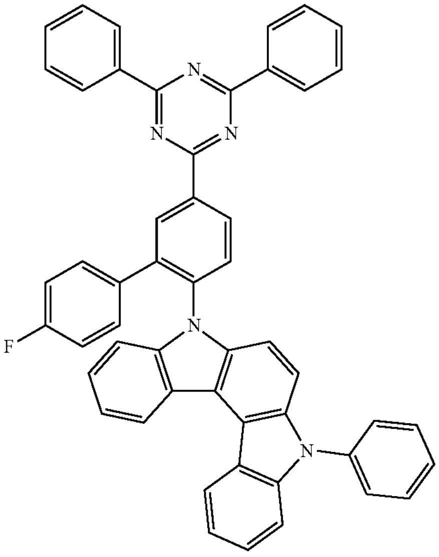
-continued
1-180
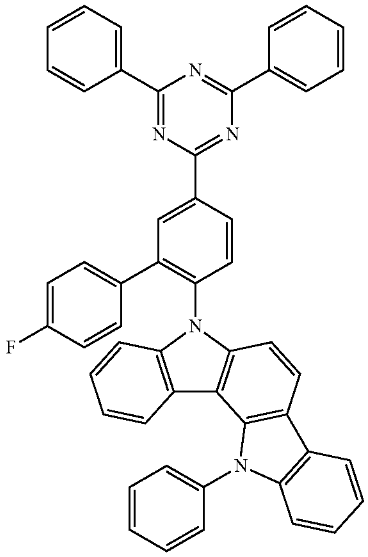
1-181
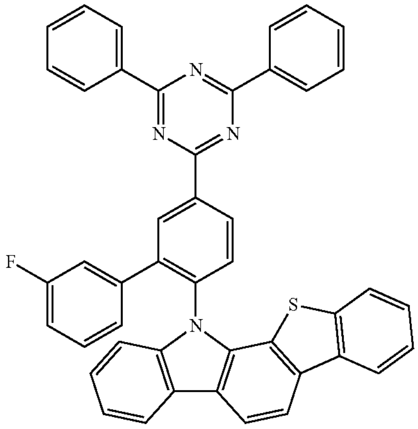
1-182
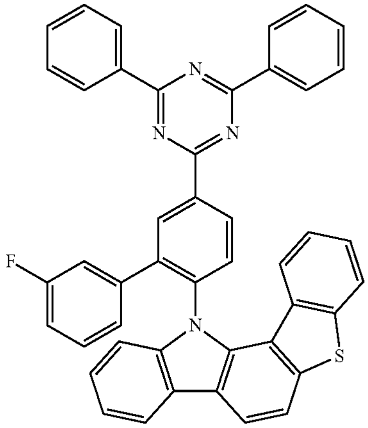

-continued
1-183
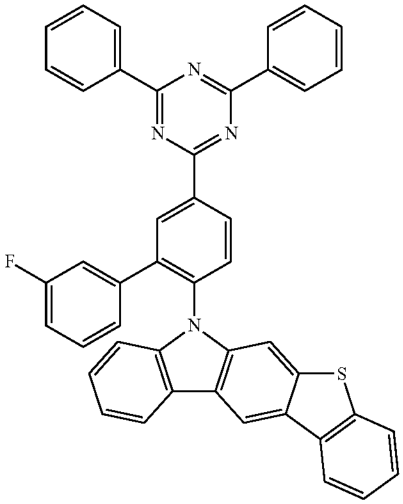
1-184
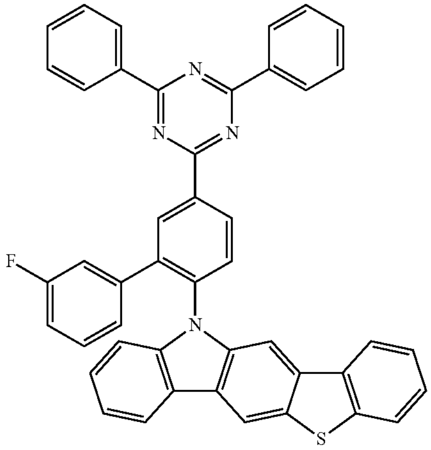
1-185
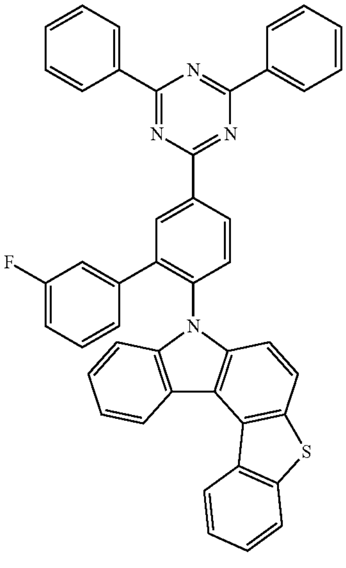
-continued
1-186
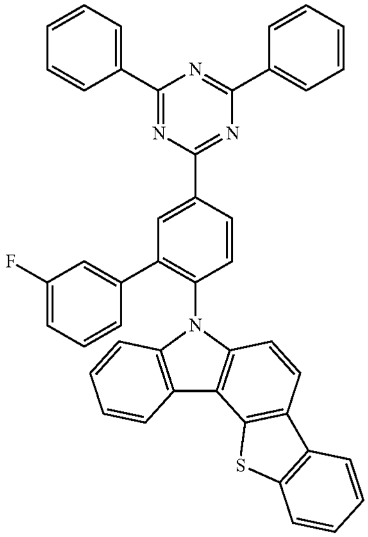
1-187
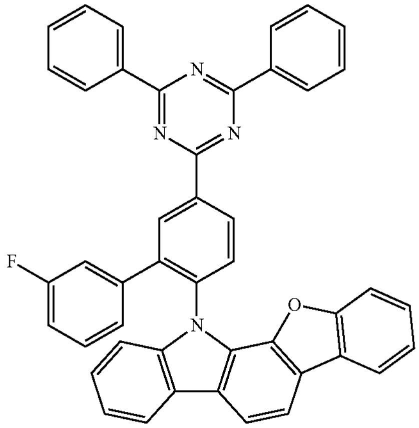
1-188
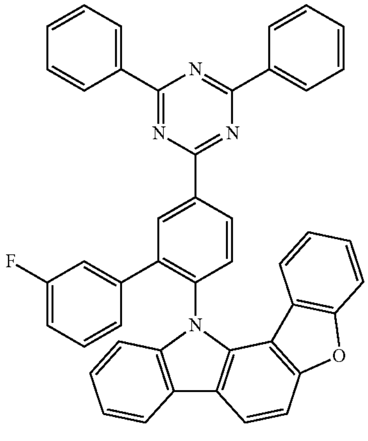

-continued
1-189
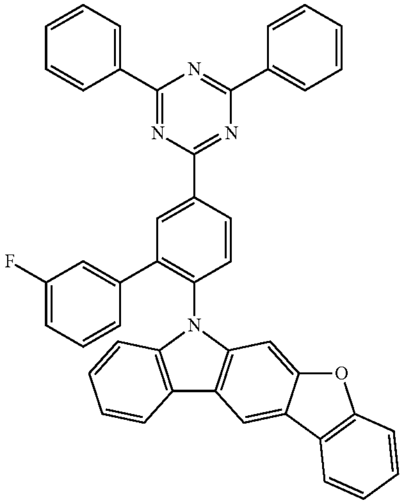
1-190
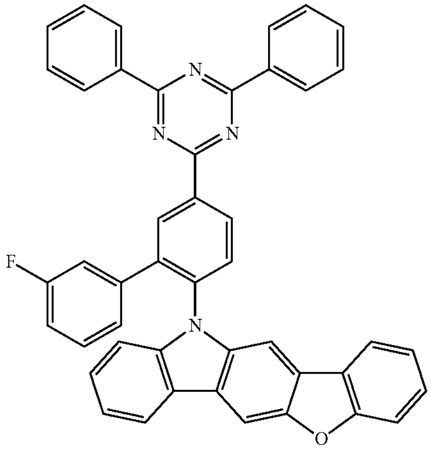
1-191
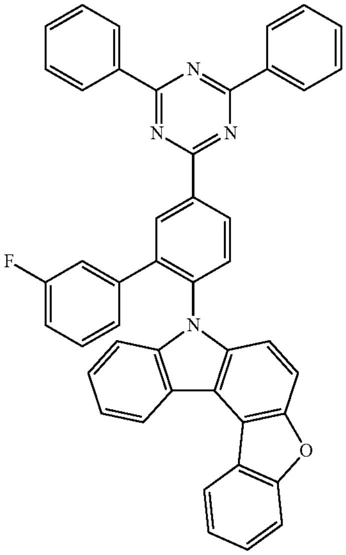
-continued
1-192
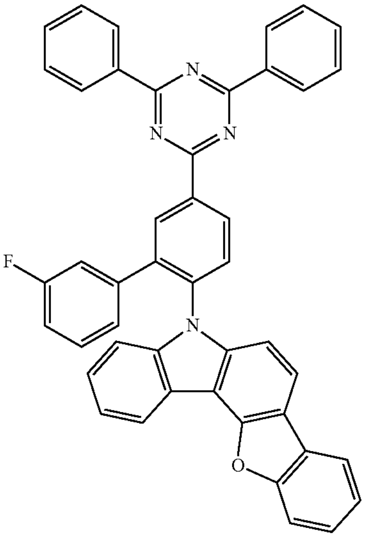
1-193
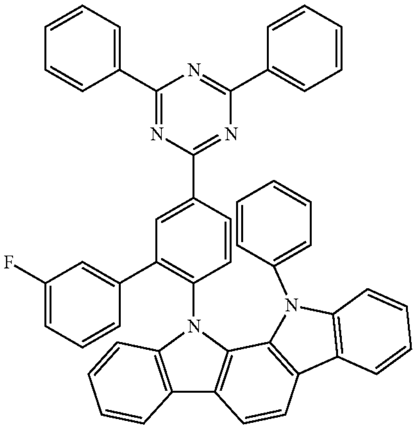
1-194
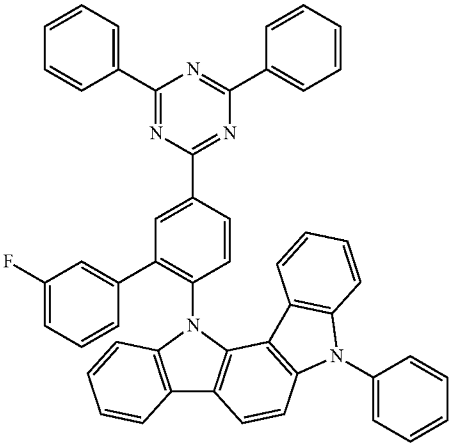

-continued
1-195
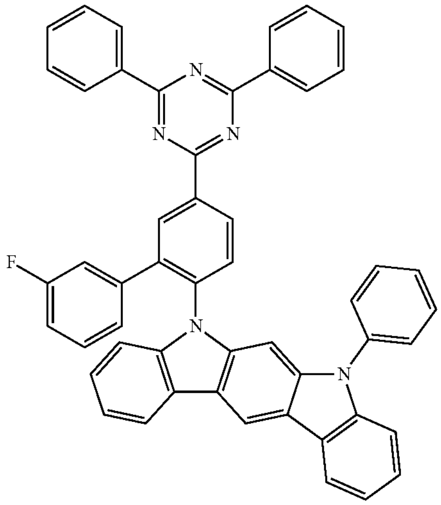
1-196
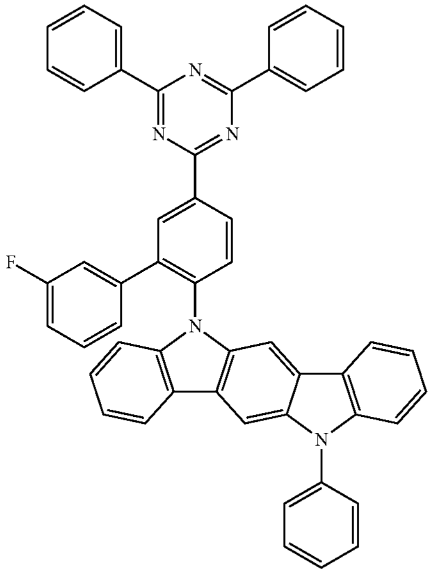
1-197
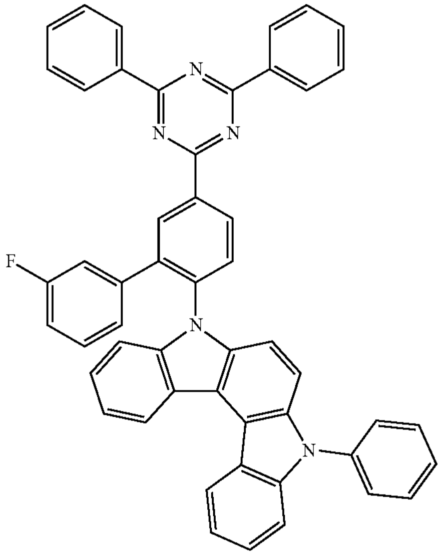
-continued
1-198
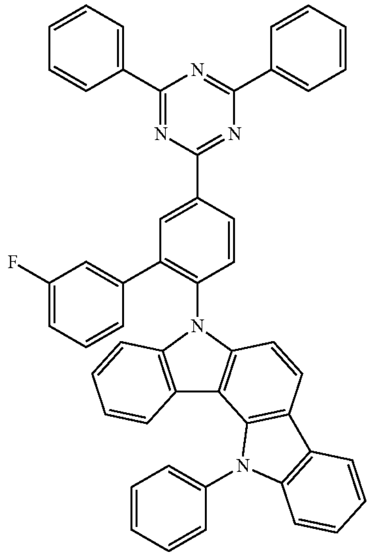
1-199
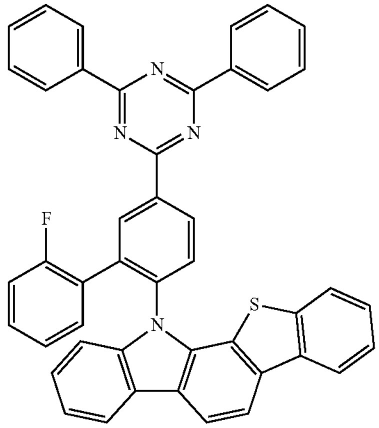
1-200
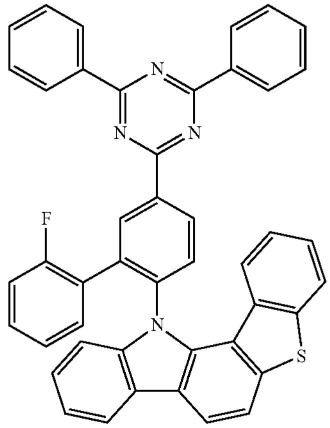

-continued
1-201
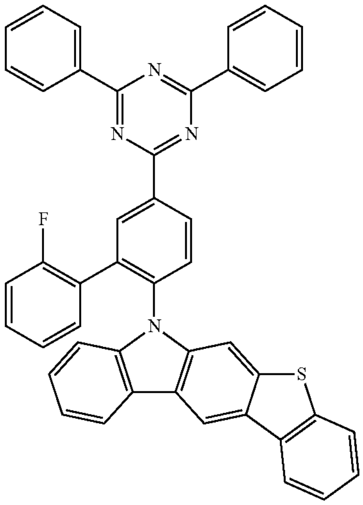
1-202
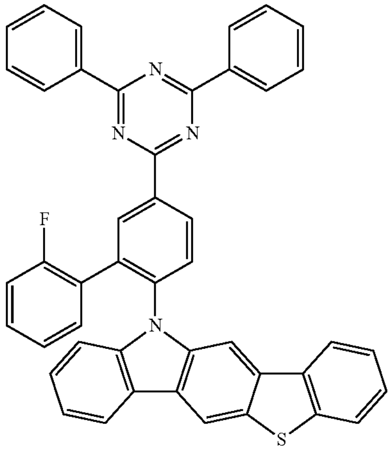
1-203
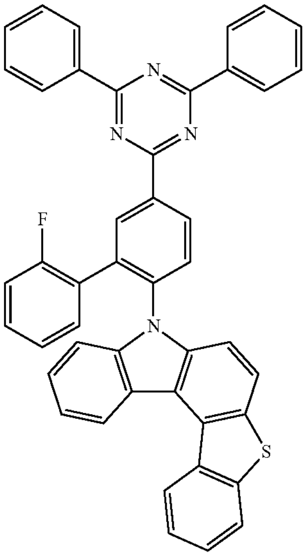
-continued
1-204
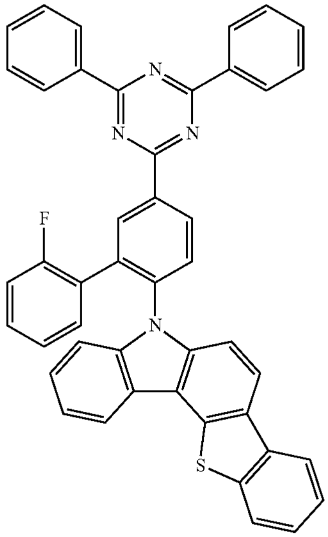
1-205
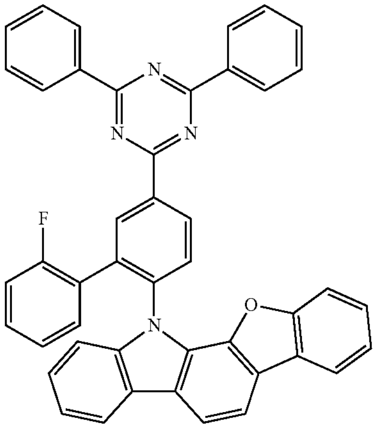
1-206
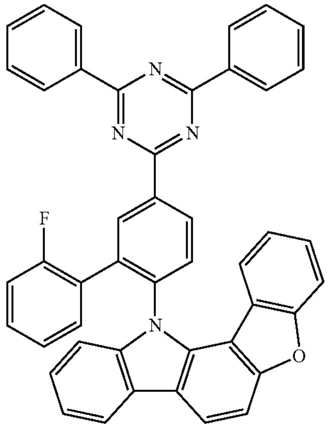

-continued
1-207
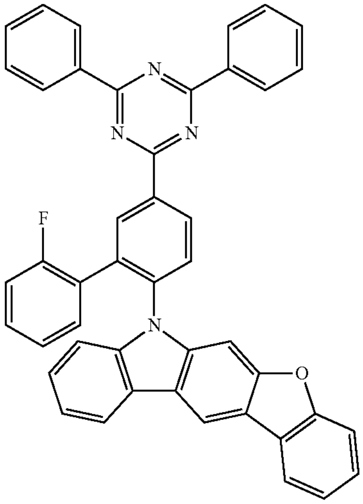
1-208
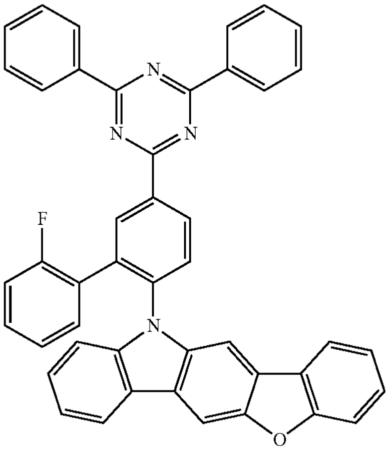
1-209
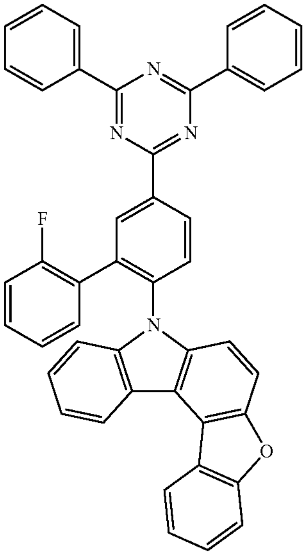
-continued
1-210
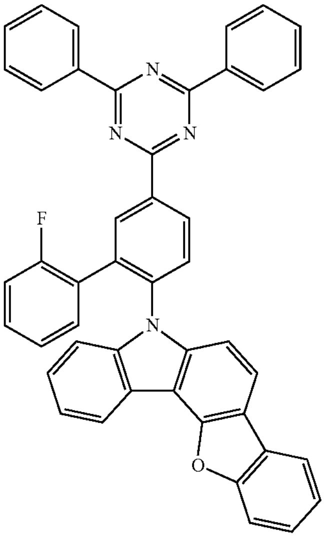
1-211
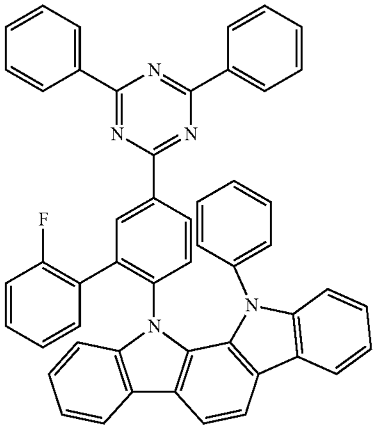
1-212
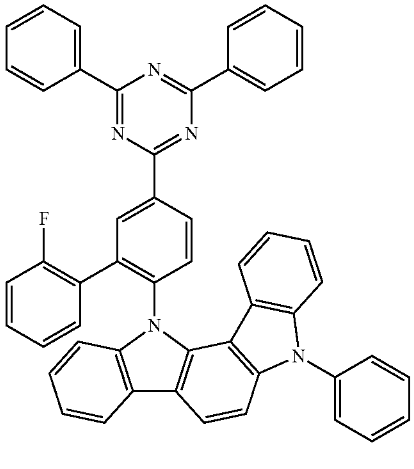

-continued
1-213
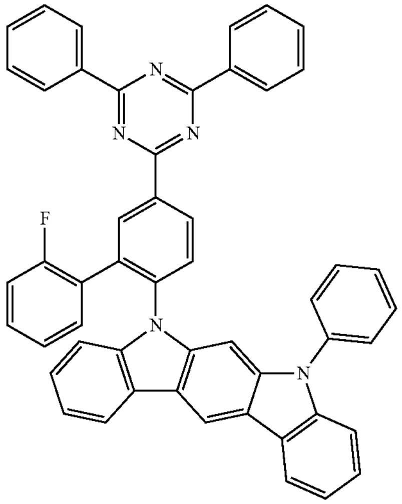
1-214
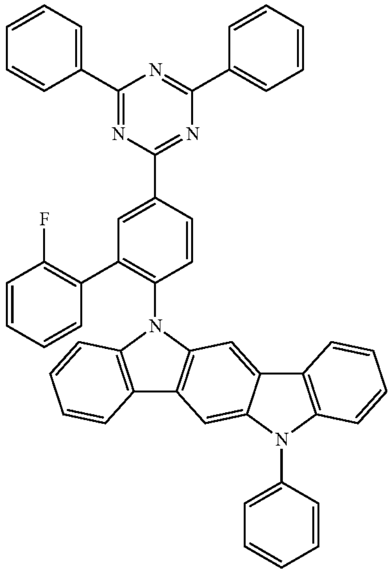
-continued
1-215
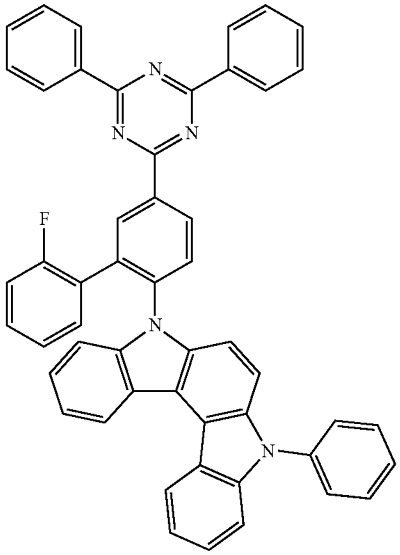
1-216
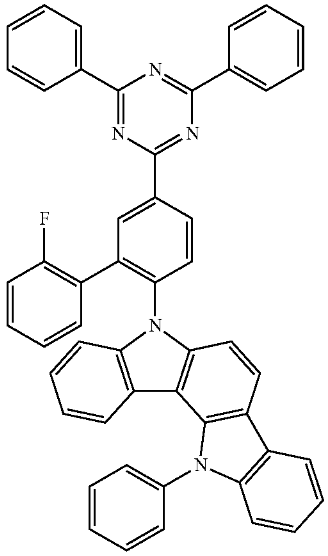

The second compound is represented by Formula 2-1.

[Formula 2-1]

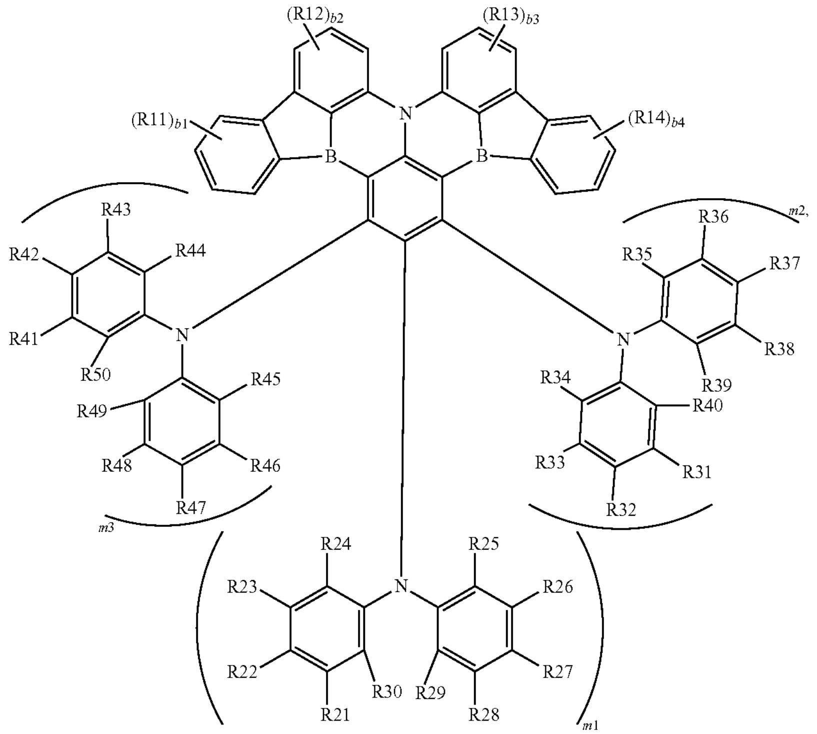

In Formula 2-1, each of R11 to R14 is independently selected from the group consisting of deuterium, tritium, a substituted or unsubstituted C1 to C20 alkyl group, a substituted or unsubstituted C6 to C30 aryl group and a substituted or unsubstituted C3 to C40, or adjacent two of R11 to R14 are connected to form an aromatic ring or a heteroaromatic ring. Each of R21 to R28, R31 to R38 and R41 to R48 is independently selected from the group consisting of hydrogen, deuterium, tritium, a substituted or unsubstituted C1 to C20 alkyl group, a substituted or unsubstituted C6 to C30 aryl group and a substituted or unsubstituted C3 to C40 heteroaryl group. Each of R29, R30, R39, R40, R49 and R50 is independently selected from the group consisting of hydrogen, deuterium, tritium, a substituted or unsubstituted C1 to C20 alkyl group, a substituted or unsubstituted C6 to C30 aryl group and a substituted or unsubstituted C3 to C40 heteroaryl group, or at least one of a pair of R29 and R30, a pair of R39 and R40 and a pair of R49 and R50 is connected to each other to form a ring. Each of m1 to m3 is independently 0 or 1, and at least one of m1 to m3 is 1. In addition, each of b1 and b4 is independently an integer of 0 to 4, and each of b2 and b3 is independently an integer of 0 to 3.

Each of R11 to R14 can be independently selected from the group consisting of a substituted or unsubstituted C1 to C20 alkyl group and a substituted or unsubstituted C6 to C30 aryl group, and b1 to b4 can be 0 or 1. For example, each of R11 to R14 can be independently selected from the group consisting of methyl, tert-butyl, and phenyl.

Each of R21 to R28, R31 to R38 and R41 to R48 can be independently selected from the group consisting of hydrogen, a substituted or unsubstituted C1 to C20 alkyl group and a substituted or unsubstituted C6 to C30 aryl group. For example, each of R21 to R28, R31 to R38 and R41 to R48 can be independently selected from the group consisting of hydrogen, methyl, tert-butyl, and phenyl. More specifically, one of R21 to R28 can be selected from the group consisting of methyl, tert-butyl, and phenyl, and the rest of R21 to R28 can be hydrogen. One of R31 to R38 can be selected from the group consisting of methyl, tert-butyl, and phenyl, and the rest of R31 to R38 can be hydrogen. One of R41 to R48 can be selected from the group consisting of methyl, tert-butyl, and phenyl, and the rest of R41 to R48 can be hydrogen.

For example, the second compound of Formula 2-1 can be one of the compounds in Formula 2-2.

[Formula 2-2]

2-1

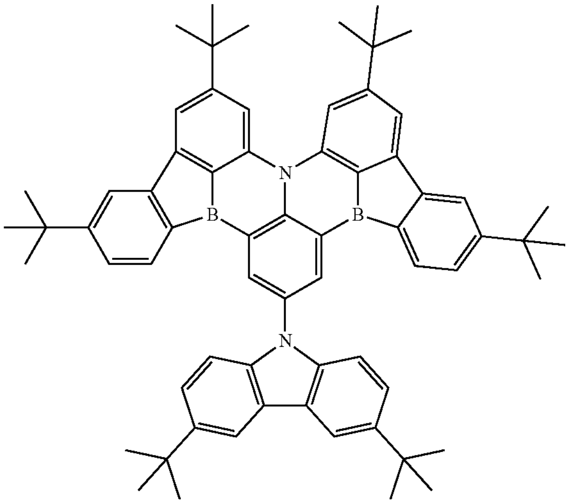

2-2

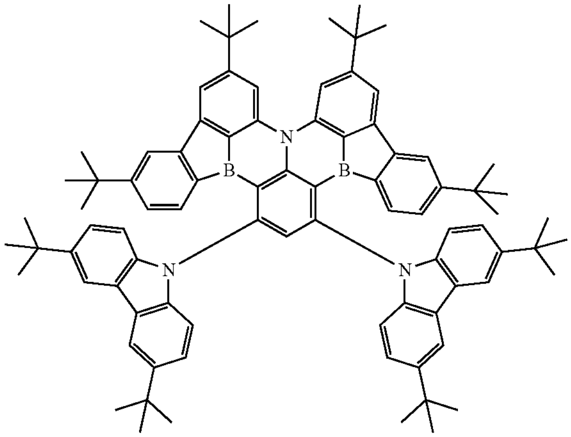

2-3

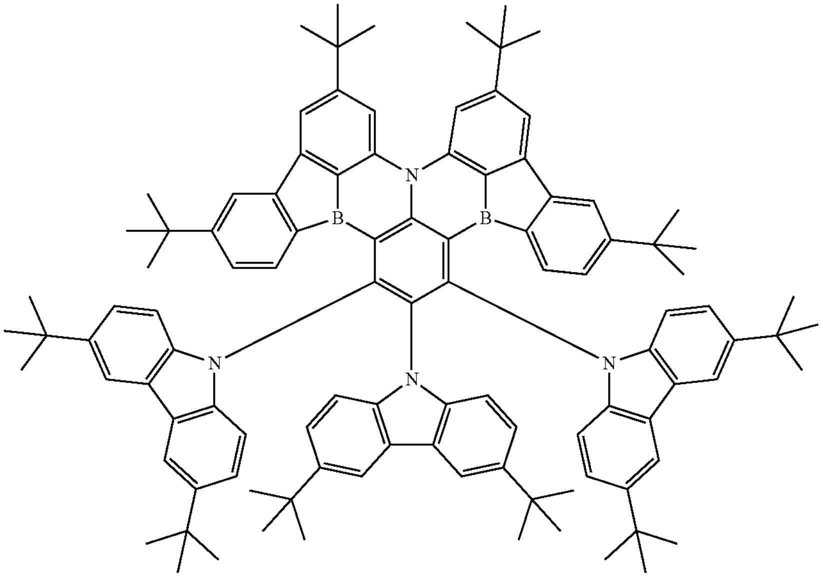

-continued
2-4
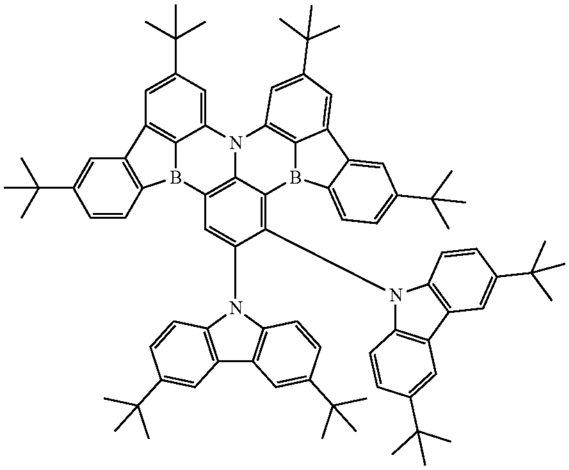
2-5
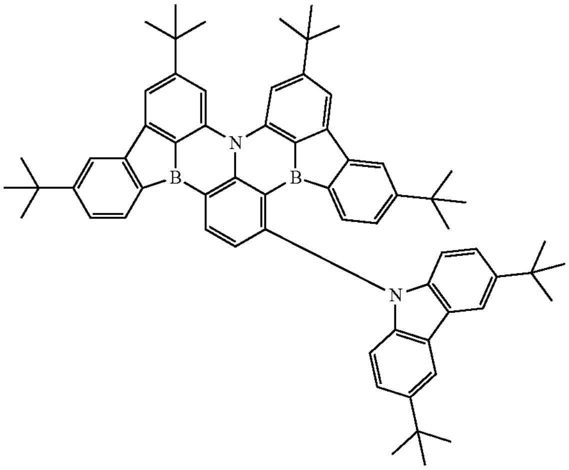
2-6
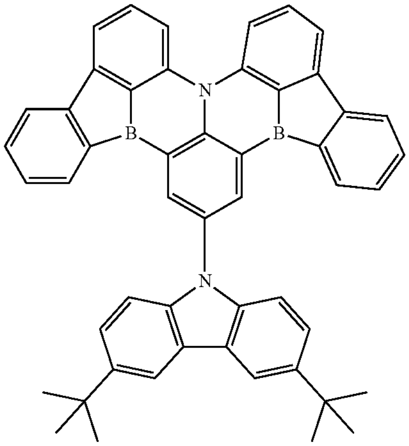
2-7
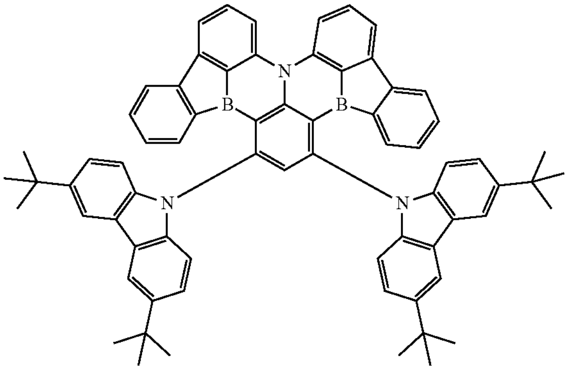
2-8
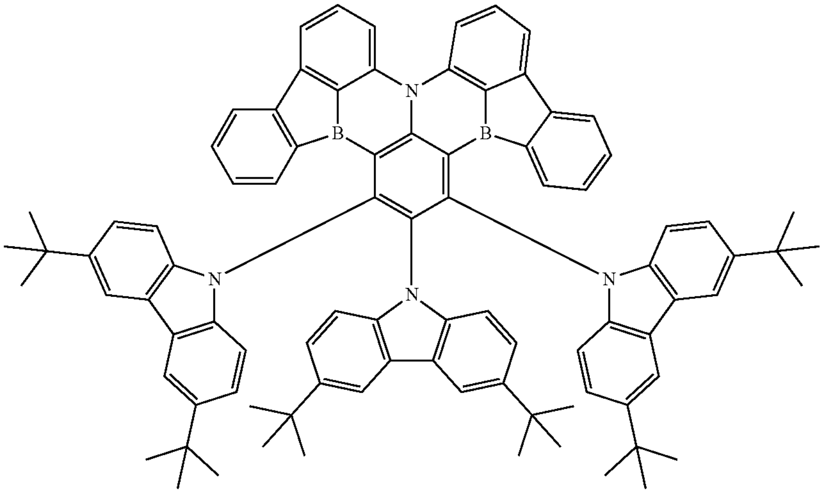

-continued
2-9
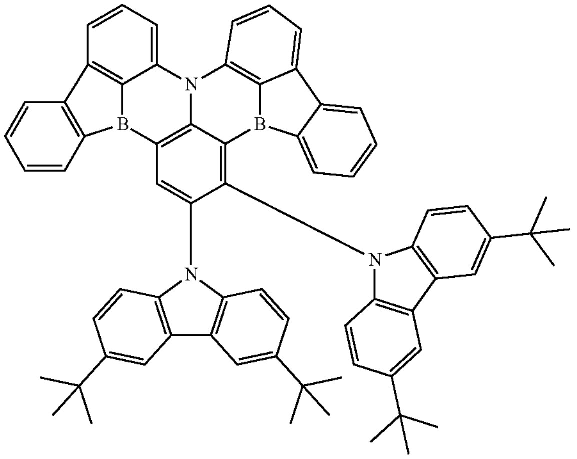
2-10
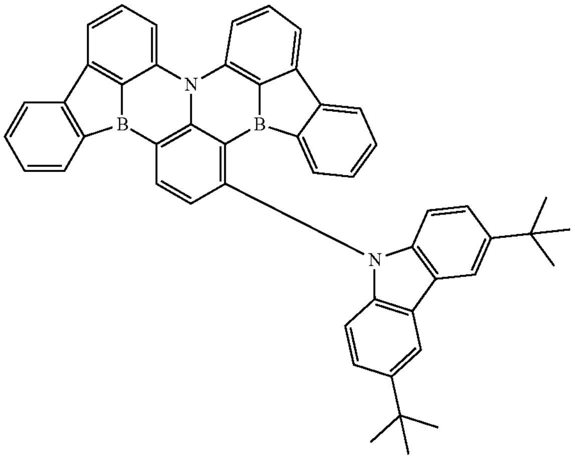
2-11
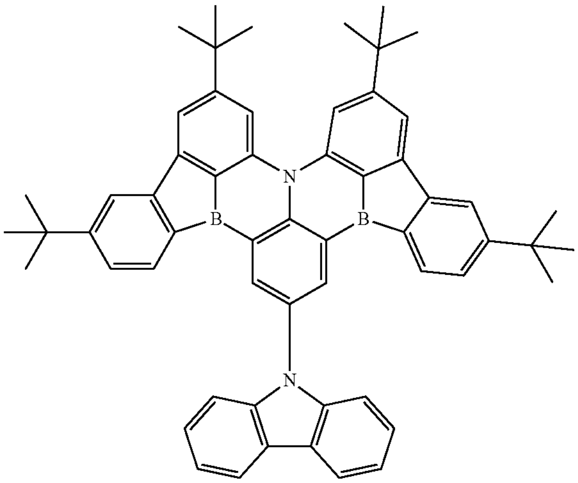
2-12
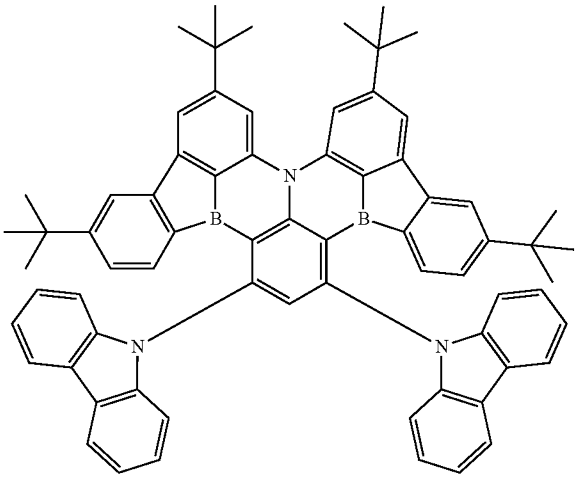
2-13
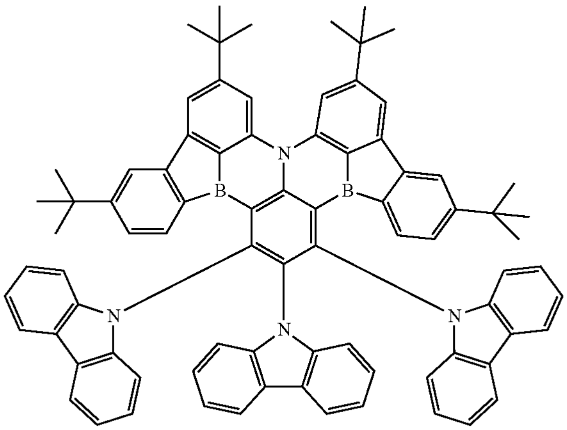
2-14
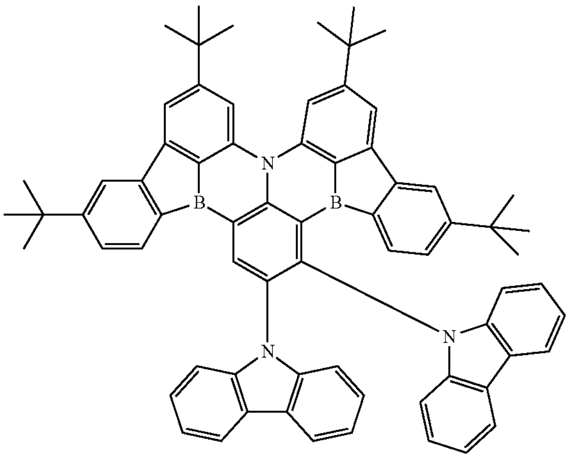

-continued
2-15
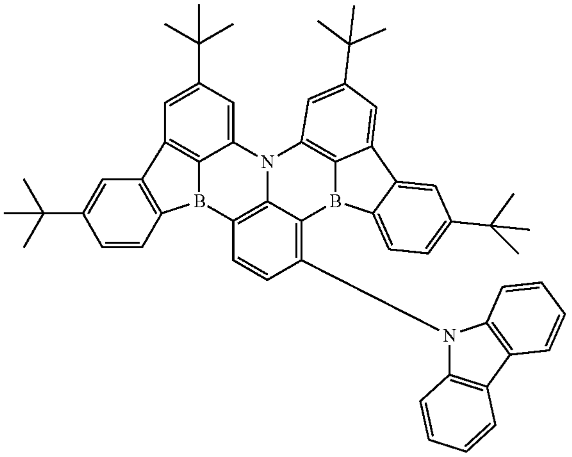
2-16
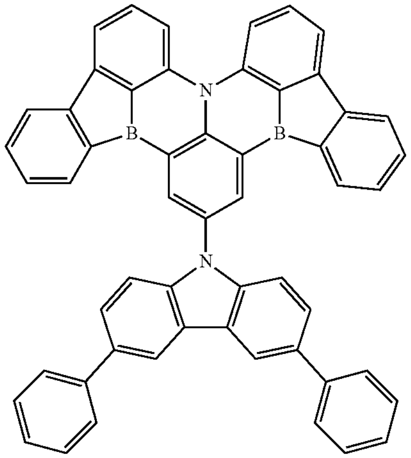
2-17
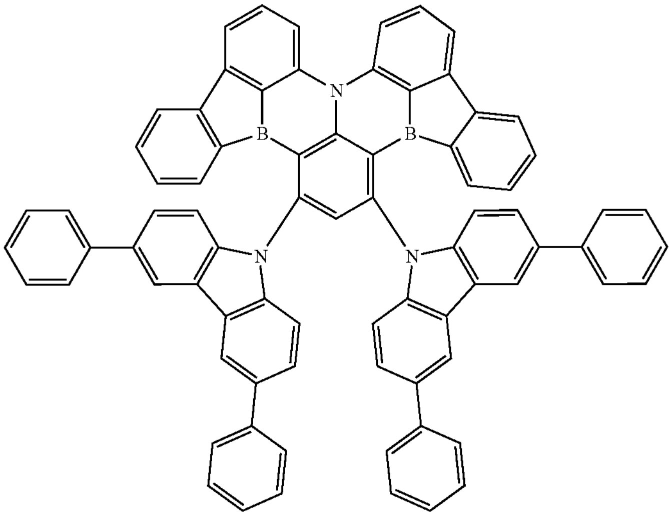
2-18
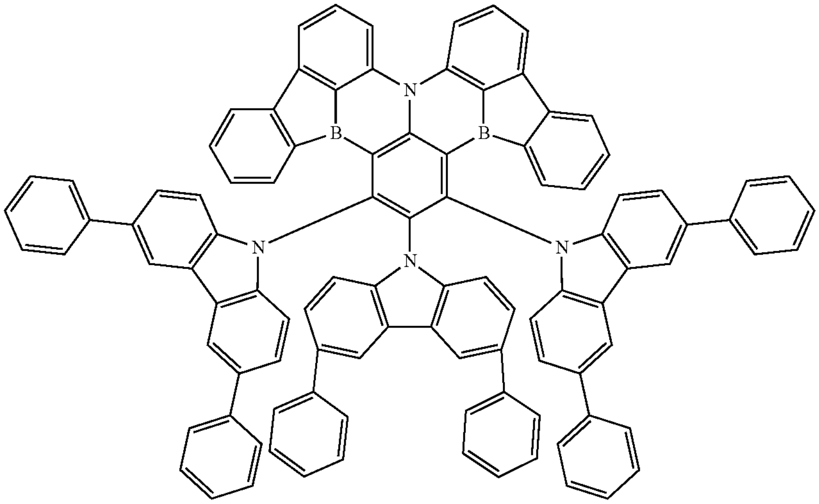

-continued
2-19
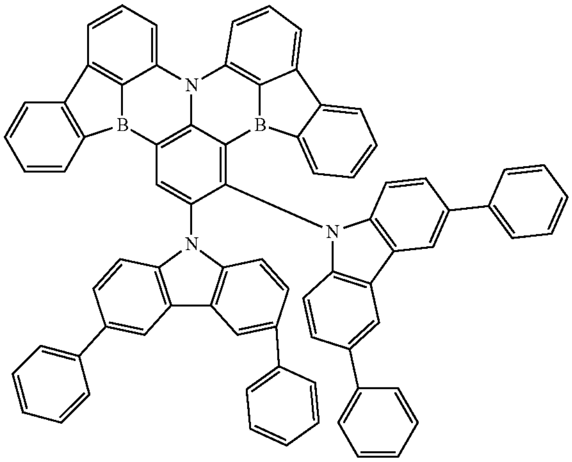
2-20
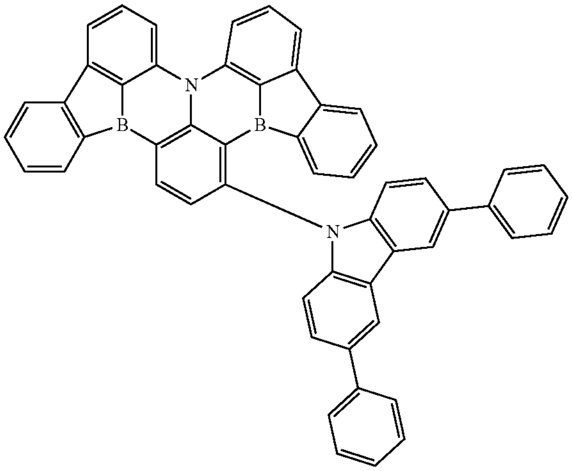
2-21
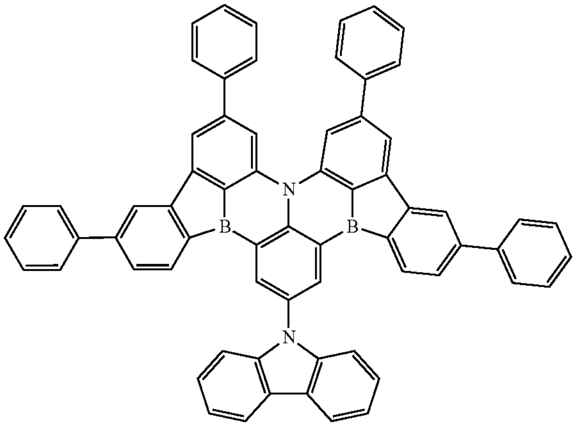
2-22
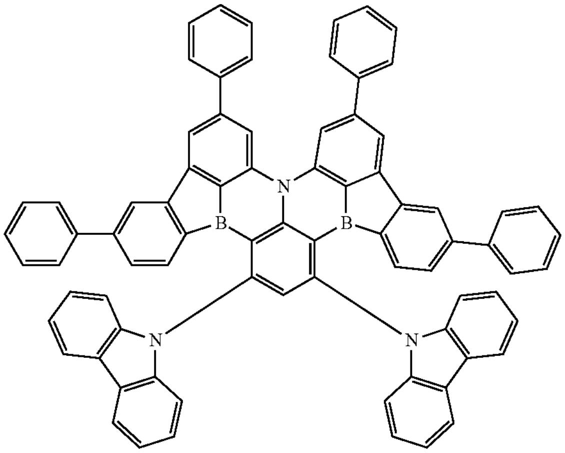
2-23
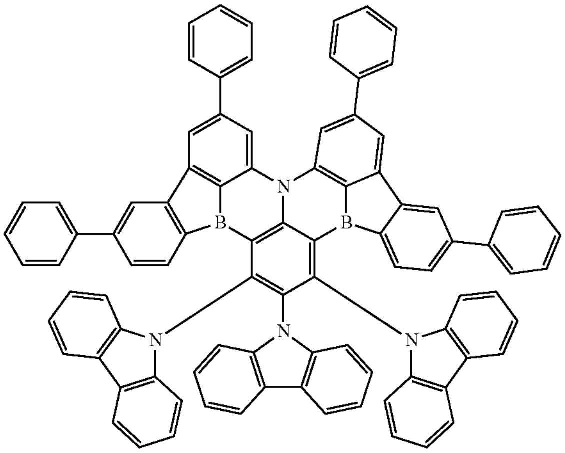
2-24
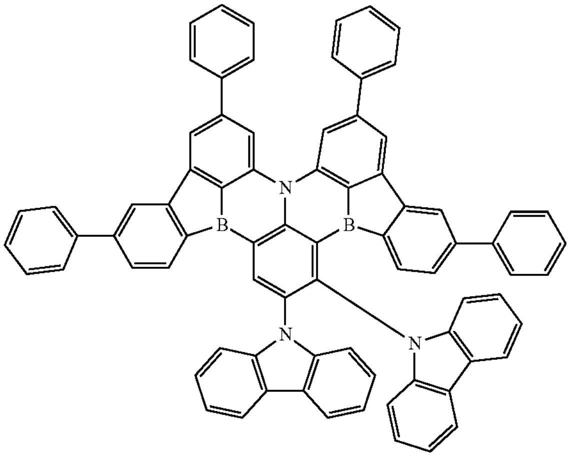

-continued
2-25
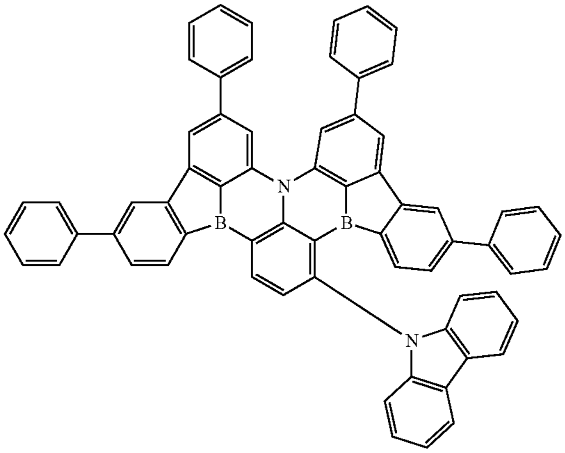
2-26
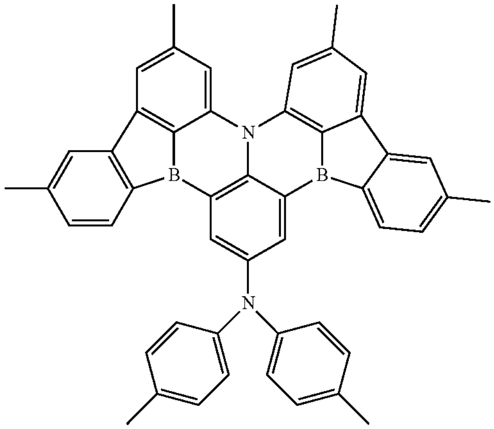
2-27
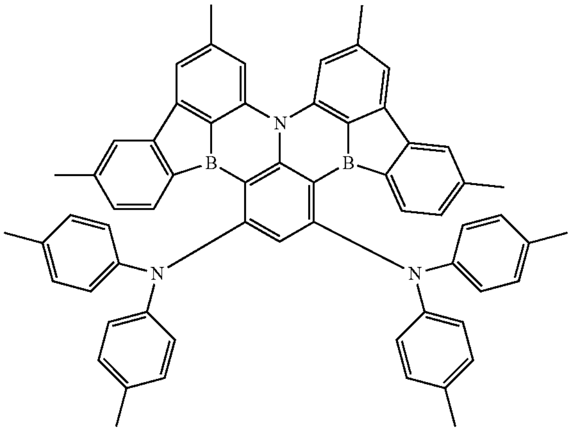
2-28
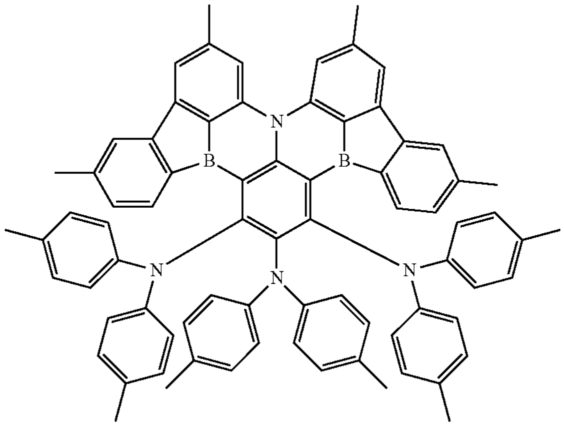
2-29
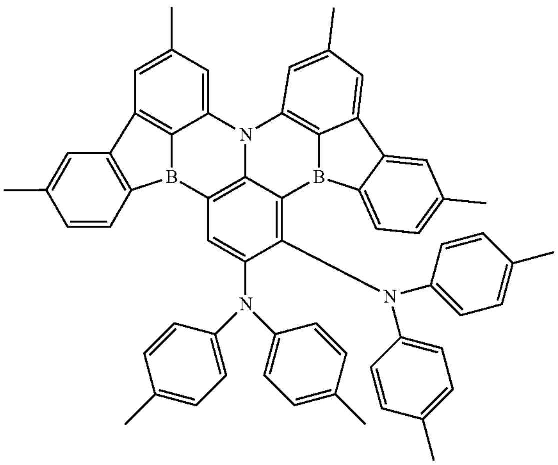
2-30
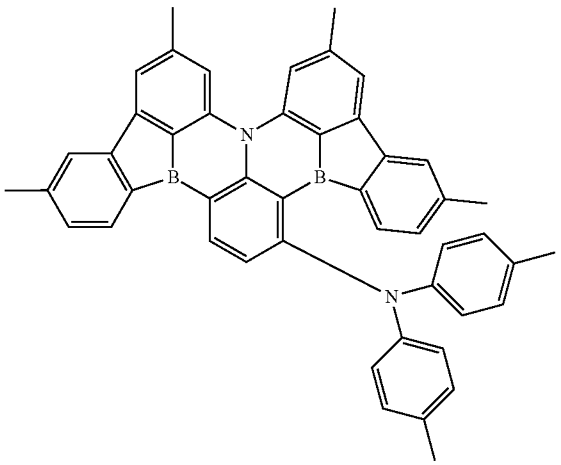

-continued
2-31
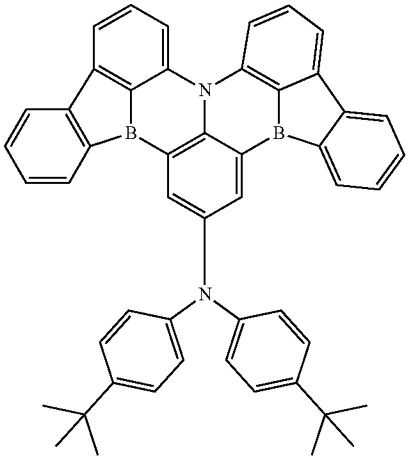
2-32
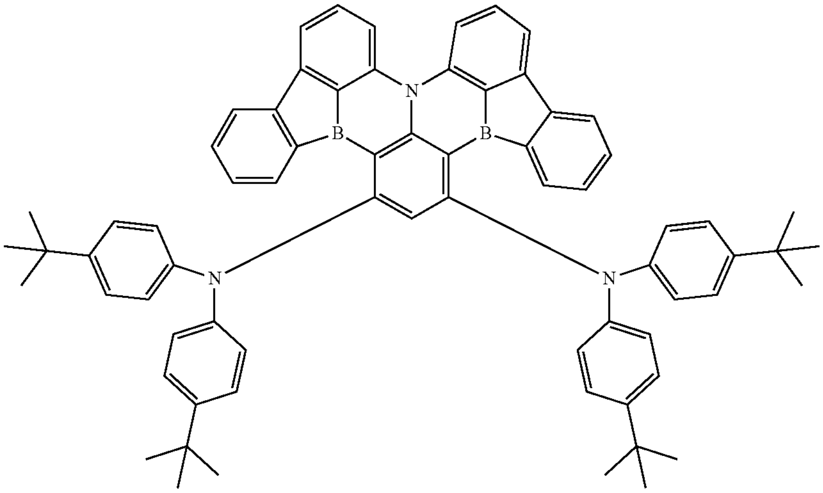
2-33
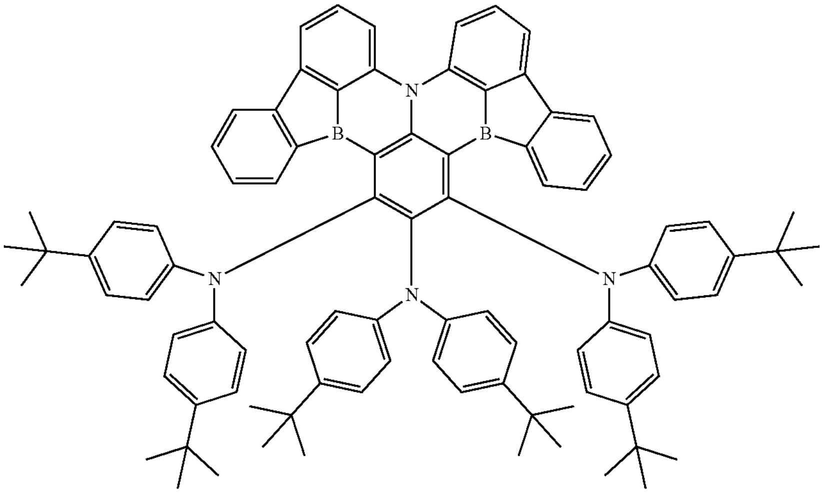

-continued
2-34
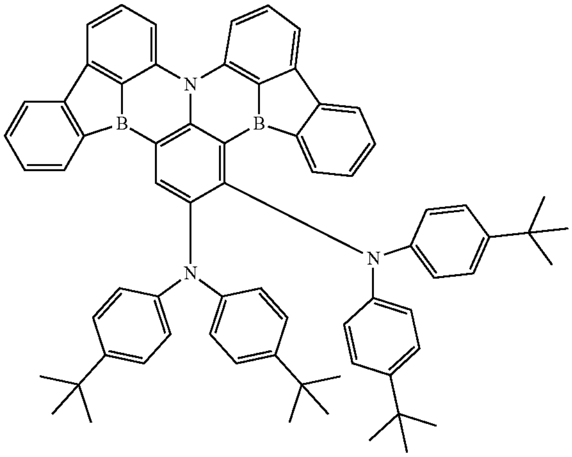
2-35
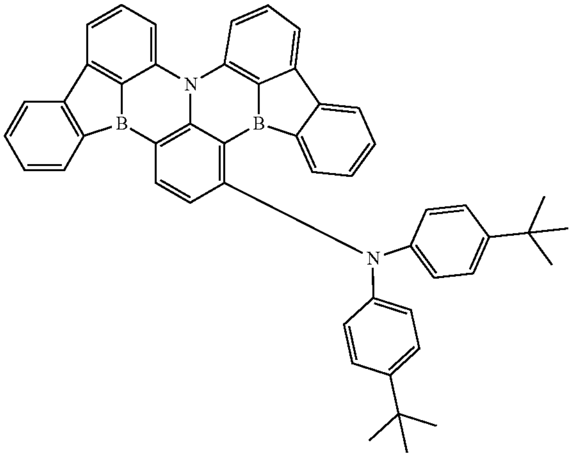
2-36
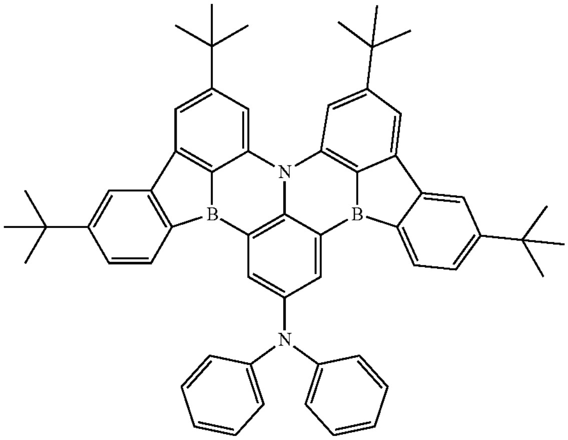
2-37
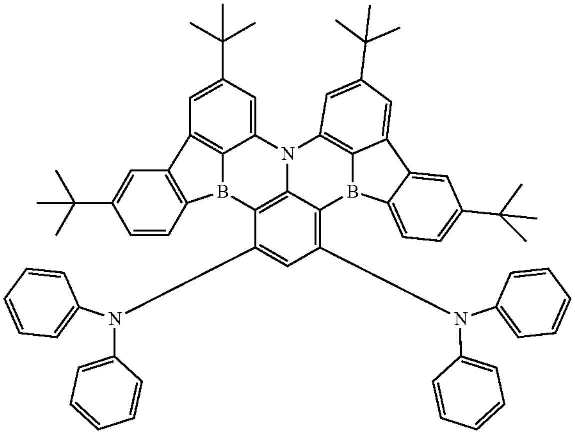
2-38
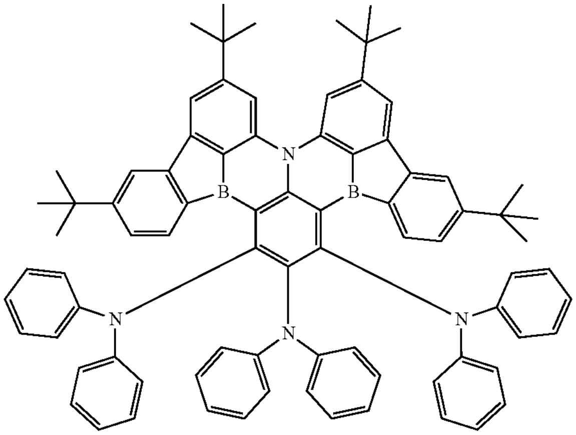
2-39
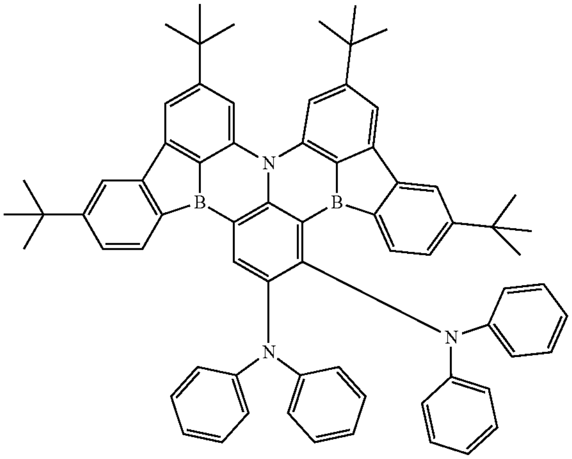

-continued
2-40
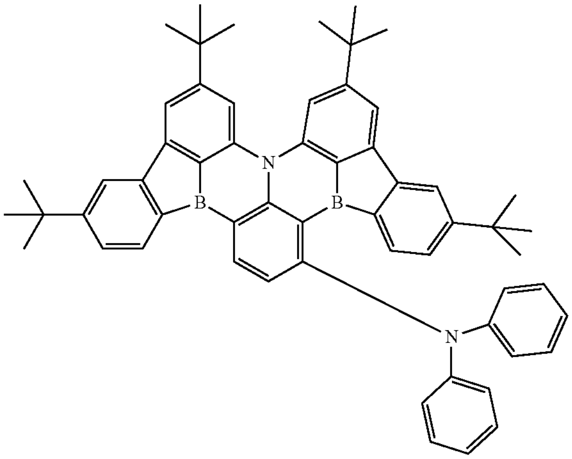
2-41
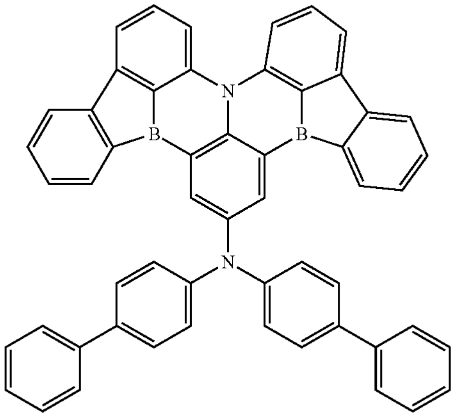
2-42
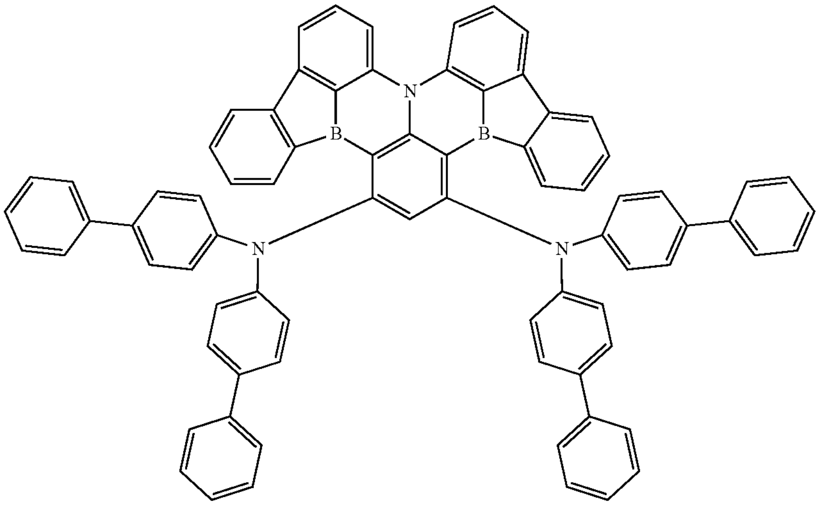
2-43
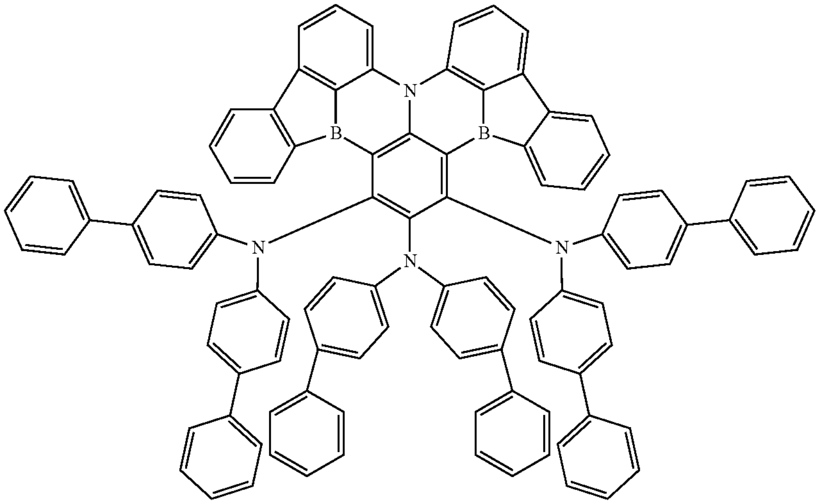

-continued
2-44
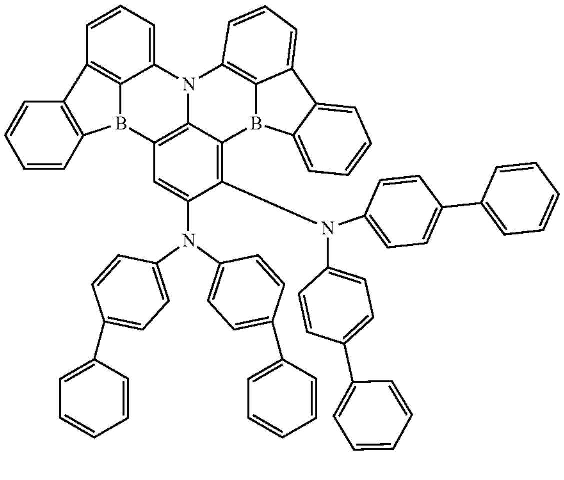
2-45
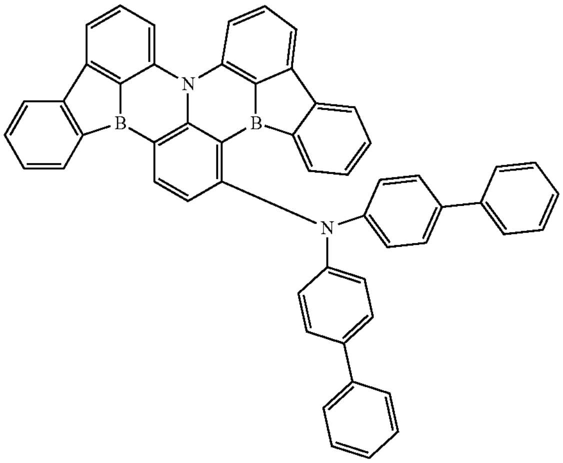
2-46
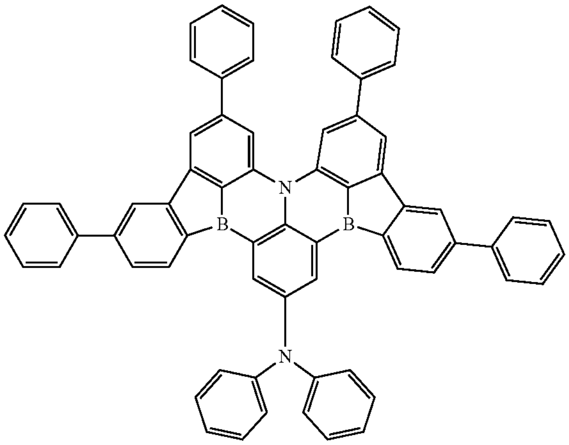
2-47
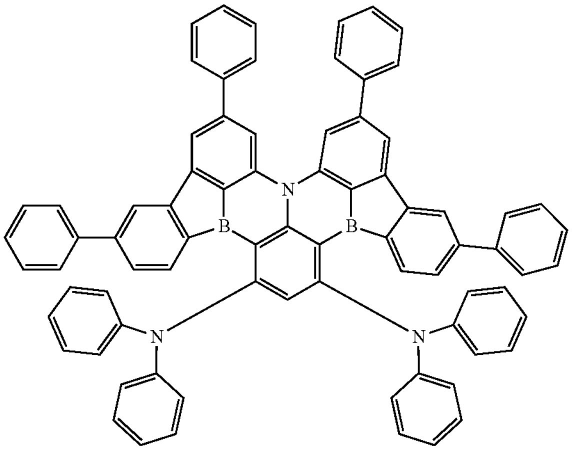
2-48
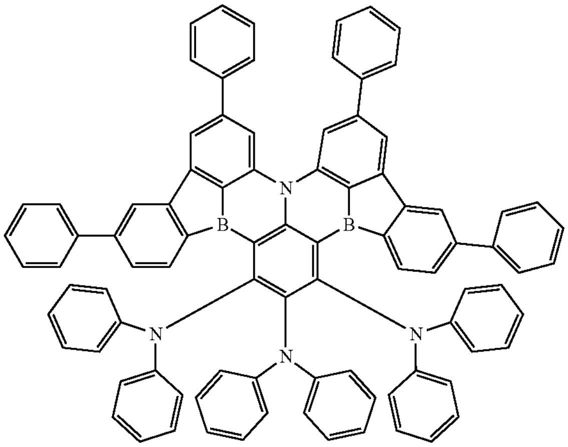
2-49
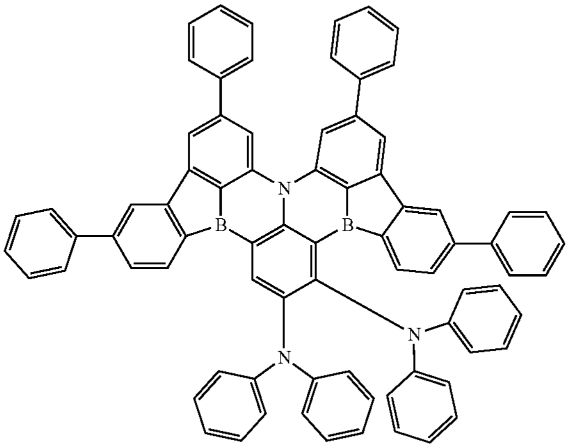

-continued
2-50
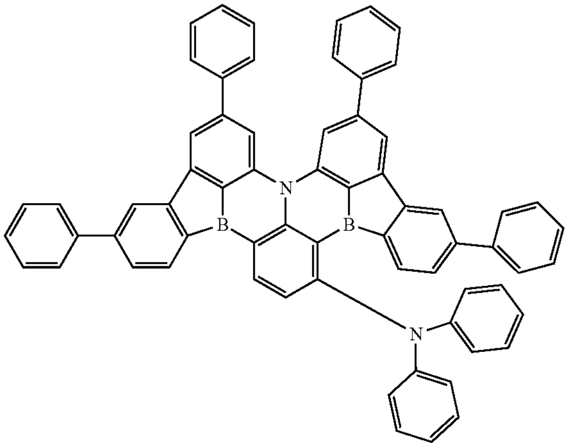
2-51
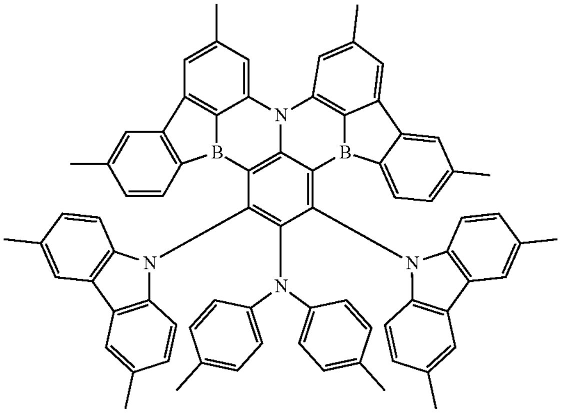
2-52
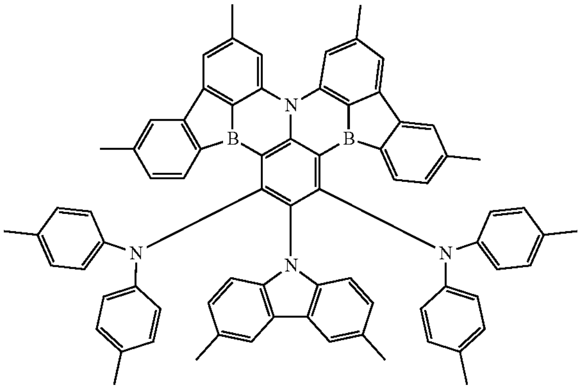
2-53
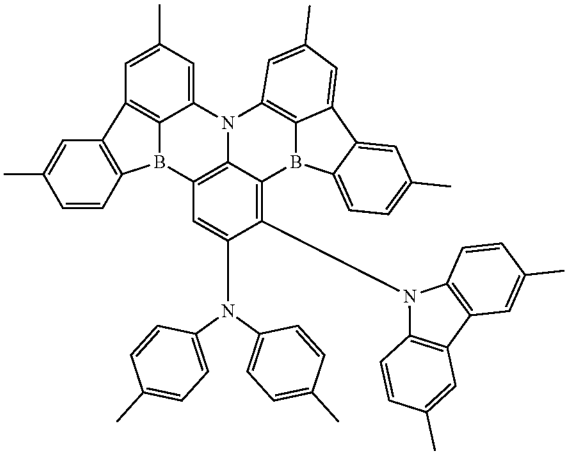
2-54
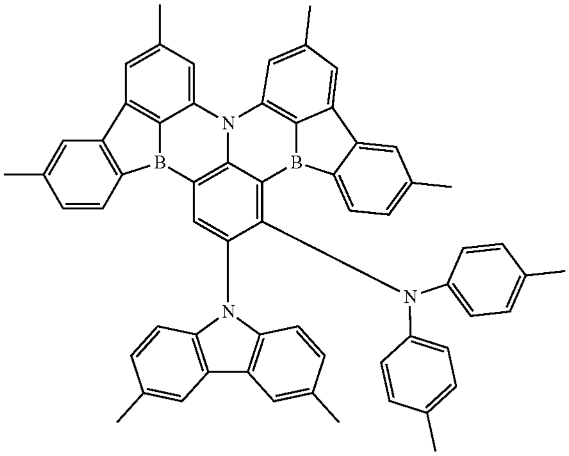
2-55
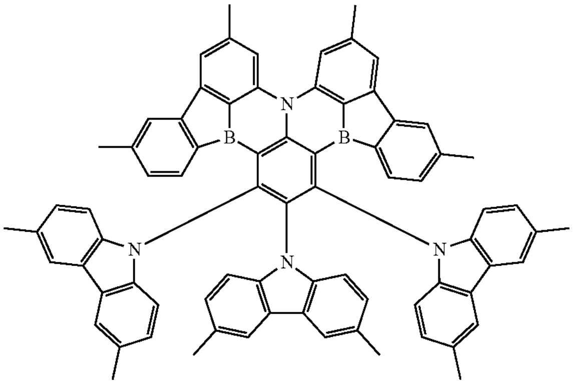

-continued
2-56
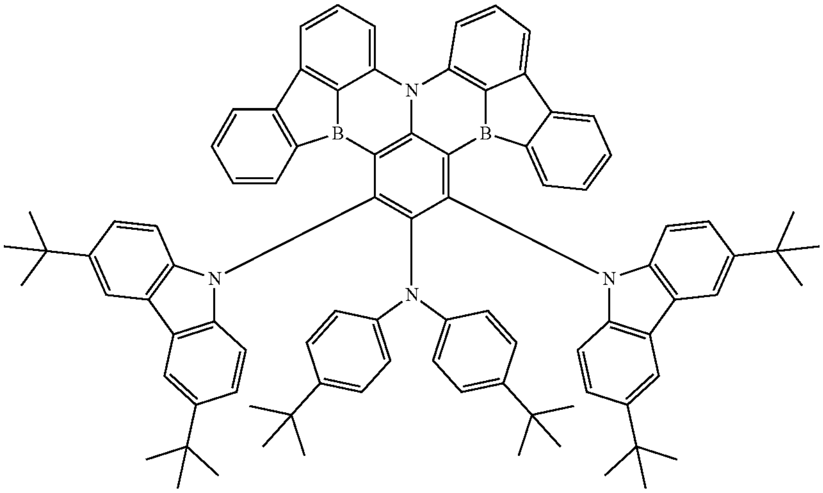
2-57
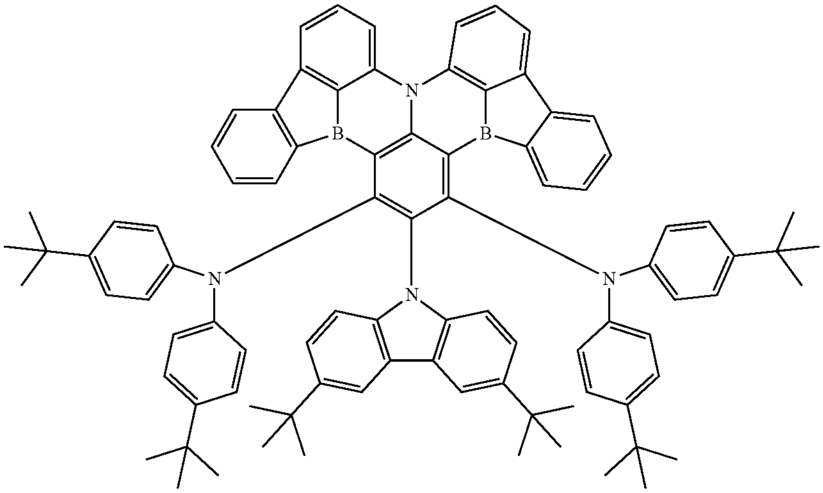
2-58
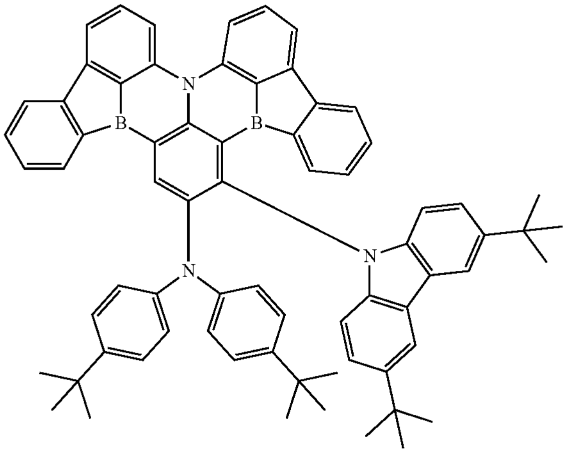
2-59
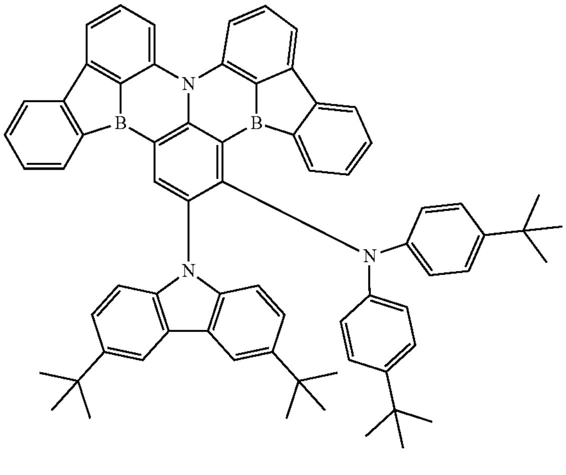

-continued
2-60
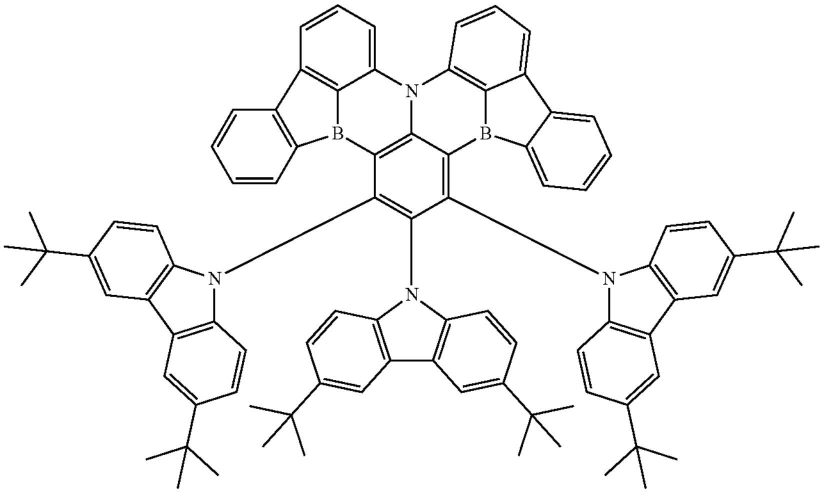
2-61
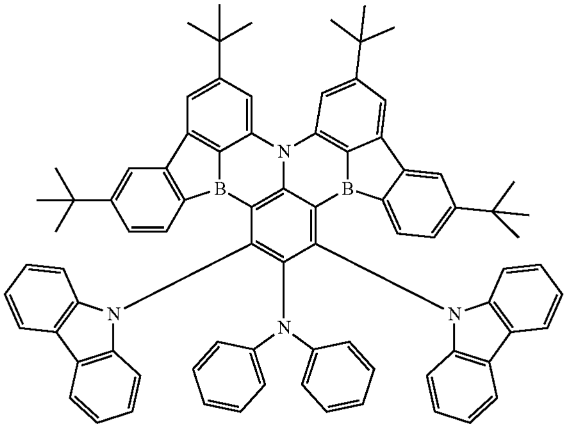
2-62
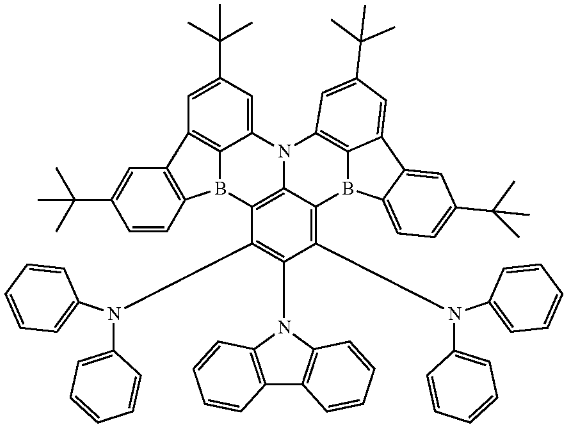
2-63
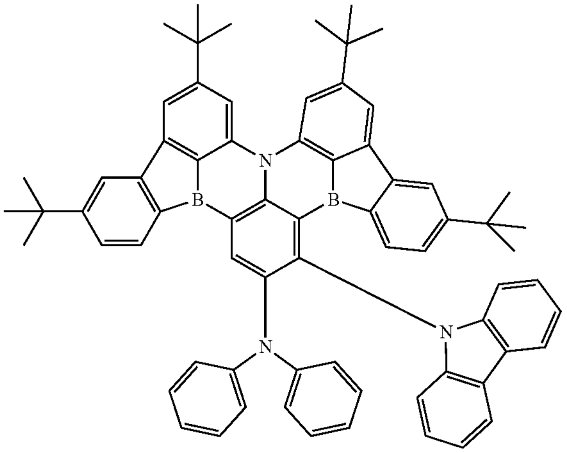
2-64
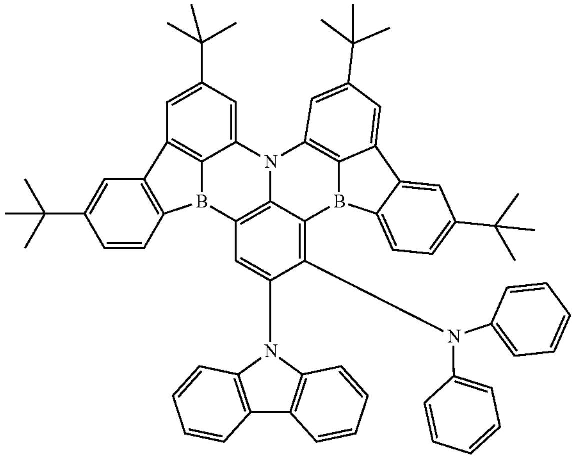

-continued
2-65
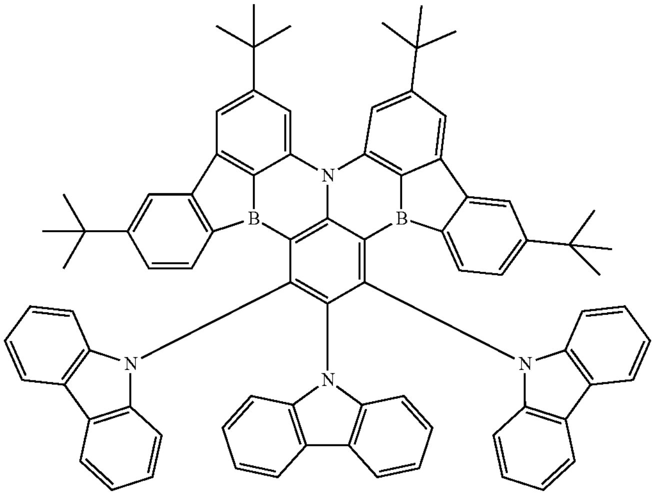
2-66
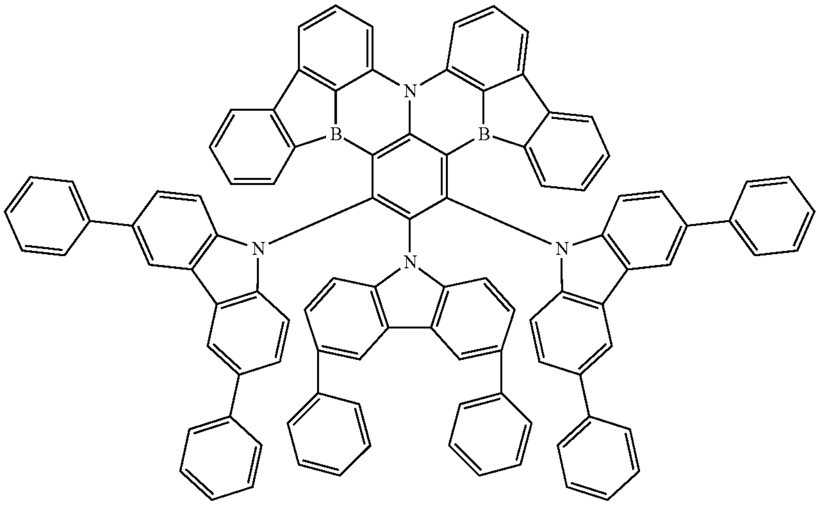
2-67
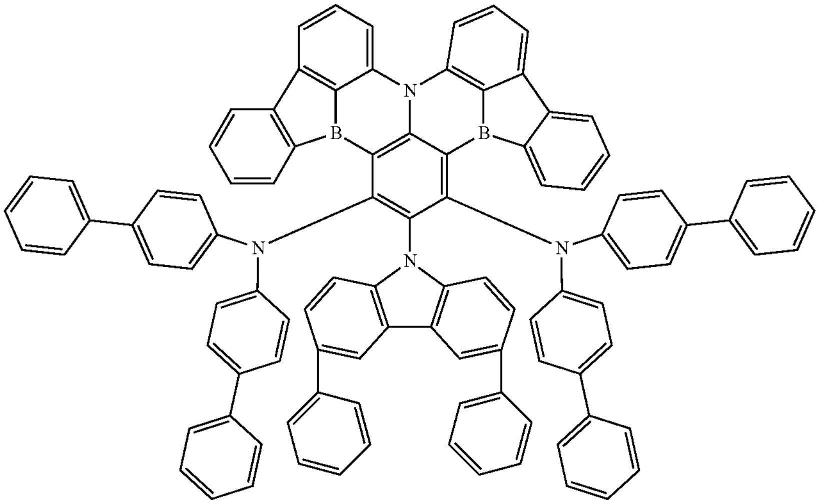

-continued
2-68
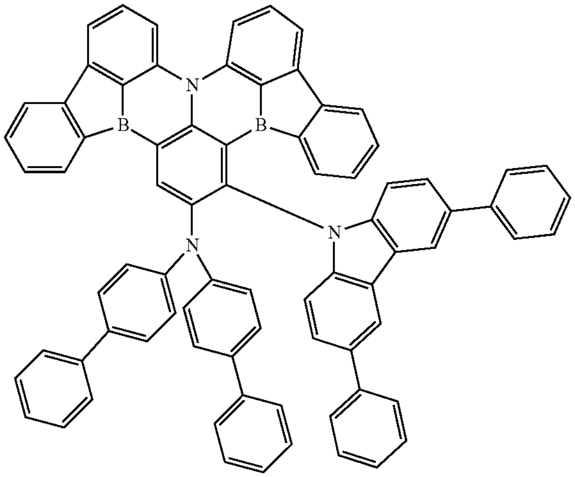
2-69
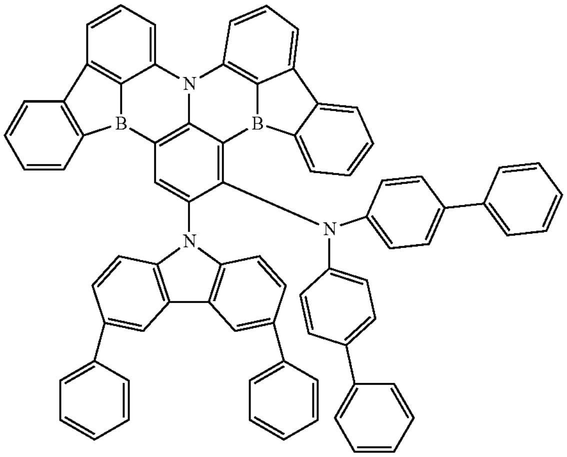
2-70
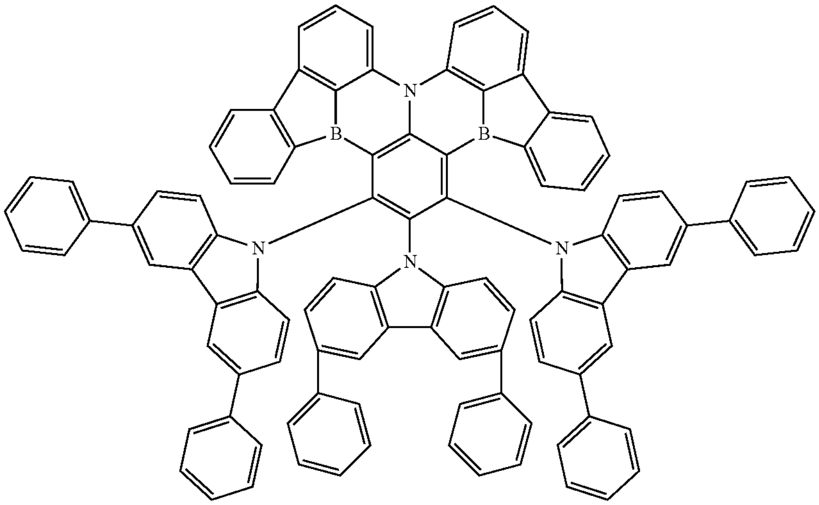
2-71
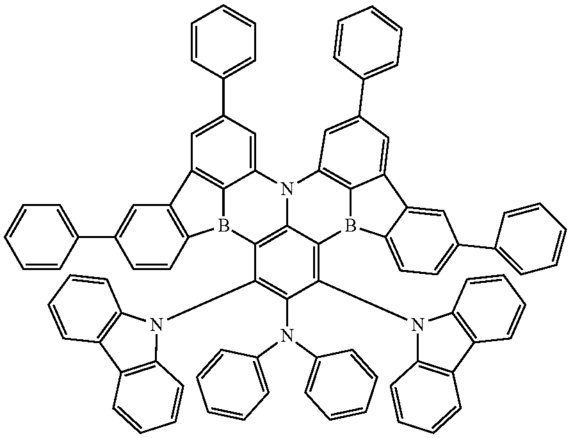
2-72
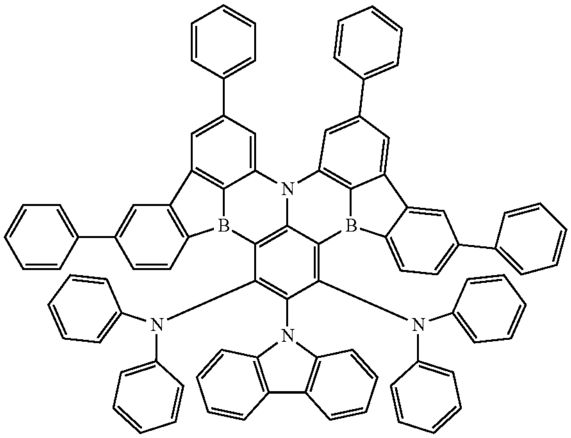

-continued
2-73
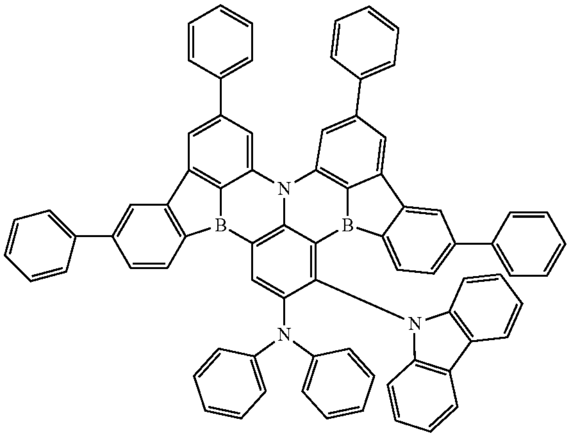
2-74
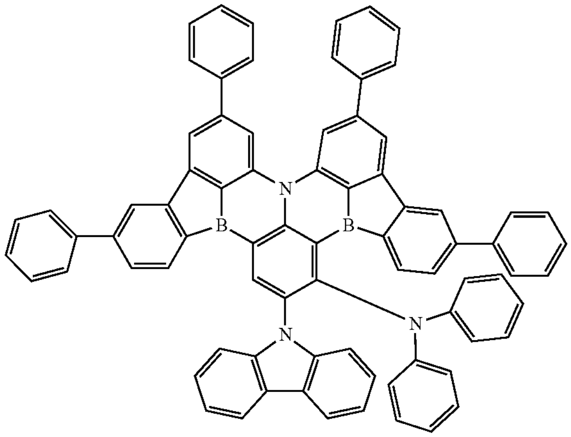
2-75
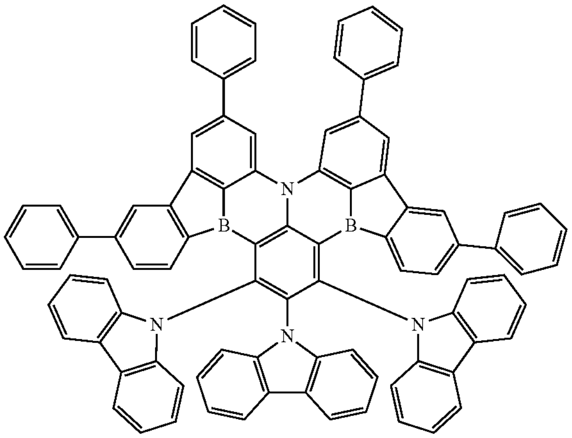
2-76
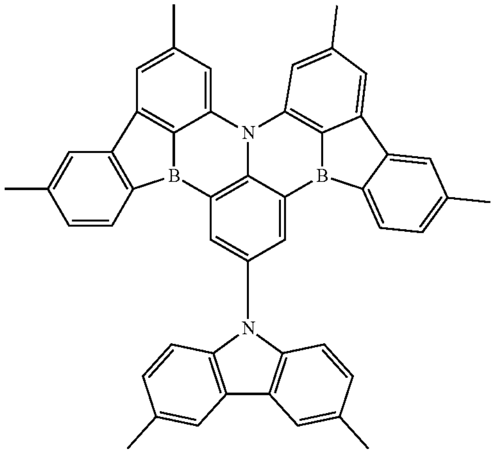
2-77
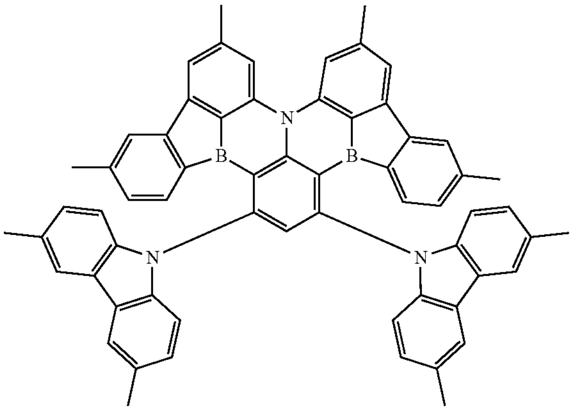
2-78
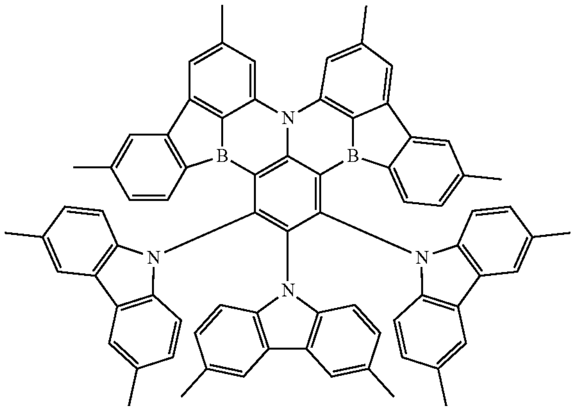

-continued 2-79

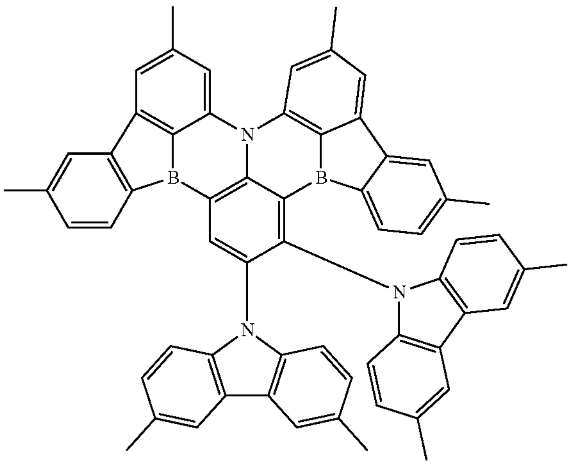

2-80

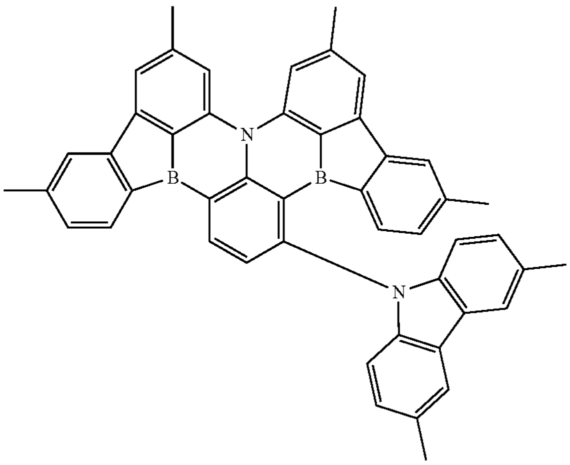

In the EML 240, a weight % of the first compound can be greater than that of the second compound.

In the EML 240, an energy of the first compound is transferred into the second compound, and the second compound provide the emission.

The energy of the triplet exciton of the first compound of Formula 1-1 is converted into the singlet exciton by a reverse intersystem crossing (RISC) such that the first compound has high quantum efficiency. However, since the first compound being the delayed fluorescent material has wide full width at half maximum (FWHM), the color purity of the OLED is decreased when the EML includes the first compound as a dopant (or an emitter).

On the other hand, the second compound of Formula 2-1 emits the light having a green wavelength range with narrow FWHM. Accordingly, the OLED D1 including the second compound can provide the green emission with excellent color purity. However, since only the singlet exciton of the second compound is involved in the emission, the OLED D including the second compound has low emitting efficiency (or a quantum efficiency).

In the OLED D1 of the present disclosure, since the EML 240 includes the first compound having high quantum efficiency and the second compound having narrow FWHM, the OLED D1 provides a hyper fluorescence.

Namely, the triplet exciton of the first compound is converted into the singlet exciton of the first compound, and the singlet exciton of the first compound is transferred into the single exciton of the second compound. Then, the emission is provided from the second compound such that the OLED D1 has narrow FWHM and high emitting efficiency.

To increase the energy transfer efficiency from the first compound to the second compound, the emission spectrum of the first compound and the absorption spectrum of the second compound can have an overlap ratio of about 35% or more.

The EML 240 can further include a third compound represented by Formula 3-1.

[Formula 3-1]

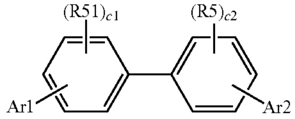

In Formula 3-1, each of R51 and R52 is independently selected from the group consisting of deuterium, tritium, a substituted or unsubstituted C1 to C20 alkyl group, a substituted or unsubstituted C6 to C30 aryl group and a substituted or unsubstituted C3 to C40 heteroaryl group, or adjacent two of R51 and R52 are connected to each other to form an aromatic ring or a heteroaromatic ring. Each of Ar1 and Ar2 is independently selected from Formulas 3-2 to 3-4, and each of c1 and c2 is independently an integer of 0 to 4.

[Formula 3-2]

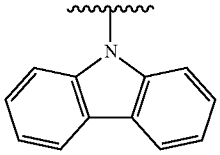

[Formula 3-3]

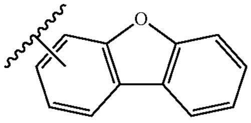

[Formula 3-4]

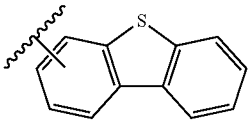

Ar1 and Ar2 can be same or different.

Adjacent R51 and R52 can be connected to form the heteroaromatic ring. In this instance, Formula 3-1 can be represented by Formula 3-5.

[Formula 3-5]

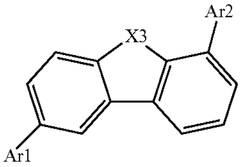

In Formula 3-5, X3 is one of O, S and NR53, and R53 is selected from the group consisting of hydrogen, deuterium, tritium, a substituted or unsubstituted C1 to C20 alkyl group, a substituted or unsubstituted C6 to C30 aryl group and a substituted or unsubstituted C3 to C40 heteroaryl group.

For example, the third compound can be one of the compounds in Formula 3-6.

[Formula 3-6]

3-1

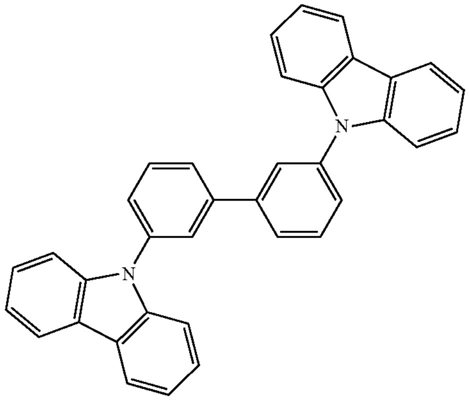

3-2

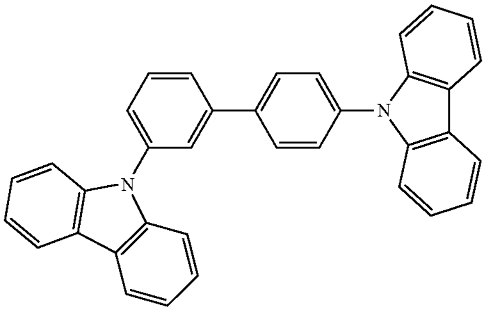

-continued 3-3

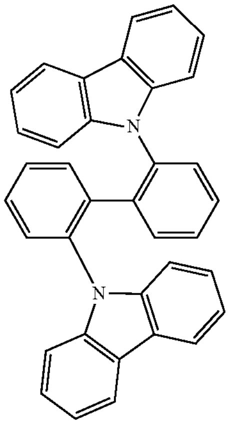

3-4

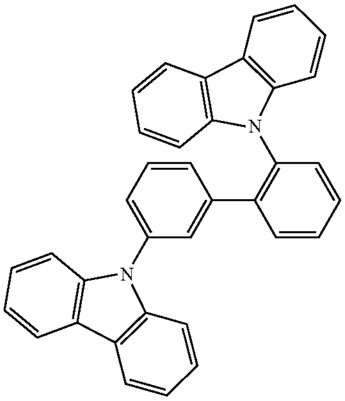

3-5

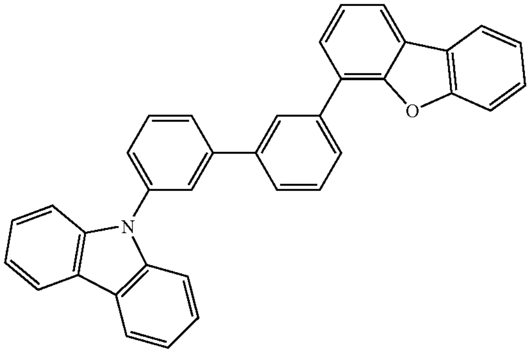

-continued
3-6
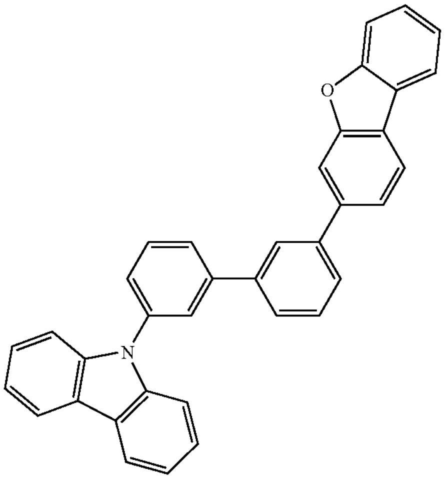
3-7
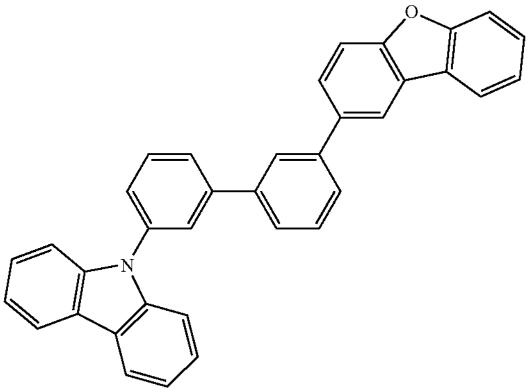
3-8
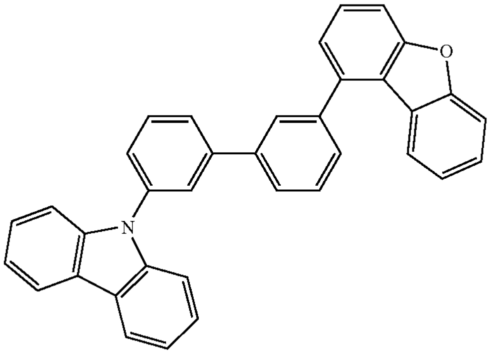
3-9
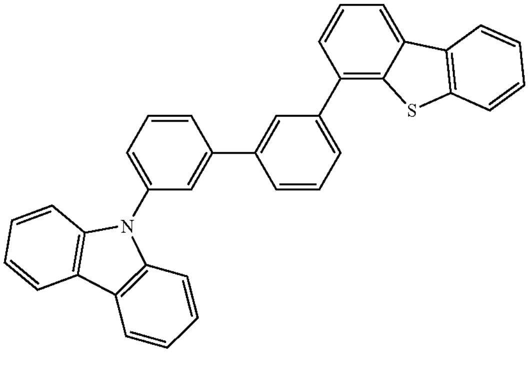
-continued
3-10
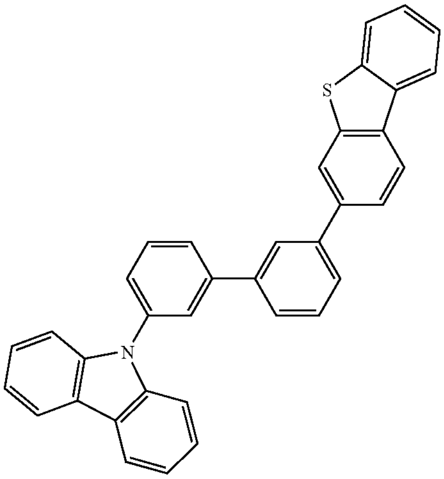
3-11
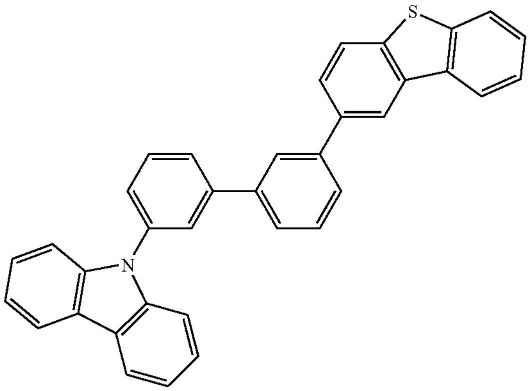
3-12
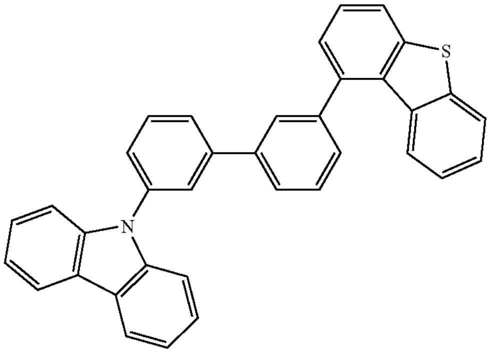
3-13
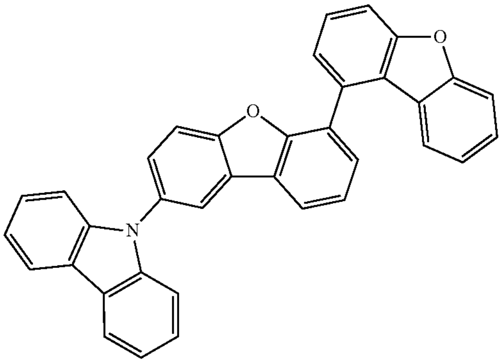

-continued
3-14
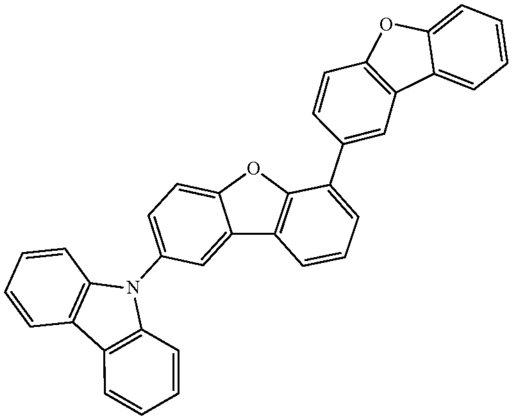
3-15
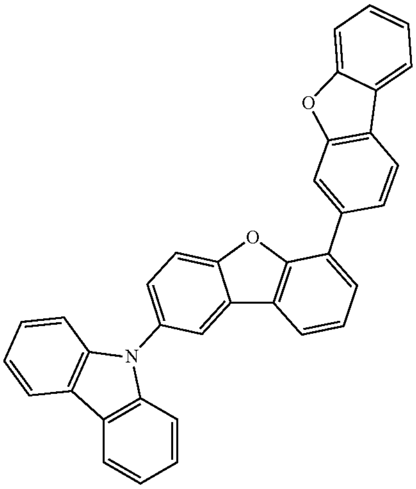
3-16
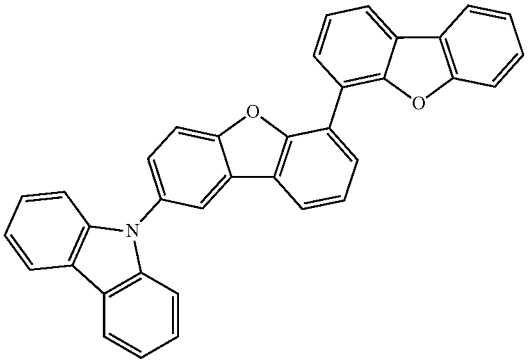
-continued
3-17
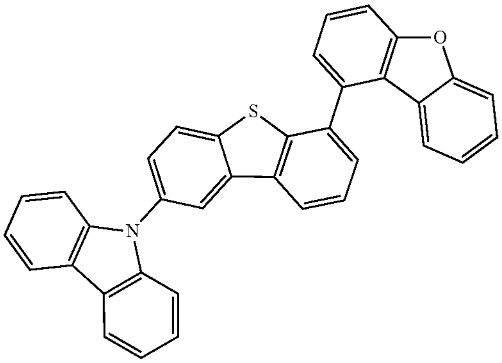
3-18
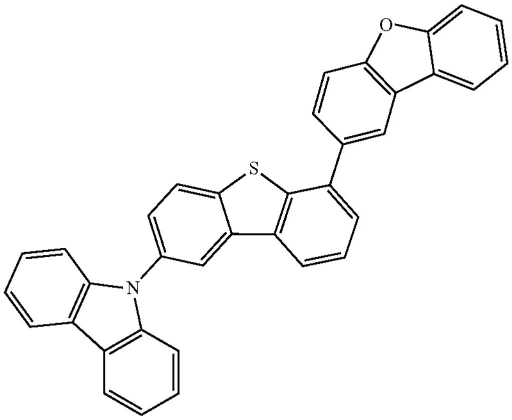
3-19
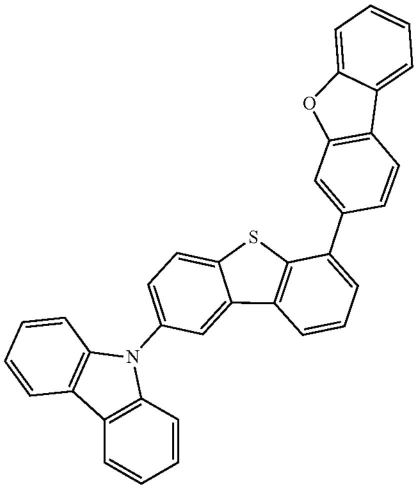

-continued 3-20

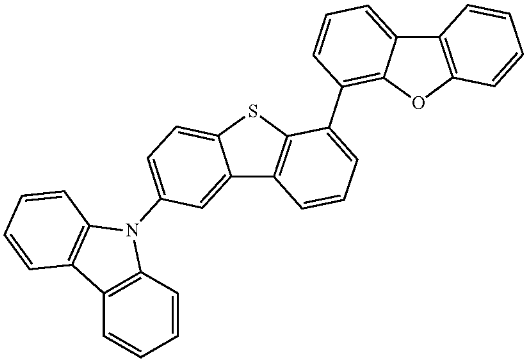

3-21

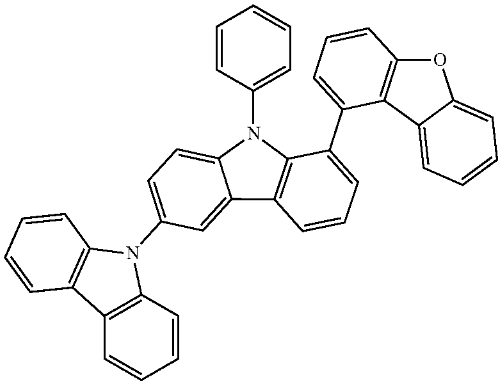

3-22

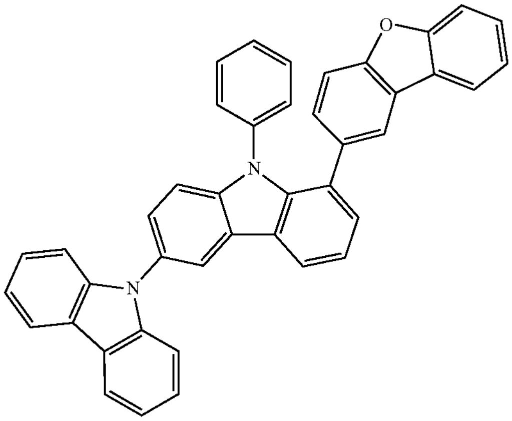

-continued 3-23

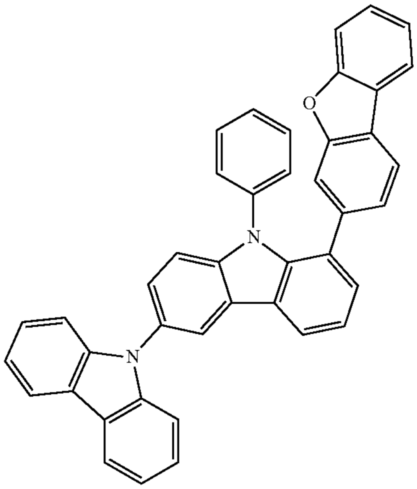

3-24

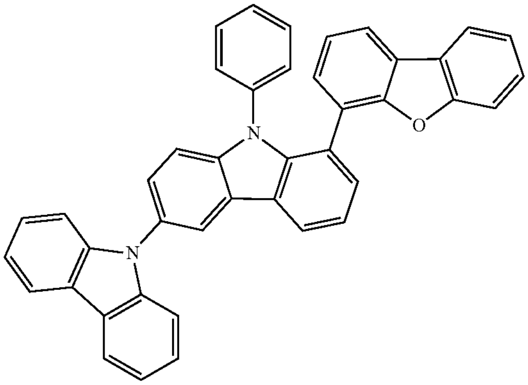

In the EML 240, a weight % of the third compound can be greater than that of the second compound and can be equal to or smaller than that of the first compound.

In the EML 240, the third compound acts as a host, the second compound acts as a dopant (or an emitter), and the first compound acts as an auxiliary host or an auxiliary dopant.

The hole from the first electrode 210 as an anode and the electron from the second electrode 230 as a cathode are combined in the host to generate the exciton in the host. The exciton is transferred into the first compound, and the triplet exciton of the first compound is converted into the singlet exciton of the first compound. The singlet exciton of the first compound is transferred into the second compound, and the emission is provide from the second compound.

In the EML 240, a singlet energy level of the first compound is smaller (lower) than that of the third compound being the host and is greater (higher) than that of the second compound. In addition, a triplet energy level of the first compound is smaller than that of the third compound being the host and is greater than that of the second compound.

A difference between a lowest unoccupied molecular orbital (LUMO) energy level of the second compound being the fluorescent material (FD) and a LUMO energy level of the first compound being the delayed fluorescent material (TD) can be about −0.6 eV or more and about 0.1 eV or less. ($0.1 \geq$ LUMO (FD)−LUMO(TD)$\geq -0.6$)

A highest occupied molecular orbital (HOMO) energy level of the second compound being the fluorescent material (FD) can be equal to or higher than that of the first compound being the delayed fluorescent material (TD).

In addition, a difference between the triplet energy level of the first compound and the singlet energy level of the first compound can be about 0.3 eV or less, and an energy bandgap of the first compound can be about 2.0 eV to about 3.0 eV.

As mentioned above, the first compound having a delayed fluorescence property has high quantum efficiency and poor color purity due to wide FWHM. On the other hand, the second compound having a fluorescence property has narrow FWHM and low emitting efficiency.

However, in the OLED D1 of the present disclosure, the singlet exciton of the first compound being the delayed fluorescent material is transferred into the second compound being the fluorescent material, and the emission is provided from the second compound. Accordingly, the emitting efficiency and the color purity of the OLED D1 are improved. In addition, since the overlapping ratio between the emission spectrum of the first compound represented by Formula 1-1 and the absorption spectrum of the second compound represented by Formula 2-1 is relatively large, the emitting efficiency of the OLED D1 is further increased.

[OLED]

An anode (ITO, 70 nm), an HIL (Formula 4-1, 10 nm), an HTL (Formula 4-2, 140 nm), an EBL (Formula 4-3, 10 nm), an EML (40 nm), an HBL (Formula 4-4, 10 nm), an ETL (Formula 4-5, 30 nm), an EIL (Liq, 1 nm) and a cathode (Mg:Ag, 10 nm) are sequentially deposited to form an OLED.

[Formula 4-1]

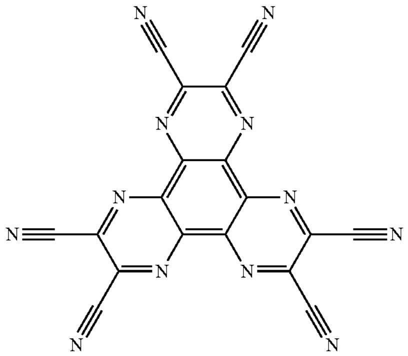

[Formula 4-2]

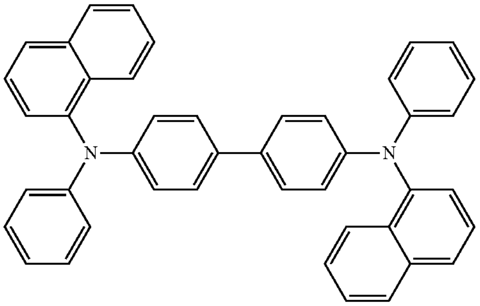

-continued

[Formula 4-3]

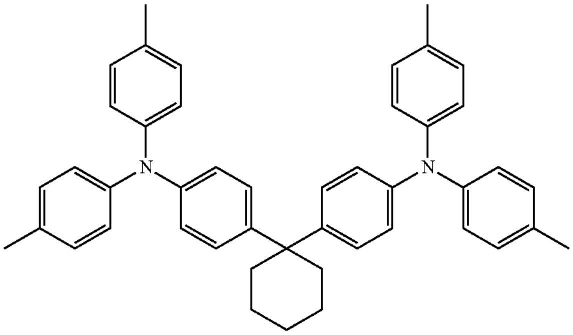

[Formula 4-4]

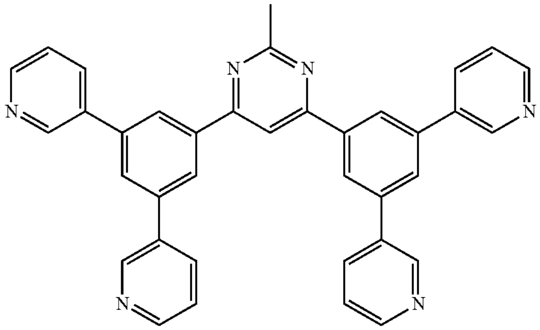

[Formula 4-5]

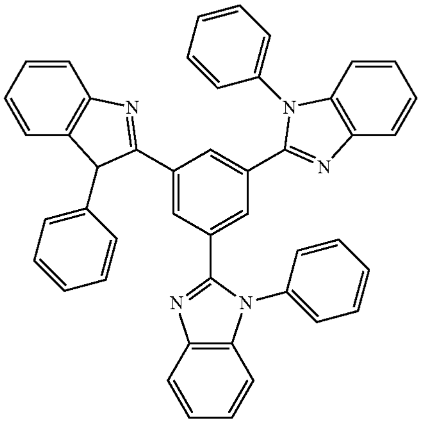

1. COMPARATIVE EXAMPLES (1) Comparative Example 1 (Ref1)

The compound 3-1 in Formula 3-6 (49 wt. %), the compound 5-1 in Formula 5 (50 wt. %) and the compound 2-3 in Formula 2-2 (1 wt. %) are used to form the EML.

(2) Comparative Example 2 (Ref2)

The compound 3-1 in Formula 3-6 (49 wt. %), the compound 5-2 in Formula 5 (50 wt. %) and the compound 2-3 in Formula 2-2 (1 wt. %) are used to form the EML.

(3) Comparative Example 3 (Ref3)

The compound 3-1 in Formula 3-6 (49 wt. %), the compound 5-3 in Formula 5 (50 wt. %) and the compound 2-3 in Formula 2-2 (1 wt. %) are used to form the EML.

(4) Comparative Example 4 (Ref4)

The compound 3-1 in Formula 3-6 (49 wt. %), the compound 5-4 in Formula 5 (50 wt. %) and the compound 2-3 in Formula 2-2 (1 wt. %) are used to form the EML.

(5) Comparative Example 5 (Ref5)

The compound 3-1 in Formula 3-6 (49 wt. %), the compound 5-1 in Formula 5 (50 wt. %) and the compound 2-5 in Formula 2-2 (1 wt. %) are used to form the EML.

(6) Comparative Example 6 (Ref6)

The compound 3-1 in Formula 3-6 (49 wt. %), the compound 5-2 in Formula 5 (50 wt. %) and the compound 2-5 in Formula 2-2 (1 wt. %) are used to form the EML.

(7) Comparative Example 7 (Ref7)

The compound 3-1 in Formula 3-6 (49 wt. %), the compound 5-3 in Formula 5 (50 wt. %) and the compound 2-5 in Formula 2-2 (1 wt. %) are used to form the EML.

(8) Comparative Example 8 (Ref8)

The compound 3-1 in Formula 3-6 (49 wt. %), the compound 5-4 in Formula 5 (50 wt. %) and the compound 2-5 in Formula 2-2 (1 wt. %) are used to form the EML.

(9) Comparative Example 9 (Ref9)

The compound 3-1 in Formula 3-6 (49 wt. %), the compound 5-1 in Formula 5 (50 wt. %) and the compound 2-41 in Formula 2-2 (1 wt. %) are used to form the EML.

(10) Comparative Example 10 (Ref10)

The compound 3-1 in Formula 3-6 (49 wt. %), the compound 5-2 in Formula 5 (50 wt. %) and the compound 2-41 in Formula 2-2 (1 wt. %) are used to form the EML.

(11) Comparative Example 11 (Ref11)

The compound 3-1 in Formula 3-6 (49 wt. %), the compound 5-3 in Formula 5 (50 wt. %) and the compound 2-41 in Formula 2-2 (1 wt. %) are used to form the EML.

(12) Comparative Example 12 (Ref12)

The compound 3-1 in Formula 3-6 (49 wt. %), the compound 5-4 in Formula 5 (50 wt. %) and the compound 2-41 in Formula 2-2 (1 wt. %) are used to form the EML.

2. Examples (1) Example 1 (Ex1)

The compound 3-1 in Formula 3-6 (49 wt. %), the compound 1-3 in Formula 1-4 (50 wt. %) and the compound 2-3 in Formula 2-2 (1 wt. %) are used to form the EML.

(2) Example 2 (Ex2)

The compound 3-1 in Formula 3-6 (49 wt. %), the compound 1-14 in Formula 1-4 (50 wt. %) and the compound 2-3 in Formula 2-2 (1 wt. %) are used to form the EML.

(3) Example 3 (Ex3)

The compound 3-1 in Formula 3-6 (49 wt. %), the compound 1-15 in Formula 1-4 (50 wt. %) and the compound 2-3 in Formula 2-2 (1 wt. %) are used to form the EML.

(4) Example 4 (Ex4)

The compound 3-1 in Formula 3-6 (49 wt. %), the compound 1-16 in Formula 1-4 (50 wt. %) and the compound 2-3 in Formula 2-2 (1 wt. %) are used to form the EML.

(5) Example 5 (Ex5)

The compound 3-1 in Formula 3-6 (49 wt. %), the compound 1-3 in Formula 1-4 (50 wt. %) and the compound 2-5 in Formula 2-2 (1 wt. %) are used to form the EML.

(6) Example 6 (Ex6)

The compound 3-1 in Formula 3-6 (49 wt. %), the compound 1-14 in Formula 1-4 (50 wt. %) and the compound 2-5 in Formula 2-2 (1 wt. %) are used to form the EML.

(7) Example 7 (Ex7)

The compound 3-1 in Formula 3-6 (49 wt. %), the compound 1-15 in Formula 1-4 (50 wt. %) and the compound 2-5 in Formula 2-2 (1 wt. %) are used to form the EML.

(8) Example 8 (Ex8)

The compound 3-1 in Formula 3-6 (49 wt. %), the compound 1-16 in Formula 1-4 (50 wt. %) and the compound 2-5 in Formula 2-2 (1 wt. %) are used to form the EML.

(9) Example 9 (Ex9)

The compound 3-1 in Formula 3-6 (49 wt. %), the compound 1-3 in Formula 1-4 (50 wt. %) and the compound 2-41 in Formula 2-2 (1 wt. %) are used to form the EML.

(10) Example 10 (Ex10)

The compound 3-1 in Formula 3-6 (49 wt. %), the compound 1-14 in Formula 1-4 (50 wt. %) and the compound 2-41 in Formula 2-2 (1 wt. %) are used to form the EML.

(11) Example 11 (Ex11)

The compound 3-1 in Formula 3-6 (49 wt. %), the compound 1-15 in Formula 1-4 (50 wt. %) and the compound 2-41 in Formula 2-2 (1 wt. %) are used to form the EML.

(12) Example 12 (Ex12)

The compound 3-1 in Formula 3-6 (49 wt. %), the compound 1-16 in Formula 1-4 (50 wt. %) and the compound 2-41 in Formula 2-2 (1 wt. %) are used to form the EML.

[Formula 5]

5-1

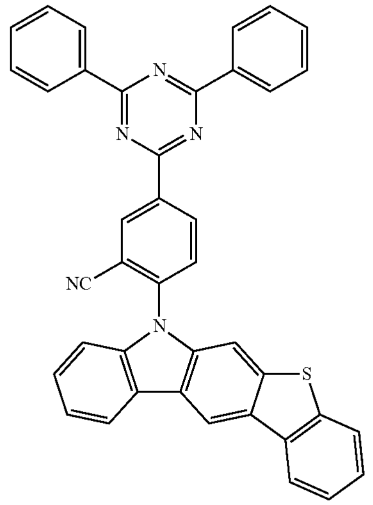

5-2

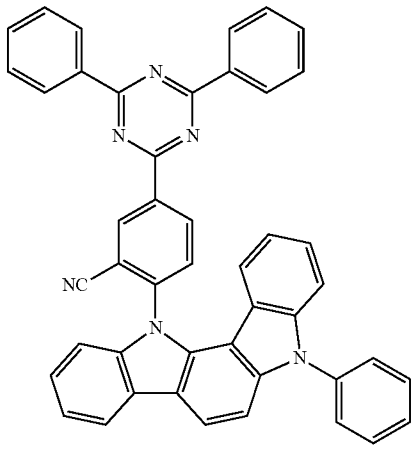

5-3

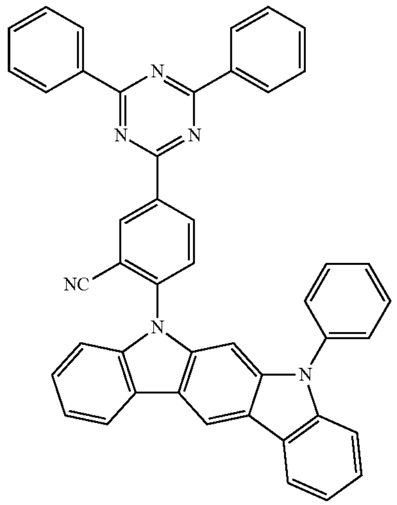

-continued 5-4

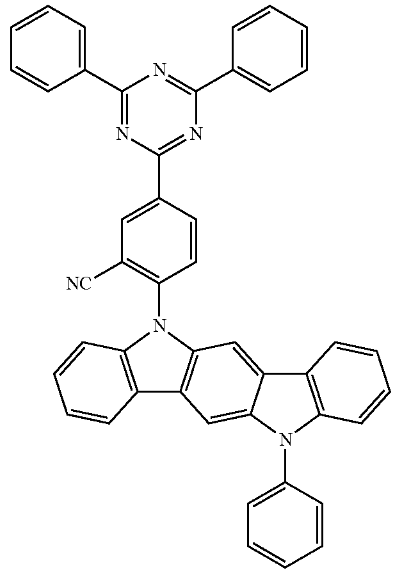

The emitting properties, i.e., a driving voltage (V), a current efficiency (cd/A), a maximum emission wavelength ($TD_{EL}$) of the delayed fluorescent material, a maximum absorption wavelength ($FD_{abs}$) of the fluorescent material and an overlapping ratio between a maximum emission wavelength range of the delayed fluorescent material, a maximum absorption wavelength range of the fluorescent material, of the OLED in Comparative Examples 1 to 12 and Examples 1 to 12 are measured and listed in Tables 1 to 3.

TABLE 1

| | | | | | λmax | | |
|---|---|---|---|---|---|---|---|
| | TD | FD | V | cd/A | $TD_{EL}$ | $FD_{abs}$ | Overlap(%) |
| Ref1 | 5-1 | 2-3 | 3.8 | 82 | 528 | 514 | 30 |
| Ref2 | 5-2 | | 3.6 | 76 | 532 | | 28 |
| Ref3 | 5-3 | | 3.6 | 68 | 530 | | 26 |
| Ref4 | 5-4 | | 3.5 | 78 | 538 | | 26 |
| Ex1 | 1-3 | | 3.8 | 145 | 509 | | 39 |
| Ex2 | 1-14 | | 3.8 | 140 | 514 | | 38 |
| Ex3 | 1-15 | | 3.7 | 142 | 510 | | 37 |
| Ex4 | 1-16 | | 3.7 | 138 | 516 | | 37 |

TABLE 2

| | | | | | λmax | | |
|---|---|---|---|---|---|---|---|
| | TD | FD | V | cd/A | $TD_{EL}$ | $FD_{abs}$ | Overlap(%) |
| Ref5 | 5-1 | 2-5 | 3.6 | 72 | 528 | 512 | 28 |
| Ref6 | 5-2 | | 3.5 | 70 | 532 | | 27 |
| Ref7 | 5-3 | | 3.6 | 68 | 530 | | 27 |
| Ref8 | 5-4 | | 3.6 | 65 | 538 | | 24 |
| Ex5 | 1-3 | | 3.9 | 141 | 509 | | 38 |
| Ex6 | 1-14 | | 3.8 | 139 | 510 | | 38 |
| Ex7 | 1-15 | | 3.8 | 134 | 514 | | 37 |
| Ex8 | 1-16 | | 3.9 | 135 | 516 | | 36 |

TABLE 3

| | TD | FD | V | cd/A | λmax $TD_{EL}$ | λmax $FD_{abs}$ | Overlap(%) |
|---|---|---|---|---|---|---|---|
| Ref9 | 5-1 | 2-41 | 3.7 | 32 | 528 | 482 | 20 |
| Ref10 | 5-2 | | 3.5 | 24 | 532 | | 18 |
| Ref11 | 5-3 | | 3.6 | 23 | 530 | | 18 |
| Ref12 | 5-4 | | 3.6 | 20 | 538 | | 15 |
| Ex9 | 1-3 | | 3.8 | 76 | 509 | | 28 |
| Ex10 | 1-14 | | 3.8 | 65 | 510 | | 26 |
| Ex11 | 1-15 | | 3.8 | 68 | 514 | | 27 |
| Ex12 | 1-16 | | 3.9 | 60 | 516 | | 25 |

As shown in Tables 1 to 3, in comparison to the OLED of Comparative Examples 1 to 12, the emitting efficiency of the OLED of Examples 1 to 12, which includes the first compound represented by Formula 1-1 and the second compound represented by Formula 2-1, is significantly increased.

Namely, in comparison to the OLED including the delayed fluorescent material, i.e., the compounds 5-1 to 5-4, in which a cyano group is directly connected to a phenylene linker, the emitting efficiency of the OLED including the delayed fluorescent material, i.e., the compounds 1-3 and 1-14 to 1-16, in which a cyano group is indirectly connected to a phenylene linker through an arylene moiety, with the fluorescent material represented by Formula 2-1, is significantly increased.

Figure 4:
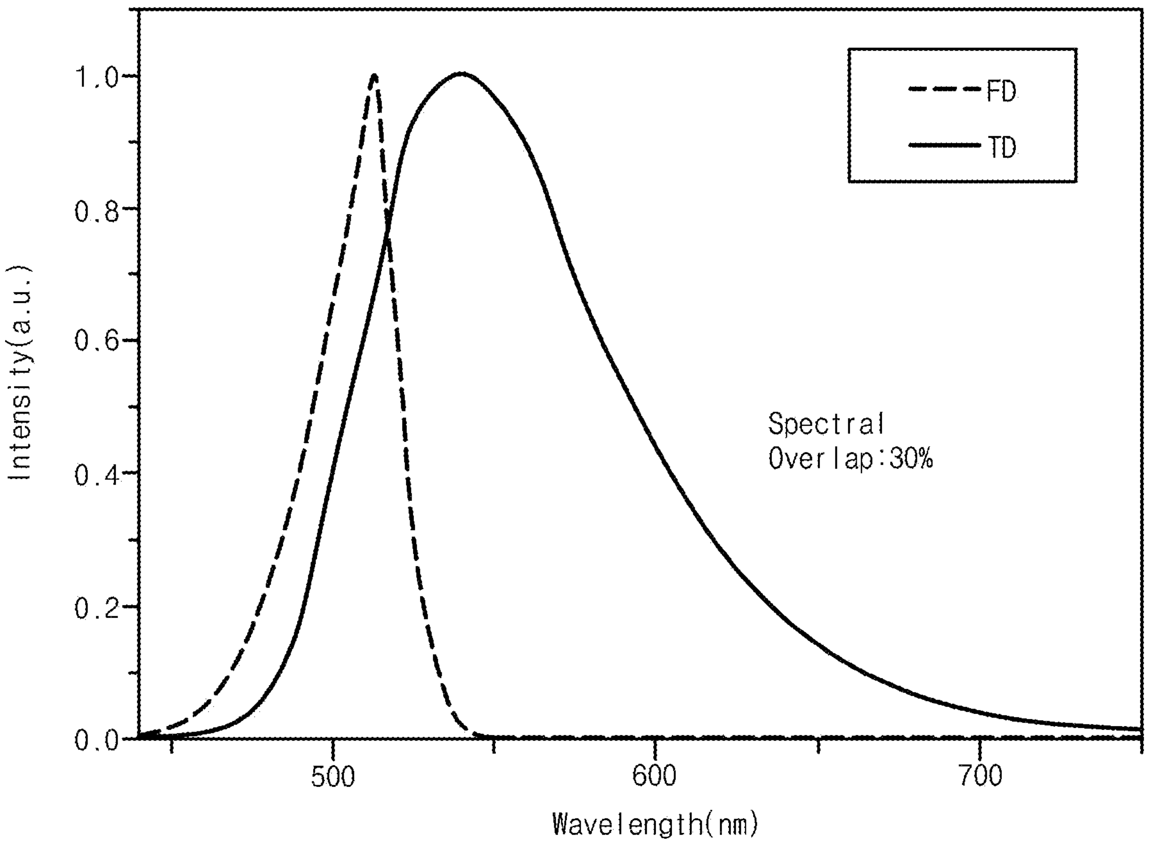
FIG. 4 is a schematic view illustrating a relation between an emission spectrum of a delayed fluorescent material and an absorption spectrum of a fluorescent material in an OLED.

Referring to FIG. 4, which is a schematic view illustrating a relation between an emission spectrum of a delayed fluorescent material and an absorption spectrum of a fluorescent material in an OLED, the emission spectrum of the delayed fluorescent material, i.e., the compound 5-1 “TD” in Formula 5, and the absorption spectrum of a fluorescent material, i.e., the compound 2-3 “FD” in Formula 2-2, have an overlapping ratio of about 30%.

Figure 5:
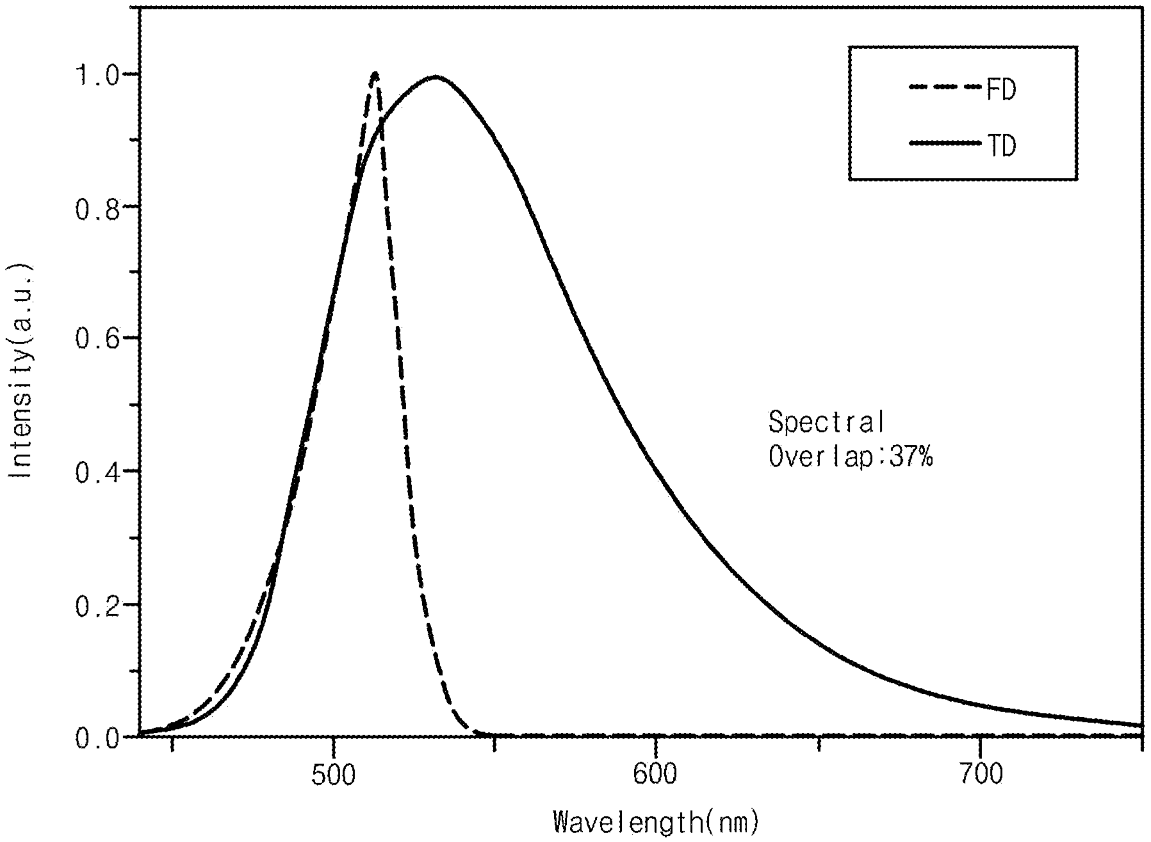
FIG. 5 is a schematic view illustrating a relation between an emission spectrum of a first compound and an absorption spectrum of a second compound in an OLED according to the second embodiment of the present disclosure.

On the other hand, referring to FIG. 5, which is a schematic view illustrating a relation between an emission spectrum of a first compound and an absorption spectrum of a second compound in an OLED according to the second embodiment of the present disclosure, the emission spectrum of the first compound, i.e., the compound 1-15 “TD” in Formula 1-4, and the absorption spectrum of a fluorescent material, i.e., the compound 2-3 “FD” in Formula 2-2, have an overlapping ratio of about 37%.

Namely, in the first compound of the present disclosure, since a substituent, i.e., Y in Formula 1-1, being selected from the group consisting of a cyano group (—CN), a nitro group (—$NO_2$), halogen, a C1 to C20 alkyl group substituted with at least one of a cyano group, a nitro group and halogen, a C6 to C30 aryl group substituted with at least one of a cyano group, a nitro group and halogen and a C3 to C40 heteroaryl group substituted with at least one of a cyano group, a nitro group and halogen, is connected to the phenylene linker through an arylene moiety, i.e., L in Formula 1-1, the emission spectrum of the first compound is shifted into a short wavelength range, and the overlapping ratio between the emission spectrum of the first compound and the absorption spectrum of the second compound is increased. As a result, the emitting efficiency of the OLED D1 including the first and second compounds is significantly increased.

Figure 6:
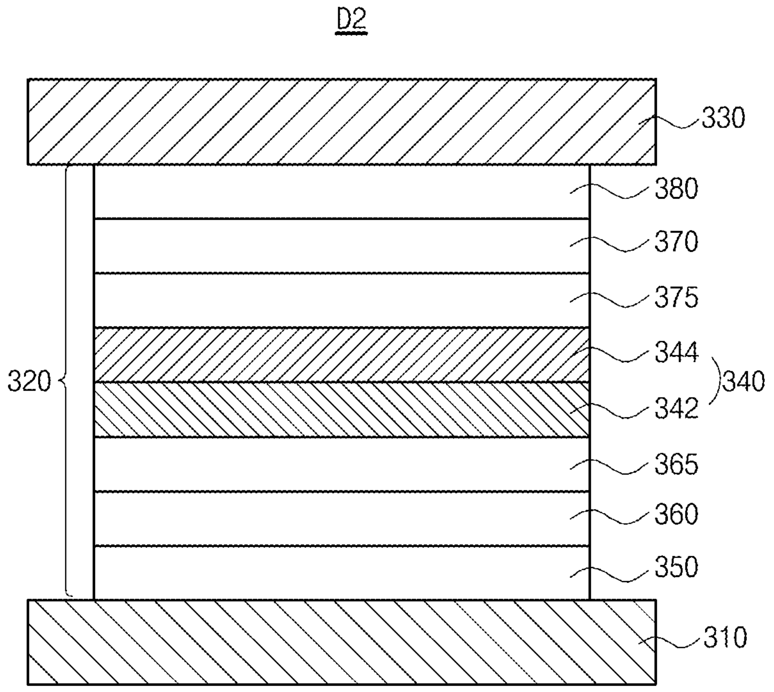
FIG. 6 is a schematic cross-sectional view of an OLED according to a third embodiment of the present disclosure.

FIG. 6 is a schematic cross-sectional view of an OLED according to a third embodiment of the present disclosure.

As shown in FIG. 6, an OLED D2 according to the third embodiment of the present disclosure includes the first and second electrodes 310 and 330, which face each other, and the light emitting layer 320 therebetween. The light emitting layer 320 includes an EML 340. The organic light emitting display device 100 (of FIG. 2) can include a red pixel region, a green pixel region and a blue pixel region, and the OLED D2 can be positioned in the green pixel region.

The first electrode 310 can be an anode, and the second electrode 330 can be a cathode. One of the first and second electrodes 310 and 330 can be a transparent electrode (or a semi-transparent electrode), and the other one of the first and second electrodes 310 and 330 can be a reflection electrode.

The light emitting layer 320 can further include at least one of the HTL 360 between the first electrode 310 and the EML 340 and the ETL 370 between the second electrode 330 and the EML 340.

In addition, the light emitting layer 320 can further include at least one of the HIL 350 between the first electrode 310 and the HTL 360 and the EIL 380 between the second electrode 330 and the ETL 370.

Moreover, the light emitting layer 320 can further include at least one of the EBL 365 between the HTL 360 and the EML 340 and the HBL 375 between the EML 340 and the ETL 370.

The EML 340 includes a first EML (a first layer or a lower emitting material layer) 342 and a second EML (a second layer or an upper emitting material layer) 344 sequentially stacked over the first electrode 310. Namely, the second EML 344 is positioned between the first EML 342 and the second electrode 330.

In the EML 340, one of the first and second EMLs 342 and 344 includes the second compound in Formula 2-1 being the fluorescent material, and the other one of the first and second EMLs 342 and 344 includes the first compound in Formula 1-1 being the delayed fluorescent material. In addition, the first EML 342 and the second EML 344 can further include a fourth compound and a fifth compound, respectively, as a host. The fourth compound in the first EML 342 and the fifth compound in the second EML 344 can be same or different. For example, each of the fourth and fifth compounds can be same as the third compound.

The OLED, where the first compound is included in the second EML 344, will be explained.

As mentioned above, the first compound having a delayed fluorescent property has high quantum efficiency. However, since the first compound has wide FWHM, the firth compound has a disadvantage in a color purity. On other hand, the second compound having a fluorescent property has narrow FWHM. However, since the triplet exciton of the second compound is not involved in the light emission, the second compound has a disadvantage in an emitting efficiency.

In the OLED D2, since the triplet exciton energy of the first compound in the second EML 344 is converted into the singlet exciton energy of the first compound by the RISC and the singlet exciton energy of the first compound is transferred into the singlet exciton energy of the second compound in the first EML 342, the second compound provides the light emission. Accordingly, both the singlet exciton energy and the triplet exciton energy are involved in the light emission such that the emitting efficiency is improved. In addition, since the light emission is provided from the second compound of the fluorescent material, the emission having narrow FWHM is provided.

The absorption spectrum of the second compound and the emission spectrum of the first compound have an overlapping ratio of about 35% or more. Accordingly, the energy of the first compound in the second EML 344 is efficiently transferred into the second compound in the first EML 342 such that the emitting efficiency of the OLED D2 is improved.

In the first EML 342, the weight % of the fourth compound can be greater than that of the second compound. In the second EML 344, the weight % of the fifth compound can be equal to or greater than that of the first compound. The weight % of the second compound in the first EML 342 can be smaller than that of the first compound in the second EML 344. As a result, the energy transfer by FRET from the first compound in the second EML 344 into the second compound in the first EML 342 is sufficiently generated, and the emitting efficiency of the OLED D2 can be further improved. For example, the second compound in the first EML 342 can have a weight % of 0.01 to 10, preferably 0.01 to 5, the first compound in the second EML 344 can have a weight % of 30 to 50, preferably 40 to 50, but it is not limited thereto.

The host of the first EML 342 can be same as a material of the EBL 365. In this instance, the first EML 342 can have an electron blocking function with an emission function. Namely, the first EML 342 can serve as a buffer layer for blocking the electron. When the EBL 365 is omitted, the first EML 342 can serve as an emitting material layer and an electron blocking layer.

When the second EML 344 includes the second compound and the first EML 342 includes the first compound, the host of the second EML 344 can be same as a material of the HBL 375. In this instance, the second EML 344 can have a hole blocking function with an emission function. Namely, the second EML 344 can serve as a buffer layer for blocking the hole. When the HBL 375 is omitted, the second EML 344 can serve as an emitting material layer and a hole blocking layer.

Figure 7:
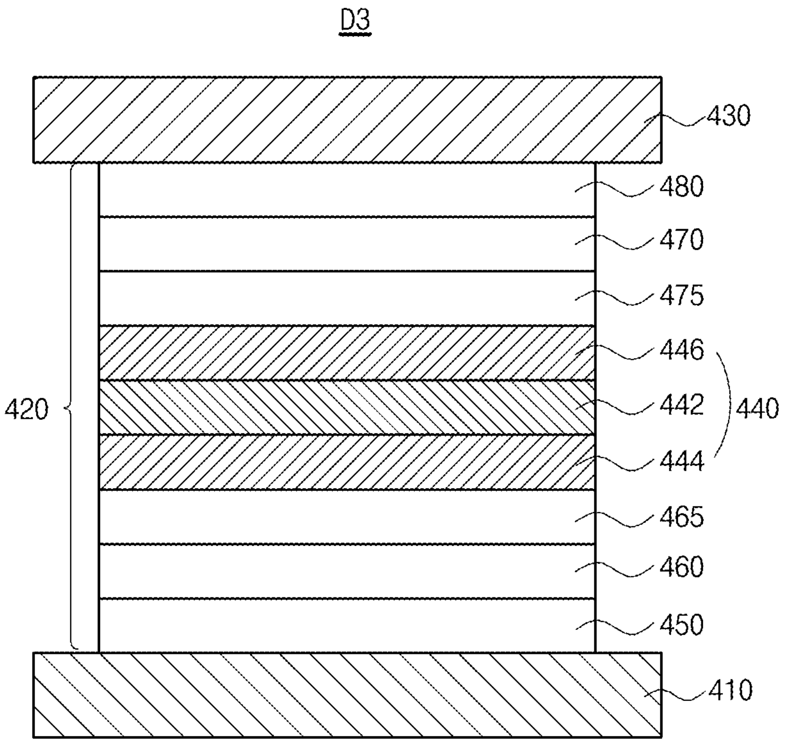
FIG. 7 is a schematic cross-sectional view of an OLED according to a fourth embodiment of the present disclosure.

FIG. 7 is a schematic cross-sectional view of an OLED according to a fourth embodiment of the present disclosure.

As shown in FIG. 7, an OLED D3 according to the fourth embodiment of the present disclosure includes the first and second electrodes 410 and 430, which face each other, and the light emitting layer 420 therebetween. The light emitting layer 420 includes an EML 440. The organic light emitting display device 100 (of FIG. 2) can include a red pixel region, a green pixel region and a blue pixel region, and the OLED D3 can be positioned in the green pixel region.

The first electrode 410 can be an anode, and the second electrode 430 can be a cathode. One of the first and second electrodes 410 and 430 can be a transparent electrode (or a semi-transparent electrode), and the other one of the first and second electrodes 410 and 430 can be a reflection electrode.

The light emitting layer 420 can further include at least one of the HTL 460 between the first electrode 410 and the EML 440 and the ETL 470 between the second electrode 430 and the EML 440.

In addition, the light emitting layer 420 can further include at least one of the HIL 450 between the first electrode 410 and the HTL 460 and the EIL 480 between the second electrode 430 and the ETL 470.

Moreover, the light emitting layer 420 can further include at least one of the EBL 465 between the HTL 460 and the EML 440 and the HBL 475 between the EML 440 and the ETL 470.

The EML 440 includes a first EML (a first layer, an intermediate emitting material layer) 442, a second EML (a second layer, a lower emitting material layer) 444 between the first EML 442 and the first electrode 410, and a third EML (a third layer, an upper emitting material layer) 446 between the first EML 442 and the second electrode 430. Namely, the EML 440 has a triple-layered structure of the second EML 444, the first EML 442 and the third EML 446 sequentially stacked.

For example, the first EML 442 can be positioned between the EBL 465 and the HBL 475, the second EML 444 can be positioned between the EBL 465 and the first EML 442, and the third EML 446 can be positioned between the HBL 475 and the first EML 442.

In the EML 440, the first EML 442 includes the first compound being the delayed fluorescent material in Formula 1-1, and each of the second and third EMLs 444 and 446 includes the second compound being the fluorescent compound in Formula 2-1. The second compound in the second EML 444 and the second compound in the third EML 446 can be same or different. The first EML 442, the second EML 444 and the third EML 446 can further include a sixth compound, a seventh compound and an eighth compound, respectively, being a host. The sixth compound in the first EML 442, the seventh compound in the second EML 444 and the eighth compound in the third EML 446 can be same or different. For example, each of the sixth, seventh and eighth compounds can be same as the third compound.

In the OLED D3, since the triplet exciton energy of the firth compound in the first EML 442 is converted into the singlet exciton energy of the third compound by the RISC and the singlet exciton energy of the third compound is transferred into the singlet exciton energy of the second compound in the second and third EMLs 444 and 446, the second compound in the second and third EMLs 444 and 446 provides the light emission. Accordingly, both the singlet exciton energy and the triplet exciton energy are involved in the light emission such that the emitting efficiency is improved. In addition, since the light emission is provided from the second compound being the fluorescent material, the emission having narrow FWHM is provided.

As mentioned above, the absorption spectrum of the second compound and the emission spectrum of the first compound have an overlapping ratio of about 35% or more. Accordingly, the energy of the first compound in the first EML 442 is efficiently transferred into the second compound in the second and third EMLs 444 and 446 such that the emitting efficiency of the OLED D3 is improved.

In the first EML 442, the weight % of the sixth compound can be equal to or greater than that of the first compound. In the second EML 444, the weight % of the seventh compound can be greater than that of the second compound. In the third EML 446, the weight % of the eighth compound can be greater than that of the second compound.

In addition, the weight % of the first compound in the first EML 442 can be greater than each of that of the second compound in the second EML 444 and that of the second compound in the third EML 446. As a result, the energy transfer by FRET from the firth compound in the first EML 442 into the second compound in the second and third EML 444 and 446 is sufficiently generated, and the emitting efficiency of the OLED D3 can be further improved. For example, the first compound in the first EML 442 can have a weight % of 30 to 50, preferably 40 to 50, the second compound in each of the second and third EMLs 444 and 446 can have a weight % of 0.01 to 10, preferably 0.01 to 5, but it is not limited thereto.

The host of the second EML 444 can be same as a material of the EBL 465. In this instance, the second EML 444 can have an electron blocking function with an emission function. Namely, the second EML 444 can serve as a buffer layer for blocking the electron. When the EBL 465 is omitted, the second EML 444 can serve as an emitting material layer and an electron blocking layer.

The host of the third EML 446 can be same as a material of the HBL 475. In this instance, the third EML 446 can have a hole blocking function with an emission function. Namely, the third EML 446 can serve as a buffer layer for blocking the hole. When the HBL 475 is omitted, the third EML 446 can serve as an emitting material layer and a hole blocking layer.

The host in the second EML 444 can be same as a material of the EBL 465, and the host in the third EML 446 can be same as a material of the HBL 475. In this instance, the second EML 444 can have an electron blocking function with an emission function, and the third EML 446 can have a hole blocking function with an emission function. Namely, the second EML 444 can serve as a buffer layer for blocking the electron, and the third EML 446 can serve as a buffer layer for blocking the hole. When the EBL 465 and the HBL 475 are omitted, the second EML 444 can serve as an emitting material layer and an electron blocking layer and the third EML 446 serves as an emitting material layer and a hole blocking layer.

Figure 8:
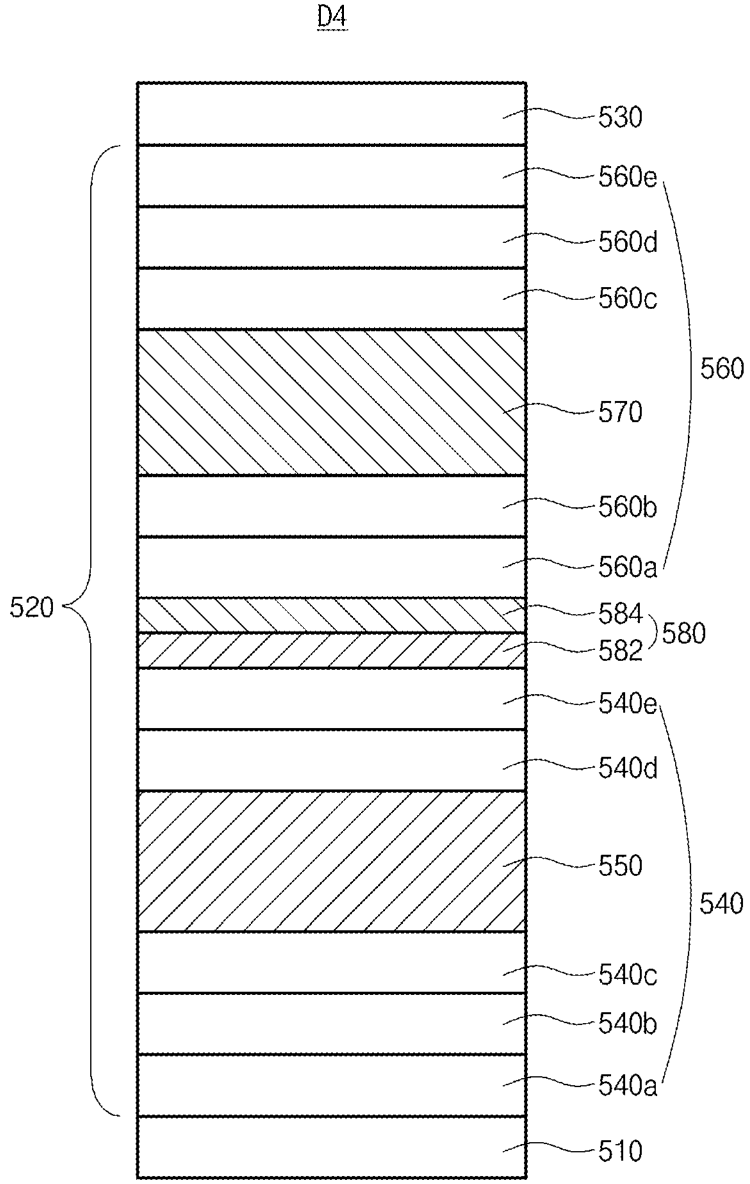
FIG. 8 is a schematic cross-sectional view of an OLED according to a fifth embodiment of the present disclosure.

FIG. 8 is a schematic cross-sectional view of an OLED according to a fifth embodiment of the present disclosure.

As shown in FIG. 8, the OLED D4 includes the first and second electrodes 510 and 530, which face each other, and the emitting layer 520 therebetween. The organic light emitting display device 100 (of FIG. 2) can include a red pixel region, a green pixel region and a blue pixel region, and the OLED D4 can be positioned in the green pixel region.

The first electrode 510 can be an anode, and the second electrode 530 can be a cathode. One of the first and second electrodes 510 and 530 can be a transparent electrode (or a semi-transparent electrode), and the other one of the first and second electrodes 510 and 530 can be a reflection electrode.

The light emitting layer 520 includes a first emitting part 540 including a first EML 550 and a second emitting part 560 including a second EML 570. In addition, the light emitting layer 520 can further include a charge generation layer (CGL) 580 between the first and second emitting parts 540 and 560.

The CGL 580 is positioned between the first and second emitting parts 540 and 560 such that the first emitting part 540, the CGL 580 and the second emitting part 560 are sequentially stacked on the first electrode 510. Namely, the first emitting part 540 is positioned between the first electrode 510 and the CGL 580, and the second emitting part 580 is positioned between the second electrode 530 and the CGL 580.

The first emitting part 540 includes the first EML 550.

In addition, the first emitting part 540 can further include at least one of a first HTL 540*b* between the first electrode 510 and the first EML 550, an HIL 540*a* between the first electrode 510 and the first HTL 540*b*, and a first ETL 540*e* between the first EML 550 and the CGL 580.

Moreover, the first emitting part 540 can further include at least one of a first EBL 540*c* between the first HTL 540*b* and the first EML 550 and a first HBL 540*d* between the first EML 550 and the first ETL 540*e*.

The second emitting part 560 includes the second EML 570.

In addition, the second emitting part 560 can further include at least one of a second HTL 560*a* between the CGL 580 and the second EML 570, a second ETL 560*d* between the second EML 570 and the second electrode 164, and an EIL 560*e* between the second ETL 560*d* and the second electrode 530.

Moreover, the second emitting part 560 can further include at least one of a second EBL 560*b* between the second HTL 560*a* and the second EML 570 and a second HBL 560*c* between the second EML 570 and the second ETL 560*d*.

The CGL 580 is positioned between the first and second emitting parts 540 and 560. Namely, the first and second emitting parts 540 and 560 are connected to each other through the CGL 580. The CGL 580 can be a P-N junction type CGL of an N-type CGL 582 and a P-type CGL 584.

The N-type CGL 582 is positioned between the first ETL 540*e* and the second HTL 560*a*, and the P-type CGL 584 is positioned between the N-type CGL 582 and the second HTL 560*a*. The N-type CGL 582 provides an electron into the first EML 550 of the first emitting part 540, and the P-type CGL 584 provides a hole into the second EML 570 of the second emitting part 560.

The first and second EMLs 550 and 570 are a green EML. At least one of the first and second EMLs 550 and 570 includes the first compound represented by Formula 1-1 and the second compound represented by Formula 2-1.

For example, the first EML 550 can include the first compound represented by Formula 1-1 being the delayed fluorescent material and the second compound represented by Formula 2-1 being the fluorescent material. The first EML 550 can further include a third compound as a host. The third compound can be the compound represented by Formula 3-1.

In the first EML 550, the weight % of the first compound can be greater than that of the second compound and can be equal to or greater than that of the third compound. When the weight % of the first compound is greater than that of the second compound, the energy transfer from the first compound to the second compound is efficiently generated. For example, in the first EML 550, the second compound can have a weight % of 0.01 to 10, preferably 0.01 to 5, more preferably 0.1 to 5, the first compound can have a weight % of 30 to 60, preferably 40 to 60, preferably 40 to 50 or 45 to 55, but it is not limited thereto.

The second EML 570 can include the first compound represented by Formula 1-1 and the second compound represented by Formula 2-1. Alternatively, the second EML 570 can include a delayed fluorescent compound and/or a fluorescent compound, at least one of which is different from the first and second compounds in the first EML 550, such that the first and second EMLs 550 and 570 have a different in an emitted-light wavelength or an emitting efficiency. Alternatively, the second EML 570 can include a host and a green dopant being a phosphorescent material.

In the OLED D4 of the present disclosure, the singlet energy level of the first compound as the delayed fluorescent material is transferred into the second compound as the fluorescent material, and the light emission is generated from the second compound. Accordingly, the emitting efficiency and the color purity of the OLED D4 are improved. In addition, since the first compound of Formula 1-1 and the second compound of Formula 2-1 are included in the first EML 550, the emitting efficiency and the color purity of the OLED D4 are further improved. Moreover, since the OLED D4 has a two-stack structure (double-stack structure) with two green EMLs, the color sense of the OLED D4 is improved and/or the emitting efficiency of the OLED D4 is optimized.

Figure 9:
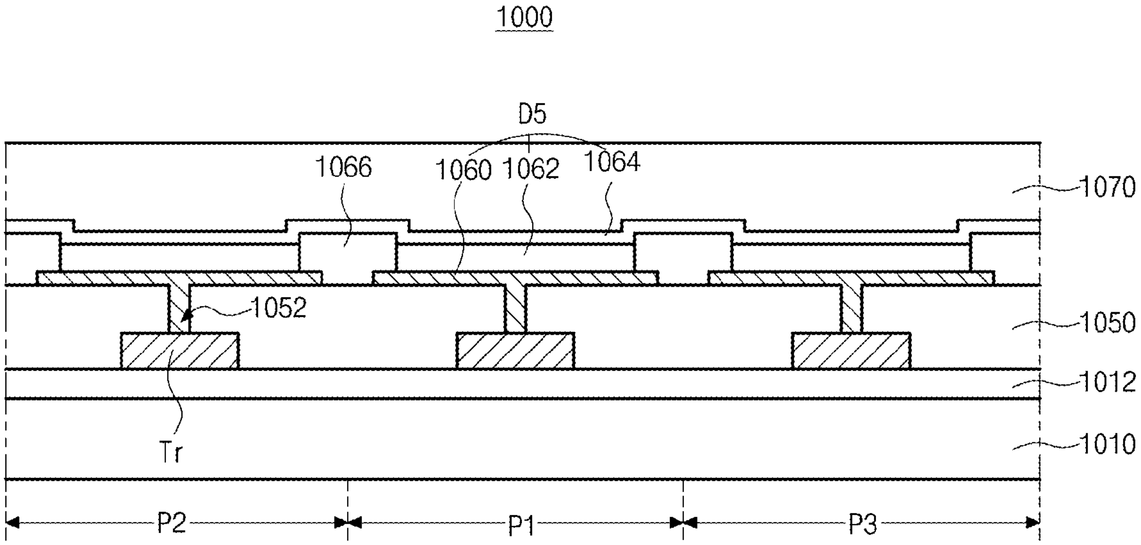
FIG. 9 is a schematic cross-sectional view of an organic light emitting display device according to a sixth embodiment of the present disclosure.

FIG. 9 is a schematic cross-sectional view of an organic light emitting display device according to a sixth embodiment of the present disclosure.

As shown in FIG. 9, the organic light emitting display device 1000 includes a substrate 1010, wherein first to third pixel regions P1, P2 and P3 are defined, a TFT Tr over the substrate 1010 and an OLED D5. The OLED D5 is disposed over the TFT Tr and is connected to the TFT Tr. For example, the first to third pixel regions P1, P2 and P3 can be a green pixel region, a red pixel region and a blue pixel region, respectively.

The substrate 1010 may be a glass substrate or a flexible substrate. For example, the flexible substrate can be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 1012 is formed on the substrate 1010, and the TFT Tr is formed on the buffer layer 1012. The buffer layer 1012 can be omitted.

As explained with FIG. 2, the TFT Tr can include a semiconductor layer, a gate electrode, a source electrode and a drain electrode and can serve as a driving element.

A planarization layer (or passivation layer) 1050 is formed on the TFT Tr. The planarization layer 1050 has a flat top surface and includes a drain contact hole 1052 exposing the drain electrode of the TFT Tr.

The OLED D5 is disposed on the planarization layer 1050 and includes a first electrode 1060, a light emitting layer 1062 and a second electrode 1064. The first electrode 1060 is connected to the drain electrode of the TFT Tr, and the light emitting layer 1062 and the second electrode 1064 are sequentially stacked on the first electrode 1060. The OLED D5 is disposed in each of the first to third pixel regions P1 to P3 and emits different color light in the first to third pixel regions P1 to P3. For example, the OLED D5 in the first pixel region P1 can emit the green light, the OLED D5 in the second pixel region P2 can emit the red light, and the OLED D5 in the third pixel region P3 can emit the blue light.

The first electrode 1060 is formed to be separate in the first to third pixel regions P1 to P3, and the second electrode 1064 is formed as one-body to cover the first to third pixel regions P1 to P3.

The first electrode 1060 is one of an anode and a cathode, and the second electrode 1064 is the other one of the anode and the cathode. In addition, one of the first and second electrodes 1060 and 1064 can be a light transmitting electrode (or a semi-transmitting electrode), and the other one of the first and second electrodes 1060 and 1064 can be a reflecting electrode.

For example, the first electrode 1060 can be the anode and can include a transparent conductive oxide material layer formed of a transparent conductive oxide (TCO) material having a relatively high work function. The second electrode 1064 can be the cathode and can include a metallic material layer formed of a low resistance metallic material having a relatively low work function. For example, the transparent conductive oxide material layer of the first electrode 1060 include at least one of indium-tin-oxide (ITO), indium-zinc-oxide (IZO), indium-tin-zinc oxide (ITZO), tin oxide (SnO), zinc oxide (ZnO), indium-copper-oxide (ICO) and aluminum-zinc oxide alloy (Al:ZnO), and the second electrode 1064 can include Al, Mg, Ca, Ag, their alloy, e.g., Mg—Ag alloy, or their combination.

In the bottom-emission type organic light emitting display device 1000, the first electrode 1060 can have a single-layered structure of the transparent conductive oxide material layer.

On the other hand, in the top-emission type organic light emitting display device 1000, a reflection electrode or a reflection layer can be formed under the first electrode 1060. For example, the reflection electrode or the reflection layer can be formed of Ag or aluminum-palladium-copper (APC) alloy. In this instance, the first electrode 1060 can have a triple-layered structure of ITO/Ag/ITO or ITO/APC/ITO. In addition, the second electrode 1064 can have a thin profile (small thickness) to provide a light transmittance property (or a semi-transmittance property).

A bank layer 1066 is formed on the planarization layer 1050 to cover an edge of the first electrode 1060. Namely, the bank layer 1066 is positioned at a boundary of the first to third pixel regions P1 to P3 and exposes a center of the first electrode 1060 in the first to third pixel regions P1 to P3.

The light emitting layer 1062 as an emitting unit is formed on the first electrode 1060. The light emitting layer 1062 can have a single-layered structure of an EML. Alternatively, the light emitting layer 1062 can further include at least one of an HIL, an HTL, an EBL, which are sequentially stacked between the first electrode 1060 and the EML, an HBL, an ETL and an EIL, which are sequentially stacked between the EML and the second electrode 1064.

In the first pixel region P1 being the green pixel region, the EML of the light emitting layer 1062 includes the first compound being the delayed fluorescent material and the second compound being the fluorescent material. The EML of the light emitting layer 1062 can further include a third compound as a host. The first compound is represented by Formula 1-1, and the second compound is represented by Formula 2-1. The third compound can be represented by Formula 3-1.

An encapsulation film 1070 is formed on the second electrode 1064 to prevent penetration of moisture into the OLED D5. The encapsulation film 1070 can have a triple-layered structure including a first inorganic insulating layer, an organic insulating layer and a second inorganic insulating layer, but it is not limited thereto.

The organic light emitting display device 1000 can further include a polarization plate for reducing an ambient light reflection. For example, the polarization plate can be a circular polarization plate. In the bottom-emission type organic light emitting display device 1000, the polarization plate can be disposed under the substrate 1010. In the top-emission type organic light emitting display device 1000, the polarization plate can be disposed on or over the encapsulation film 1070.

Figure 10:
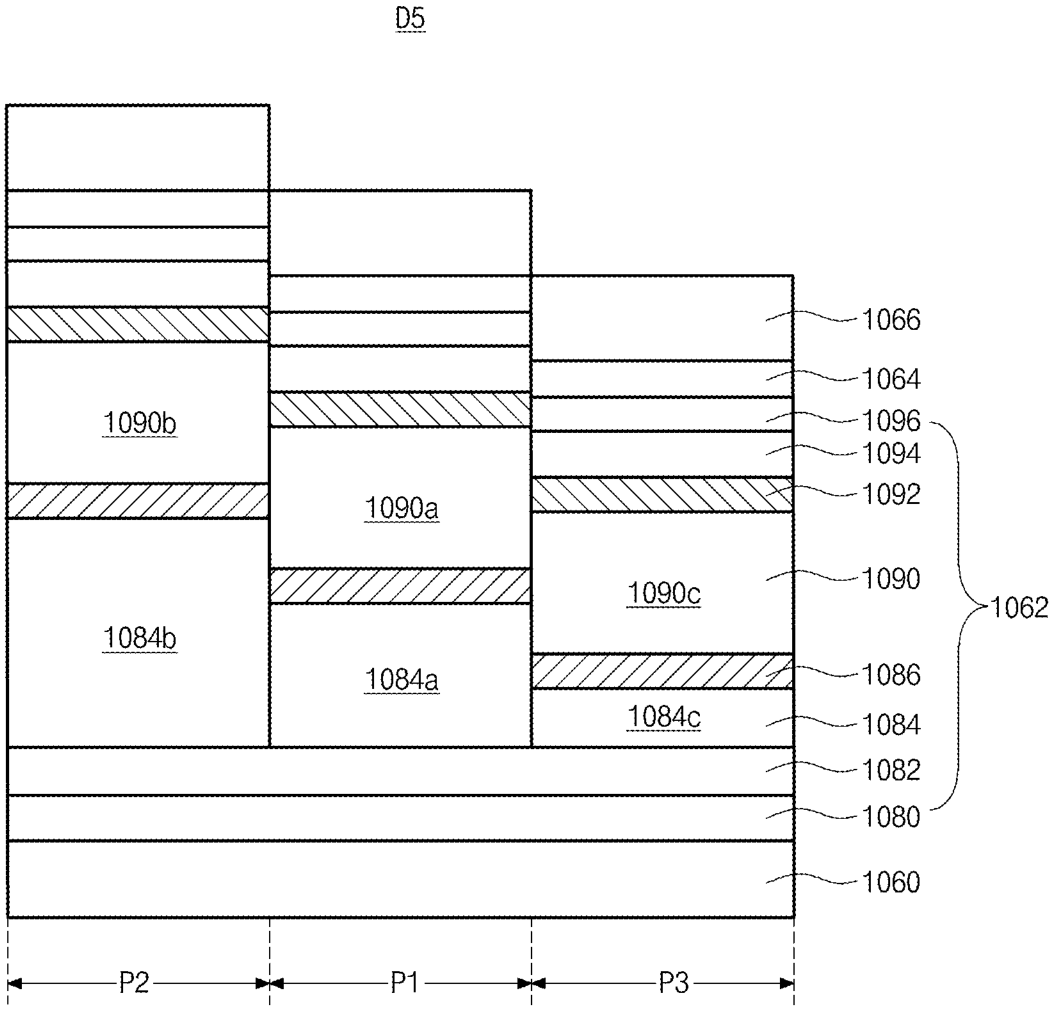
FIG. 10 is a schematic cross-sectional view of an OLED according to a seventh embodiment of the present disclosure.

FIG. 10 is a schematic cross-sectional view of an OLED according to a seventh embodiment of the present disclosure.

As shown in FIG. 10, the OLED D5 is positioned in each of first to third pixel regions P1 to P3 and includes the first and second electrodes 1060 and 1064, which face each other, and the light emitting layer 1062 therebetween. The light emitting layer 1062 includes an EML 1090.

The first electrode 1060 can be an anode, and the second electrode 1064 can be a cathode. For example, the first electrode 1060 can be a reflective electrode, and the second electrode 1064 can be a transmitting electrode (or a semi-transmitting electrode).

The light emitting layer 1062 can further include an HTL 1082 between the first electrode 1060 and the EML 1090 and an ETL 1094 between the EML 1090 and the second electrode 1064.

In addition, the light emitting layer 1062 can further include an HIL 1080 between the first electrode 1060 and the HTL 1082 and an EIL 1096 between the ETL 1094 and the second electrode 1064.

Moreover, the light emitting layer 1062 can further include an EBL 1086 between the EML 1090 and the HTL 1082 and an HBL 1092 between the EML 1090 and the ETL 1094.

Furthermore, the light emitting layer 1062 can further include an auxiliary HTL 1084 between the HTL 1082 and the EBL 1086. The auxiliary HTL 1084 can include a first auxiliary HTL **1084*a* in the first pixel region P1, a second auxiliary HTL 1084*b* in the second pixel region P2 and a third auxiliary HTL 1084*c*** in the third pixel region P3.

The first auxiliary HTL **1084*a* has a first thickness, the second auxiliary HTL 1084*b* has a second thickness, and the third auxiliary HTL 1084*c*** has a third thickness. The first thickness is smaller than the second thickness and greater than the third thickness such that the OLED D5 provides a micro-cavity structure.

Namely, by the first to third auxiliary HTLs **1084*a*, 1084*b* and 1084*c* having a difference in a thickness, a distance between the first and second electrodes 1060 and 1064 in the first pixel region P1, in which a first wavelength range light, e.g., green light, is emitted, is smaller than a distance between the first and second electrodes 1060 and 1064 in the second pixel region P2, in which a second wavelength range light, e.g., red light, being greater than the first wavelength range is emitted, and is greater than a distance between the first and second electrodes 1060 and 1064** in the third pixel region P3, in which a third wavelength range light, e.g., blue light, being smaller than the first wavelength range is emitted. Accordingly, the emitting efficiency of the OLED D5 is improved.

In FIG. 10, the third auxiliary HTL **1084*c* is formed in the third pixel region P3. Alternatively, a micro-cavity structure can be provided without the third auxiliary HTL 1084*c***.

A capping layer for improving a light-extracting property can be further formed on the second electrode 1084.

The EML 1090 includes a first EML **1090*a* in the first pixel region P1, a second EML 1090*b* in the second pixel region P2 and a third EML 1090*c* in the third pixel region P3. The first to third EMLs 1090*a*, 1090*b* and 1090*c*** can be a green EML, a red EML and a blue EML, respectively.

The first EML **1090*a* in the first pixel region P1 includes the first compound being the delayed fluorescent material and the second compound being the fluorescent material. The first EML 1090*a*** in the first pixel region P1 can further include a third compound as a host. The first compound is represented by Formula 1-1, and the second compound is represented by Formula 2-1. The third compound can be represented by Formula 3-1.

In the first EML **1090*a*** in the first pixel region P1, the weight % of the first compound can be greater than that of second compound and can be equal to or greater than that of the third compound. When the weight % of the first compound is greater than that of the second compound, the energy transfer from the first compound to the second compound is efficiently generated.

For example, in the first EML **1090*a*** in the first pixel region P1, the second compound can have a weight % of 0.01 to 10, preferably 0.01 to 5, more preferably 0.1 to 5, the first compound can have a weight % of 30 to 60, preferably 40 to 60, preferably 40 to 50 or 45 to 55, but it is not limited thereto.

Each of the second EML **1090*b* in the second pixel region P2 and the third EML 1090*c* in the third pixel region P3 can include a host and a dopant. For example, in each of the second EML 1090*b* in the second pixel region P2 and the third EML 1090*c*** in the third pixel region P3, the dopant can include at least one of a phosphorescent compound, a fluorescent compound and a delayed fluorescent compound.

The OLED D5 in FIG. 10 respectively emits the green light, the red light and the blue light in the first to third pixel regions P1 to P3 such that the organic light emitting display device 1000 (of FIG. 9) can provide a full-color image.

The organic light emitting display device 1000 can further include a color filter layer corresponding to the first to third pixel regions P1 to P3 to improve a color purity. For example, the color filter layer can include a first color filter layer, e.g., a green color filter layer, corresponding to the first pixel region P1, a second color filter layer, e.g., a red color filter layer, corresponding to the second pixel region P2, and a third color filter layer, e.g., a blue color filter layer, corresponding to the third pixel region P3.

In the bottom-emission type organic light emitting display device 1000, the color filter layer can be disposed between the OLED D5 and the substrate 1010. On the other hand, in the top-emission type organic light emitting display device 1000, the color filter layer can be disposed on or over the OLED D5.

Figure 11:
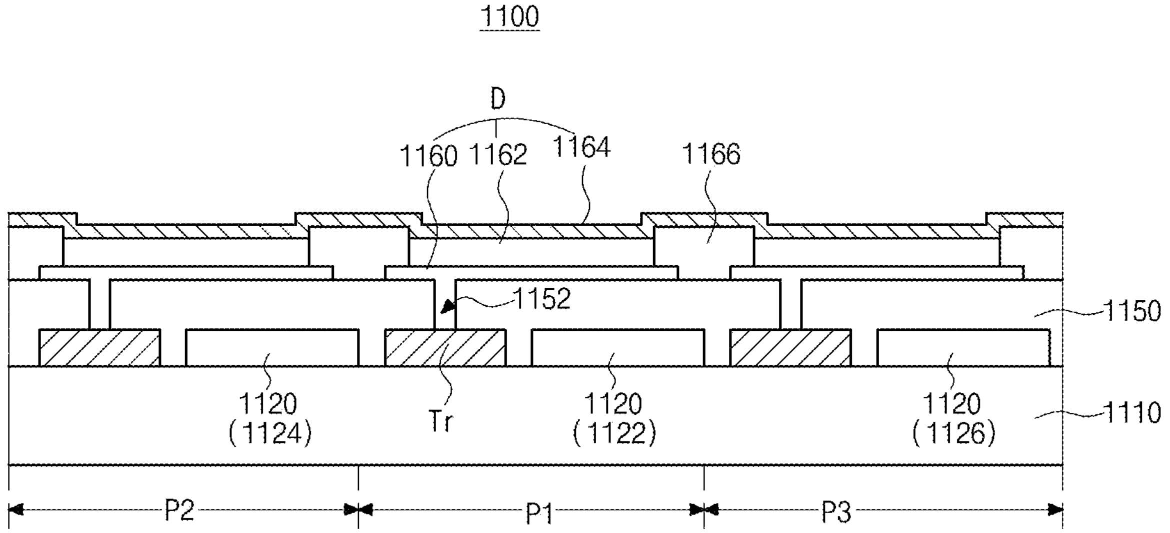
FIG. 11 is a schematic cross-sectional view of an organic light emitting display device according to an eighth embodiment of the present disclosure.

FIG. 11 is a schematic cross-sectional view of an organic light emitting display device according to an eighth embodiment of the present disclosure.

As shown in FIG. 11, the organic light emitting display device 1100 includes a substrate 1110, wherein first to third pixel regions P1, P2 and P3 are defined, a TFT Tr over the substrate 1110, an OLED D, which is disposed over the TFT Tr and is connected to the TFT Tr, and a color filter layer 1120 corresponding to the first to third pixel regions P1 to P3. For example, the first to third pixel regions P1, P2 and P3 can be a green pixel region, a red pixel region and a blue pixel region, respectively.

The substrate 1110 can be a glass substrate or a flexible substrate. For example, the flexible substrate can be a polyimide (PI) substrate, a polyethersulfone (PES) substrate, a polyethylenenaphthalate (PEN) substrate, a polyethylene terephthalate (PET) substrate or a polycarbonate (PC) substrate.

The TFT Tr is formed on the substrate 1110. Alternatively, a buffer layer can be formed on the substrate 1110, and the TFT Tr can be formed on the buffer layer.

As explained with FIG. 2, the TFT Tr can include a semiconductor layer, a gate electrode, a source electrode and a drain electrode and can serve as a driving element.

In addition, the color filter layer 1120 is disposed on the substrate 1110. For example, the color filter layer 1120 can include a first color filter layer 1122 corresponding to the first pixel region P1, a second color filter layer 1124 corresponding to the second pixel region P2, and a third color filter layer 1126 corresponding to the third pixel region P3. The first to third color filter layers 1122, 1124 and 1126 can be a green color filter layer, a red color filter layer and a blue color filter layer, respectively. For example, the first color filter layer 1122 can include at least one of a green dye and a green pigment, and the second color filter layer 1124 can include at least one of a red dye and a red pigment. The third color filter layer 1126 can include at least one of a blue dye and a blue pigment.

A planarization layer (or passivation layer) 1150 is formed on the TFT Tr and the color filter layer 1120. The planarization layer 1150 has a flat top surface and includes a drain contact hole 1152 exposing the drain electrode of the TFT Tr.

The OLED D is disposed on the planarization layer 1150 and corresponds to the color filter layer 1120. The OLED D includes a first electrode 1160, a light emitting layer 1162 and a second electrode 1164. The first electrode 1160 is connected to the drain electrode of the TFT Tr, and the light emitting layer 1162 and the second electrode 1164 are sequentially stacked on the first electrode 1160. The OLED D emits the white light in each of the first to third pixel regions P1 to P3.

The first electrode 1160 is formed to be separate in the first to third pixel regions P1 to P3, and the second electrode 1164 is formed as one-body to cover the first to third pixel regions P1 to P3.

The first electrode 1160 is one of an anode and a cathode, and the second electrode 1164 is the other one of the anode and the cathode. In addition, the first electrode 1160 can be a light transmitting electrode (or a semi-transmitting electrode), and the second electrode 1164 can be a reflecting electrode.

For example, the first electrode 1160 can be the anode and can include a transparent conductive oxide material layer formed of a transparent conductive oxide (TCO) material having a relatively high work function. The second electrode 1164 can be the cathode and can include a metallic material layer formed of a low resistance metallic material having a relatively low work function. For example, the transparent conductive oxide material layer of the first electrode 1160 include at least one of indium-tin-oxide (ITO), indium-zinc-oxide (IZO), indium-tin-zinc oxide (ITZO), tin oxide (SnO), zinc oxide (ZnO), indium-copper-oxide (ICO) and aluminum-zinc oxide alloy (Al:ZnO), and the second electrode 1164 can include Al, Mg, Ca, Ag, their alloy, e.g., Mg—Ag alloy, or their combination.

The light emitting layer 1162 as an emitting unit is formed on the first electrode 1160. The light emitting layer 1162 includes at least two emitting parts emitting different color light. Each emitting part can have a single-layered structure of an EML. Alternatively, each emitting part can further include at least one of an HIL, an HTL, an EBL, an HBL, an ETL and an EIL. In addition, the light emitting layer 1162 can further include a charge generation layer (CGL) between the emitting parts.

The EML of one of the emitting parts includes the first compound represented by Formula 1-1 being the delayed fluorescent material and the second compound represented by Formula 2-1 being the fluorescent material. Namely, the EML of one of the emitting parts includes the delayed fluorescent material and the fluorescent material. The EML of one of the emitting parts can further include a third compound as a host. The third compound can be represented by Formula 3-1.

A bank layer 1166 is formed on the planarization layer 1150 to cover an edge of the first electrode 1160. Namely, the bank layer 1166 is positioned at a boundary of the first to third pixel regions P1 to P3 and exposes a center of the first electrode 1160 in the first to third pixel regions P1 to P3. As mentioned above, since the OLED D emits the white light in the first to third pixel regions P1 to P3, the light emitting layer 1162 can be formed as a common layer in the first to third pixel regions P1 to P3 without separation in the first to third pixel regions P1 to P3. The bank layer 1166 can be formed to prevent the current leakage at an edge of the first electrode 1160 and can be omitted.

Although, the organic light emitting display device 1100 can further include an encapsulation film which is formed on the second electrode 1164 to prevent penetration of moisture into the OLED D. In addition, the organic light emitting display device 1100 can further include a polarization plate under the substrate 1110 for reducing an ambient light reflection.

In the organic light emitting display device 1100 of FIG. 11, the first electrode 1160 is a transparent electrode (light transmitting electrode), and the second electrode 1164 is a reflecting electrode. In addition, the color filter layer 1120 is positioned between the substrate 1110 and the OLED D. Namely, the organic light emitting display device 1100 is a bottom-emission type.

Alternatively, in the organic light emitting display device 1100, the first electrode 1160 can be a reflecting electrode, and the second electrode 1164 can be a transparent electrode (or a semi-transparent electrode). In this case, the color filter layer 1120 is positioned on or over the OLED D.

In the organic light emitting display device 1100, the OLED D in the first to third pixel regions P1 to P3 emits the white light, and the white light passes through the first to third color filter layers 1122, 1124 and 1126. Accordingly, the green light, the red light and the blue light are displayed in the first to third pixel regions P1 to P3, respectively.

A color conversion layer can be formed between the OLED D and the color filter layer 1120. The color conversion layer can include a green color conversion layer, a red color conversion layer and a blue color conversion layer respectively corresponding to the first to third pixel regions P1 to P3, and the white light from the OLED D can be converted into the green light, the red light and the blue light. The color conversion layer can include a quantum dot. Accordingly, the color purity of the OLED D can be further improved.

The color conversion layer can be included instead of the color filter layer 1120.

Figure 12:
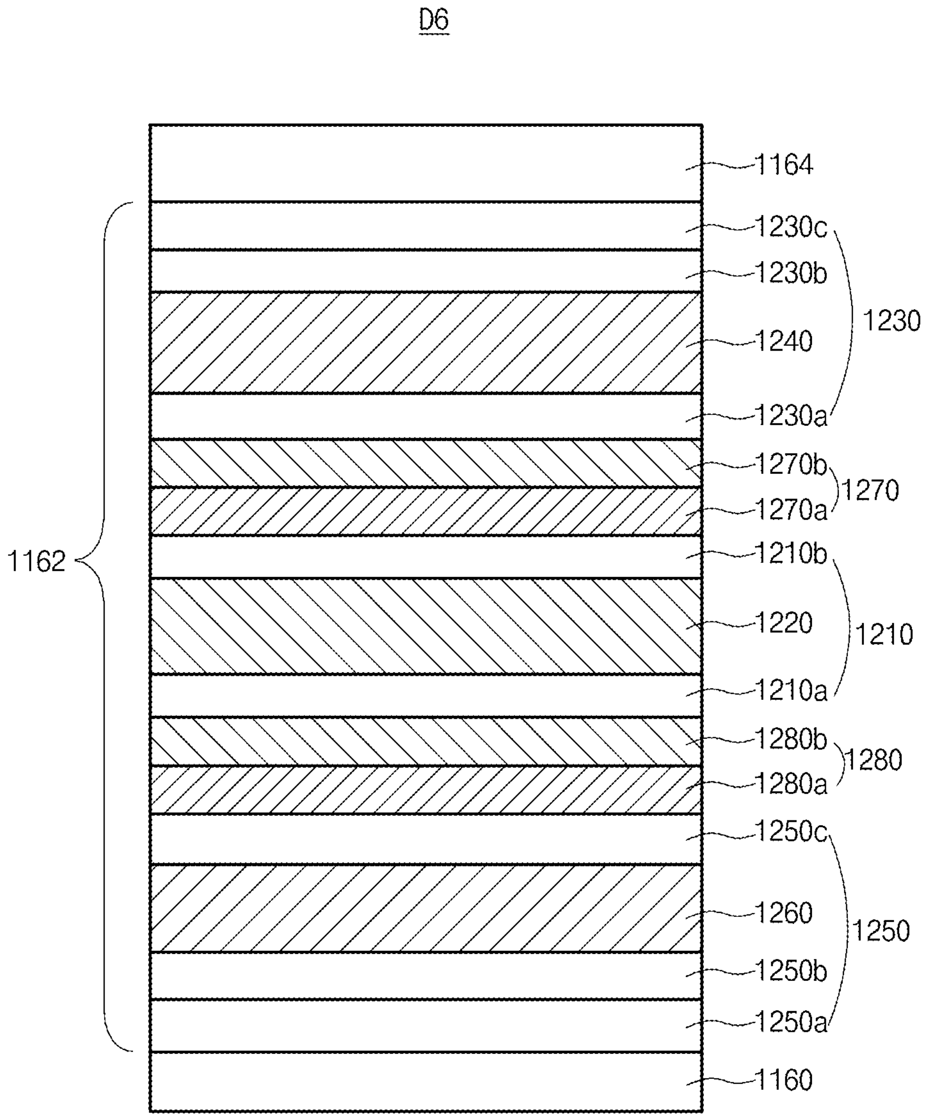
FIG. 12 is a schematic cross-sectional view of an OLED according to a ninth embodiment of the present disclosure.

FIG. 12 is a schematic cross-sectional view of an OLED according to a ninth embodiment of the present disclosure.

As shown in FIG. 12, the OLED D6 includes the first and second electrodes 1160 and 1164, which face each other, and the light emitting layer 1162 therebetween.

The first electrode 1160 can be an anode, and the second electrode 1164 can be a cathode. The first electrode 1160 is a transparent electrode (a light transmitting electrode), and the second electrode 1164 is a reflecting electrode.

The light emitting layer 1162 includes a first emitting part 1210 including a first EML 1220, a second emitting part 1230 including a second EML 1240 and a third emitting part 1250 including a third EML 1260. In addition, the light emitting layer 1162 can further include a first CGL 1270 between the first and second emitting parts 1210 and 1230 and a second CGL 1280 between the first emitting part 1210 and the third emitting part 1250.

The first CGL 1270 is positioned between the first and second emitting parts 1210 and 1230, and the second CGL 1280 is positioned between the first and third emitting parts 1210 and 1250. Namely, the third emitting part 1250, the second CGL 1280, the first emitting part 1210, the first CGL 1270 and the second emitting part 1230 are sequentially stacked on the first electrode 1160. In other words, the first emitting part 1210 is positioned between the first and second CGLs 1270 and 1280, and the second emitting part 1230 is positioned between the first CGL 1270 and the second electrode 1164. The third emitting part 1250 is positioned between the second CGL 1280 and the first electrode 1160.

The first emitting part 1210 can further include a first HTL 1210*a* under the first EML 1220 and a first ETL 1210*b* over the first EML 1220. Namely, the first HTL 1210*a* can positioned between the first EML 1220 and the second CGL 1270, and the first ETL 1210*b* can be positioned between the first EML 1220 and the first CGL 1270.

In addition, the first emitting part 1210 can further include an EBL between the first HTL 1210*a* and the first EML 1220 and an HBL between the first ETL 1210*b* and the first EML 1220.

The second emitting part 1230 can further include a second HTL 1230*a* under the second EML 1240, a second ETL 1230*b* over the second EML 1240 and an EIL 1230*c* on the second ETL 1230*b*. Namely, the second HTL 1230*a* can be positioned between the second EML 1240 and the first CGL 1270, and the second ETL 1230*b* and the EIL 1230*c* can be positioned between the second EML 1240 and the second electrode 1164.

In addition, the second emitting part 1230 can further include an EBL between the second HTL 1230*a* and the second EML 1240 and an HBL between the second ETL 1230*b* and the second EML 1240.

The third emitting part 1250 can further include a third HTL 1250*b* under the third EML 1260, an HIL 1250*a* under the third HTL 1250*b* and a third ETL 1250*c* over the third EML 1260. Namely, the HIL 1250*a* and the third HTL 1250*b* can be positioned between the first electrode 1160 and the third EML 1260, and the third ETL 1250*c* can be positioned between the third EML 1260 and the second CGL 1280.

In addition, the third emitting part 1250 can further include an EBL between the third HTL 1250*b* and the third EML 1260 and an HBL between the third ETL 1250*c* and the third EML 1260.

One of the first to third EMLs 1220, 1240 and 1260 is a green EML. Another one of the first to third EMLs 1220, 1240 and 1260 can be a blue EML, and the other one of the first to third EMLs 1220, 1240 and 1260 can be a red EML.

For example, the first EML 1220 can be the green EML, the second EML 1240 can be the blue EML, and the third EML 1260 can be the red EML. Alternatively, the first EML 1220 can be the green EML, the second EML 1240 can be the red EML, and the third EML 1260 can be the blue EML.

The first EML 1220 includes the first compound being the delayed fluorescent material and the second compound being the fluorescent material. The first EML 1220 can further include a third compound as a host. The first compound is represented by Formula 1-1, and the second compound is represented by Formula 2-1. The third compound can be represented by Formula 3-1.

In the first EML 1220, the weight % of the first compound can be greater than that of second compound and can be equal to or greater than that of the third compound. When the weight % of the first compound is greater than that of the second compound, the energy transfer from the first compound to the second compound is efficiently generated. For example, in the first EML 1220, the second compound can have a weight % of 0.01 to 10, preferably 0.01 to 5, more preferably 0.1 to 5, the first compound can have a weight % of 30 to 60, preferably 40 to 60, preferably 40 to 50 or 45 to 55, but it is not limited thereto.

The second EML 1240 includes a host and a blue dopant (or a red dopant), and the third EML 1260 includes a host and a red dopant (or a blue dopant). For example, in each of the second and third EMLs 1240 and 1260, the dopant can include at least one of a phosphorescent compound, a fluorescent compound and a delayed fluorescent compound.

The OLED D6 in the first to third pixel regions P1 to P3 (of FIG. 11) emits the white light, and the white light passes through the color filter layer 1120 (of FIG. 11) in the first to third pixel regions P1 to P3. Accordingly, the organic light emitting display device 1100 (of FIG. 11) can provide a full-color image.

Figure 13:
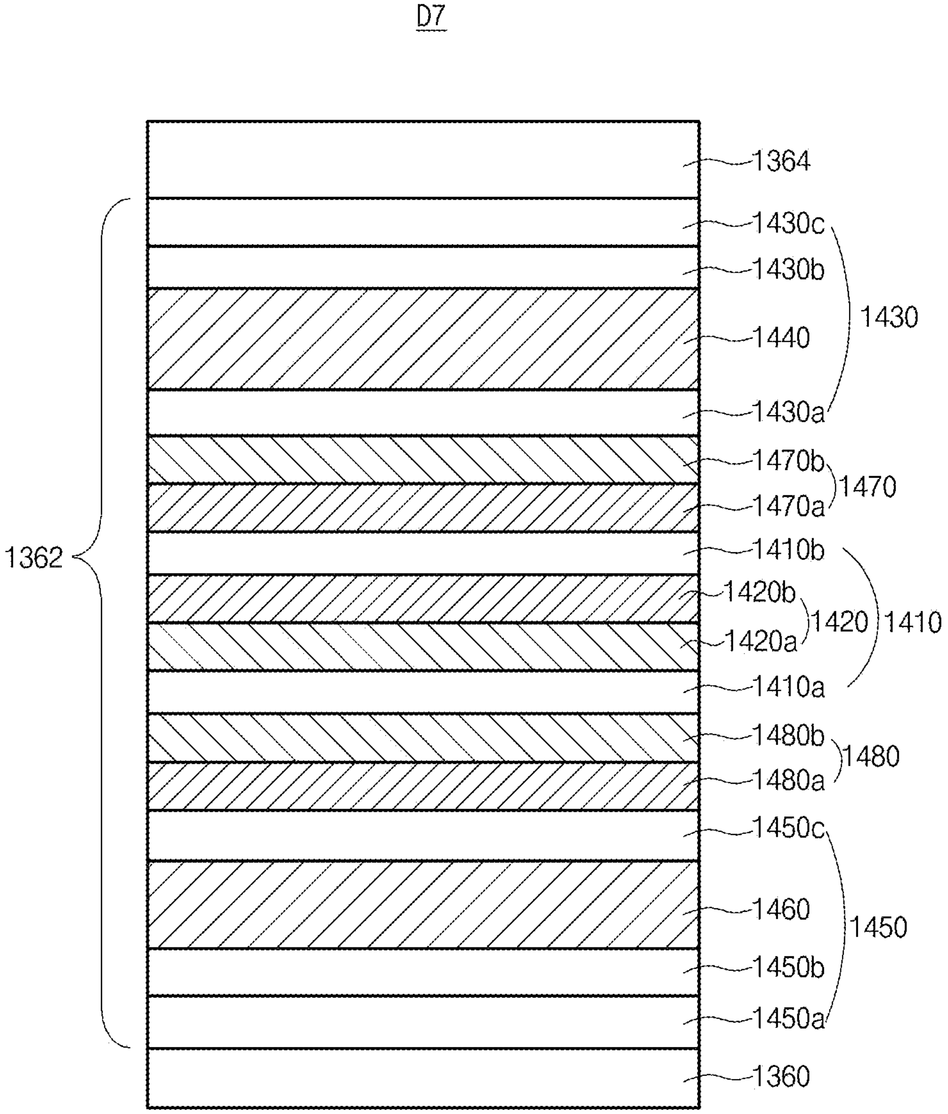
FIG. 13 is a schematic cross-sectional view of an OLED according to a tenth embodiment of the present disclosure.

FIG. 13 is a schematic cross-sectional view of an OLED according to a tenth embodiment of the present disclosure.

As shown in FIG. 13, the OLED D7 includes the first and second electrodes 1360 and 1364, which face each other, and the light emitting layer 1362 therebetween.

The first electrode 1360 can be an anode, and the second electrode 1364 can be a cathode. The first electrode 1360 is a transparent electrode (a light transmitting electrode), and the second electrode 1364 is a reflecting electrode.

The light emitting layer 1362 includes a first emitting part 1410 including a first EML 1420, a second emitting part 1430 including a second EML 1440 and a third emitting part 1450 including a third EML 1460. In addition, the light emitting layer 1362 can further include a first CGL 1470 between the first and second emitting parts 1410 and 1430 and a second CGL 1480 between the first emitting part 1410 and the third emitting part 1450.

The first EML 1420 includes a lower EML 1420*a* and an upper EML 1420*b*. Namely, the lower EML 1420*a* is positioned to be closer to the first electrode 1360, and the upper EML 1420*b* is positioned to be closer to the second electrode 1364.

The first CGL 1470 is positioned between the first and second emitting parts 1410 and 1430, and the second CGL 1480 is positioned between the first and third emitting parts 1410 and 1450. Namely, the third emitting part 1450, the second CGL 1480, the first emitting part 1410, the first CGL 1470 and the second emitting part 1430 are sequentially stacked on the first electrode 1360. In other words, the first emitting part 1410 is positioned between the first and second CGLs 1470 and 1480, and the second emitting part 1430 is positioned between the first CGL 1470 and the second electrode 1364. The third emitting part 1450 is positioned between the second CGL 1480 and the first electrode 1360.

The first emitting part 1410 can further include a first HTL 1410*a* under the first EML 1420 and a first ETL 1410*b* over the first EML 1420. Namely, the first HTL 1410*a* can positioned between the first EML 1420 and the second CGL 1470, and the first ETL 1410*b* can be positioned between the first EML 1420 and the first CGL 1470.

In addition, the first emitting part 1410 can further include an EBL between the first HTL 1410*a* and the first EML 1420 and an HBL between the first ETL 1410*b* and the first EML 1420.

The second emitting part 1430 can further include a second HTL 1430*a* under the second EML 1440, a second ETL 1430*b* over the second EML 1440 and an EIL 1430*c* on the second ETL 1430*b*. Namely, the second HTL 1430*a* can be positioned between the second EML 1440 and the first CGL 1470, and the second ETL 1430*b* and the EIL 1430*c* can be positioned between the second EML 1440 and the second electrode 1364.

In addition, the second emitting part 1430 can further include an EBL between the second HTL 1430*a* and the second EML 1440 and an HBL between the second ETL 1430*b* and the second EML 1440.

The third emitting part 1450 can further include a third HTL 1450*b* under the third EML 1460, an HIL 1450*a* under the third HTL 1450*b* and a third ETL 1450*c* over the third EML 1460. Namely, the HIL 1450*a* and the third HTL 1450*b* can be positioned between the first electrode 1360 and the third EML 1460, and the third ETL 1450*c* can be positioned between the third EML 1460 and the second CGL 1480.

In addition, the third emitting part 1450 can further include an EBL between the third HTL 1450*b* and the third EML 1460 and an HBL between the third ETL 1450*c* and the third EML 1460.

One of the lower and upper EMLs 1420*a* and 1420*b* of the first EML 1420 is a green EML, and the other one of the lower and upper EMLs 1420*a* and 1420*b* of the first EML 1420 can be a red EML. Namely, the green EML (or the red EML) and the red EML (or the green EML) are sequentially stacked to form the first EML 1420.

For example, the upper EML 1420*b* being the green EML includes the first compound being the delayed fluorescent material and the second compound being the fluorescent material. The upper EML 1420*b* can further include a third compound as a host. The first compound is represented by Formula 1-1, and the second compound is represented by Formula 2-1. The third compound can be represented by Formula 3-1.

In the upper EML 1420*b*, the weight % of the first compound can be greater than that of second compound and can be equal to or greater than that of the third compound. When the weight % of the first compound is greater than that of the second compound, the energy transfer from the first compound to the second compound is efficiently generated. For example, in the upper EML 1420*b*, the second compound can have a weight % of 0.01 to 10, preferably 0.01 to 5, more preferably 0.1 to 5, the first compound can have a weight % of 30 to 60, preferably 40 to 60, preferably 40 to 50 or 45 to 55, but it is not limited thereto.

The lower EML 1420*a* being the red EML can include a host and a red dopant.

Each of the second and third EMLs 1440 and 1460 can be a blue EML. Each of the second and third EMLs 1440 and 1460 can include a host and a blue dopant. The host and the dopant of the second EML 1440 can be same as the host and the dopant of the third EML 1460. Alternatively, the host and the dopant of the second EML 1440 can be different from the host and the dopant of the third EML 1460. For example, the dopant in the second EML 1440 can have a difference in the emitting efficiency and/or the emitting light wavelength from the dopant in the third EML 1460.

In each of the lower EML 1420*a*, the second EML 1440 and the third EML 1460, the dopant can include at least one of a phosphorescent compound, a fluorescent compound and a delayed fluorescent compound.

The OLED D7 in the first to third pixel regions P1 to P3 (of FIG. 11) emits the white light, and the white light passes through the color filter layer 1120 (of FIG. 11) in the first to third pixel regions P1 to P3. Accordingly, the organic light emitting display device 1100 (of FIG. 11) can provide a full-color image.

In FIG. 13, the OLED D7 has a three-stack (triple-stack) structure including the second and third EMLs 1440 and 1460 being the blue EML with the first EML 1420. Alternatively, one of the second and third EMLs 1440 and 1460 can be omitted such that the OLED D7 can have a two-stack (double-stack) structure.

It will be apparent to those skilled in the art that various modifications and variations can be made in the present disclosure without departing from the spirit or scope of the present disclosure. Thus, it is intended that the present disclosure cover the modifications and variations of this disclosure provided they come within the scope of the appended claims and their equivalents.

What is claimed is:

1. An organic light emitting diode, comprising:

a first electrode;

a second electrode facing the first electrode; and a first emitting material layer including a first compound and a second compound and positioned between the first and second electrodes, wherein the first compound is represented by Formula 1-1:

[Formula 1-1]

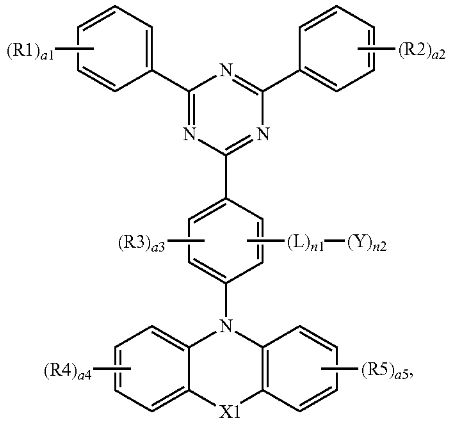

wherein X1 is one of a single bond, $C(R6)_2$, NR7, O and S, wherein Y is selected from the group consisting of a cyano group (—CN), a nitro group (—$NO_2$), halogen, a C1 to C20 alkyl group substituted with at least one of a cyano group, a nitro group and halogen, a C6 to C30 aryl group substituted with at least one of a cyano group, a nitro group and halogen and a C3 to C40 heteroaryl group substituted with at least one of a cyano group, a nitro group and halogen, wherein each of R1 to R7 is independently selected from the group consisting of deuterium, tritium, a substituted or unsubstituted C1 to C20 alkyl group, a substituted or unsubstituted C6 to C30 aryl group and a substituted or unsubstituted C3 to C40 heteroaryl group, or adjacent two of R1 to R7 are connected to form an aromatic ring or a heteroaromatic ring, wherein L is a C6 to C30 arylene group, wherein each of a1 and a2 is independently an integer of 0 to 5, wherein a3 is an integer of 0 to 3, wherein each of a4 and a5 is independently an integer of 0 to 4, wherein n1 is 1 or 2, and n2 is an integer of 1 to 5, wherein the second compound is represented by Formula 2-1:

[Formula 2-1]

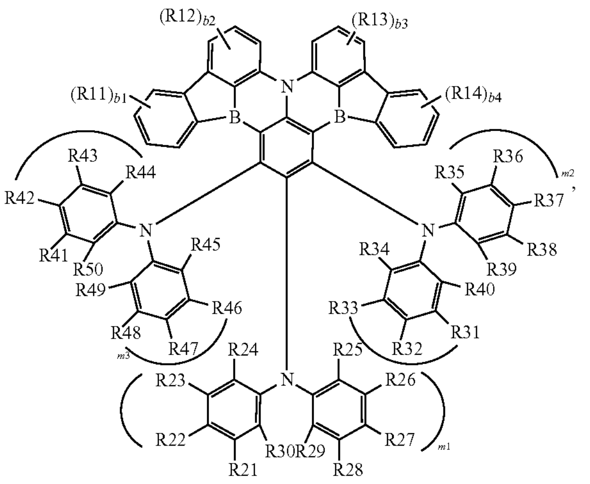

wherein each of R11 to R14 is independently selected from the group consisting of deuterium, tritium, a substituted or unsubstituted C1 to C20 alkyl group, a substituted or unsubstituted C6 to C30 aryl group and a substituted or unsubstituted C3 to C40, or adjacent two of R11 to R14 are connected to form an aromatic ring or a heteroaromatic ring, wherein each of R21 to R28, R31 to R38 and R41 to R48 is independently selected from the group consisting of hydrogen, deuterium, tritium, a substituted or unsubstituted C1 to C20 alkyl group, a substituted or unsubstituted C6 to C30 aryl group and a substituted or unsubstituted C3 to C40 heteroaryl group, wherein each of R29, R30, R39, R40, R49 and R50 is independently selected from the group consisting of hydrogen, deuterium, tritium, a substituted or unsubstituted C1 to C20 alkyl group, a substituted or unsubstituted C6 to C30 aryl group and a substituted or unsubstituted C3 to C40 heteroaryl group, or at least one of a pair of R29 and R30, a pair of R39 and R40 and a pair of R49 and R50 is connected to each other to form a ring, wherein each of m1 to m3 is independently 0 or 1, and at least one of m1 to m3 is 1, and wherein each of b1 and b4 is independently an integer of 0 to 4, and each of b2 and b3 is independently an integer of 0 to 3.

2. The organic light emitting diode according to claim 1, wherein the Formula 1-1 is represented by Formula 1-2:

[Formula 1-2]

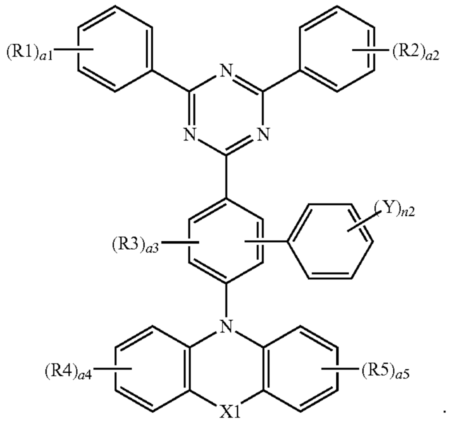

3. The organic light emitting diode according to claim 2, wherein the Formula 1-2 is represented by Formula 1-3:

[Formula 1-3]

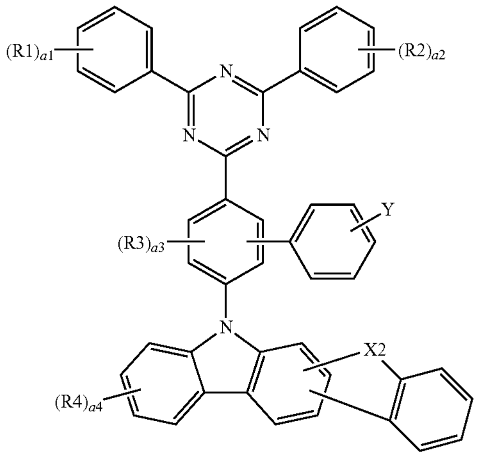

wherein X2 is one of NR8, O and S, and R8 is selected from the group consisting of hydrogen, deuterium, tritium, a substituted or unsubstituted C1 to C20 alkyl group, a substituted or unsubstituted C6 to C30 aryl group and a substituted or unsubstituted C3 to C40 heteroaryl group.

4. The organic light emitting diode according to claim 1, wherein the first compound is one of compounds in Formula 1-4:

[Formula 1-4]
1-1
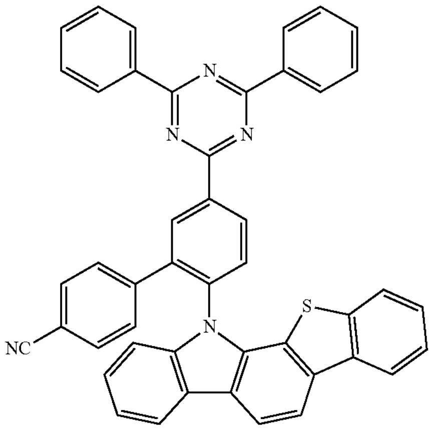
1-2
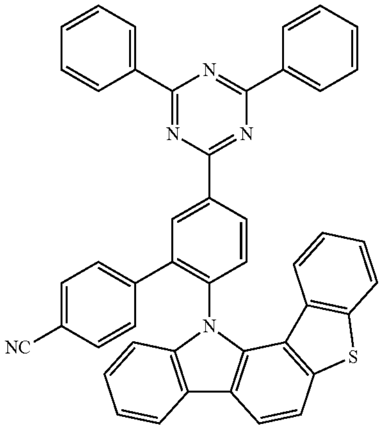
1-3
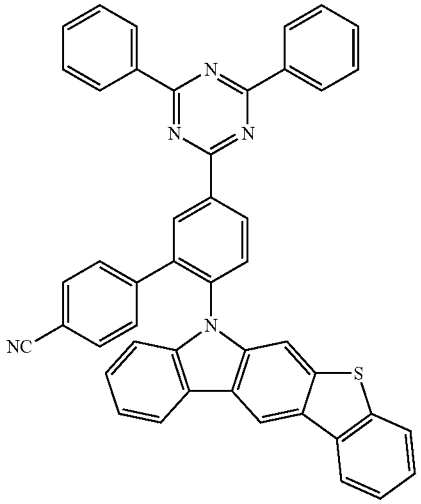
-continued
1-4
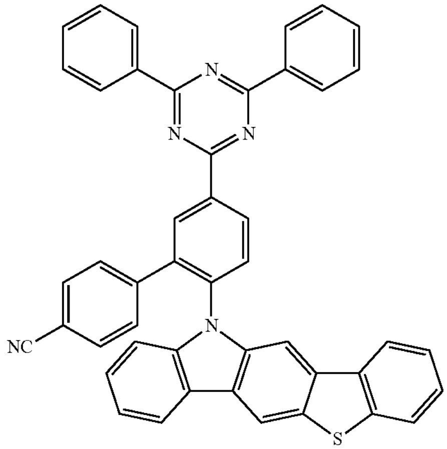
1-5
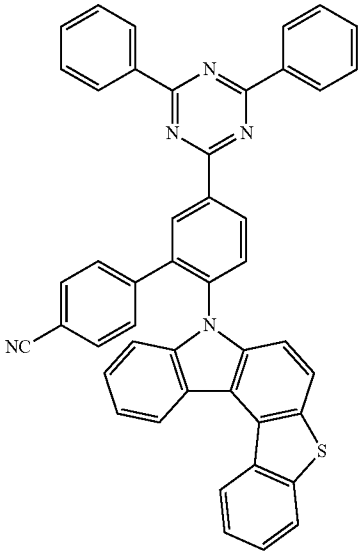
1-6
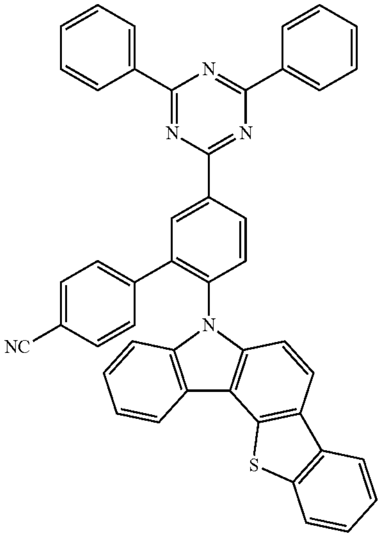

-continued
1-7
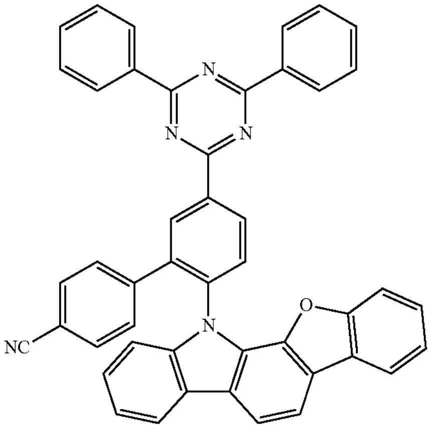
1-8
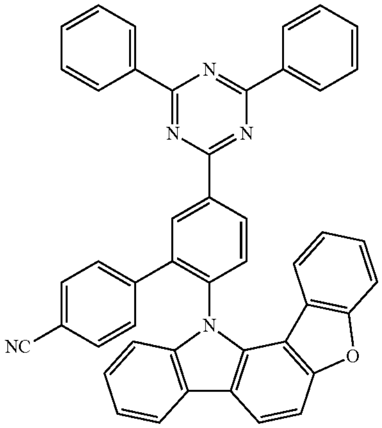
1-9
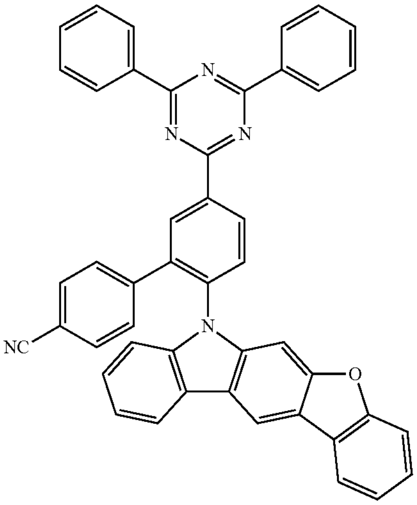
-continued
1-10
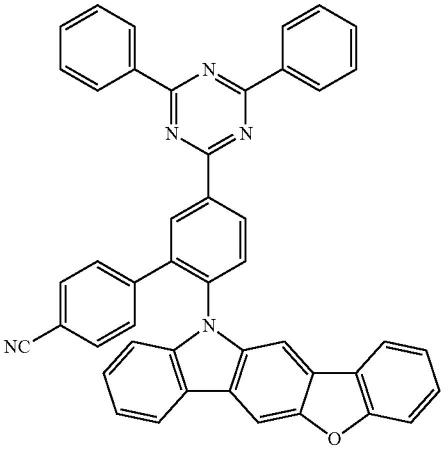
1-11
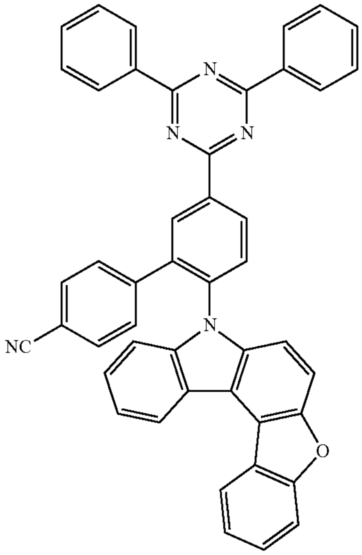
1-12
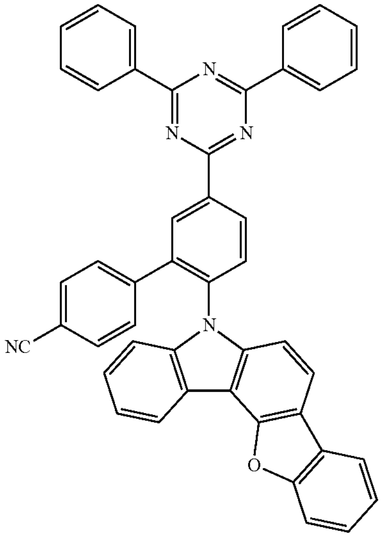

-continued
1-13
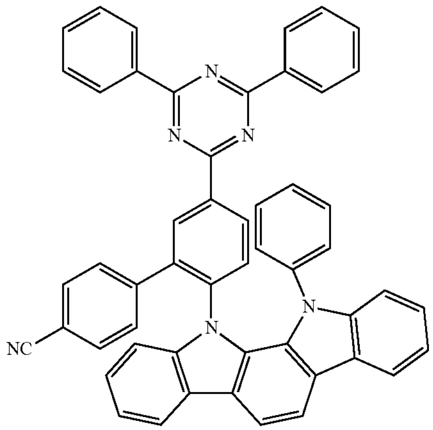
1-14
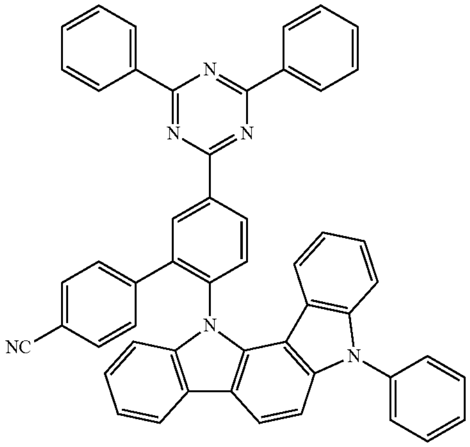
1-15
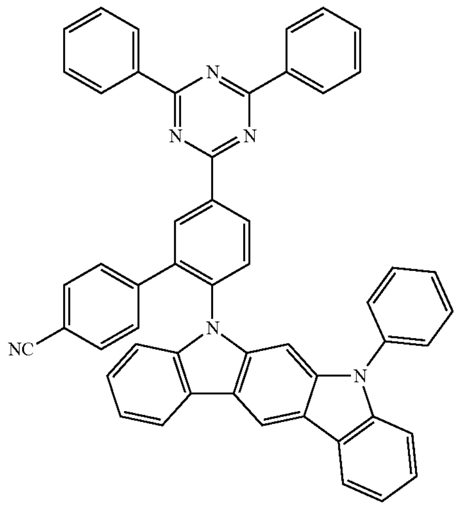
-continued
1-16
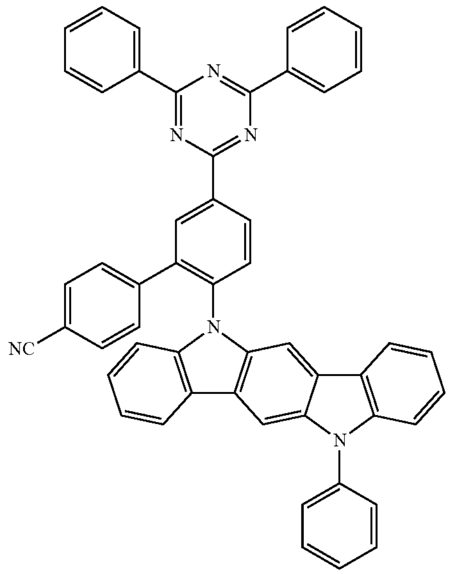
1-17
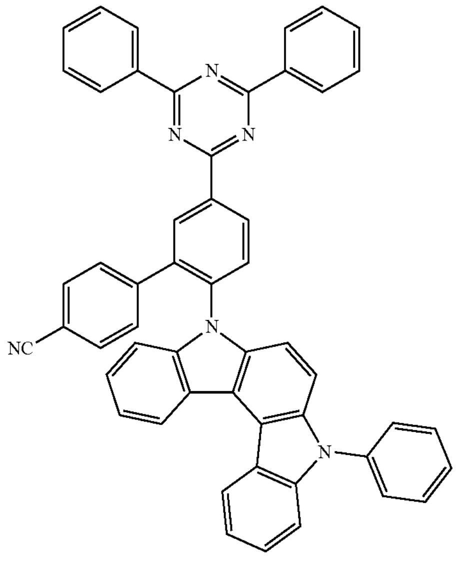

-continued
1-18
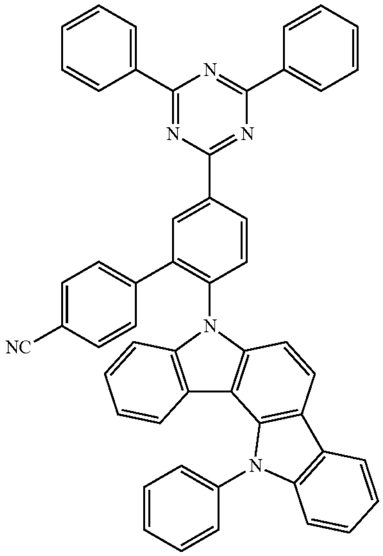
1-19
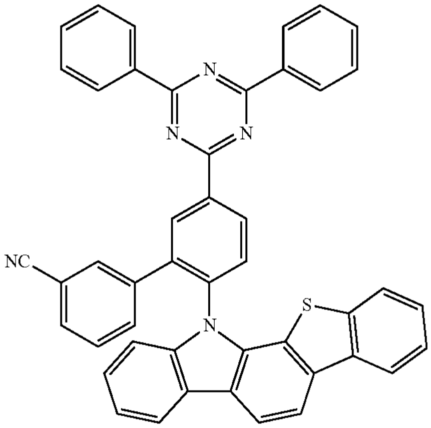
1-20
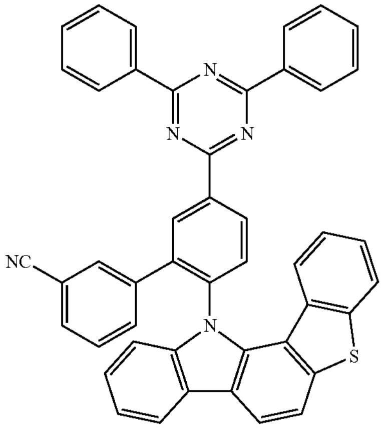
-continued
1-21
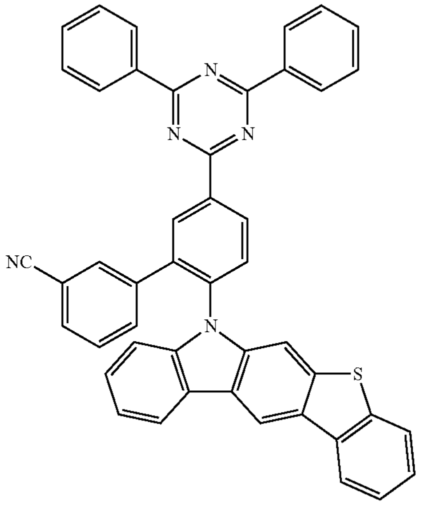
1-22
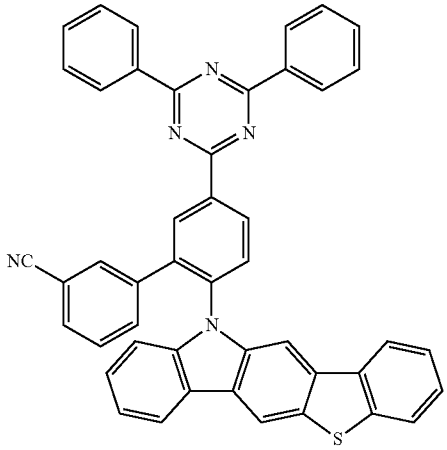
1-23
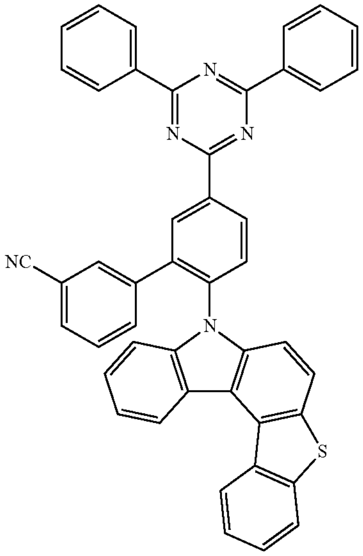

-continued
1-24
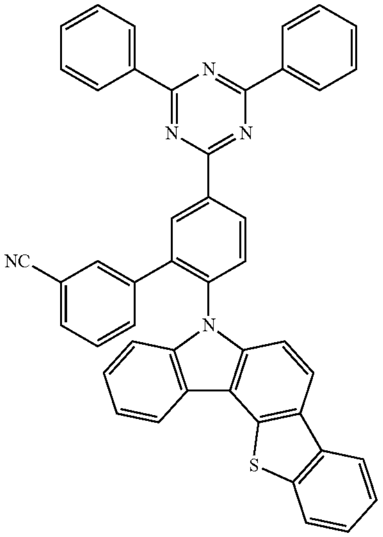
1-25
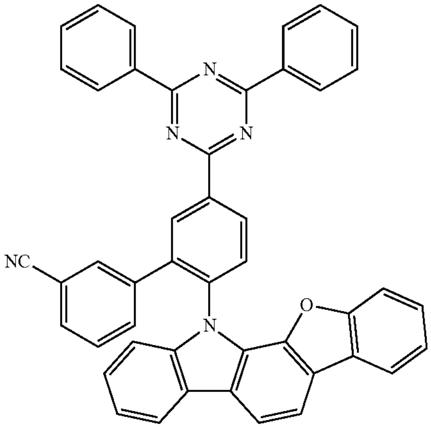
1-26
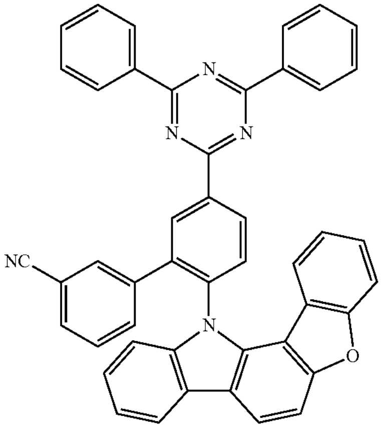
-continued
1-27
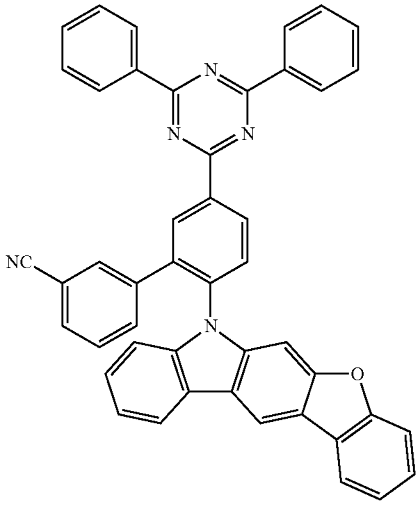
1-28
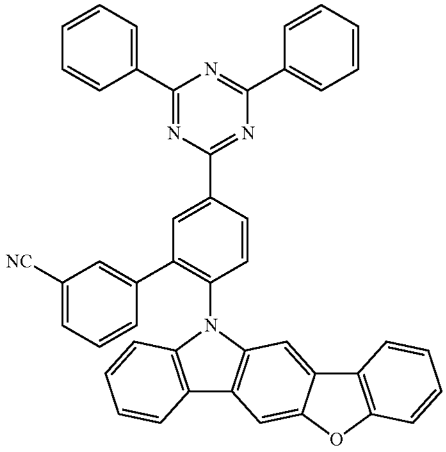
1-29
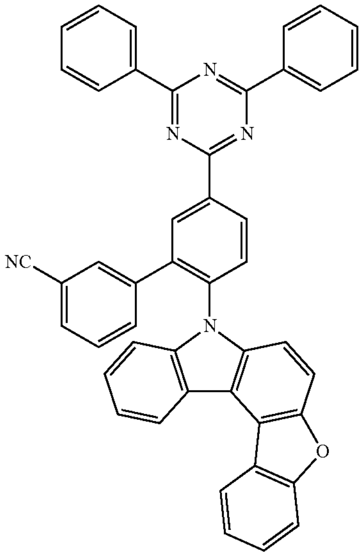

-continued
1-30
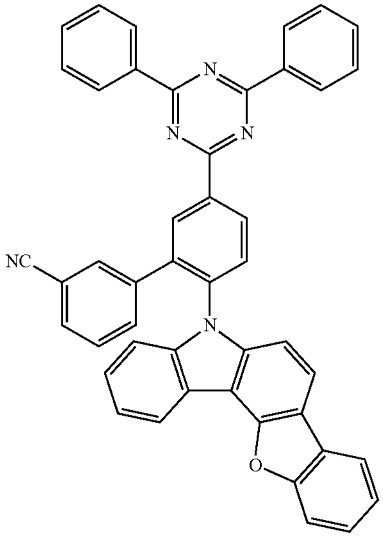
1-31
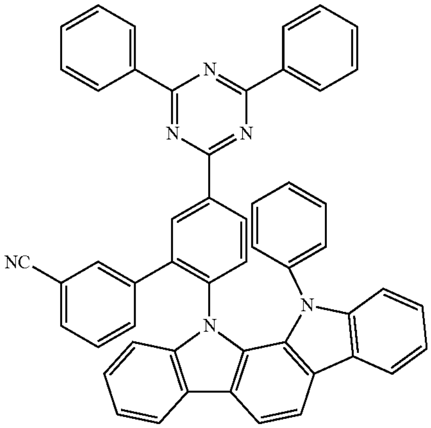
1-32
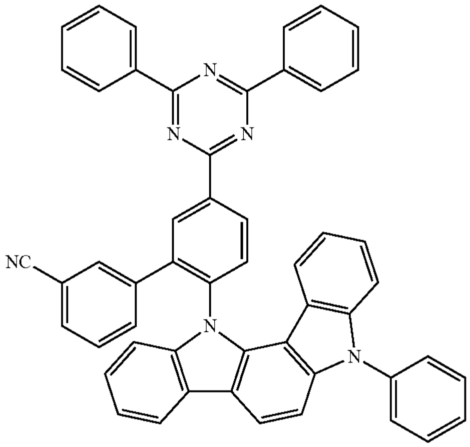
-continued
1-33
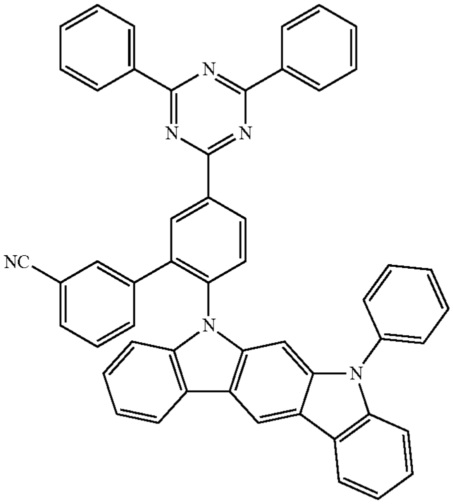
1-34
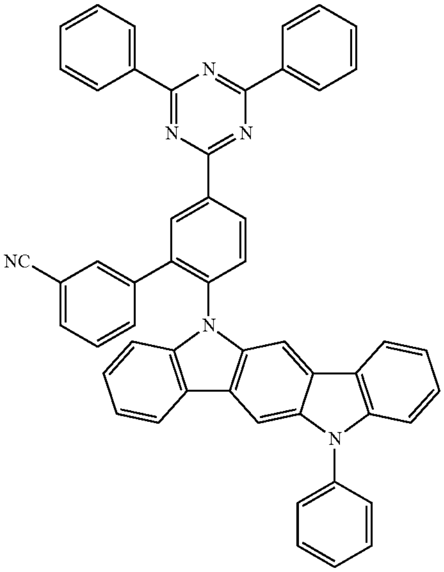

-continued
1-35
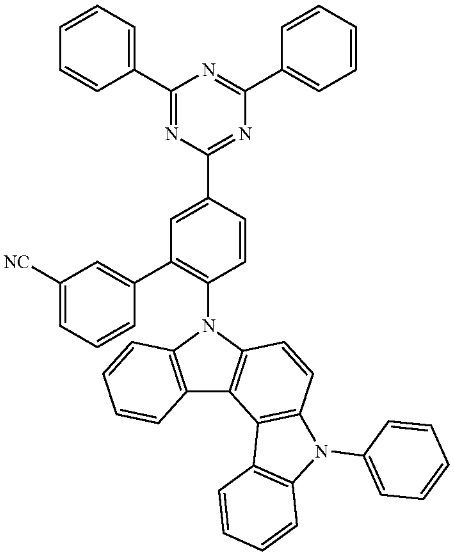
1-36
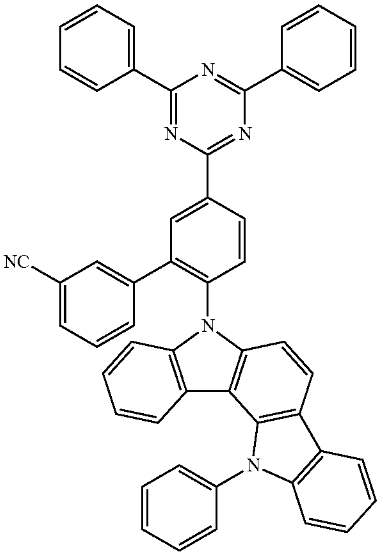
1-37
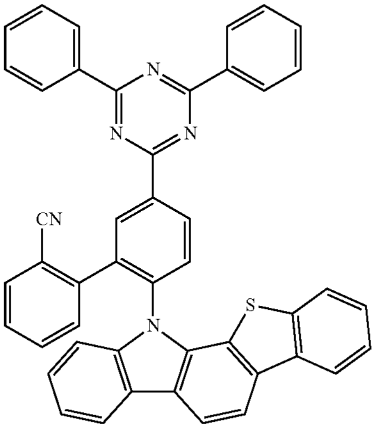
-continued
1-38
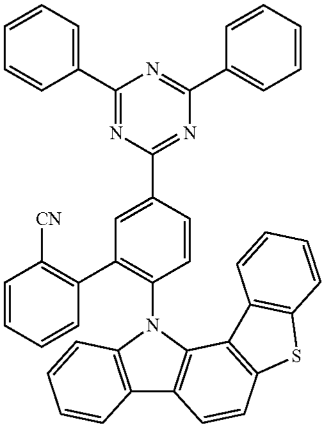
1-39
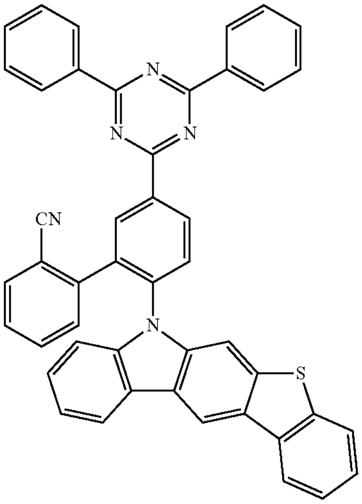
1-40
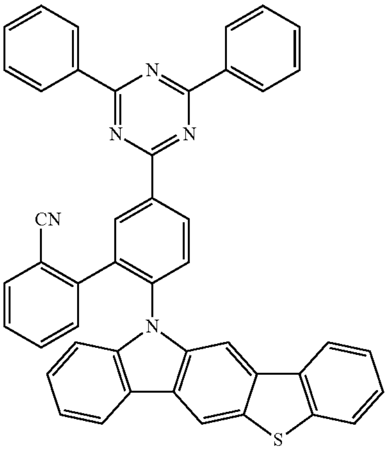

-continued
1-41
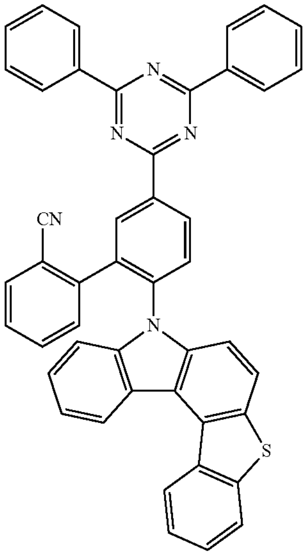
1-42
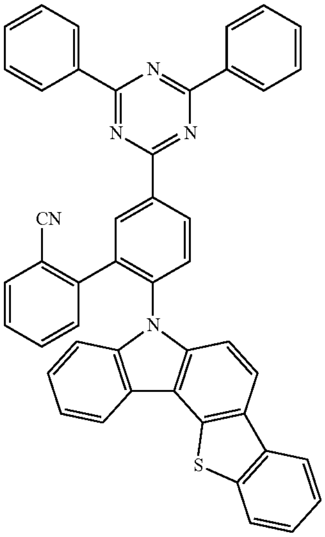
1-43
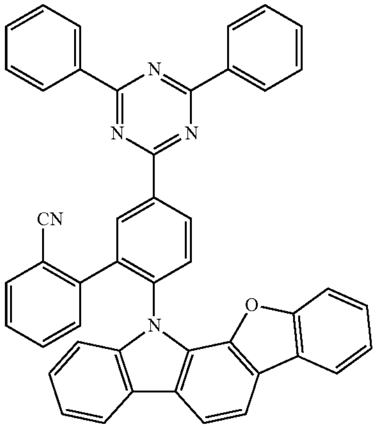
-continued
1-44
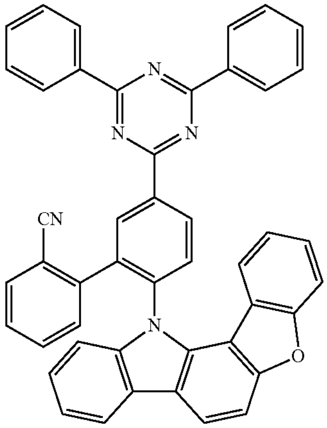
1-45
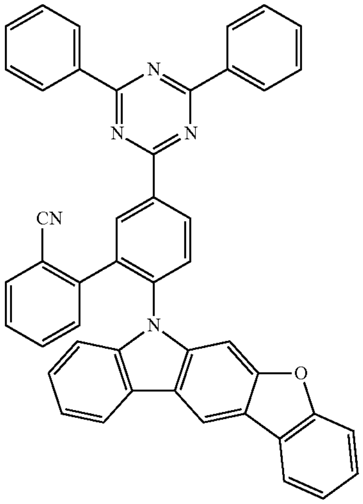
1-46
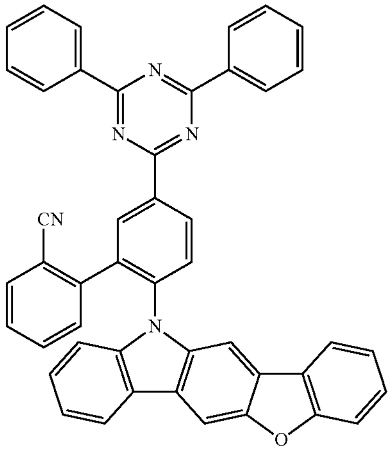

-continued
1-47
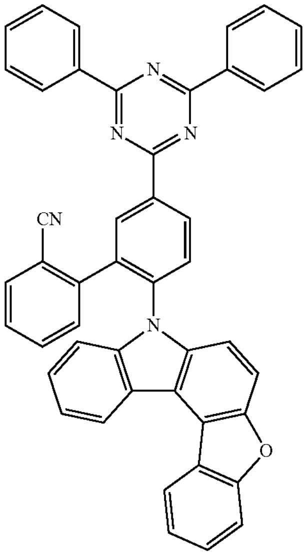
1-48
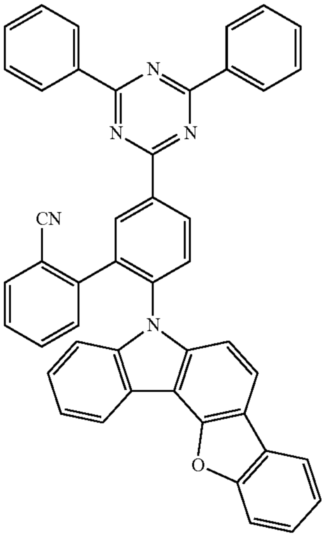
1-49
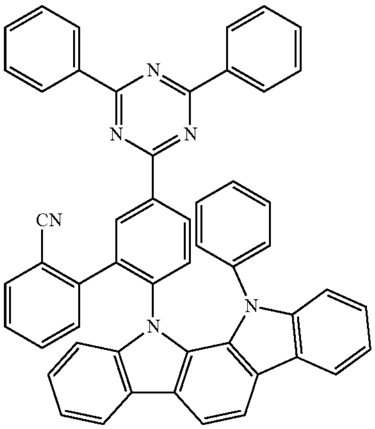
-continued
1-50
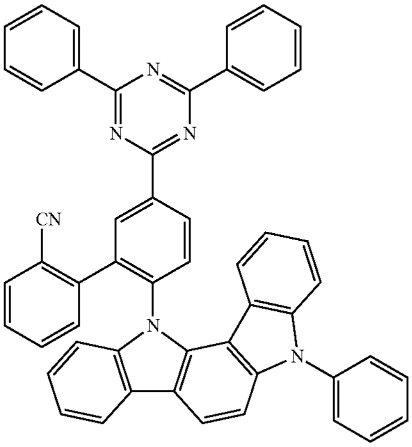
1-51
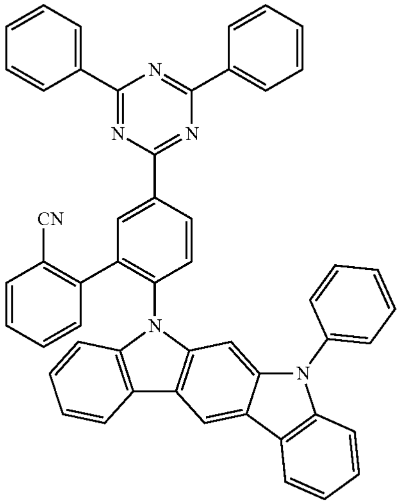
1-52
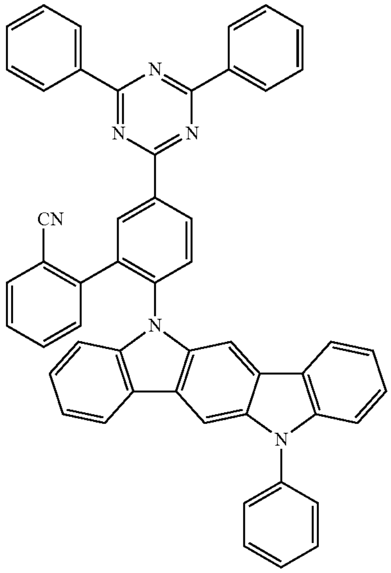

-continued
1-53
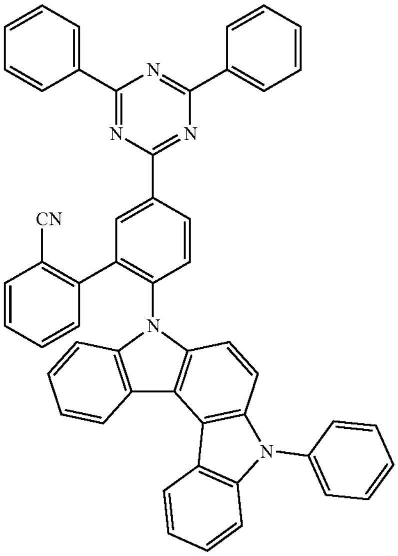
1-54
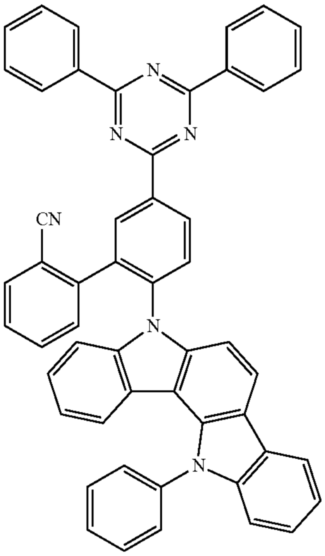
1-55
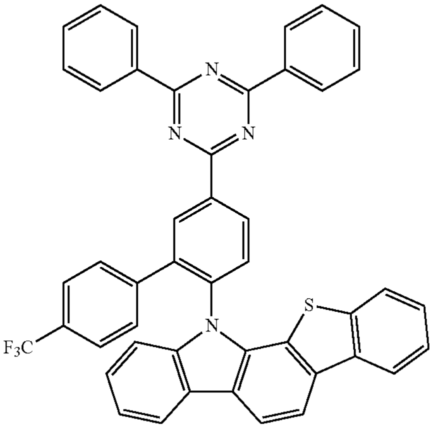
-continued
1-56
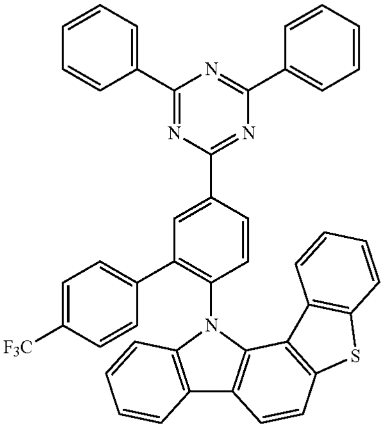
1-57
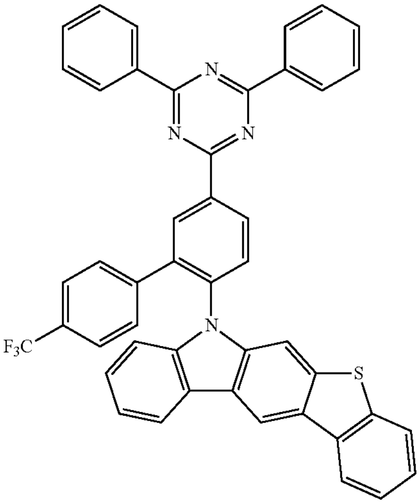
1-58
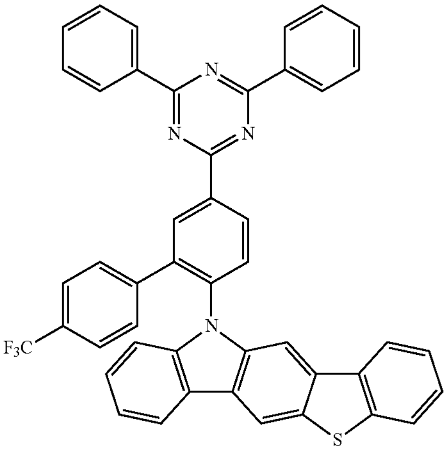

-continued
1-59
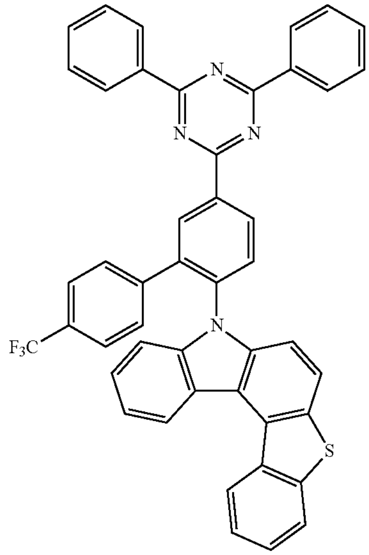
1-60
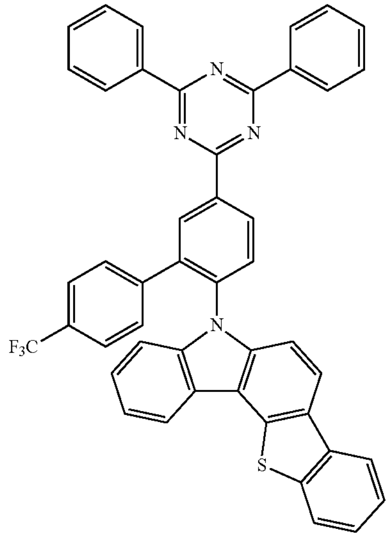
1-61
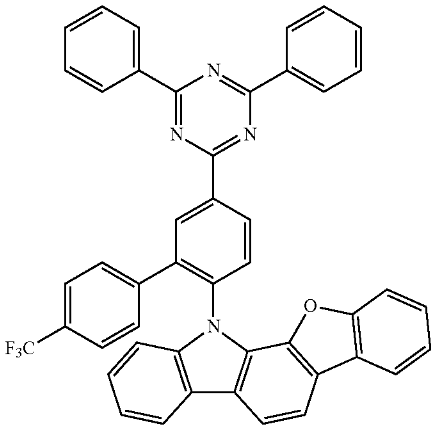
-continued
1-62
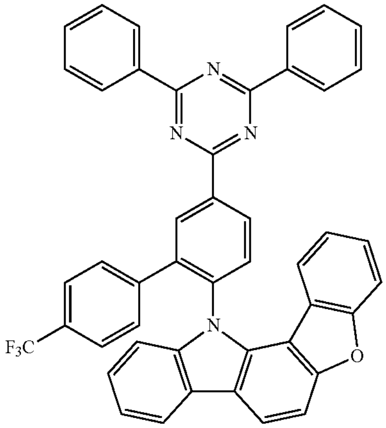
1-63
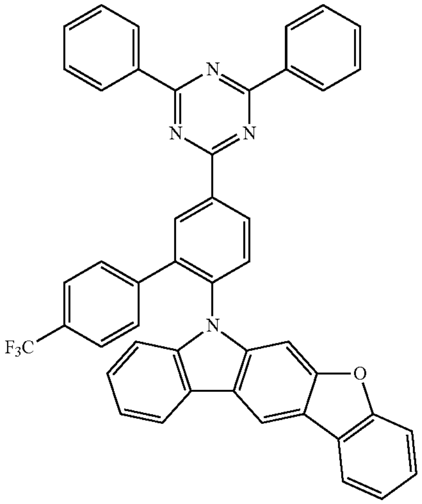
1-64
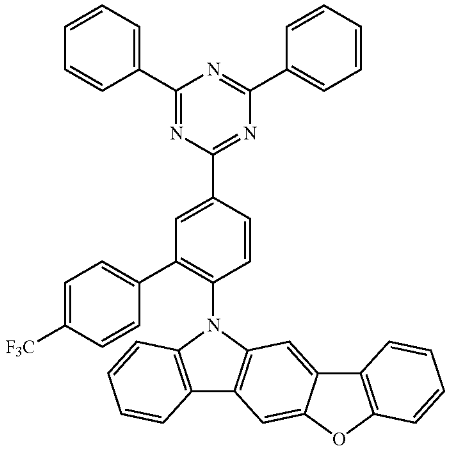

1-65
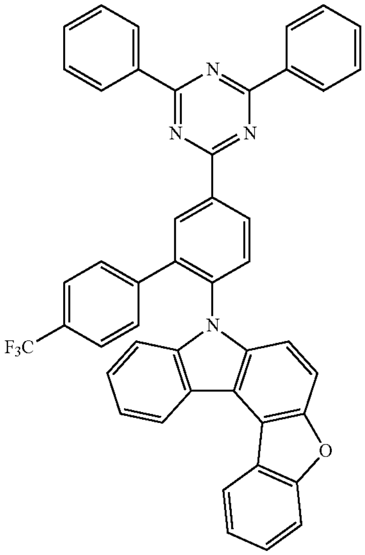
1-66
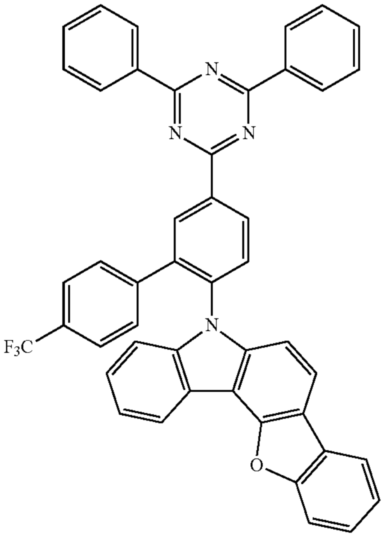
1-67
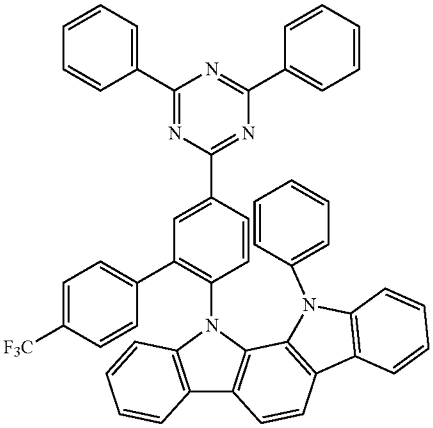
1-68
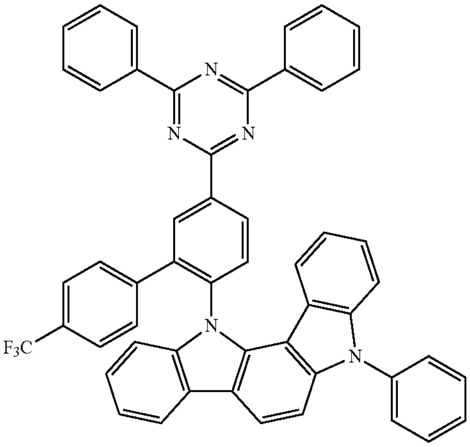
1-69
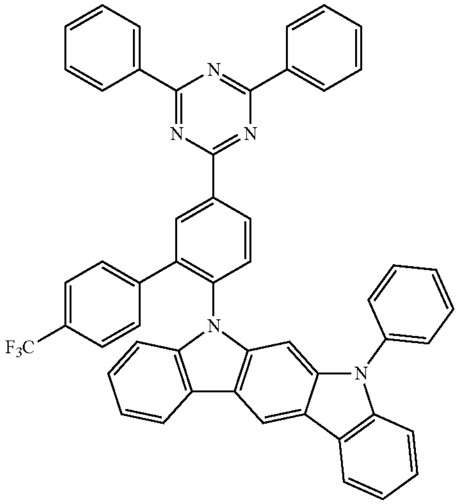
1-70
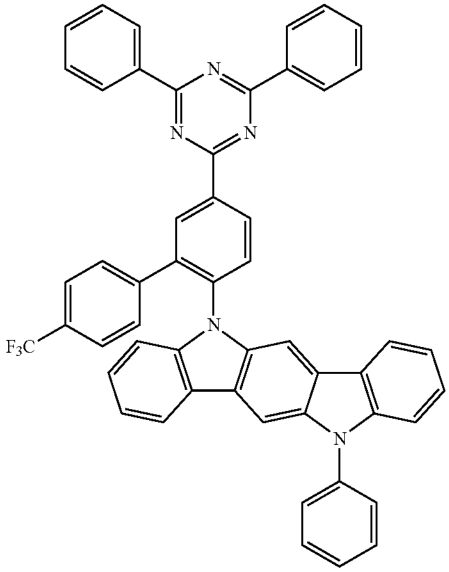

-continued
1-71
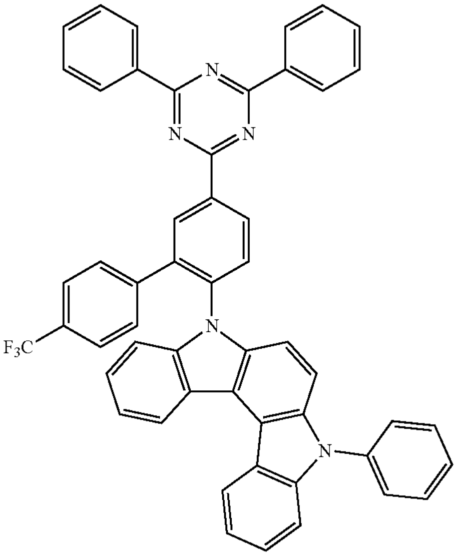
1-72
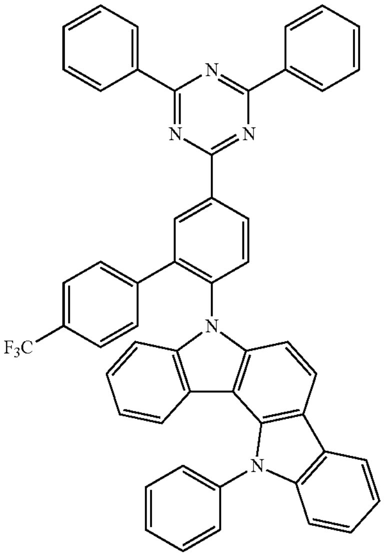
1-73
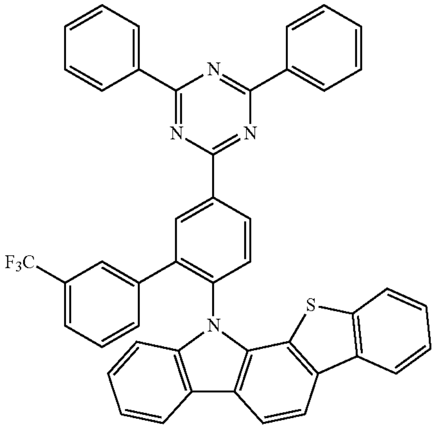
-continued
1-74
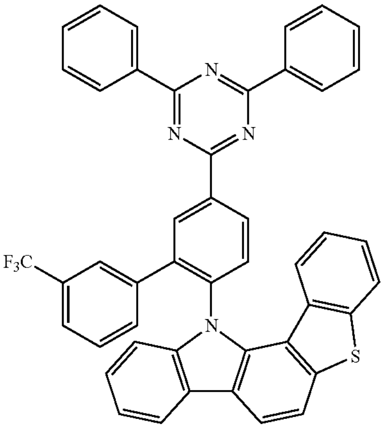
1-75
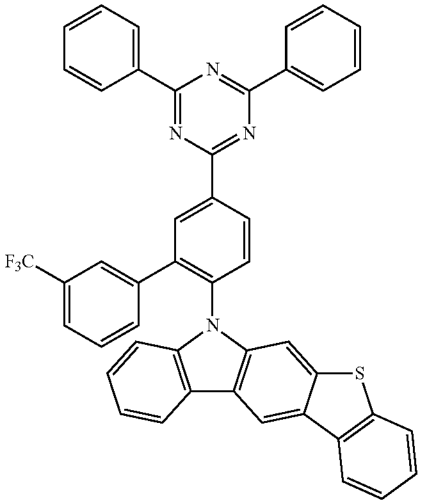
1-76
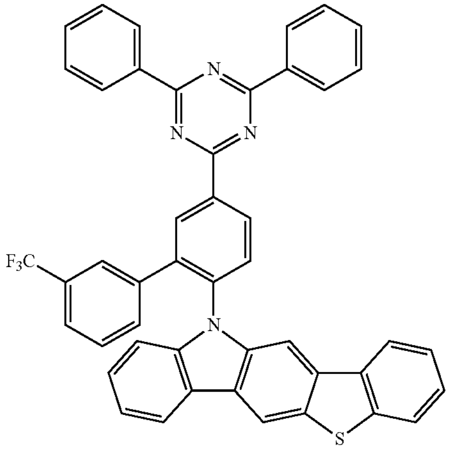

-continued
1-77
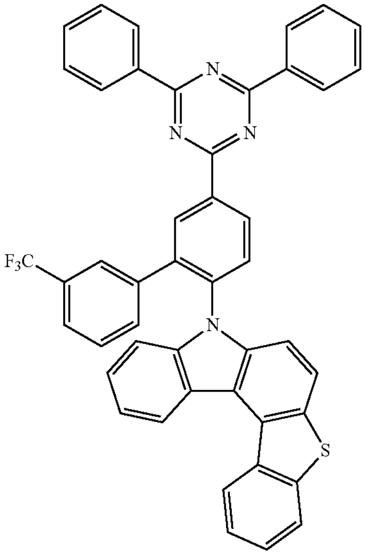
1-78
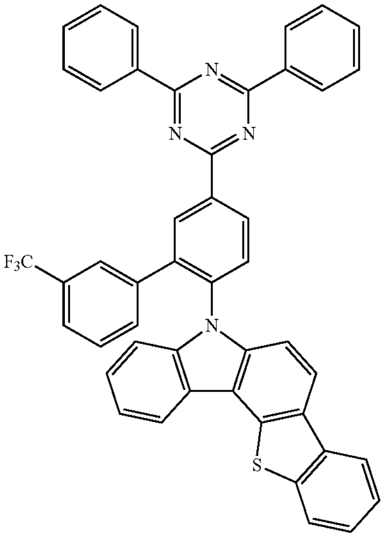
1-79
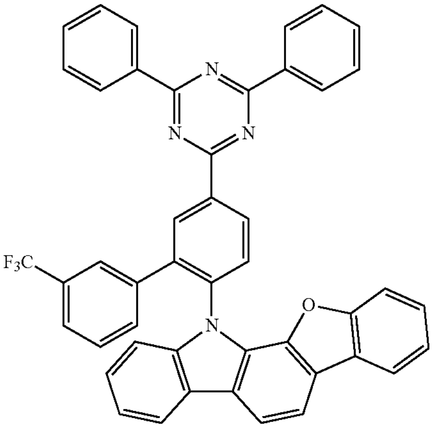
-continued
1-80
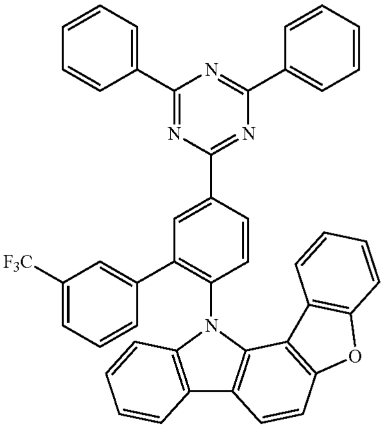
1-81
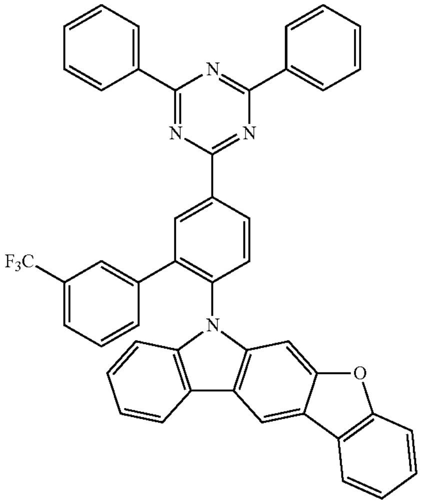
1-82
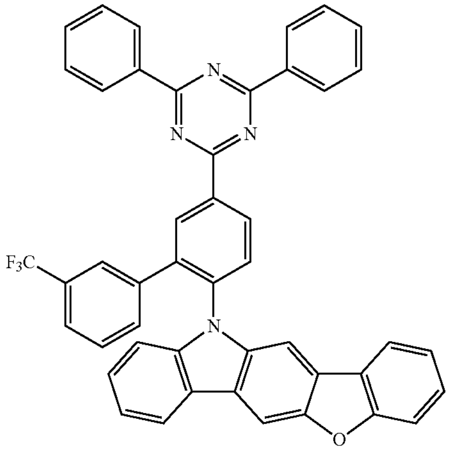

-continued
1-83
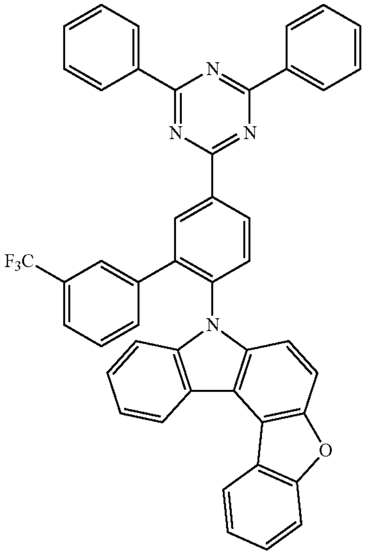
1-84
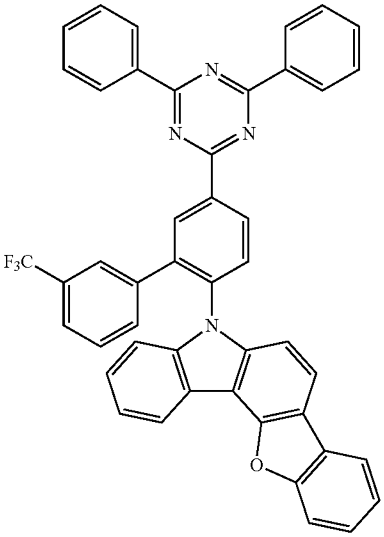
1-85
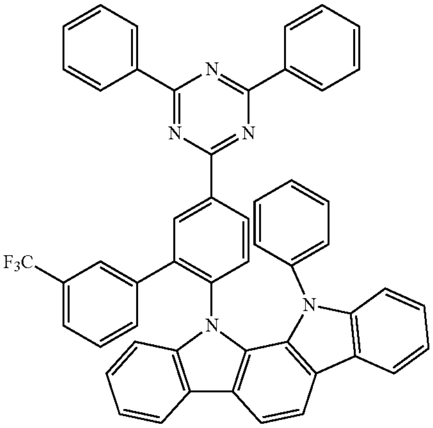
-continued
1-86
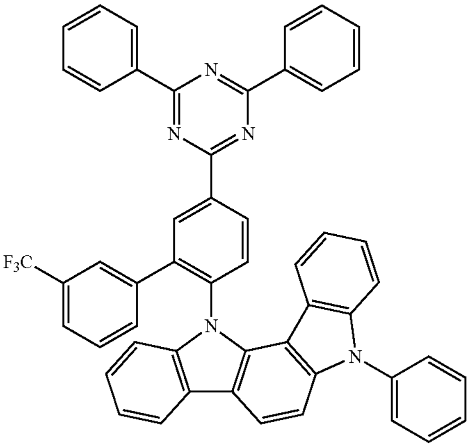
1-87
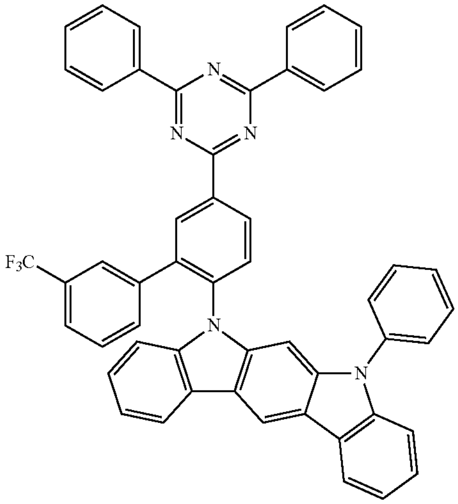
1-88
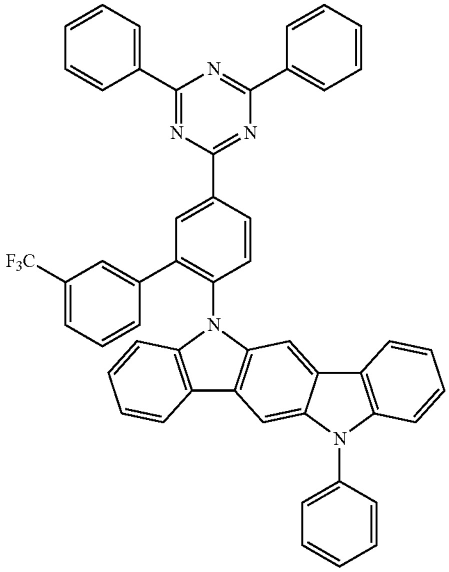

1-89
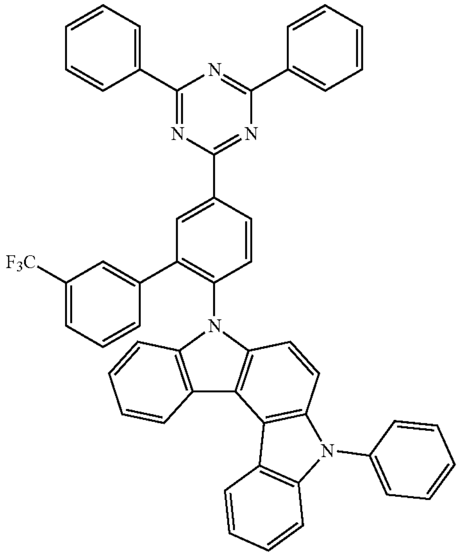
1-90
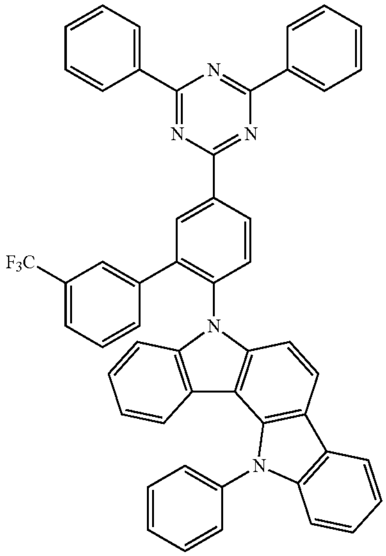
1-91
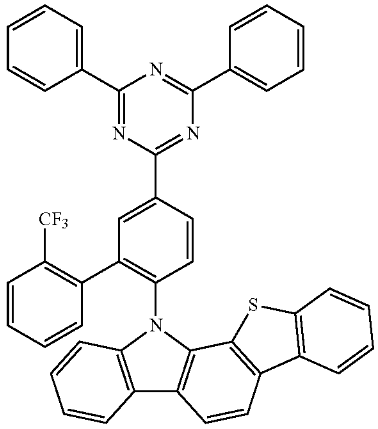
-continued
1-92
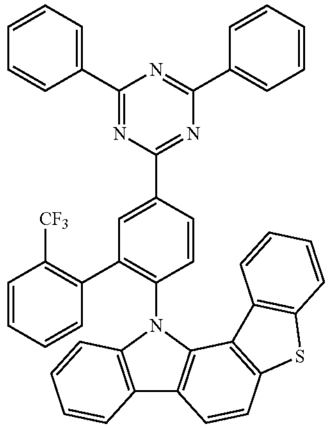
1-93
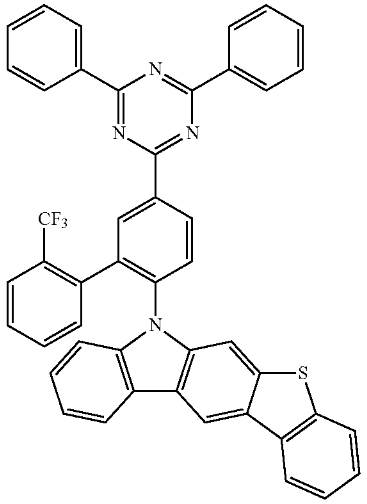
1-94
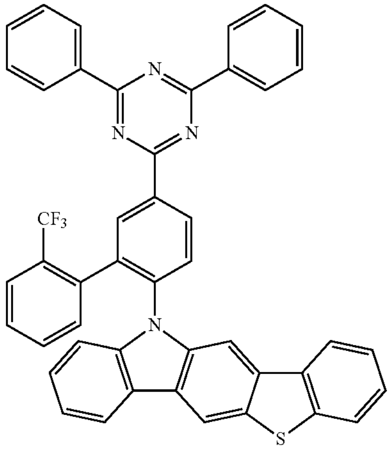

-continued
1-95
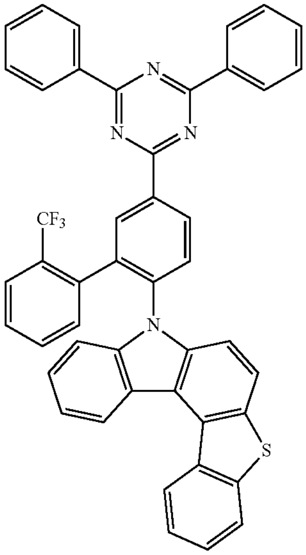
1-96
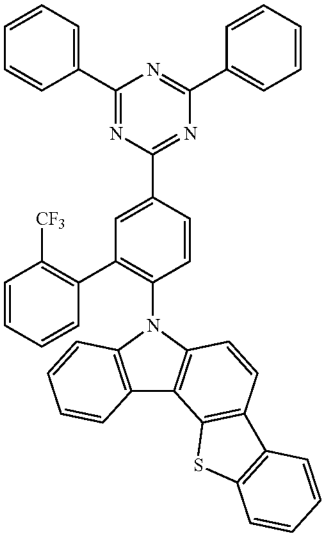
1-97
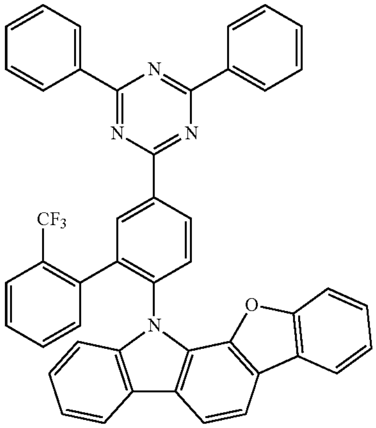
-continued
1-98
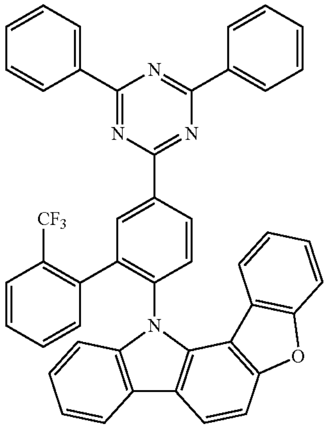
1-99
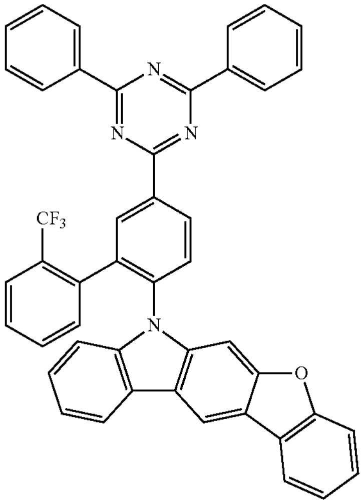
1-100
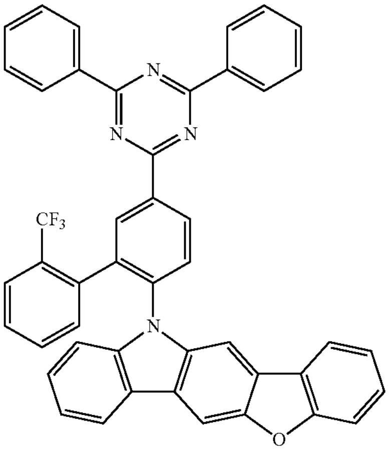

-continued
1-101
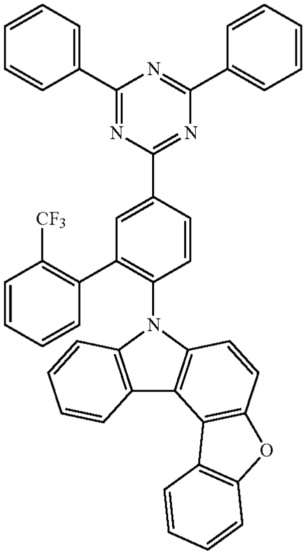
1-102
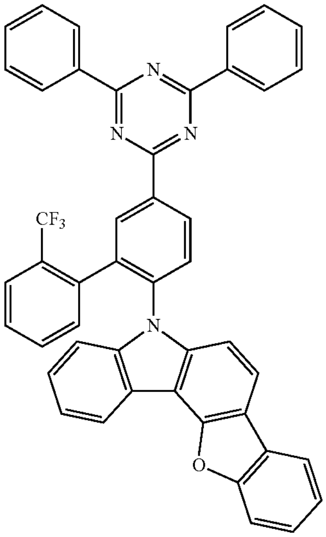
1-103
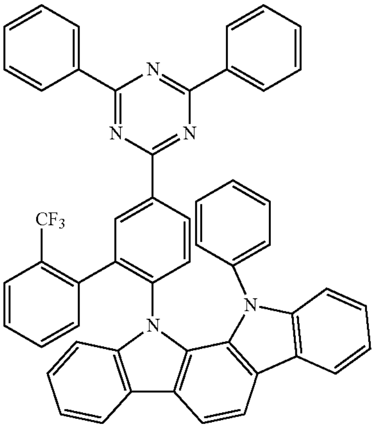
-continued
1-104
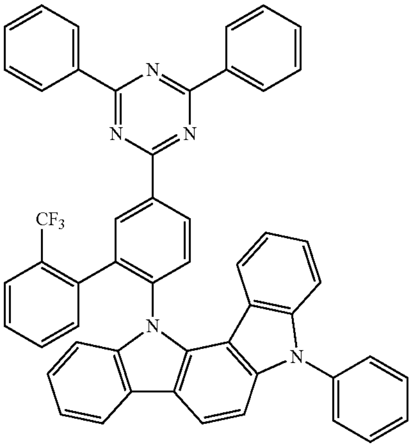
1-105
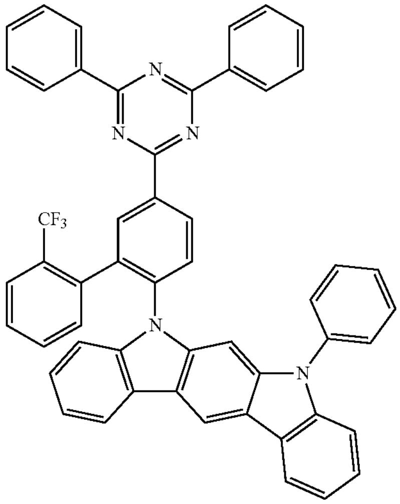
1-106
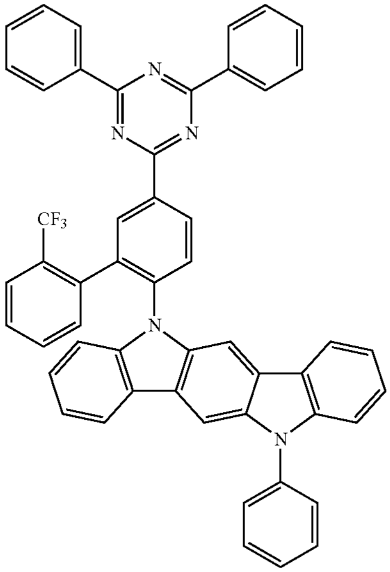

-continued
1-107
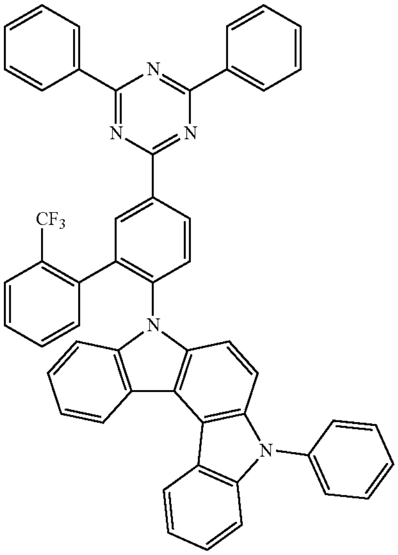
1-108
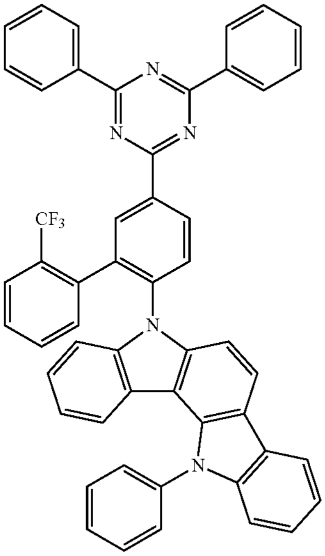
1-109
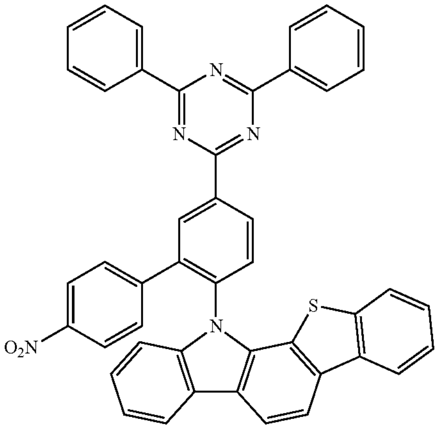
-continued
1-110
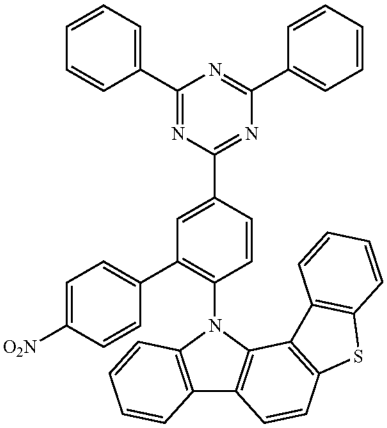
1-111
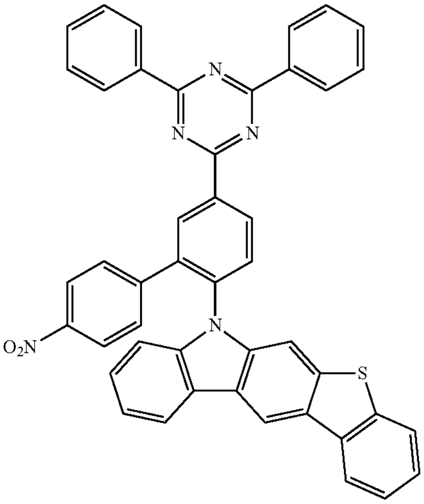
1-112
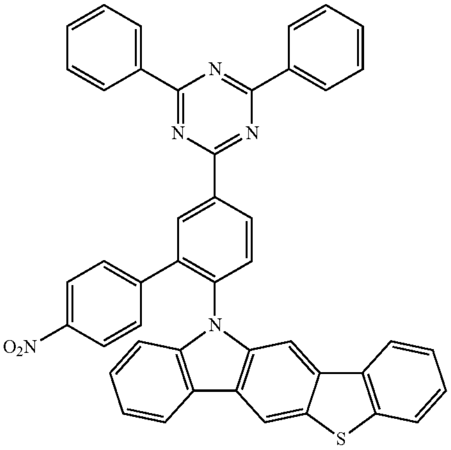

-continued
1-113
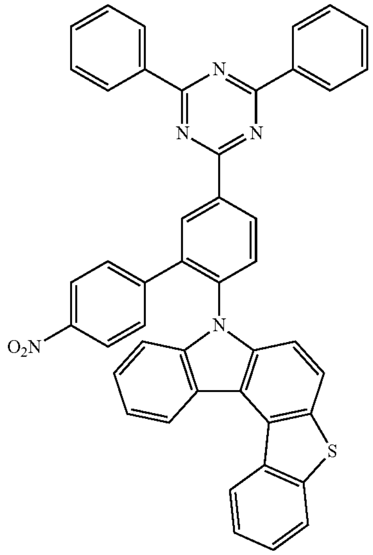
1-114
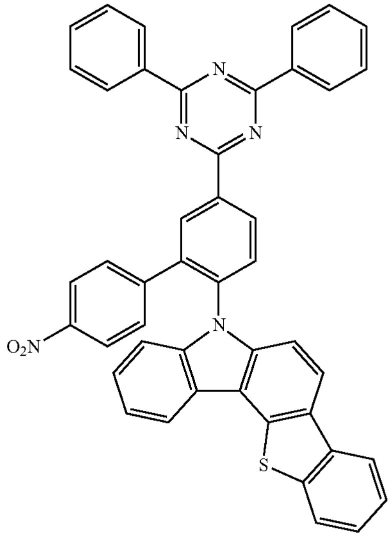
1-115
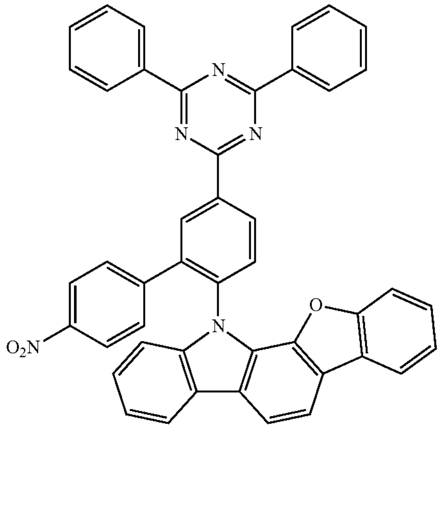
-continued
1-116
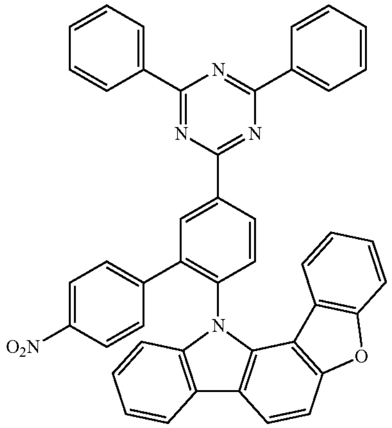
1-117
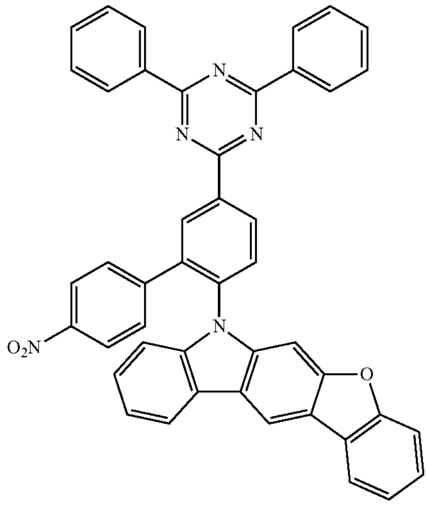
1-118
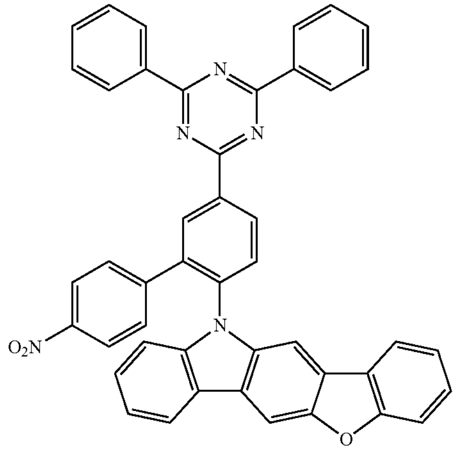

1-119
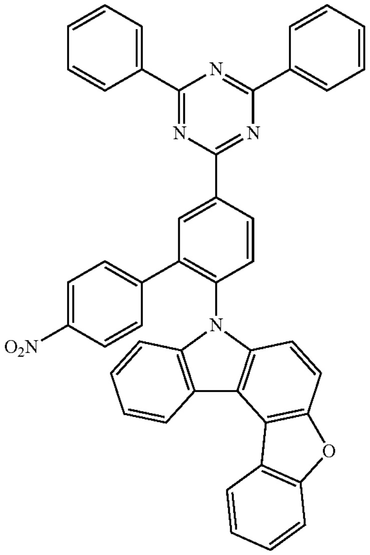
1-120
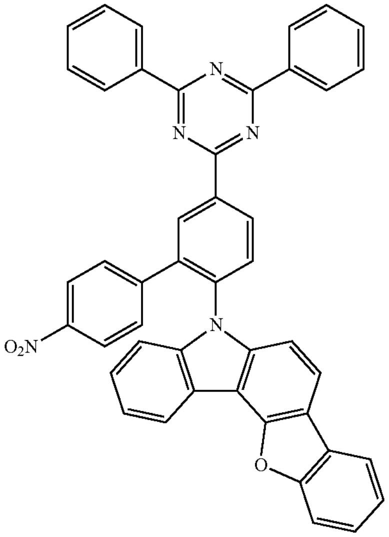
1-121
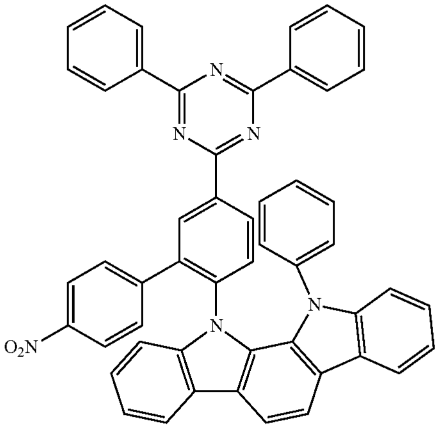
1-122
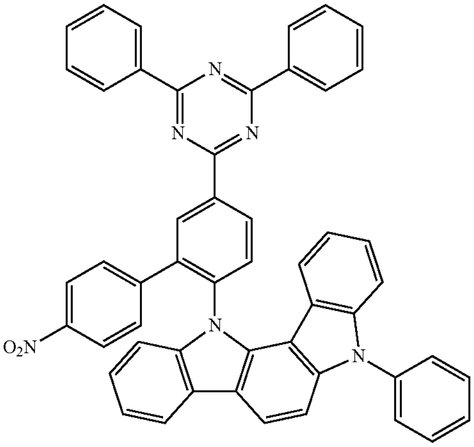
1-123
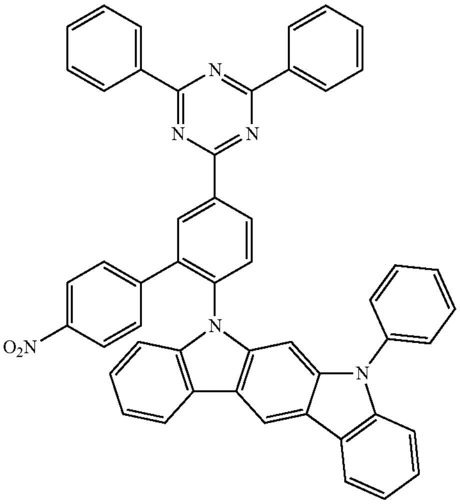
1-124
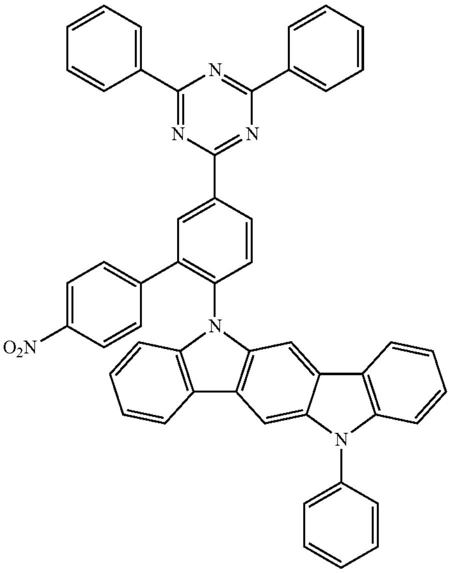

-continued
1-125
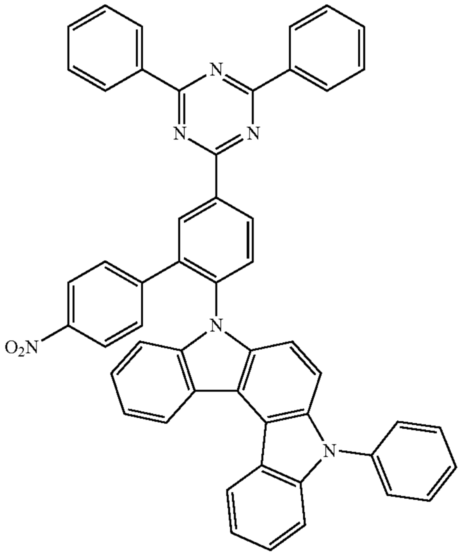
1-126
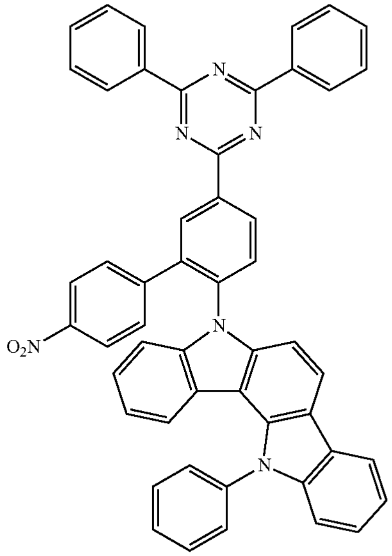
1-127
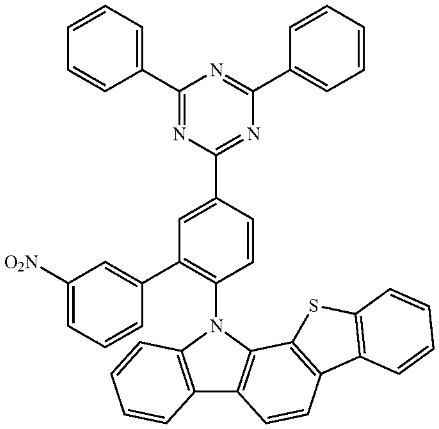
-continued
1-128
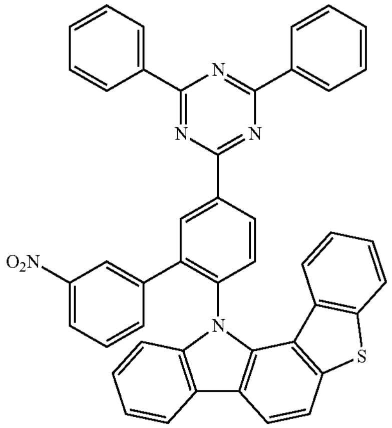
1-129
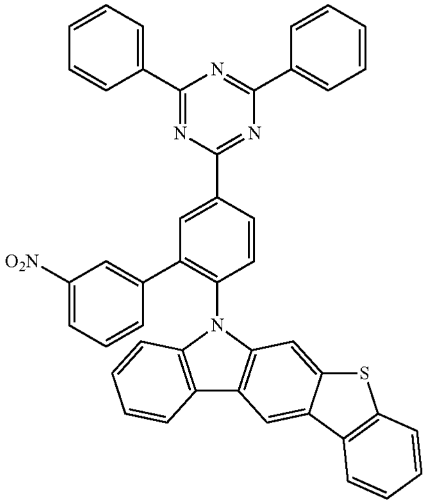
1-130
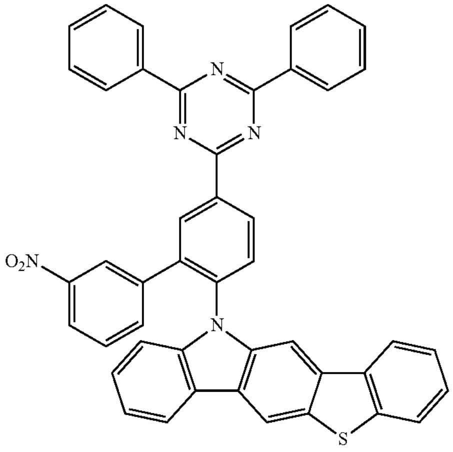

-continued
1-131
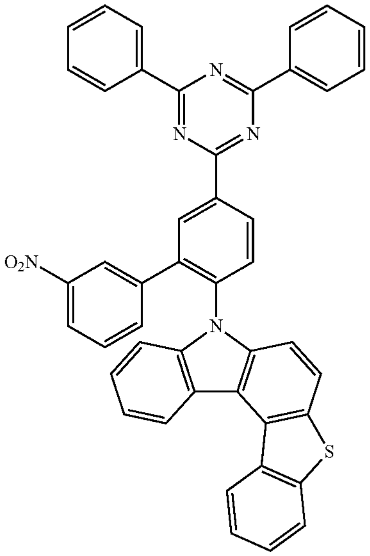
1-132
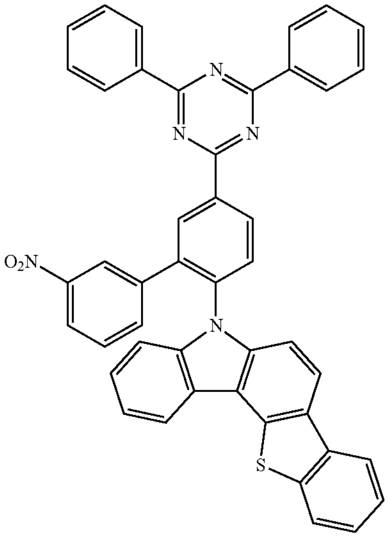
1-133
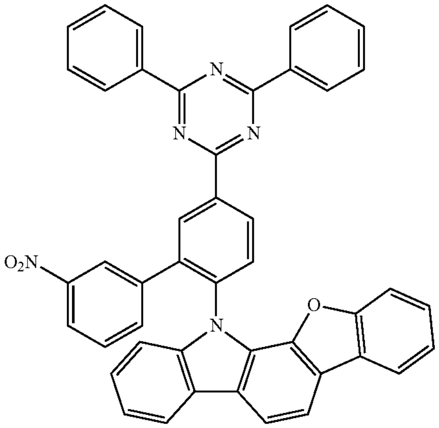
-continued
1-134
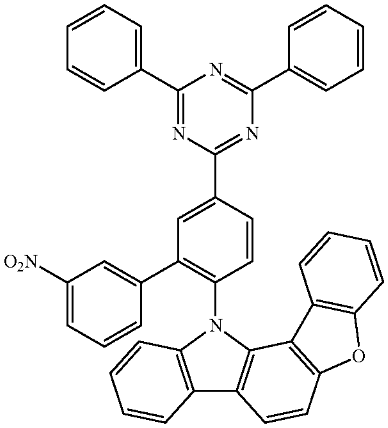
1-135
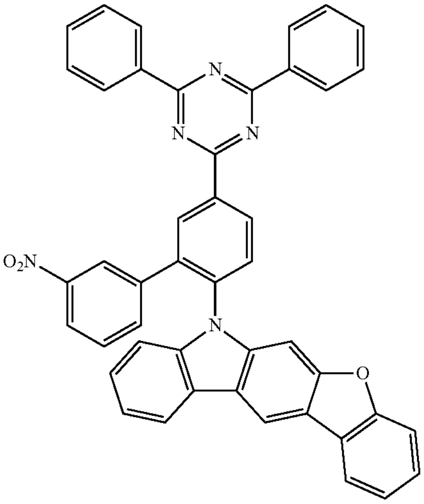
1-136
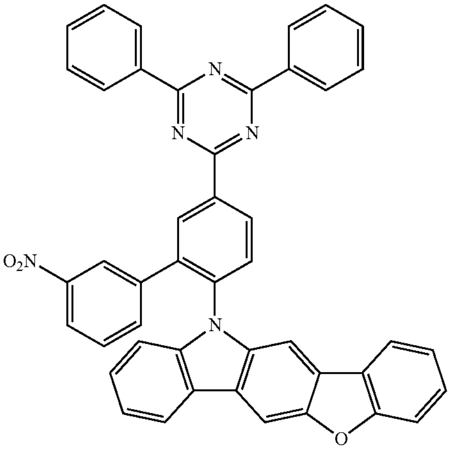

-continued
1-137
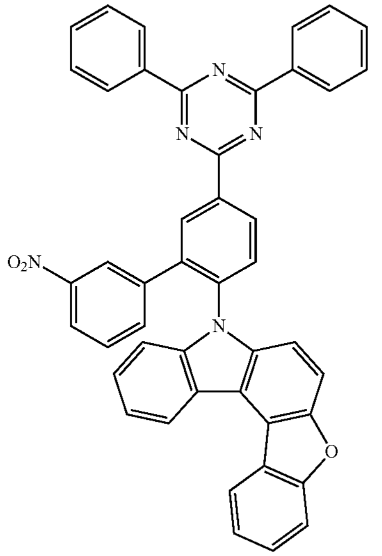
1-138
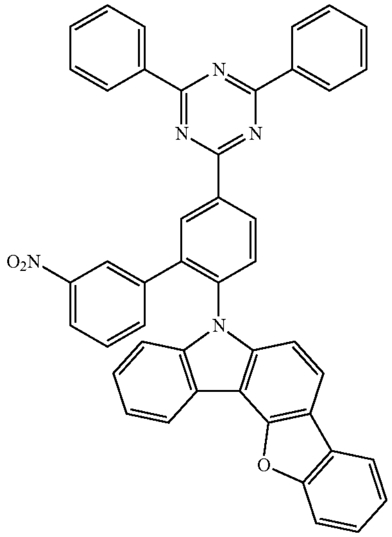
1-139
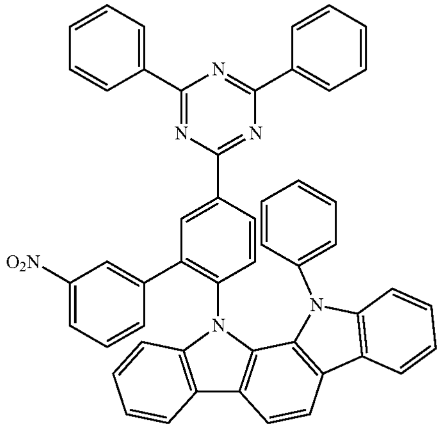
-continued
1-140
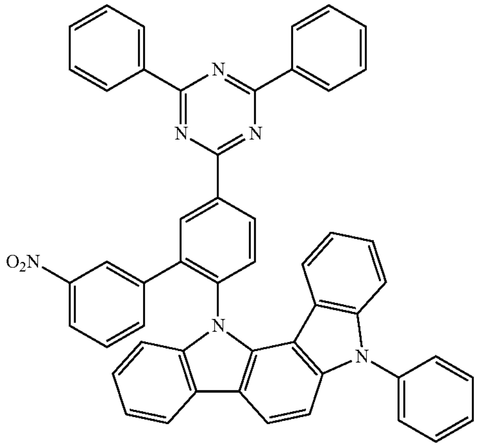
1-141
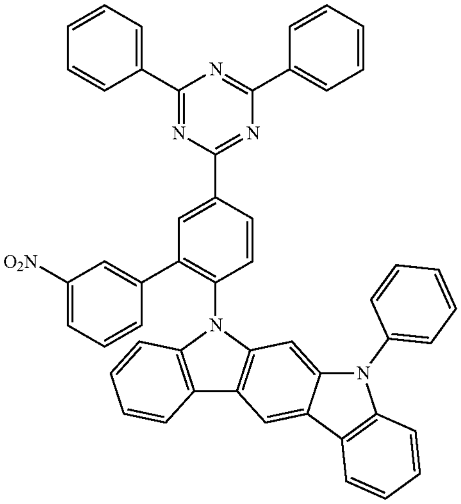
1-142
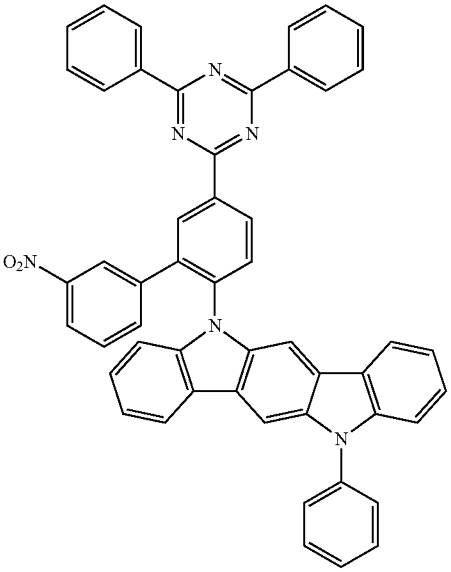

-continued
1-143
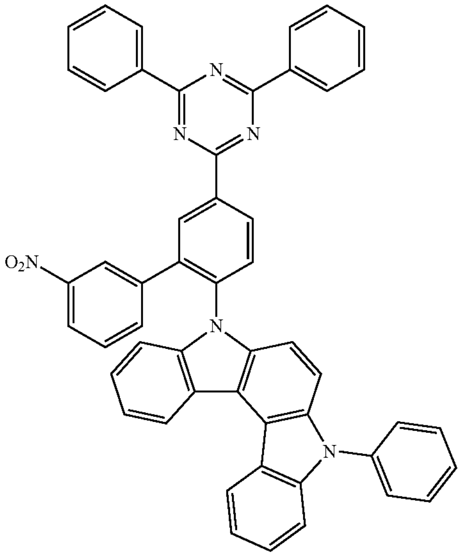
1-144
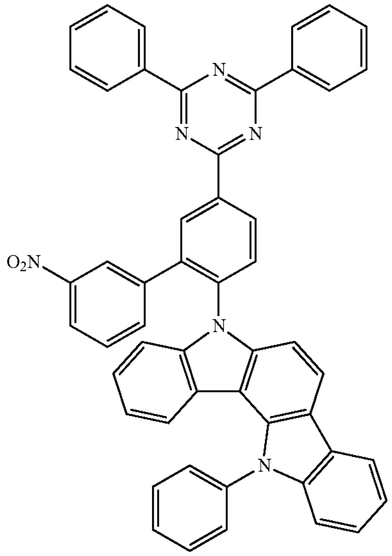
1-145
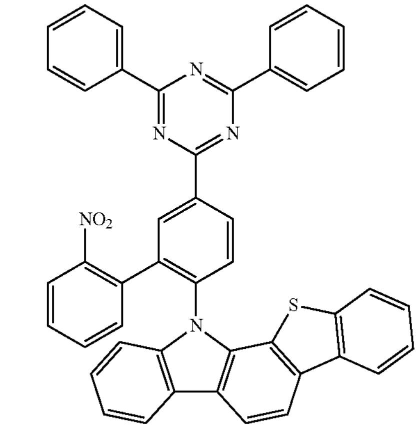
-continued
1-146
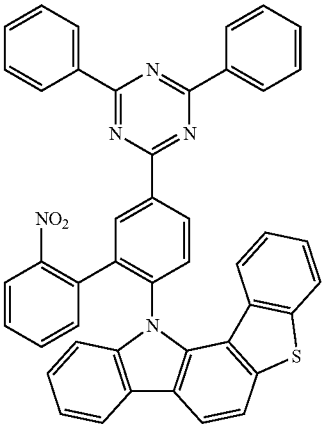
1-147
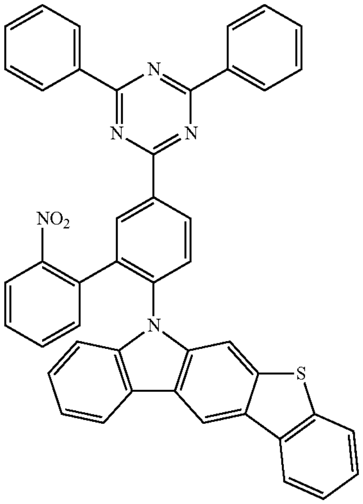
1-148
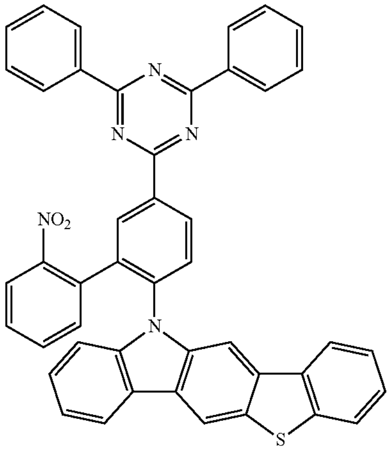

-continued
1-149
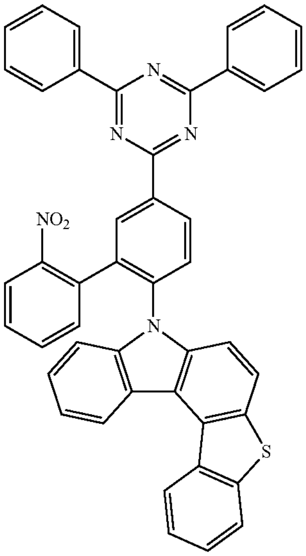
1-150
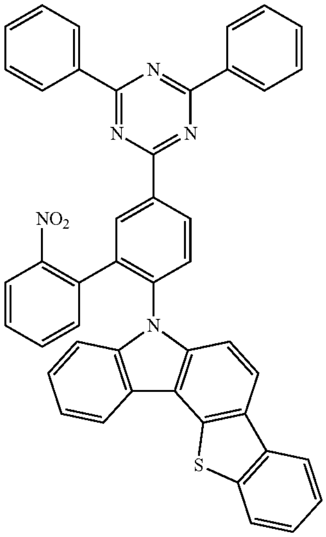
1-151
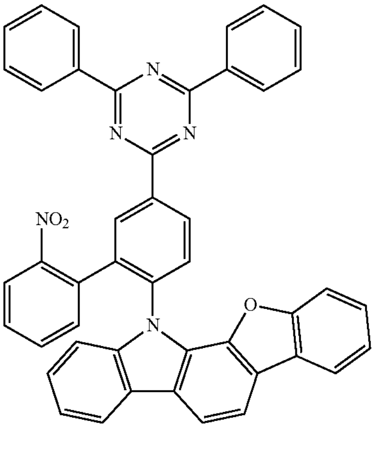
-continued
1-152
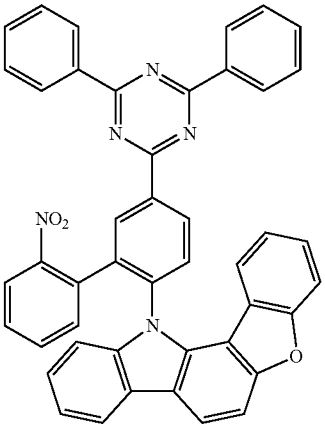
1-153
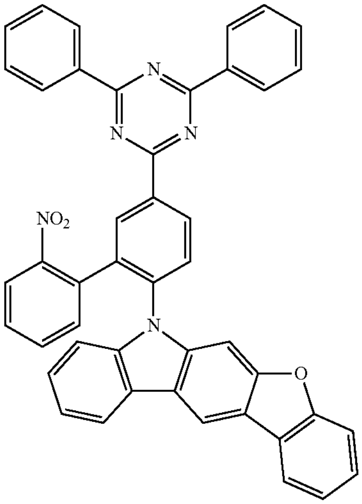
1-154
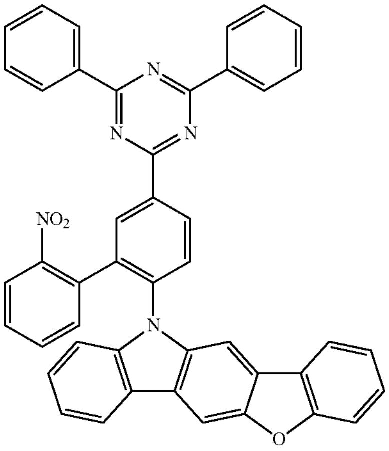

-continued
1-155
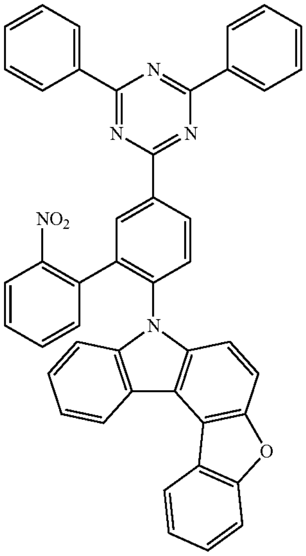
1-156
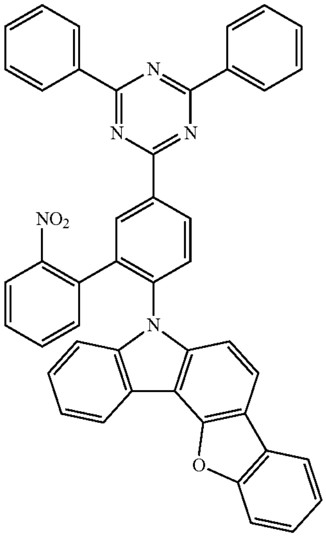
1-157
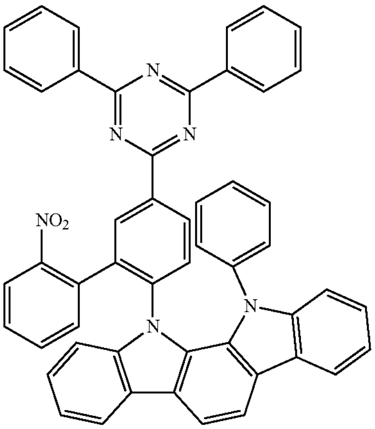
-continued
1-158
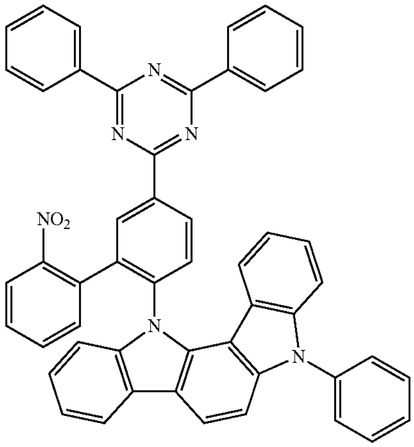
1-159
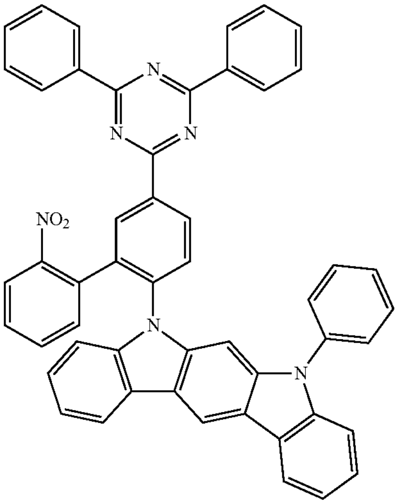
1-160
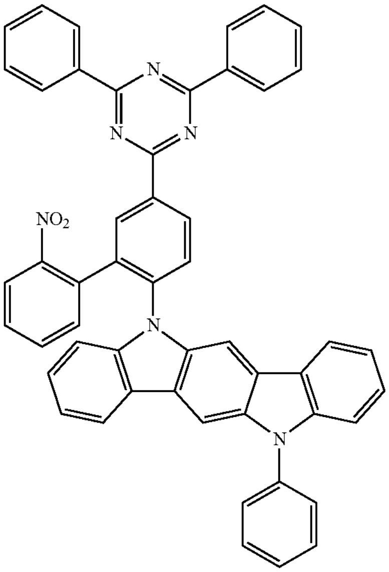

-continued
1-161
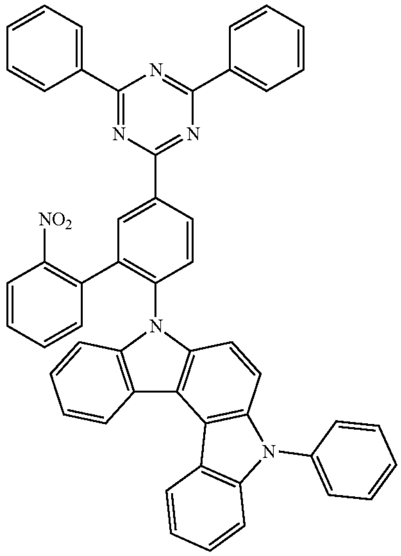
1-162
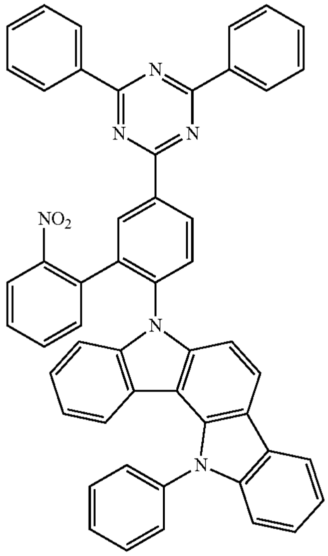
1-163
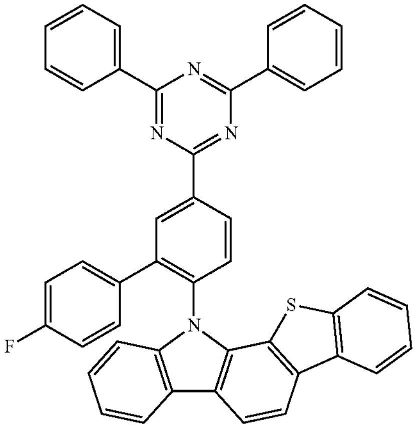
-continued
1-164
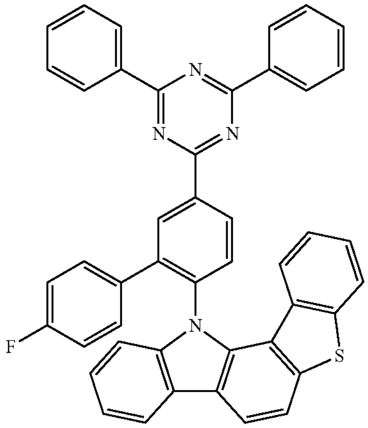
1-165
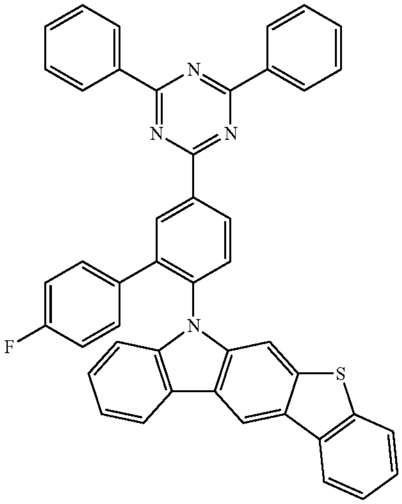
1-166
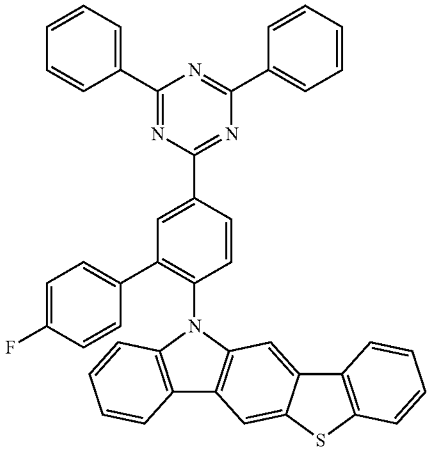

-continued
1-167
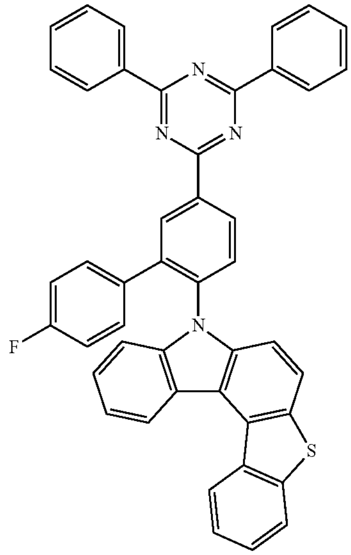
1-168
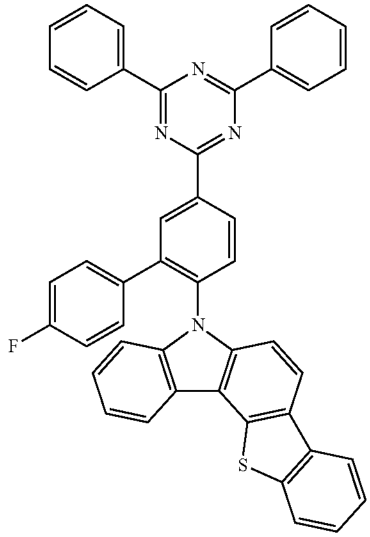
1-169
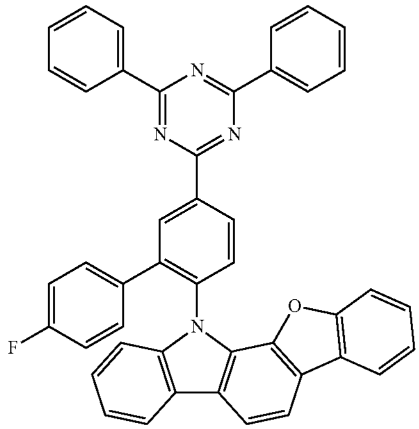
-continued
1-170
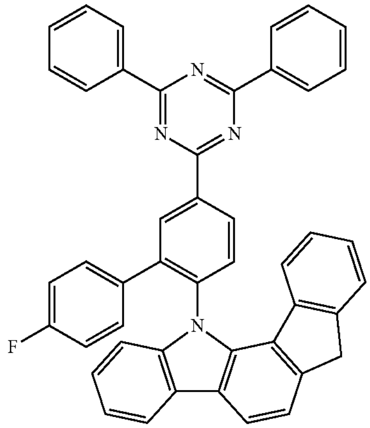
1-171
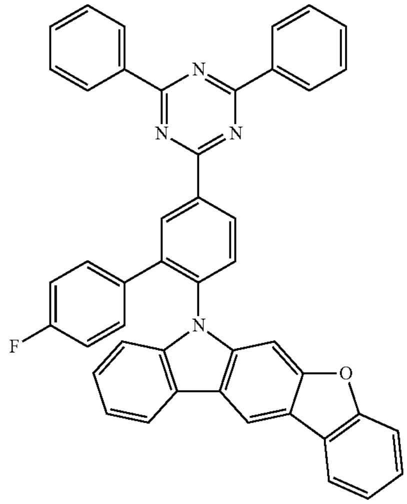
1-172
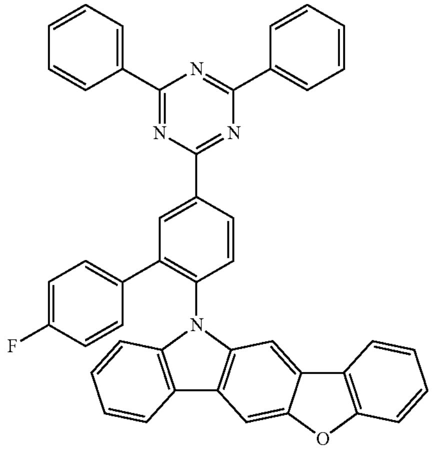

-continued
1-173
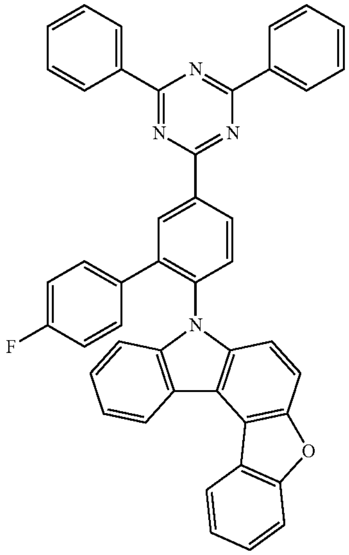
1-174
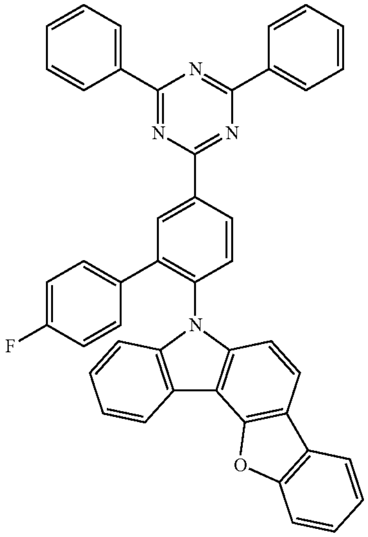
1-175
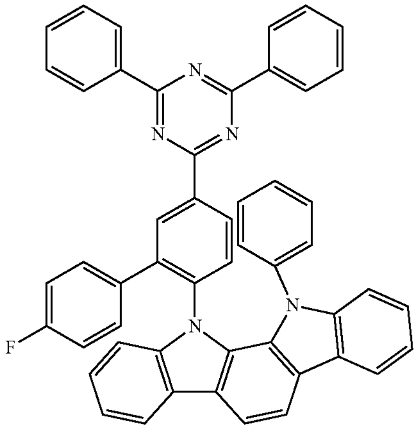
-continued
1-176
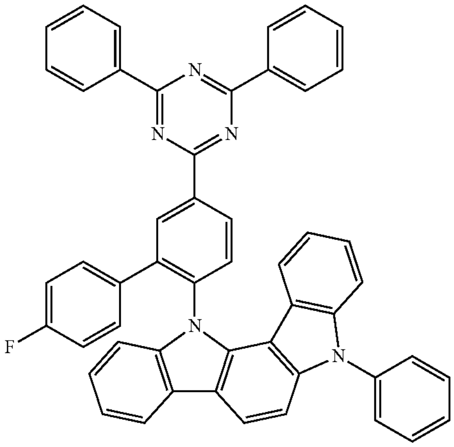
1-177
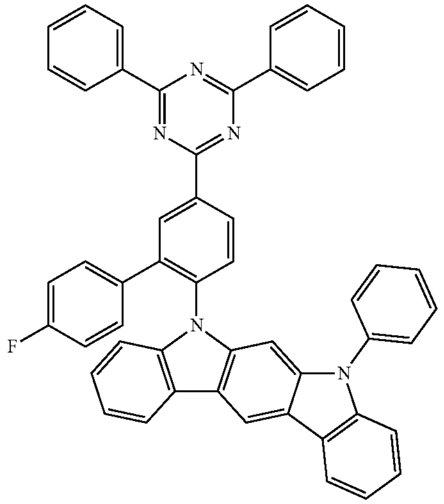
1-178
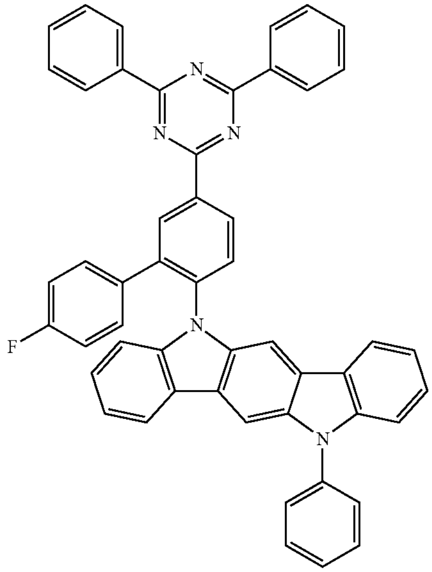

-continued
1-179
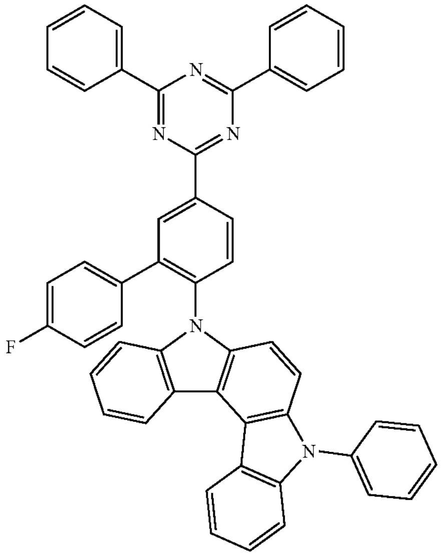
1-180
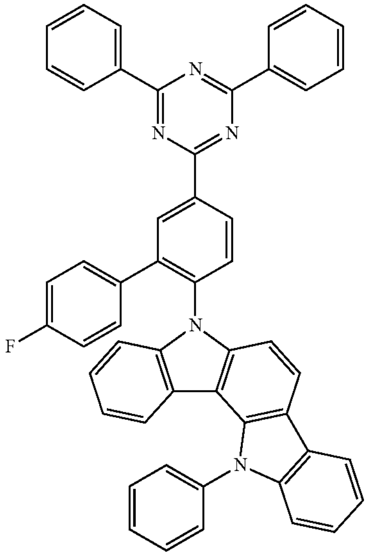
1-181
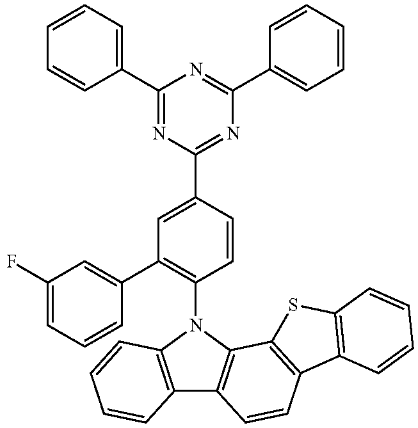
-continued
1-182
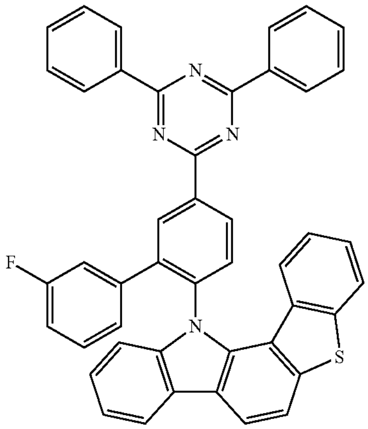
1-183
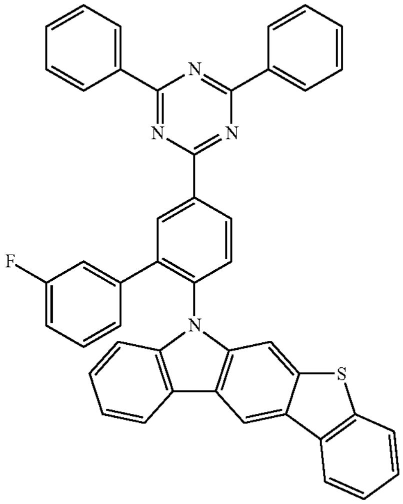
1-184
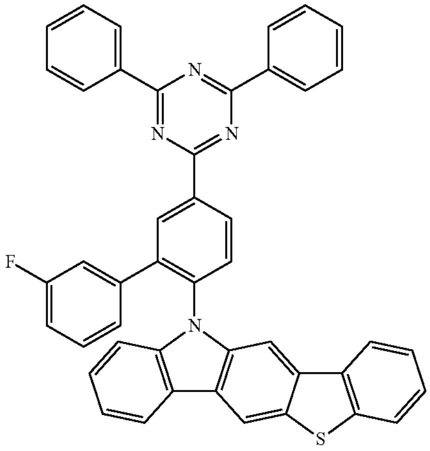

-continued
1-185
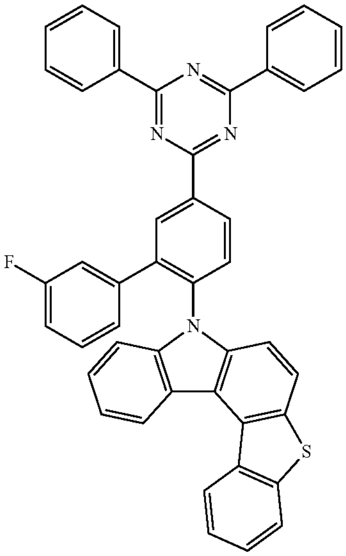
1-186
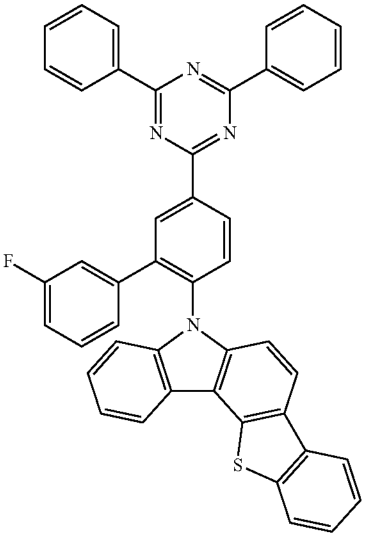
1-187
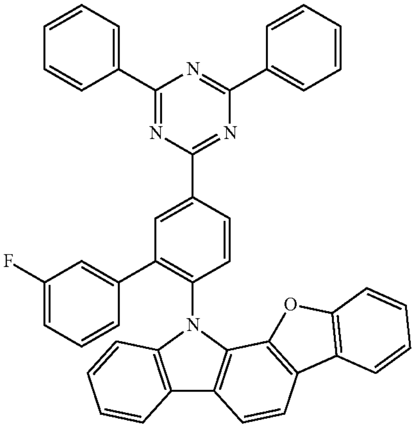
-continued
1-188
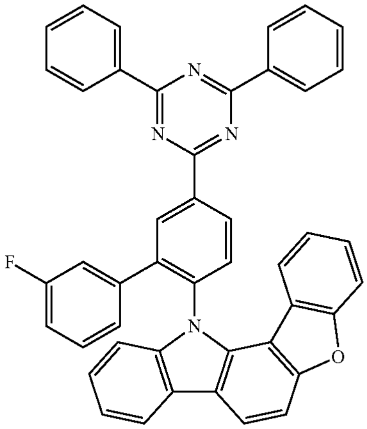
1-189
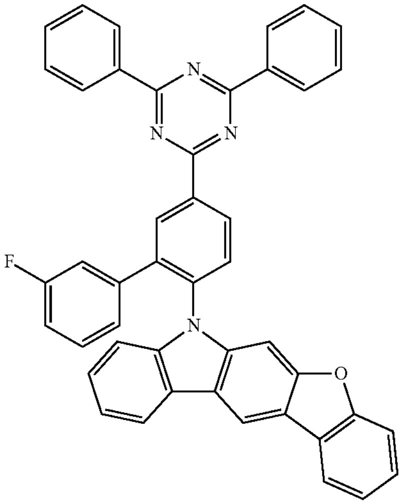
1-190
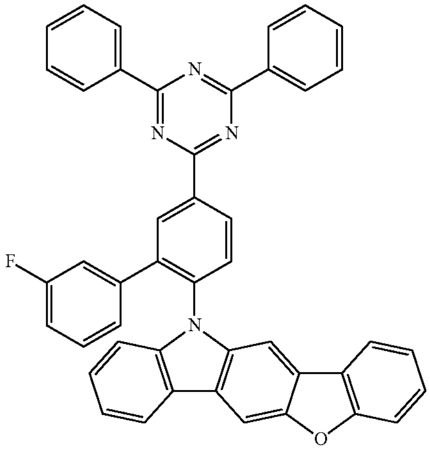

-continued
1-191
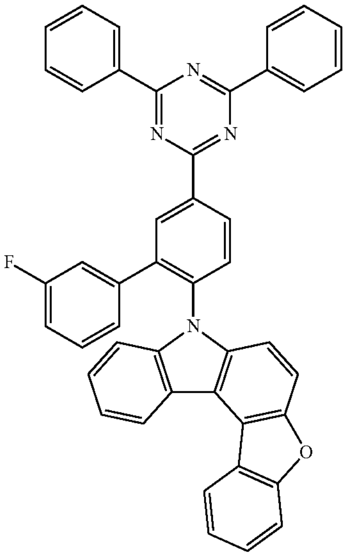
1-192
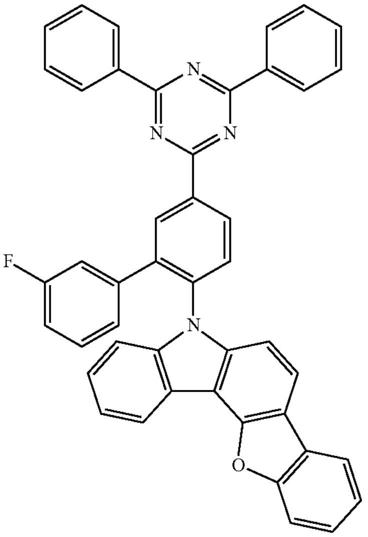
1-193
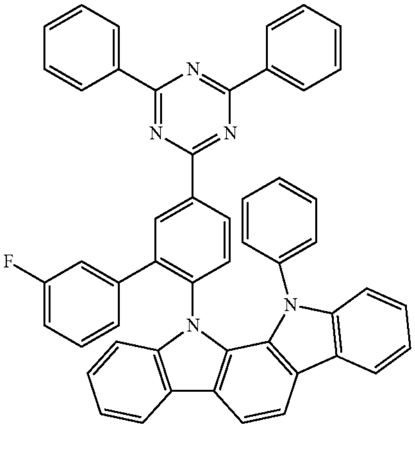
-continued
1-194
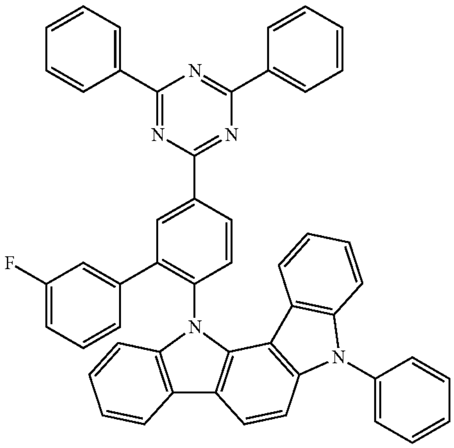
1-195
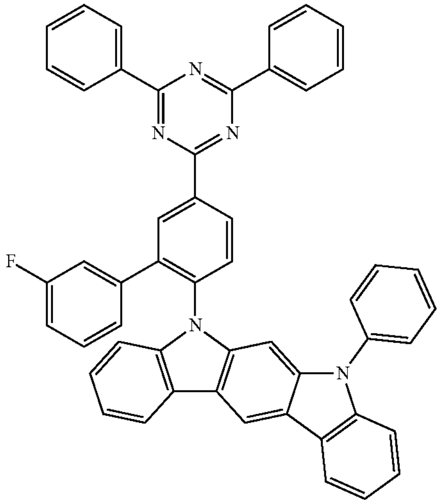
1-196
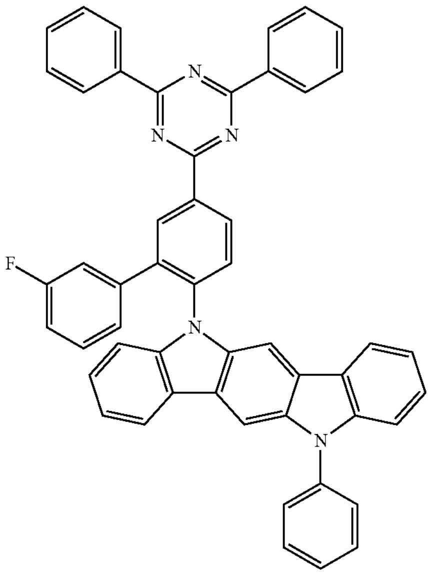

-continued
1-197
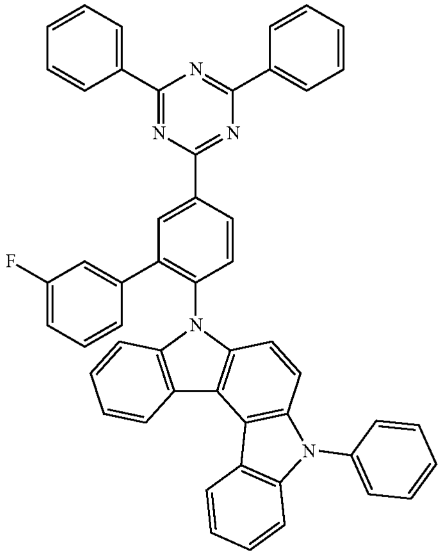
1-198
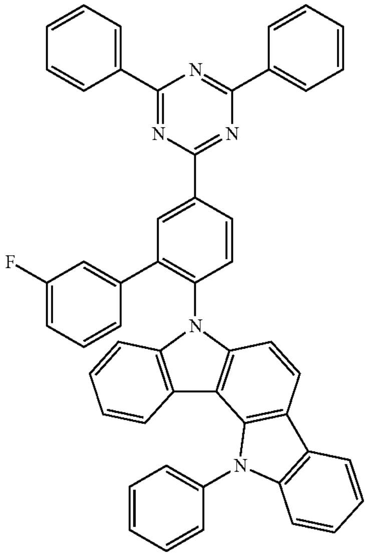
1-199
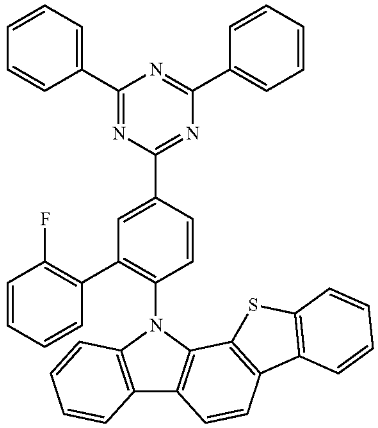
-continued
1-200
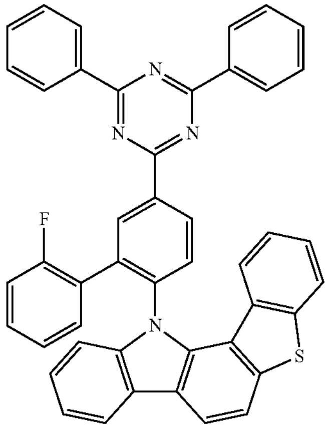
1-201
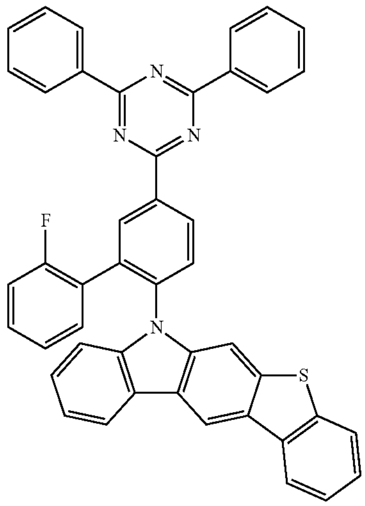
1-202
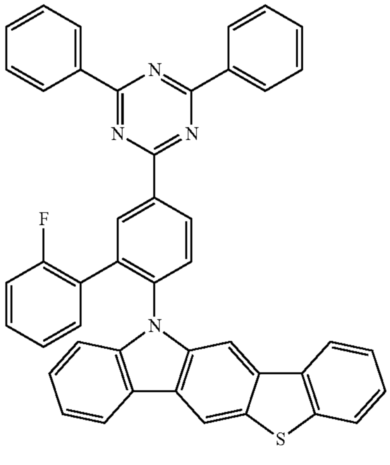

-continued
1-203
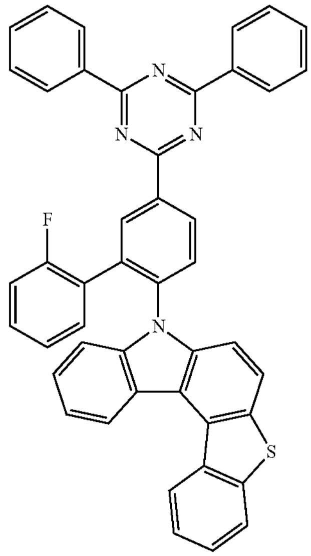
1-204
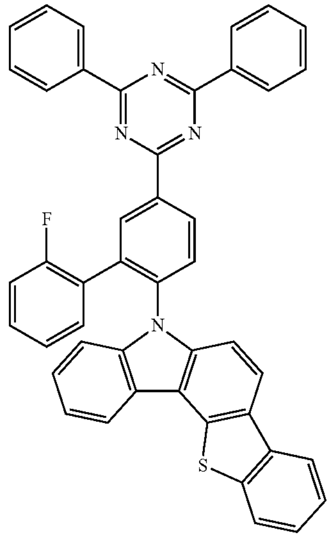
1-205
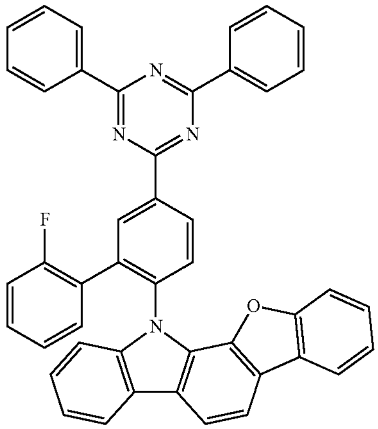
-continued
1-206
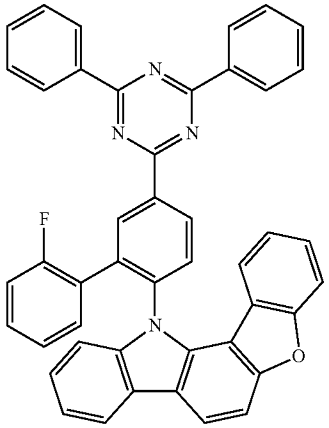
1-207
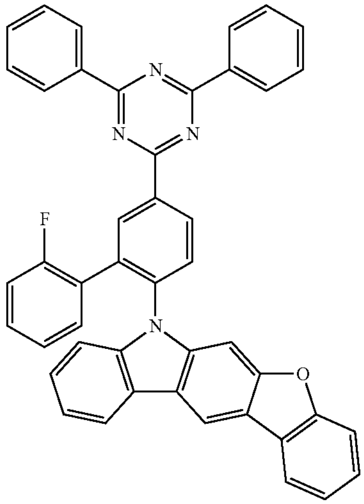
1-208
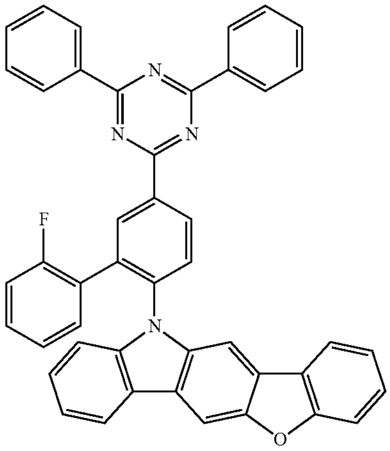

-continued
1-209
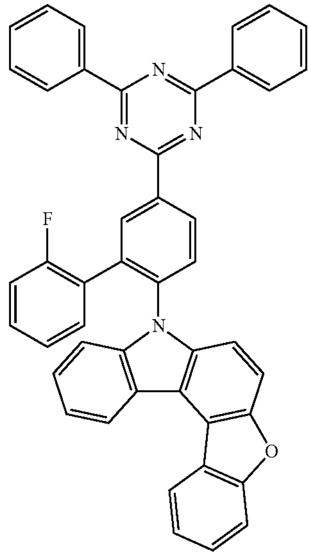
1-210
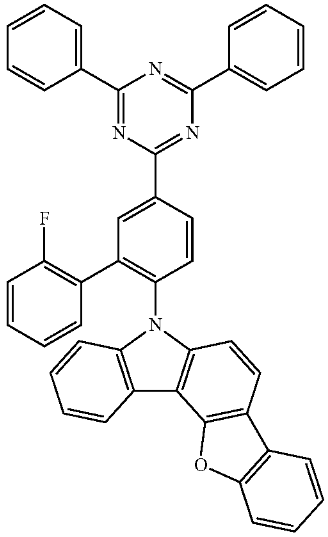
1-211
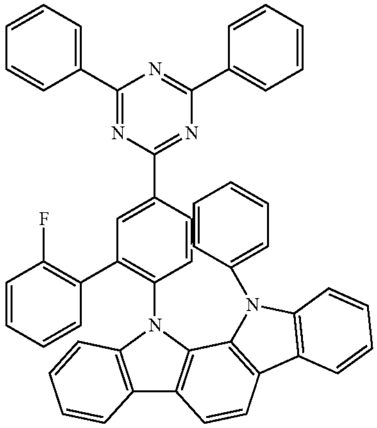
-continued
1-212
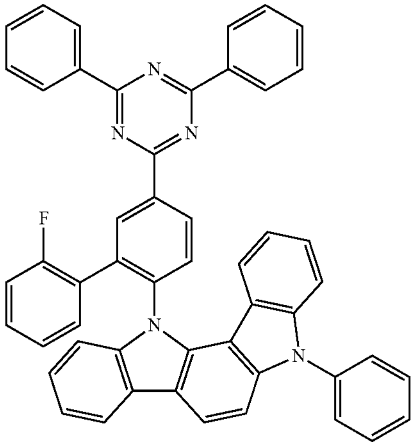
1-213
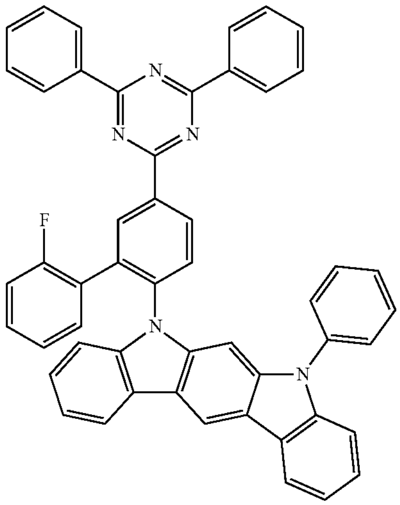
1-214
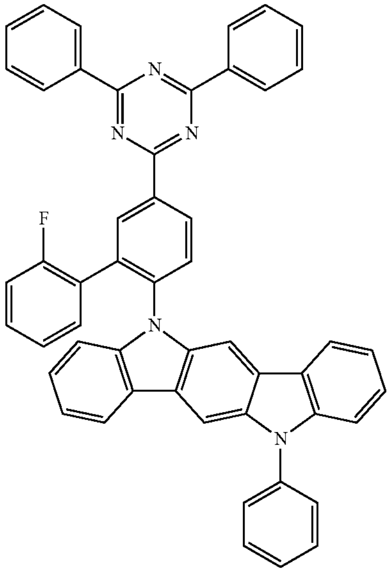

-continued
1-215
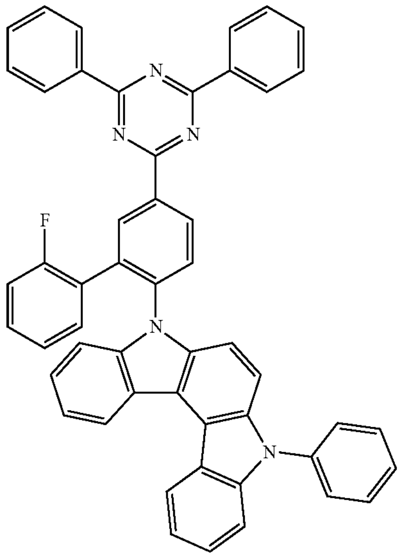
-continued
1-216
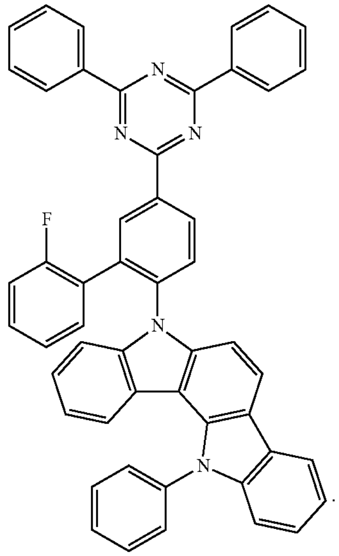
5. The organic light emitting diode according to claim 1, wherein the second compound is one of compounds in Formula 2-2:
[Formula 2-2]
2-1
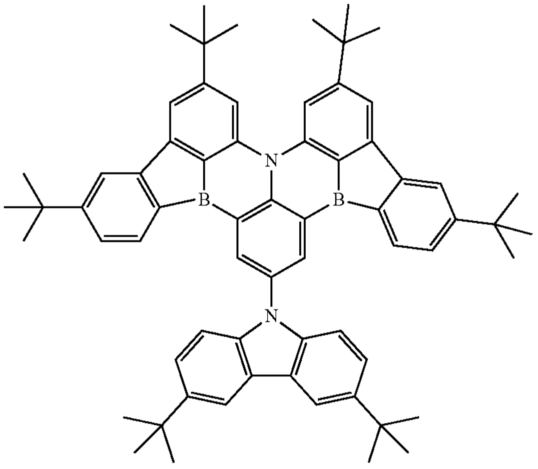

-continued
2-2
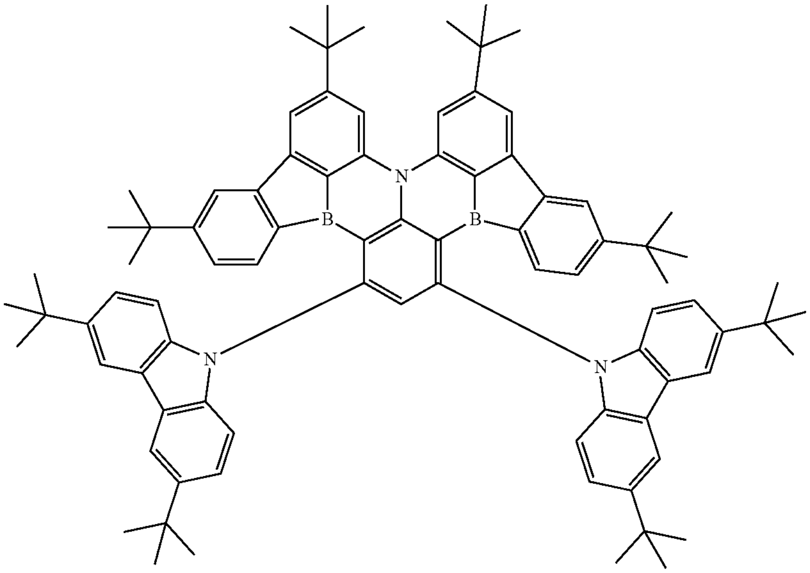
2-3
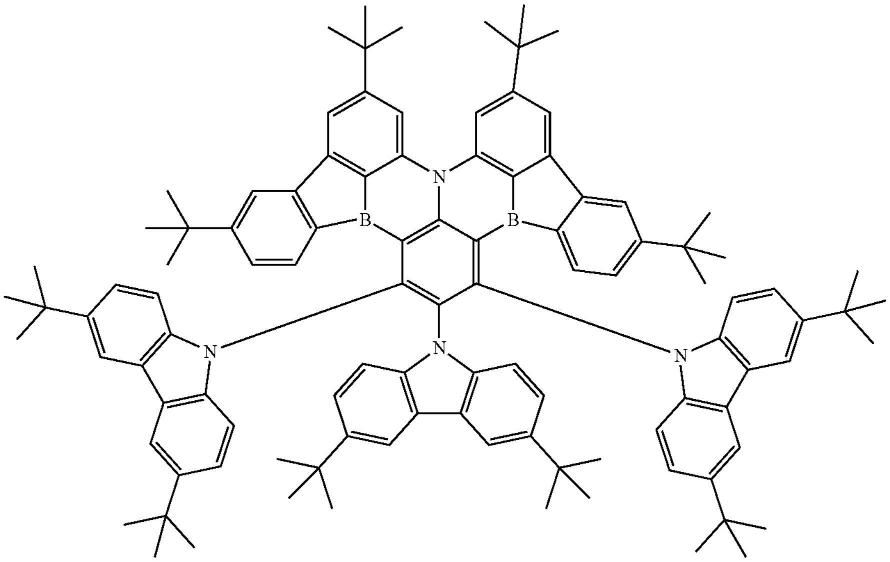
2-4
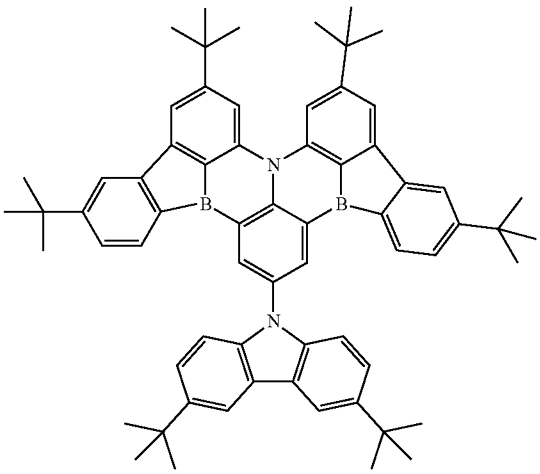
2-5
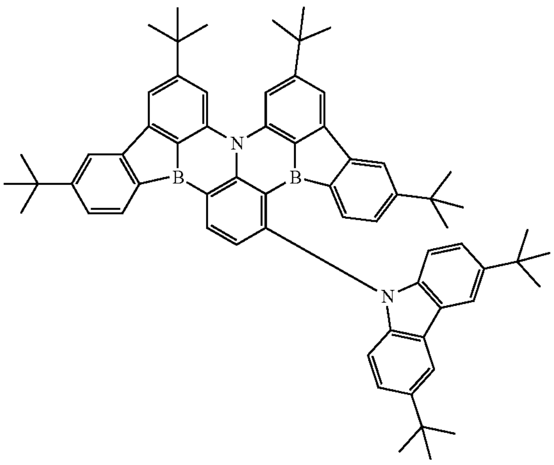

-continued
2-6
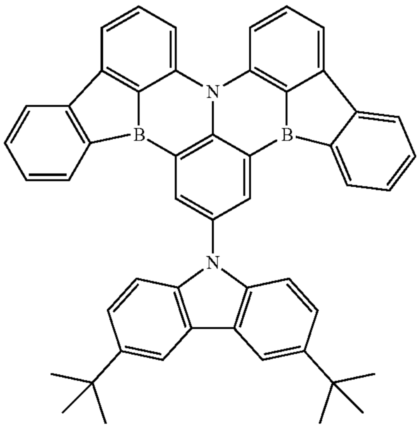
2-7
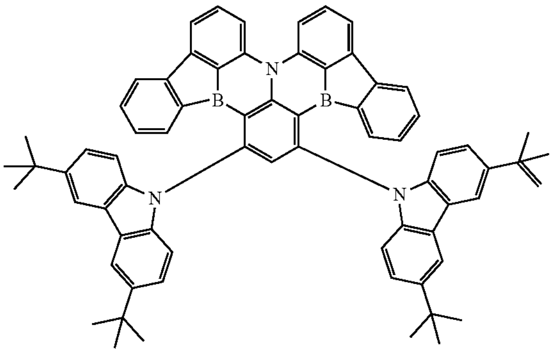
2-8
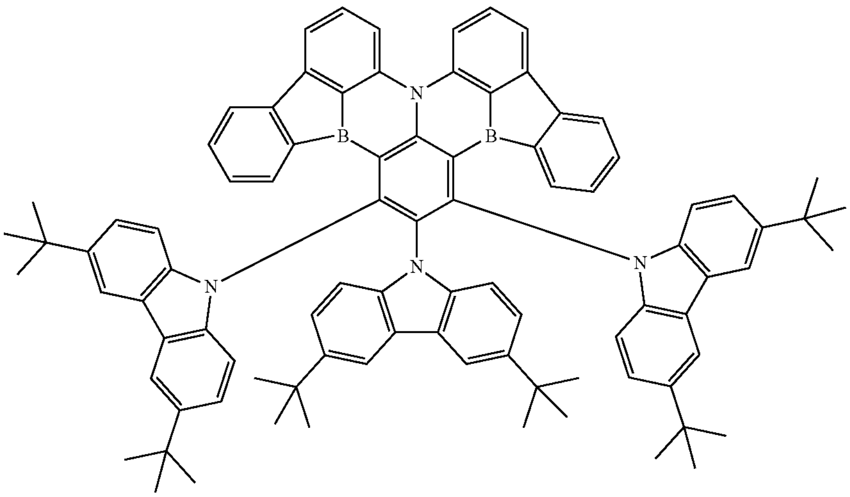
2-9
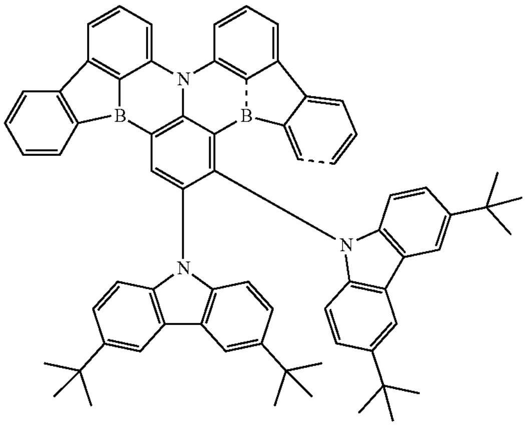
2-10
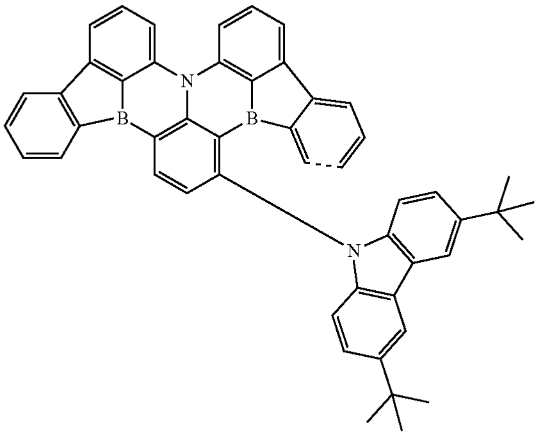

-continued
2-11
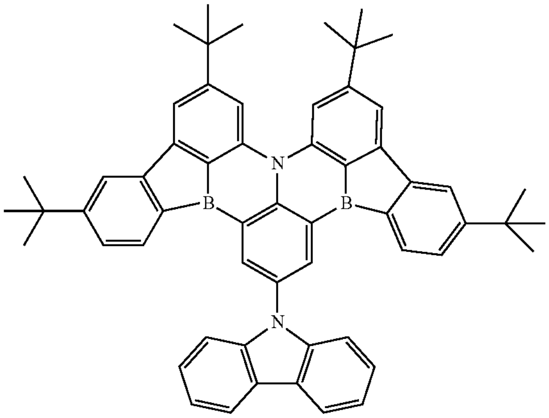
2-12
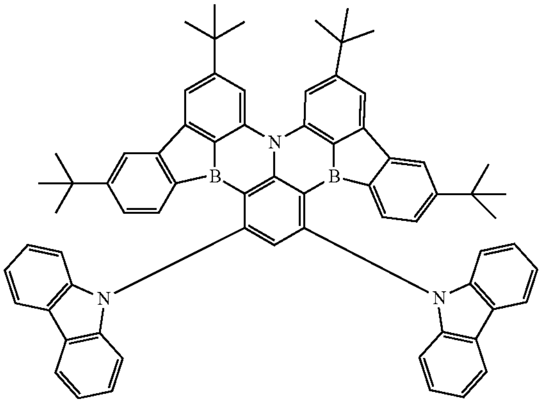
2-13
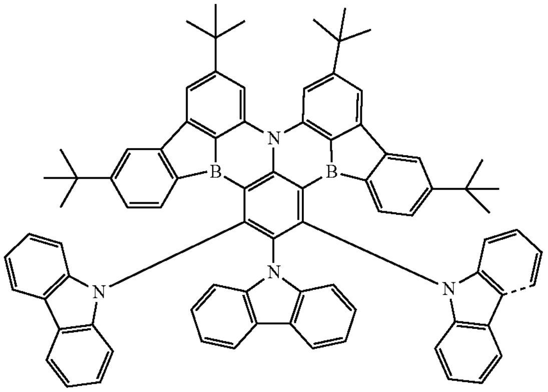
2-14
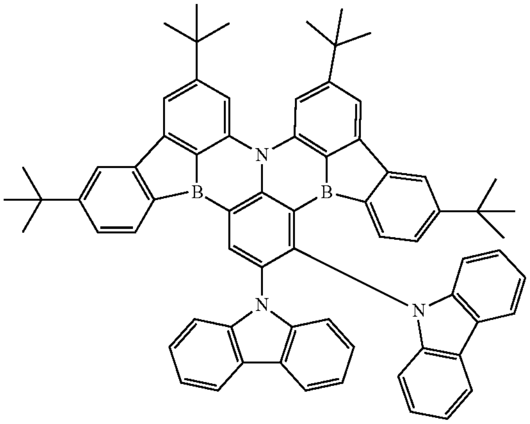
2-15
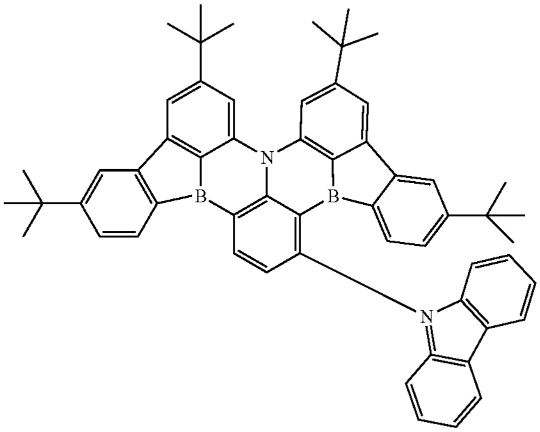
2-16
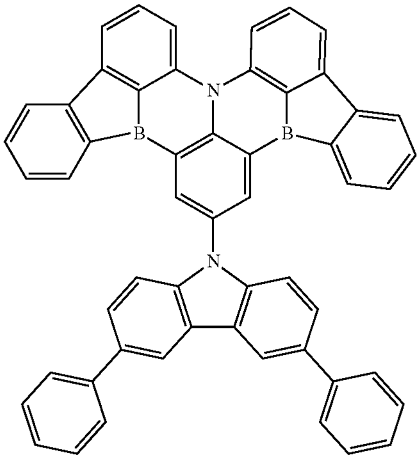

-continued
2-17
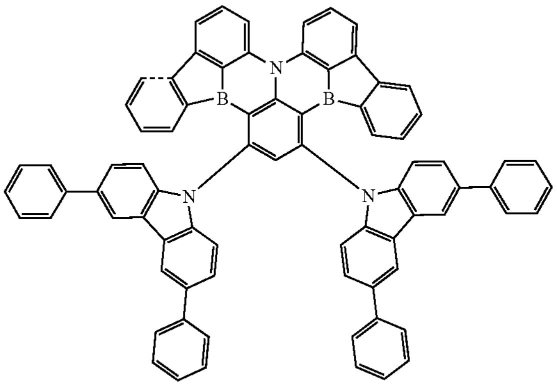
2-18
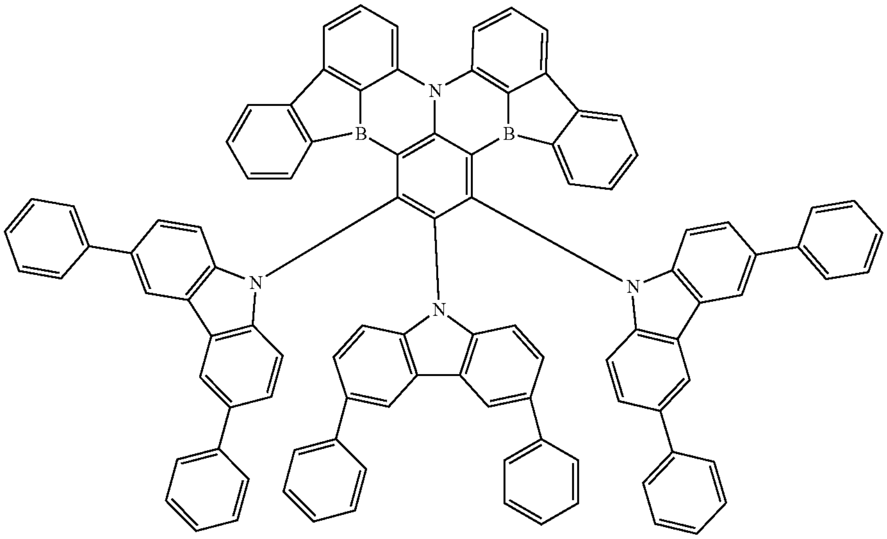
2-19
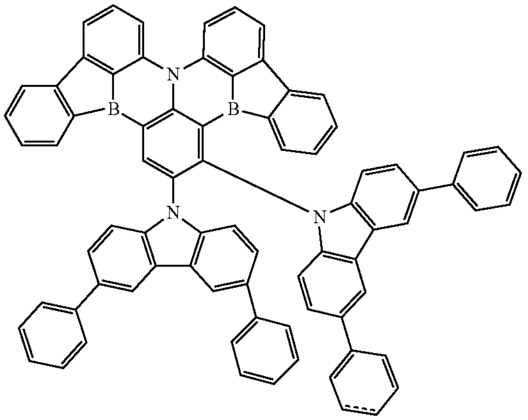
2-20
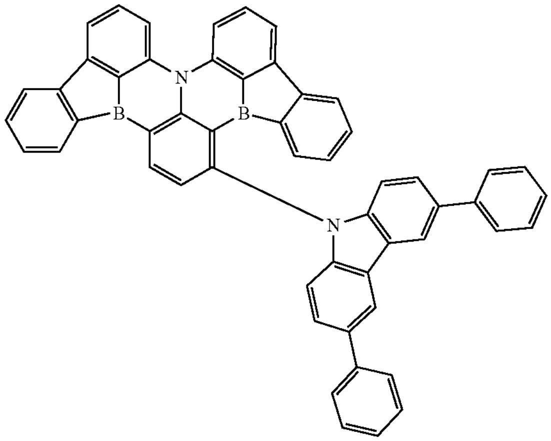

-continued
2-21
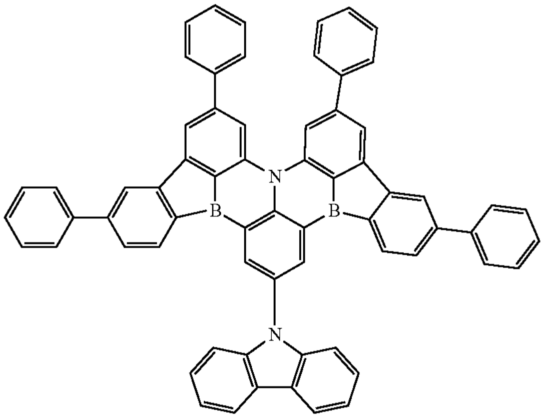
2-22
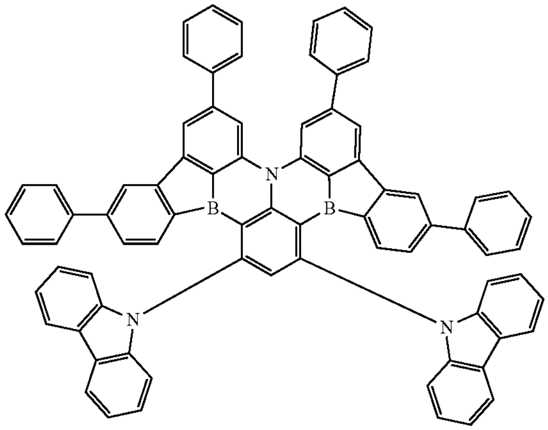
2-23
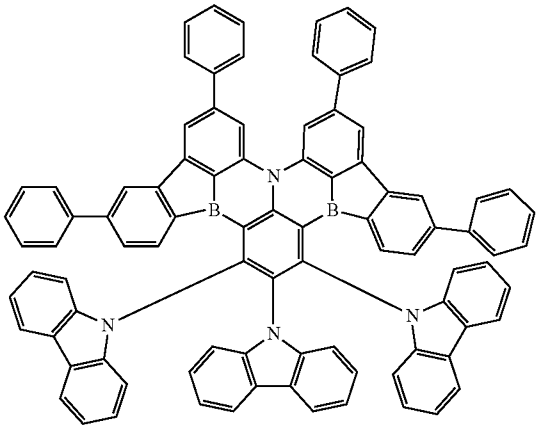
2-24
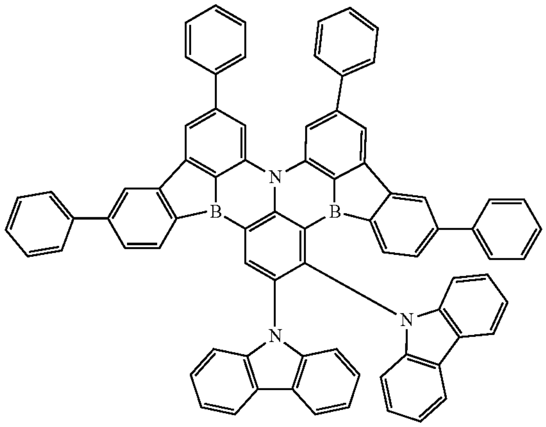
2-25
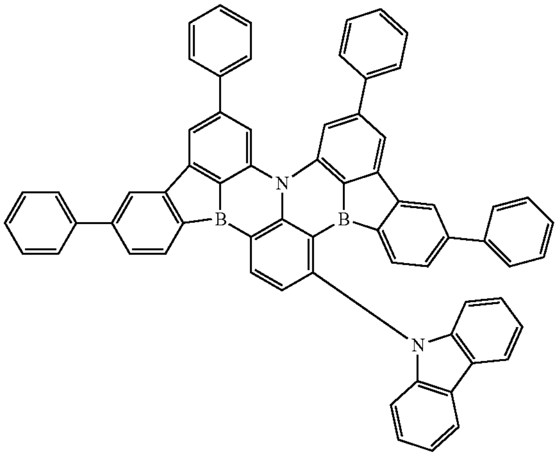
2-26
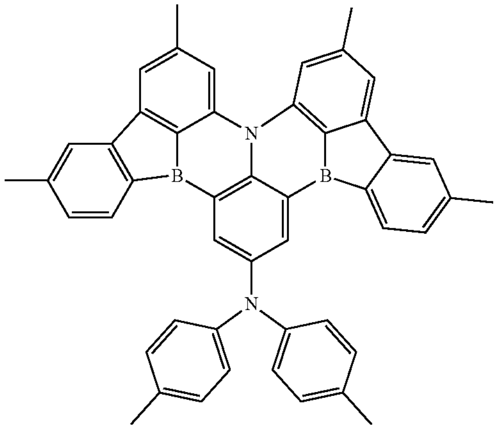

-continued
2-27
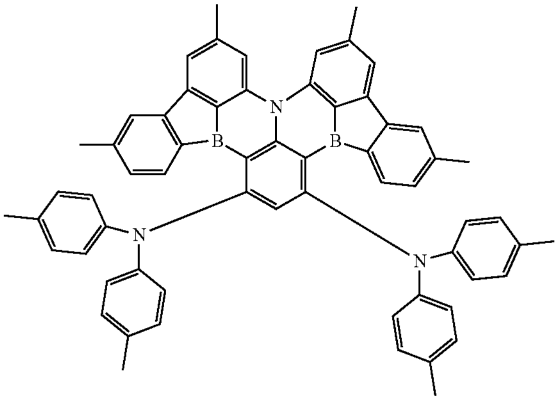
2-28
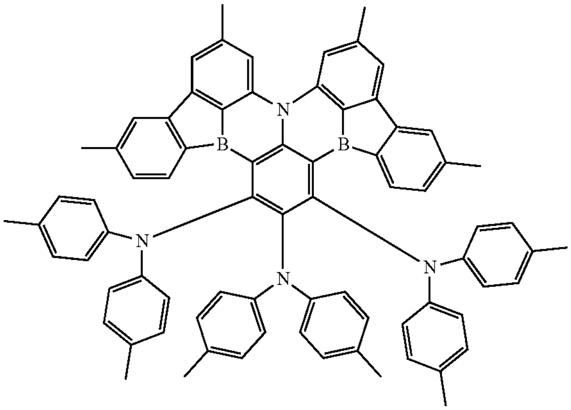
2-29
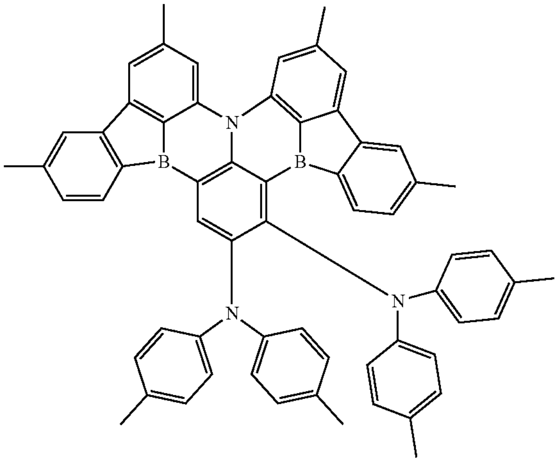
2-30
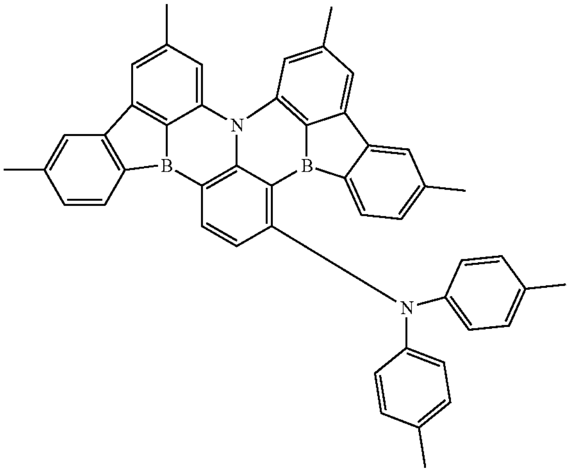
2-31
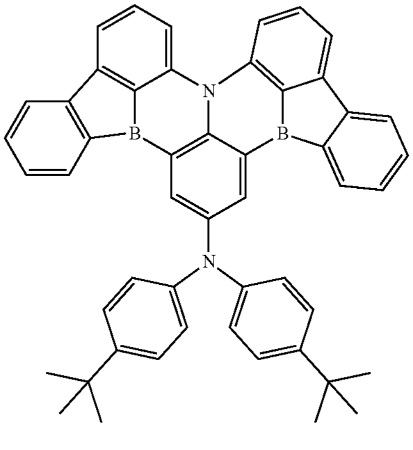
2-32
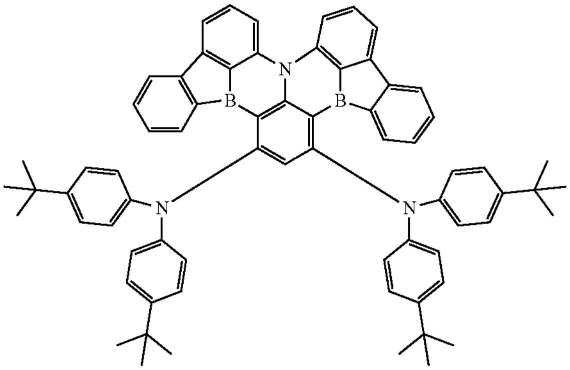

-continued
2-33
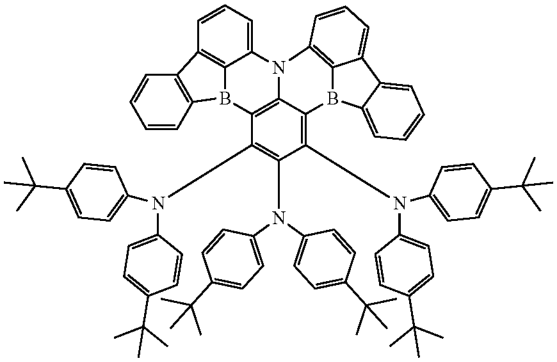
2-34
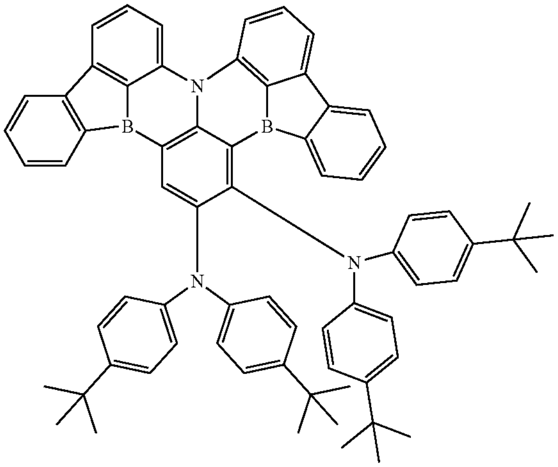
2-35
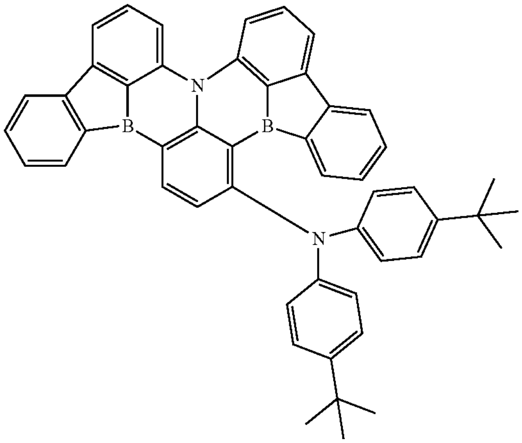
2-36
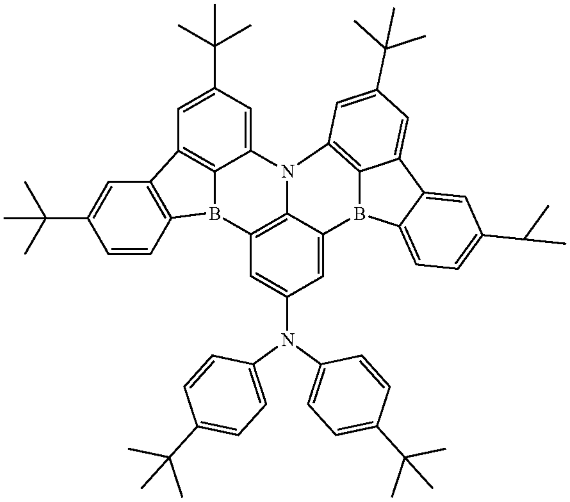
2-37
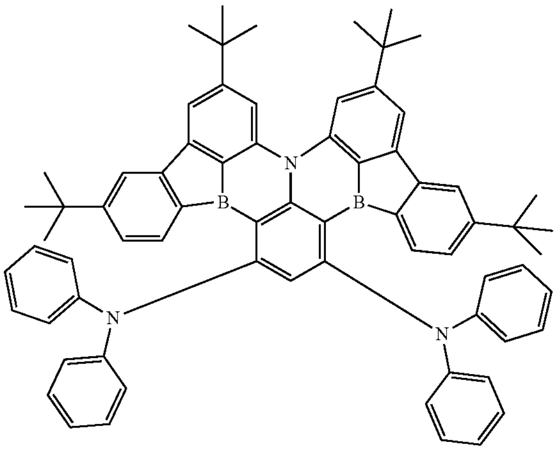
2-38
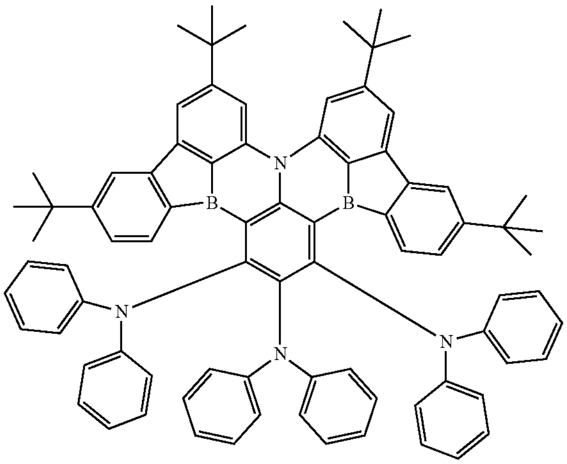

-continued
2-39
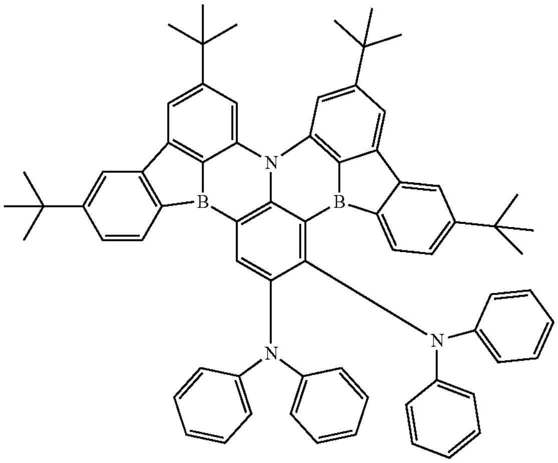
2-40
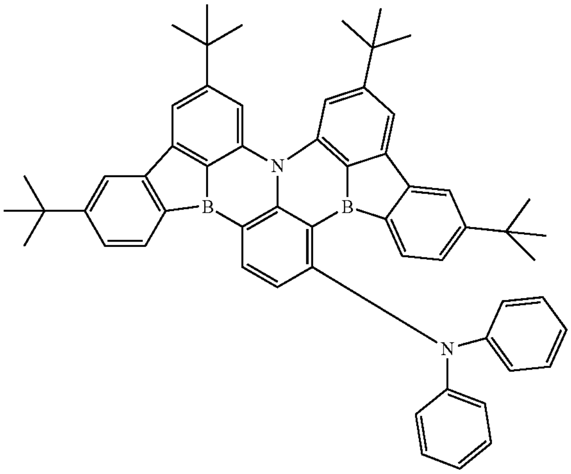
2-41
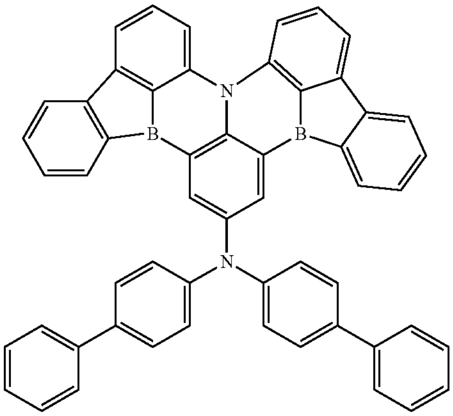
2-42
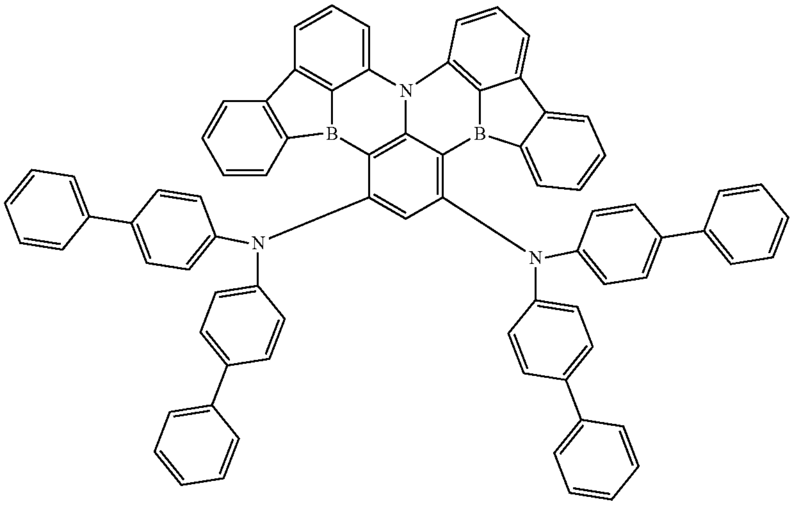

-continued
2-43
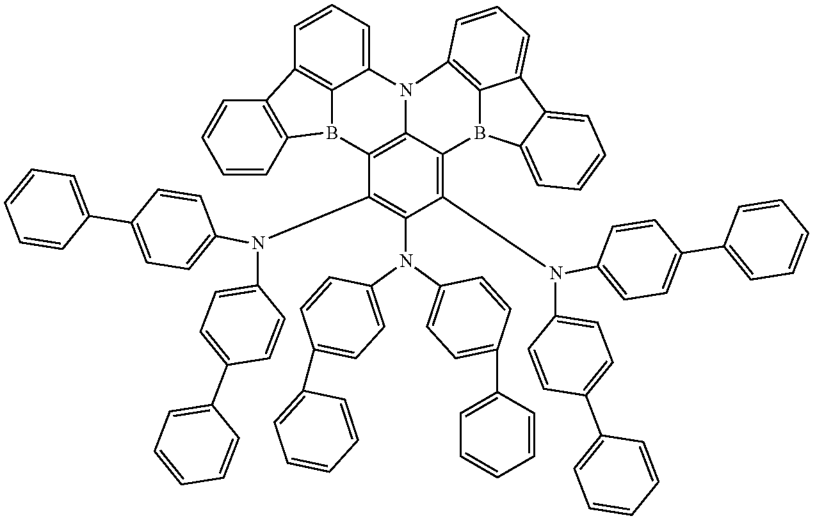
2-44
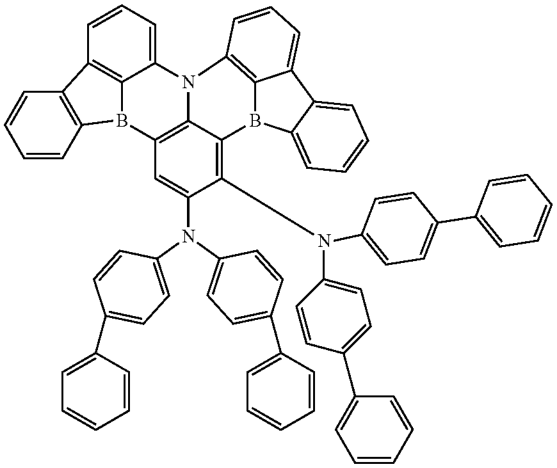
2-45
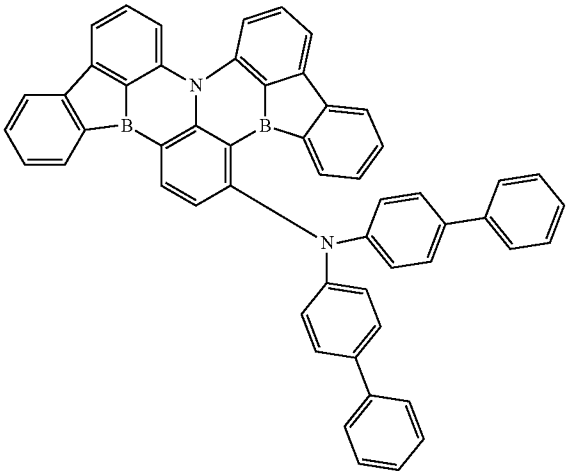
2-46
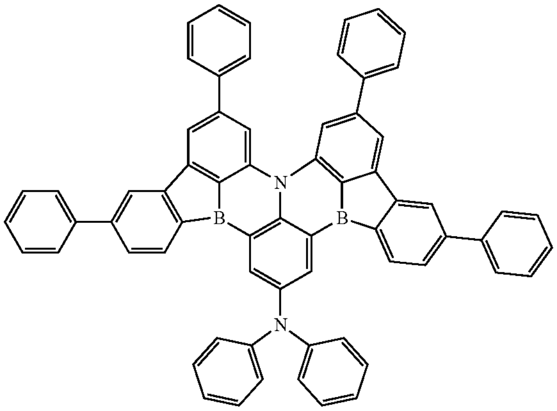
2-47
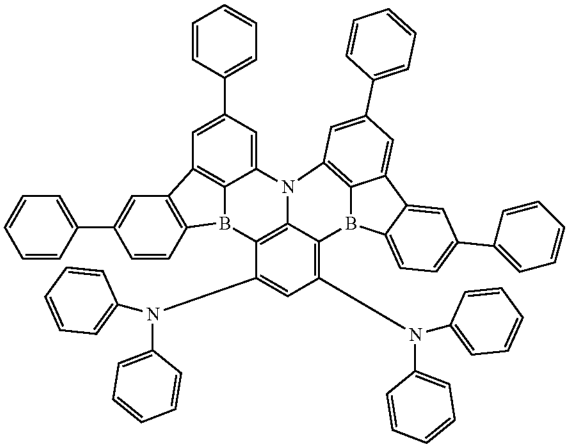

-continued
2-48
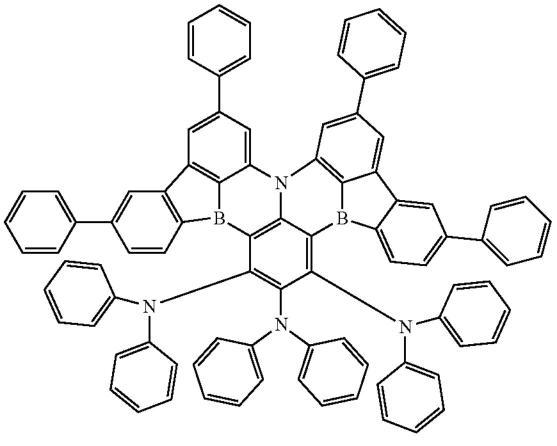
2-49
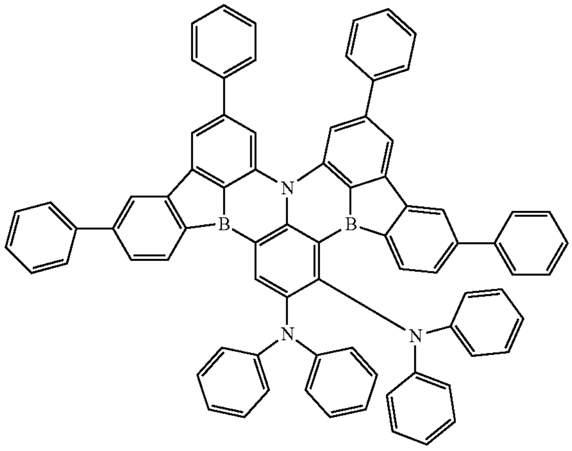
2-50
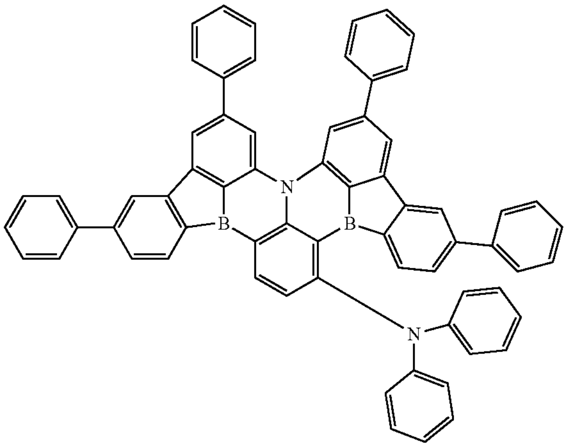
2-51
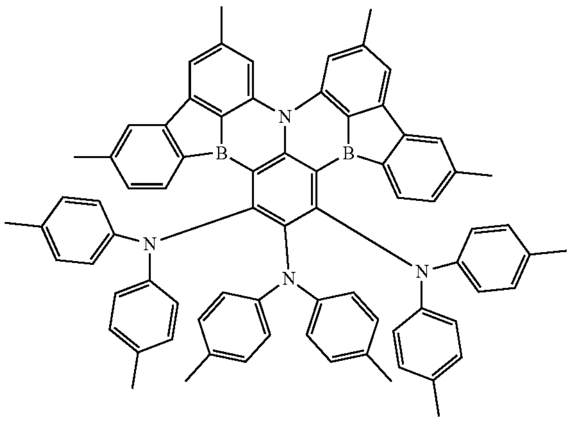
2-52
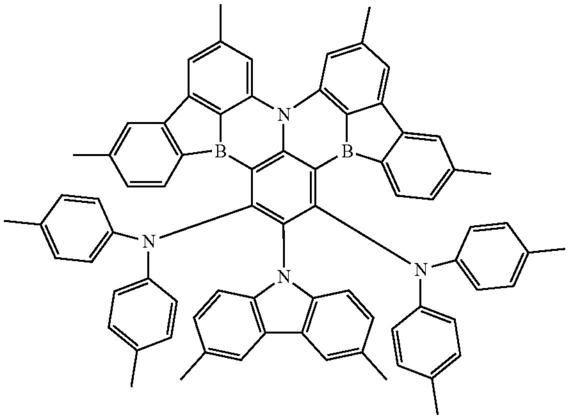
2-53
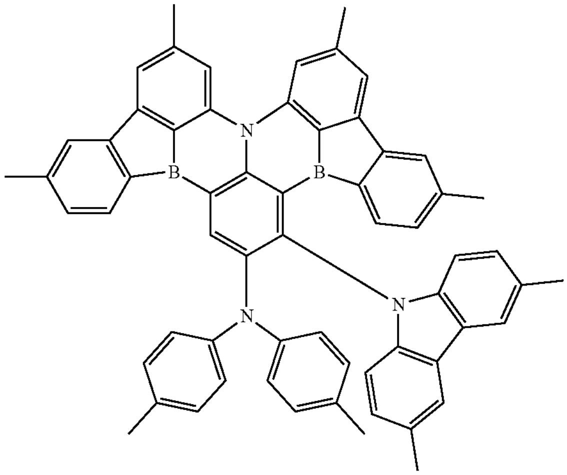

-continued
2-54
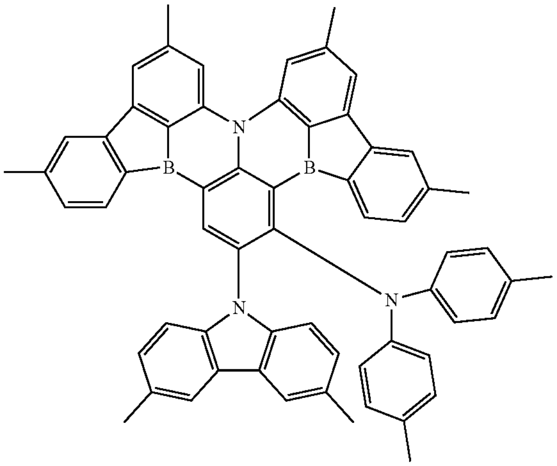
2-55
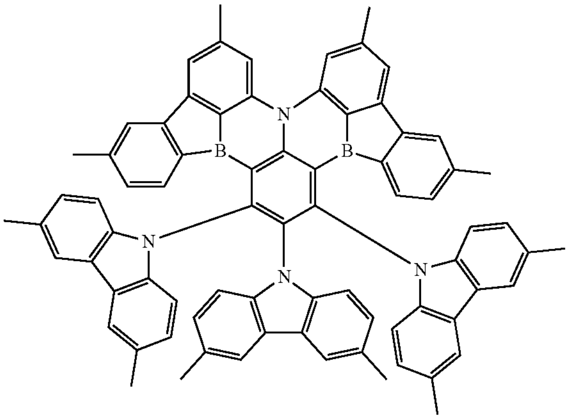
2-56
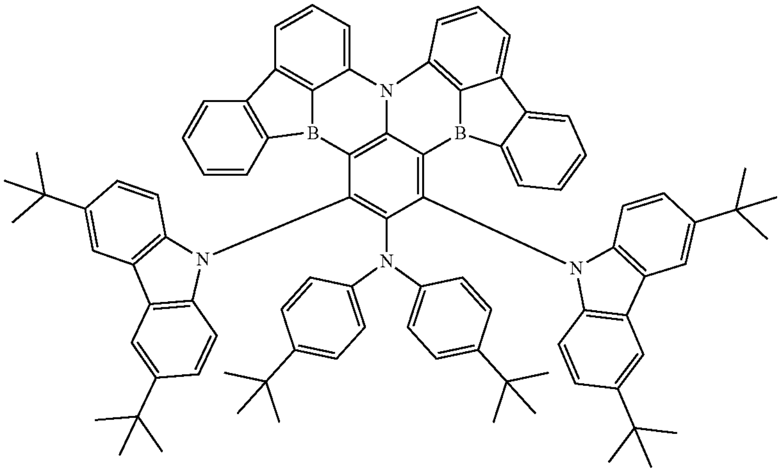
2-57
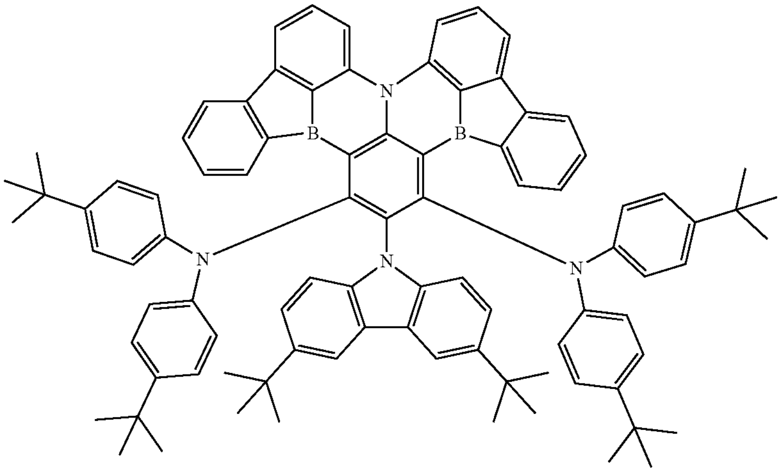

-continued
2-58
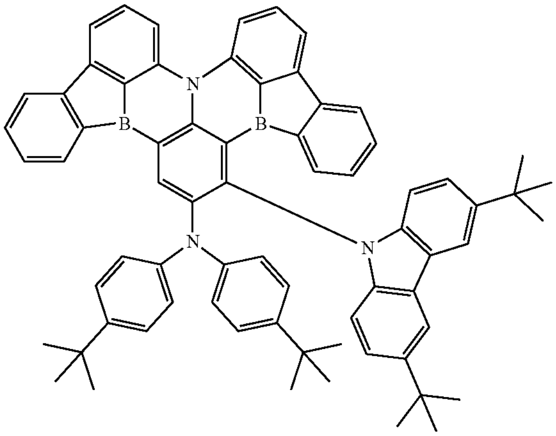
2-59
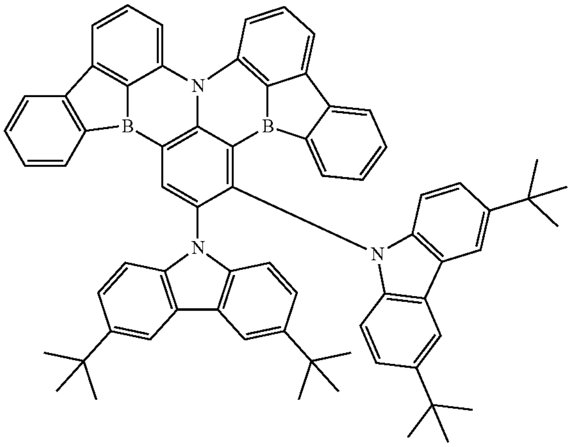
2-60
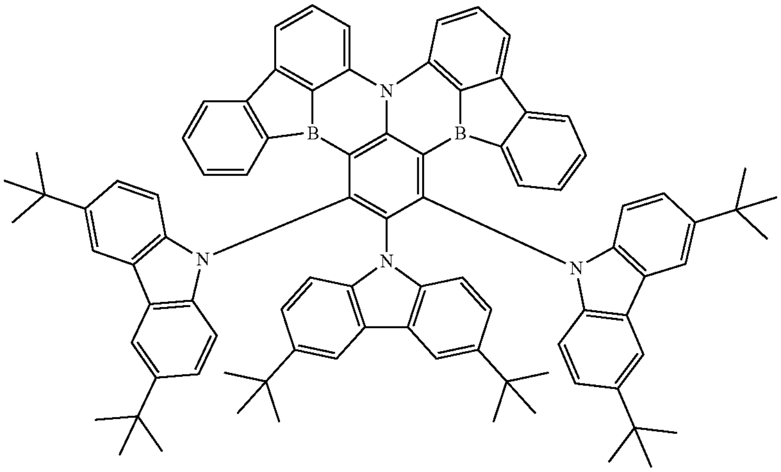
2-61
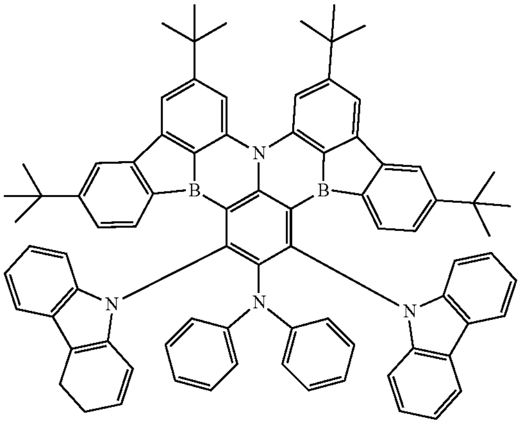
2-62
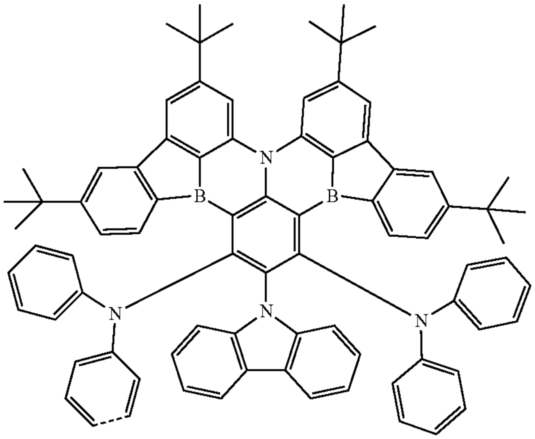

-continued
2-63
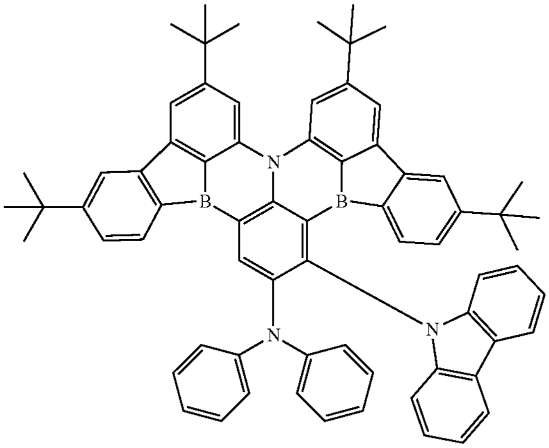
2-64
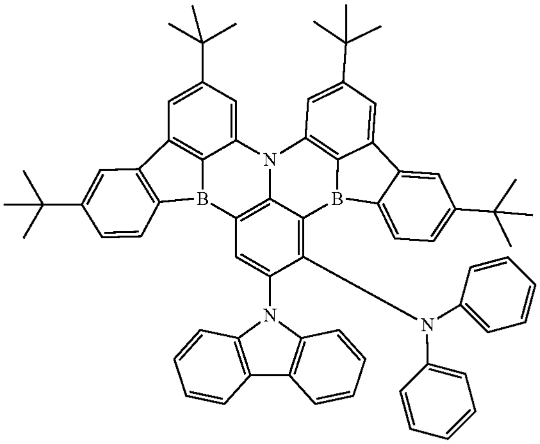
2-65
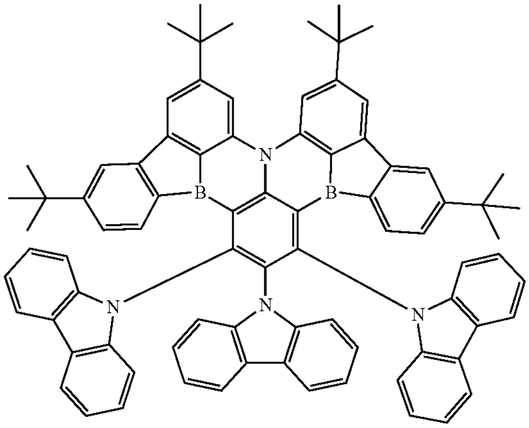
2-66
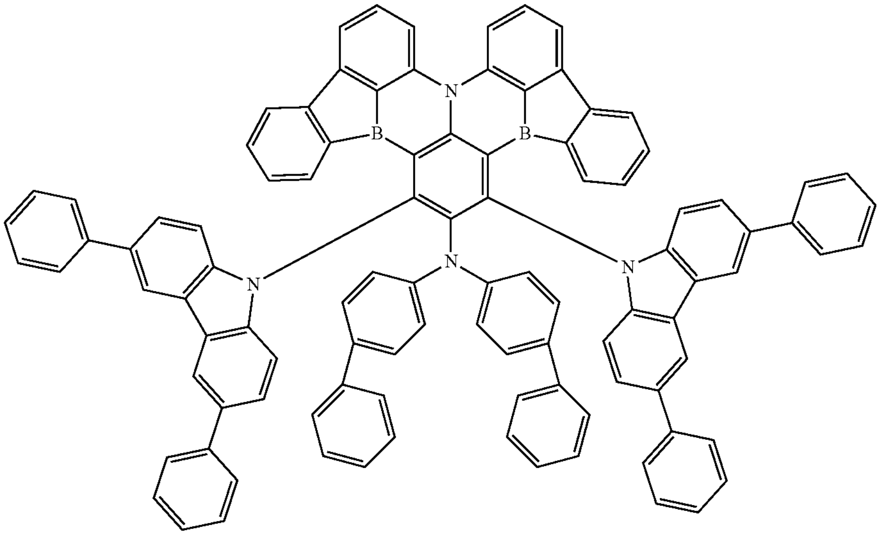

-continued
2-67
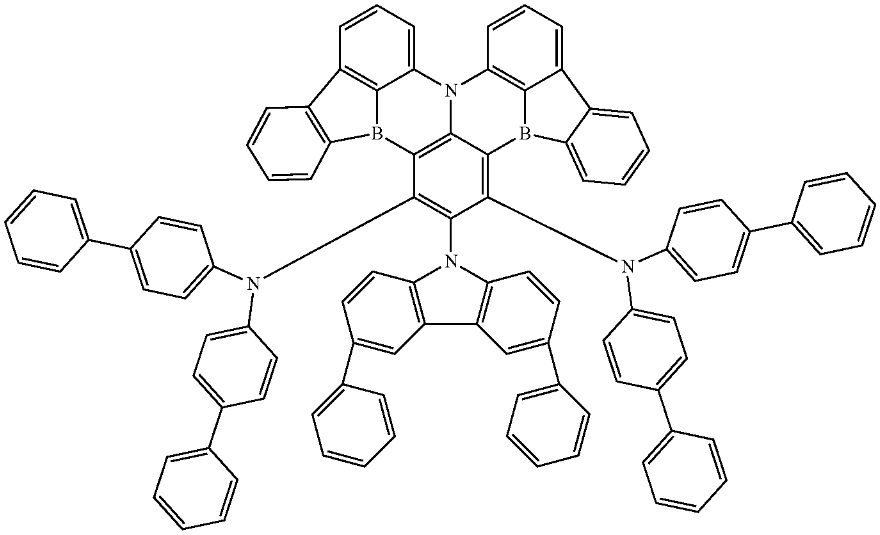
2-68
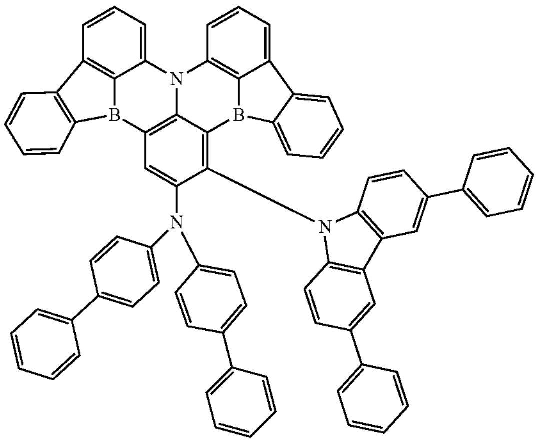
2-69
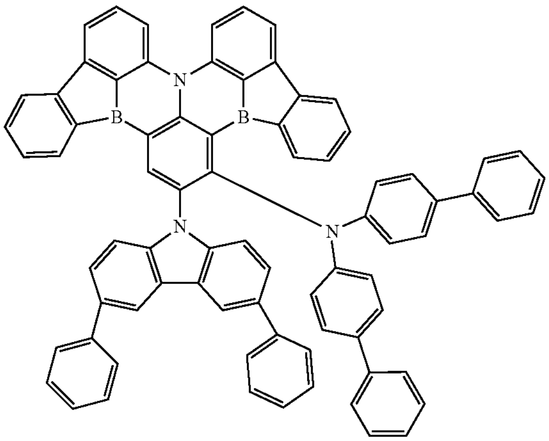
2-70
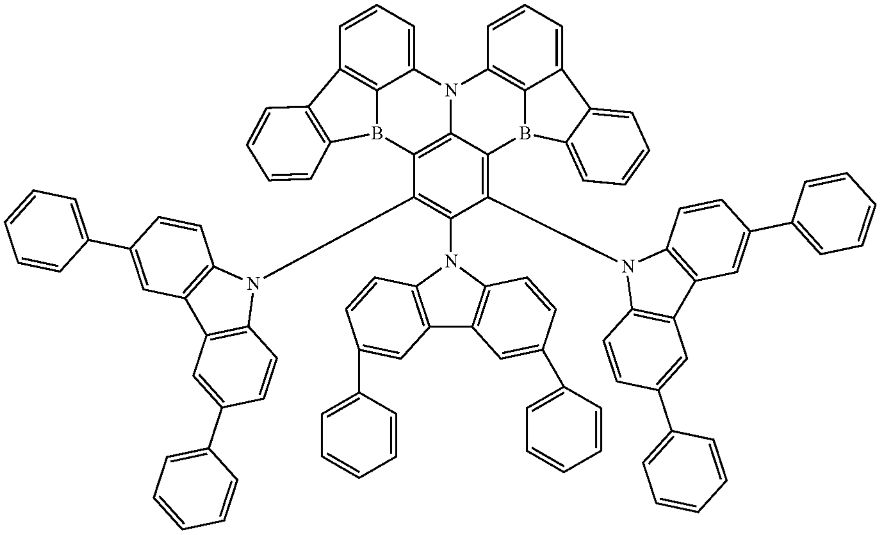

-continued
2-71
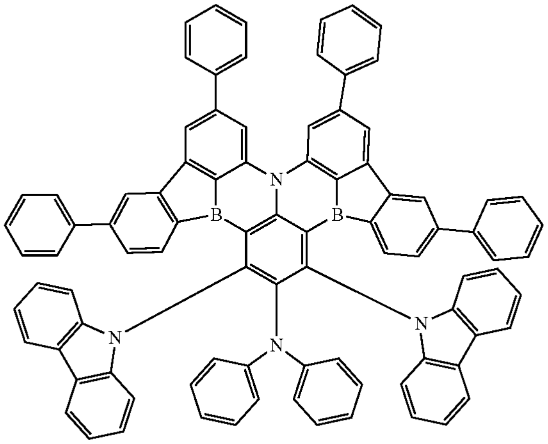
2-72
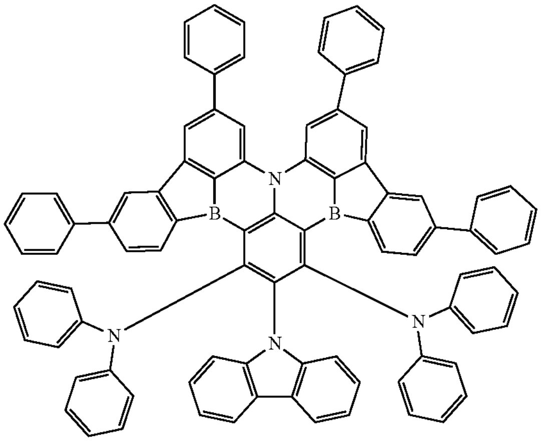
2-73
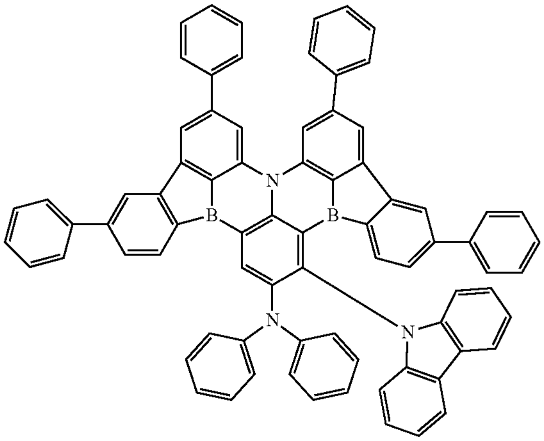
2-74
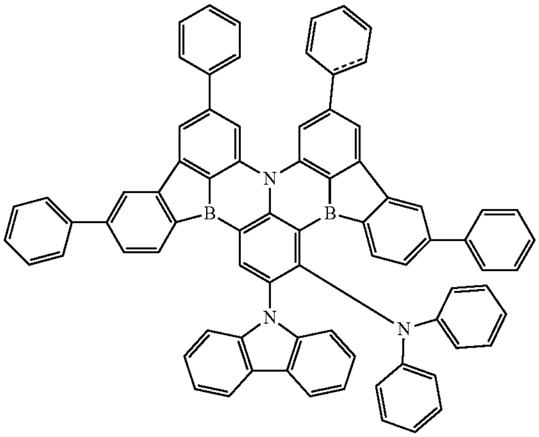
2-75
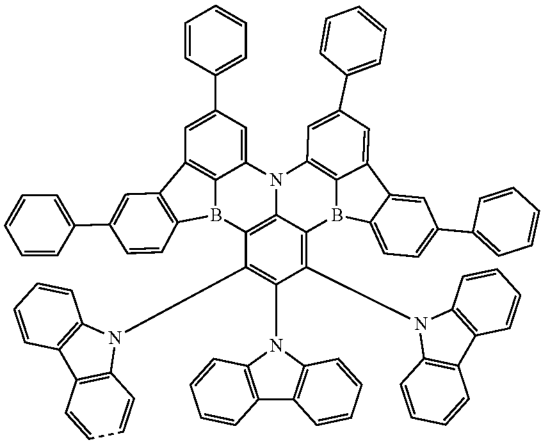
2-76
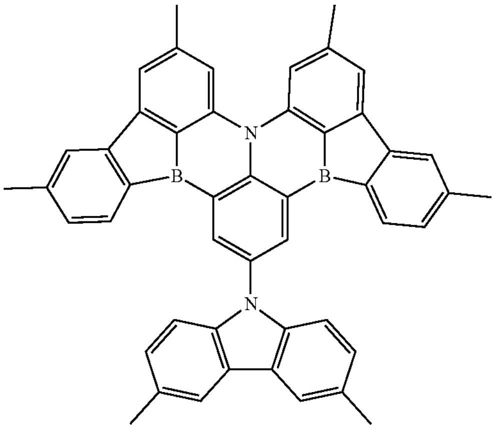

-continued 2-77

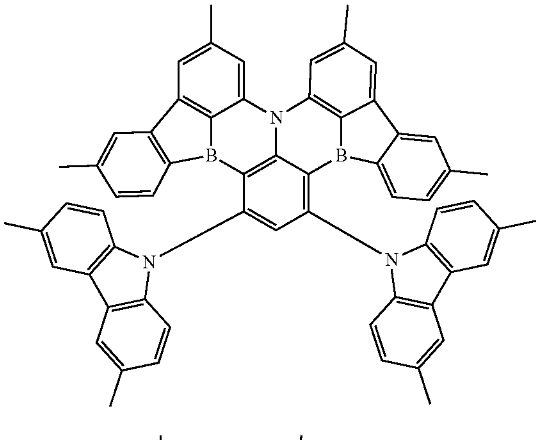

2-78

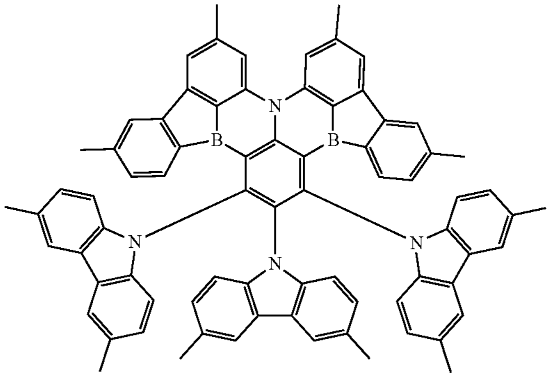

2-79

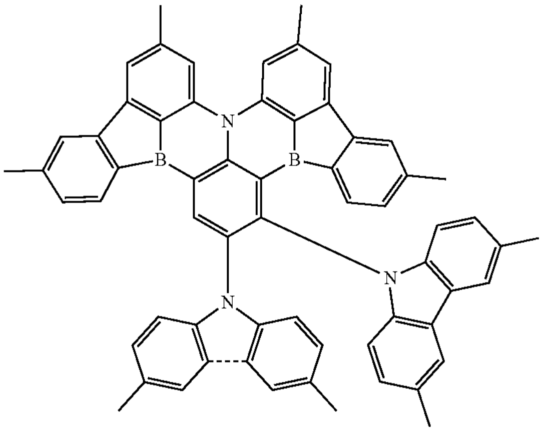

2-80

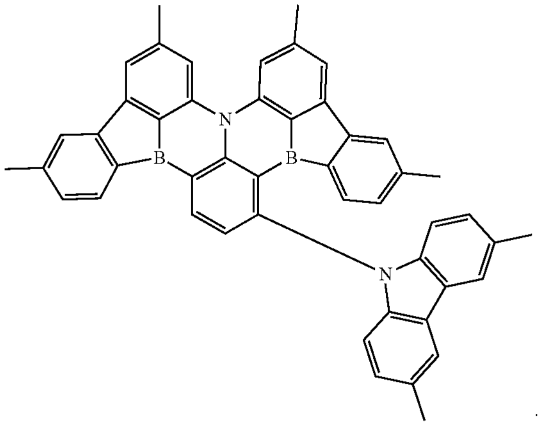

6. The organic light emitting diode according to claim 1, wherein a weight % of the first compound is greater than a weight % of the second compound.

7. The organic light emitting diode according to claim 1, wherein the first emitting material layer further includes a third compound as a first host.

8. The organic light emitting diode according to claim 7, wherein the third compound is represented by Formula 3-1:

[Formula 3-1]

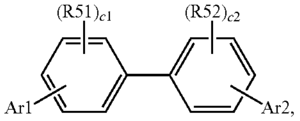

wherein each of R51 and R52 is independently selected from the group consisting of deuterium, tritium, a substituted or unsubstituted C1 to C20 alkyl group, a substituted or unsubstituted C6 to C30 aryl group and a substituted or unsubstituted C3 to C40 heteroaryl group, or adjacent two of R51 and R52 are connected to each other to form an aromatic ring or a heteroaromatic ring, wherein each of c1 and c2 is independently an integer of 0 to 4, and wherein each of Ar1 and Ar2 is independently selected from Formulas 3-2 to 3-4:

[Formula 3-2]

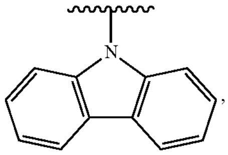

[Formula 3-3]

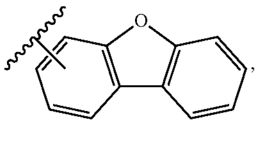

, and

[Formula 3-4]

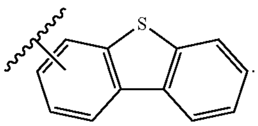

9. The organic light emitting diode according to claim 8, wherein the third compound is represented by Formula 3-5:

[Formula 3-5]

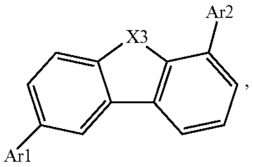

X3 is one of O, S and NR53, and R53 is selected from the group consisting of hydrogen, deuterium, tritium, a substituted or unsubstituted C1 to C20 alkyl group, a substituted or unsubstituted C6 to C30 aryl group and a substituted or unsubstituted C3 to C40 heteroaryl group.

10. The organic light emitting diode according to claim 8, wherein the third compound is one of compounds in Formula 3-6:

[Formula 3-6]

3-1

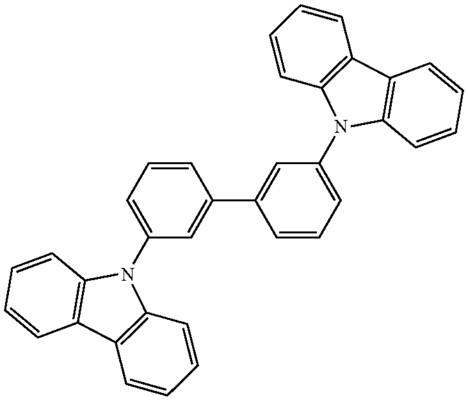

3-2

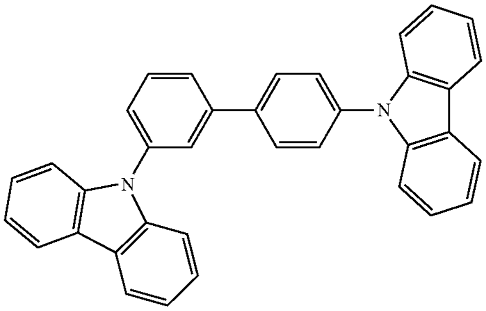

-continued 3-3

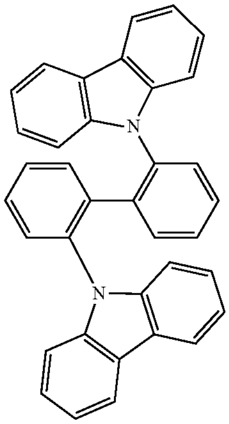

3-4

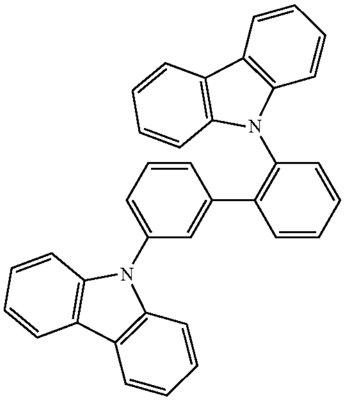

3-5

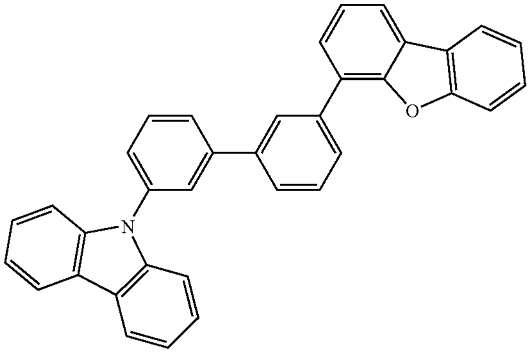

-continued
3-6
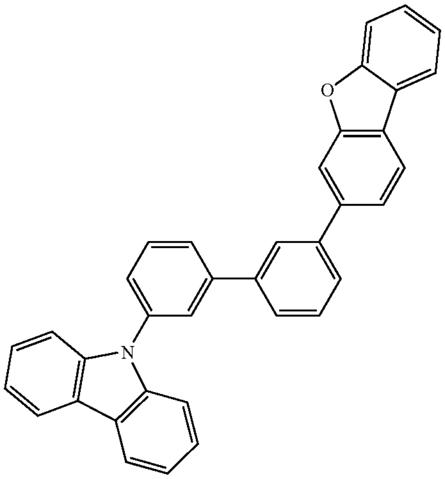
3-7
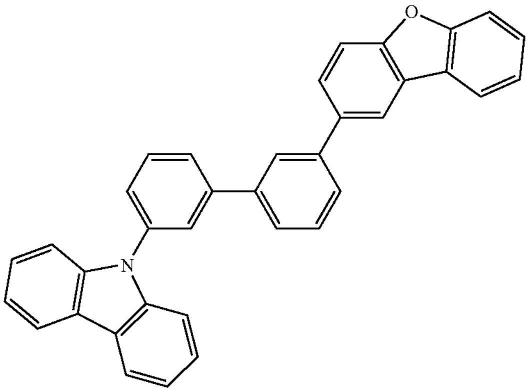
3-8
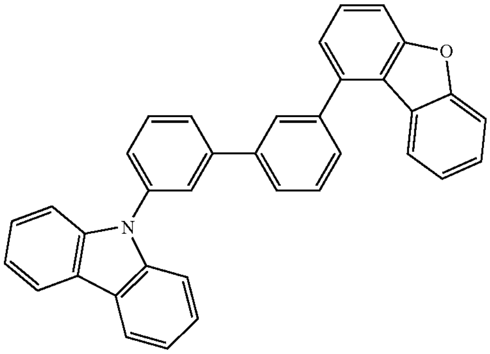
3-9
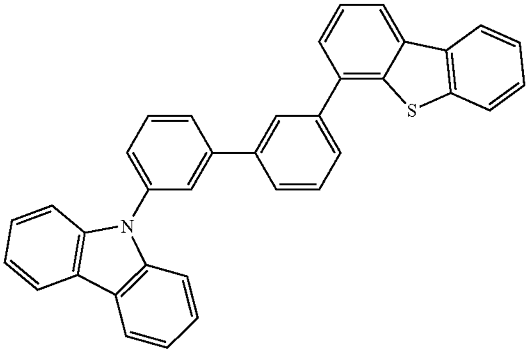
-continued
3-10
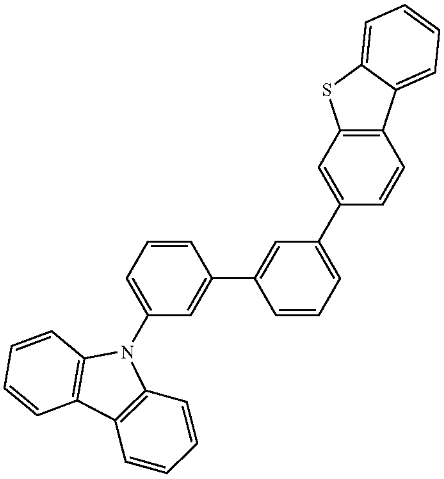
3-11
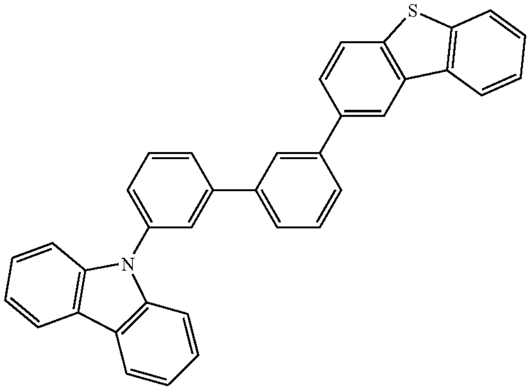
3-12
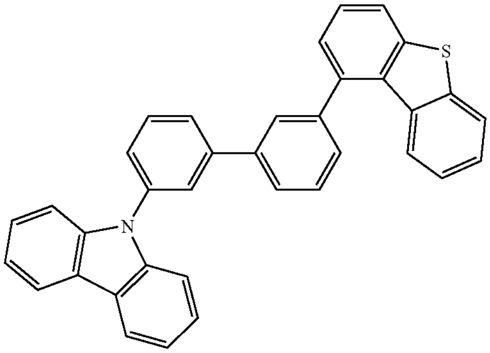
3-13
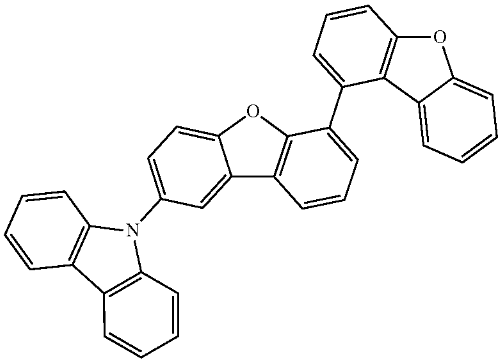

-continued
3-14
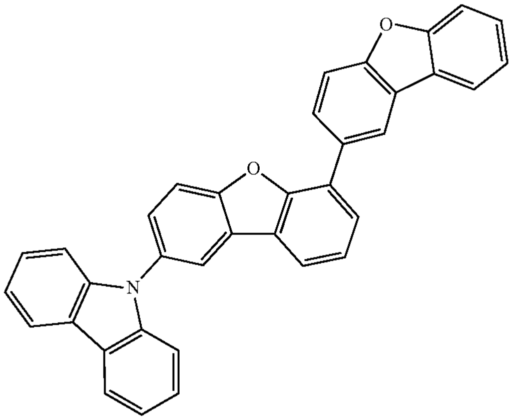
3-15
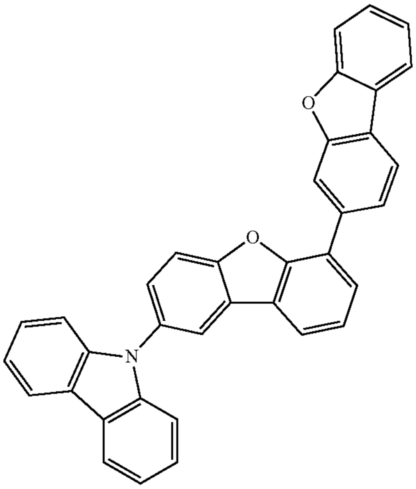
3-16
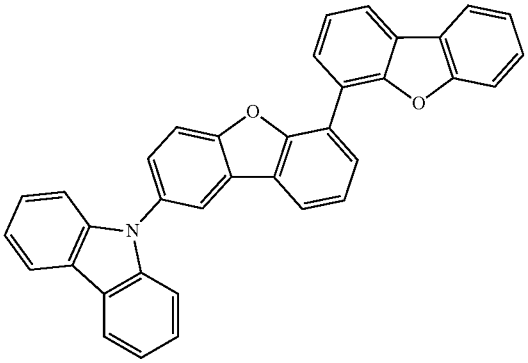
-continued
3-17
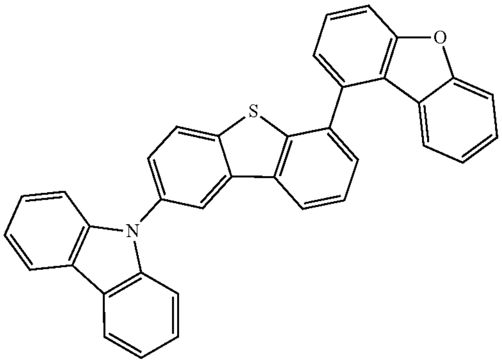
3-18
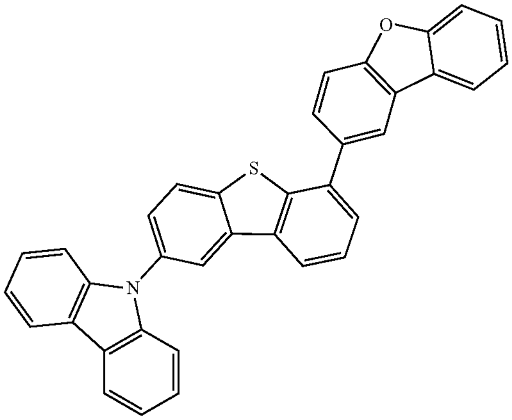
3-19
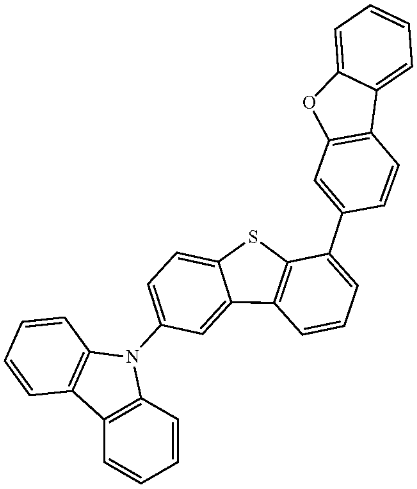

-continued 3-20

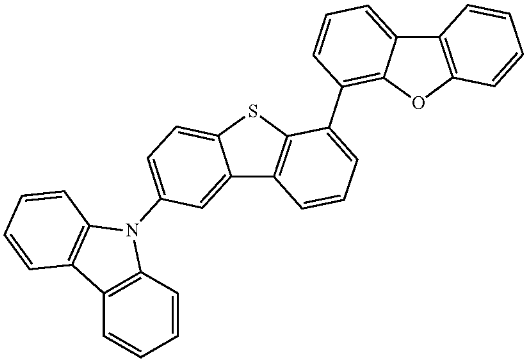

3-21

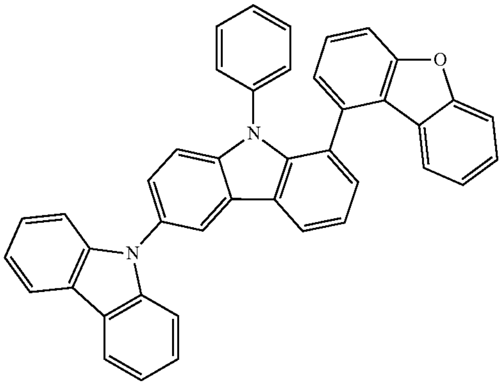

3-22

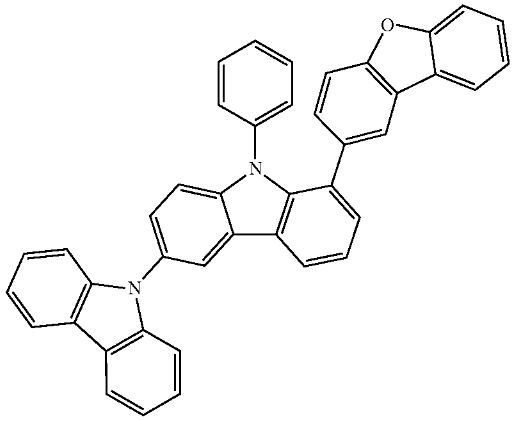

-continued 3-23

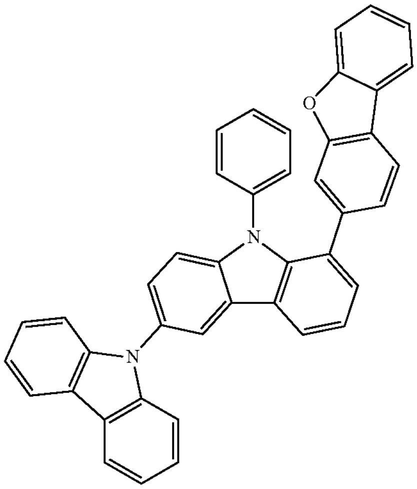

3-24

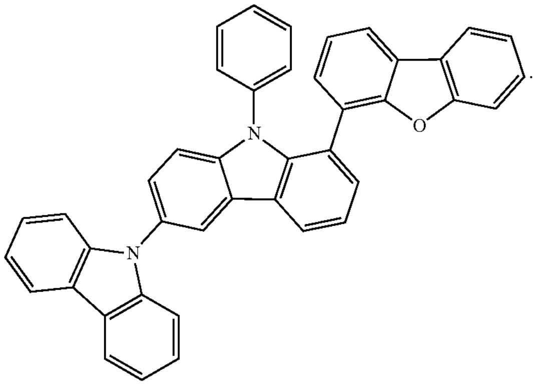

.

11. The organic light emitting diode according to claim 1, wherein the first emitting material layer includes a first layer and a second layer, and the second layer is positioned between the first layer and the second electrode, and wherein the first layer includes the second compound and a first host, and the second layer includes the first compound and a second host.

12. The organic light emitting diode according to claim 11, wherein the first emitting material layer further includes a third layer including the second compound and a third host and positioned between the second layer and the second electrode.

13. The organic light emitting diode according to claim 1, further comprising:

a second emitting material layer between the first electrode and the first emitting material layer; and a charge generation layer between the first and second emitting material layers, wherein the second emitting material layer is one of a red emitting material layer, a green emitting material layer and a blue emitting material layer.

14. An organic light emitting device, comprising:

a substrate;

the organic light emitting diode according to claim 1 disposed over the substrate; and an encapsulation film covering the organic light emitting diode.

15. The organic light emitting device according to claim 14, wherein the Formula 1-1 is represented by Formula 1-2:

[Formula 1-2]

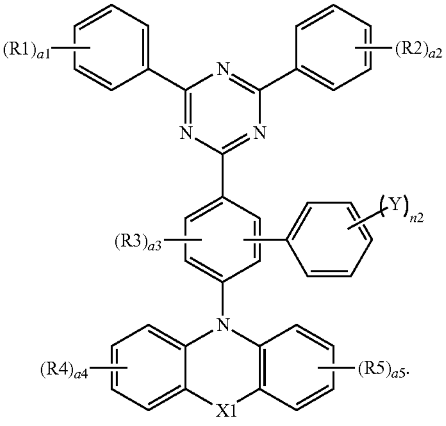

16. The organic light emitting device according to claim 15, wherein the Formula 1-2 is represented by Formula 1-3:

[Formula 1-3]

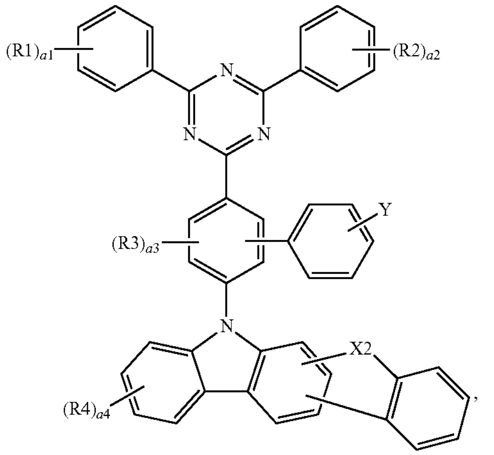

wherein X2 is one of NR8, O and S, and R8 is selected from the group consisting of hydrogen, deuterium, tritium, a substituted or unsubstituted C1 to C20 alkyl group, a substituted or unsubstituted C6 to C30 aryl group and a substituted or unsubstituted C3 to C40 heteroaryl group.

17. The organic light emitting device according to claim 14, wherein the first compound is one of compounds in Formula 1-4:

[Formula 1-4]

1-1

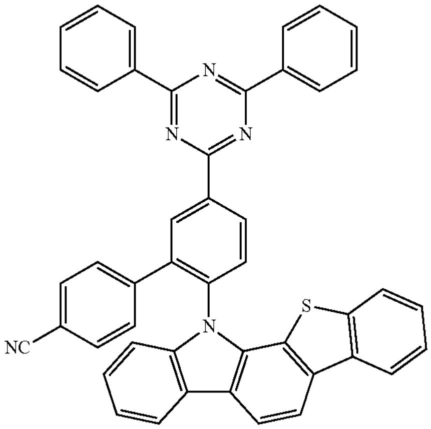

1-2

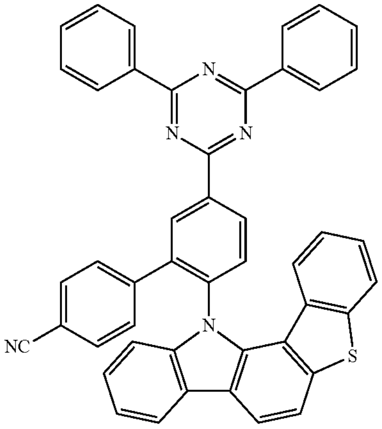

1-3

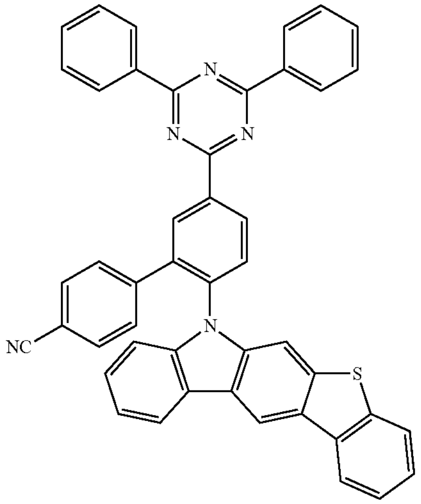

-continued
1-4
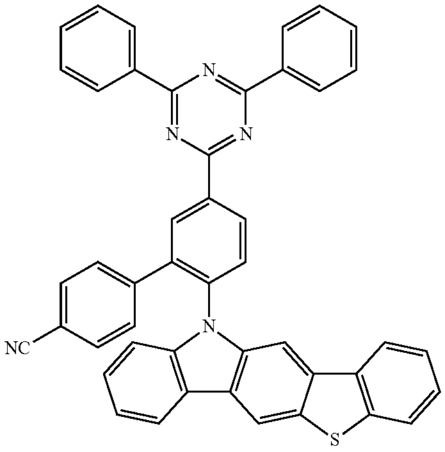
1-5
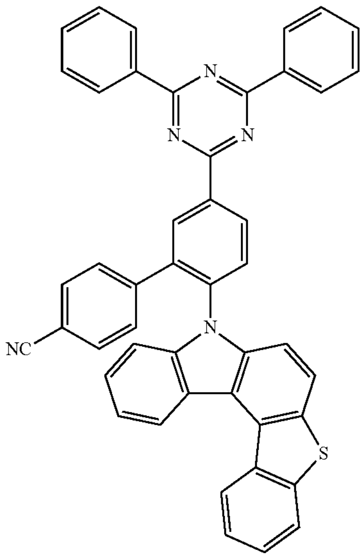
1-6
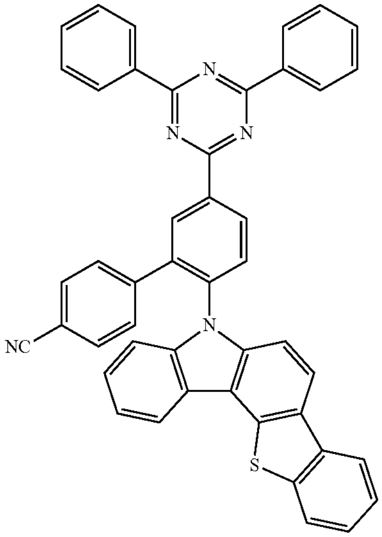
-continued
1-7
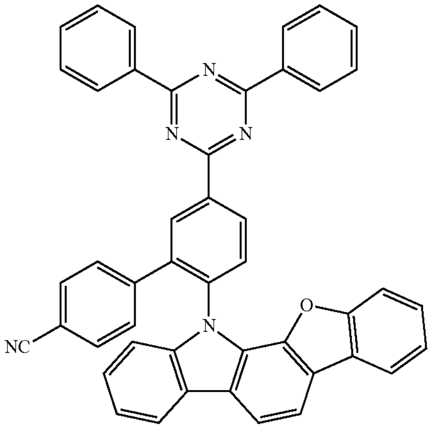
1-8
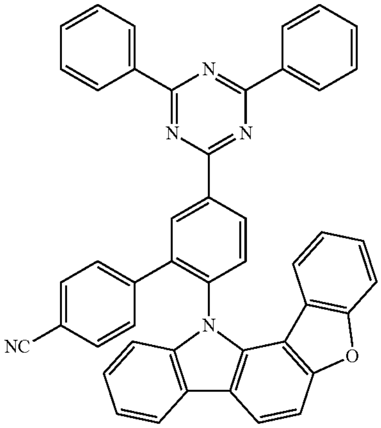
1-9
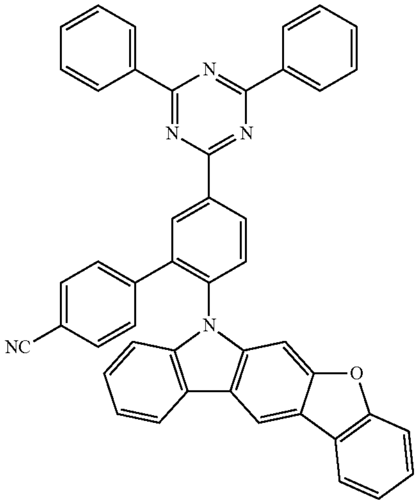

-continued
1-10
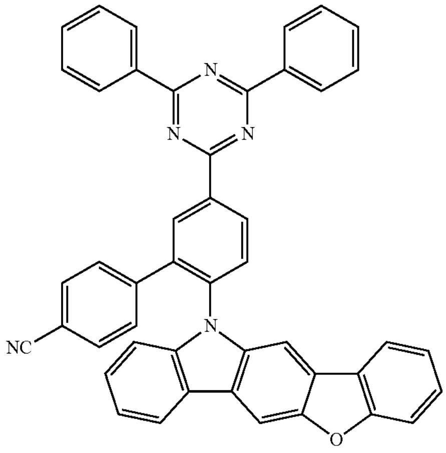
1-11
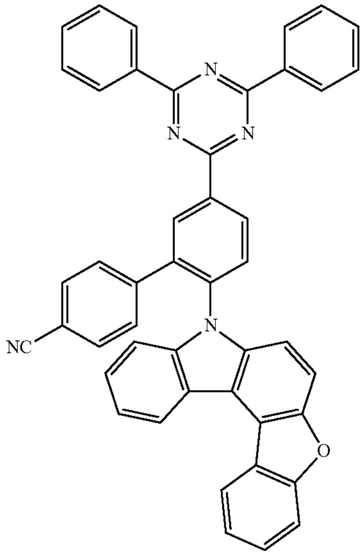
1-12
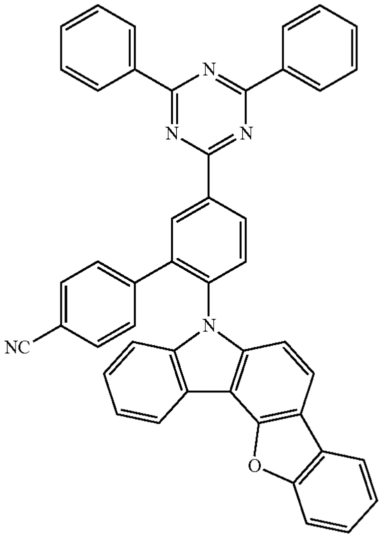
-continued
1-13
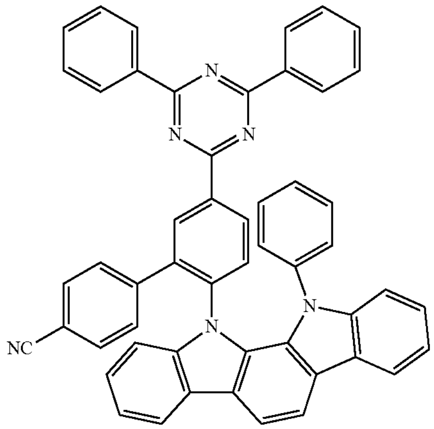
1-14
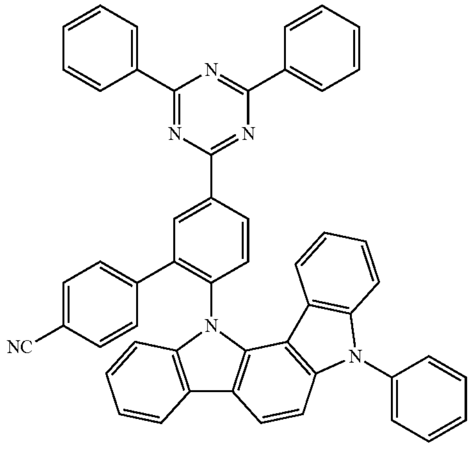
1-15
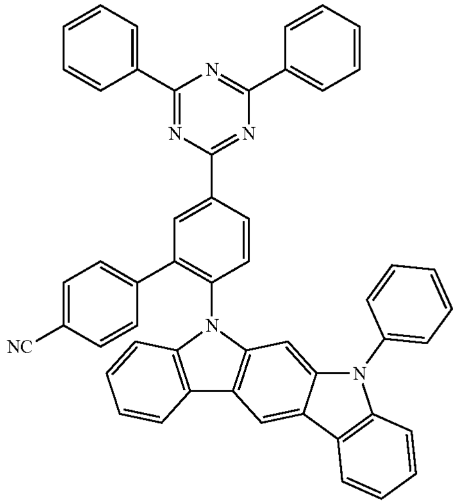

-continued
1-16
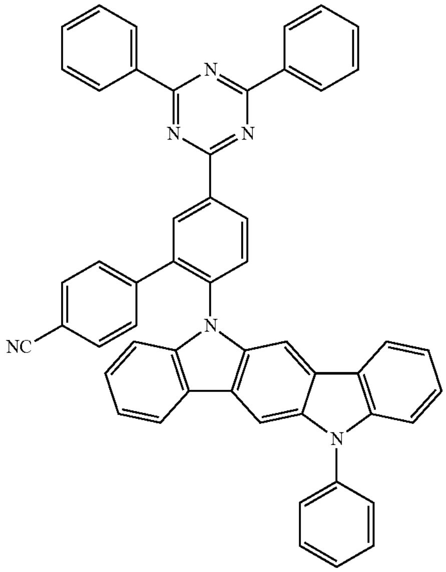
1-17
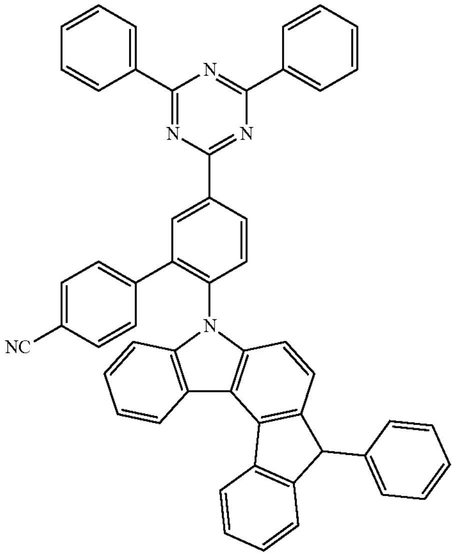
-continued
1-18
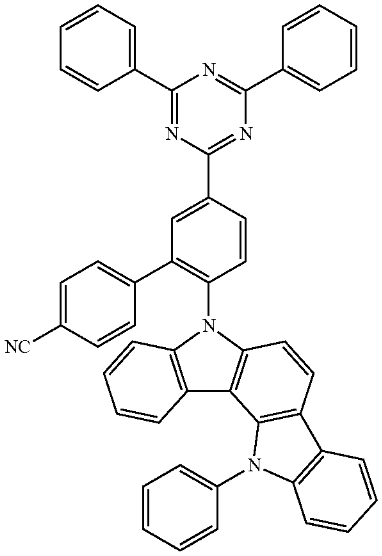
1-19
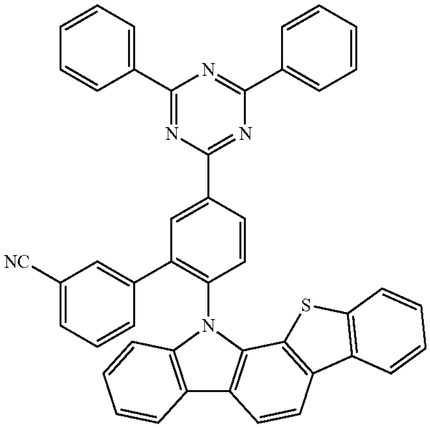
1-20
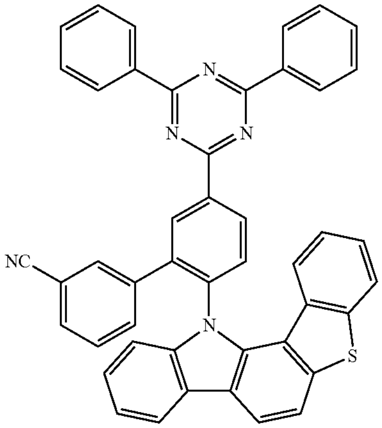

-continued
1-21
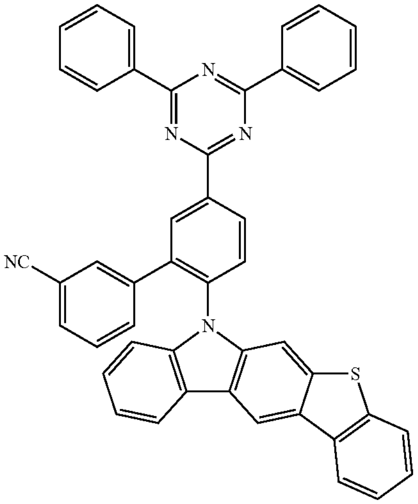
1-22
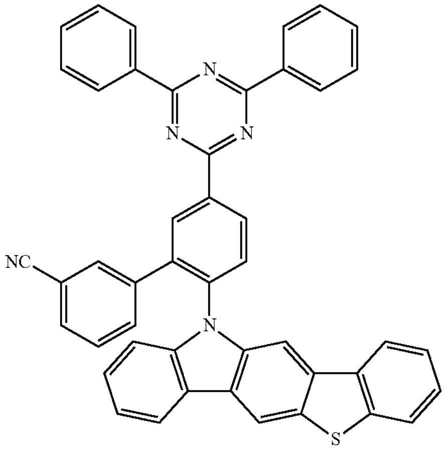
1-23
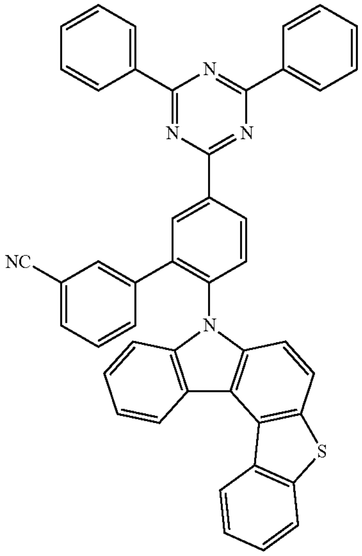
-continued
1-24
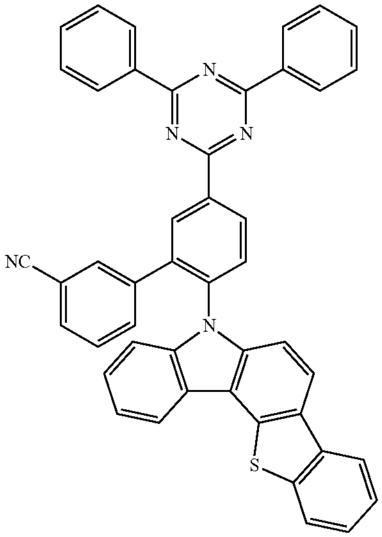
1-25
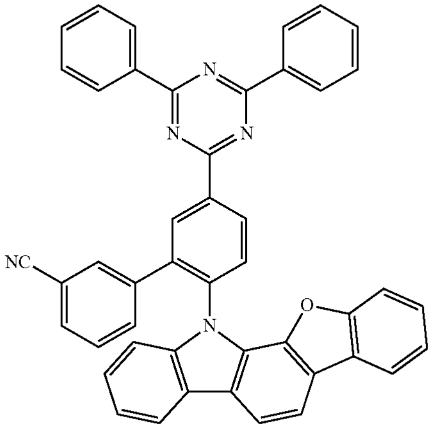
1-26
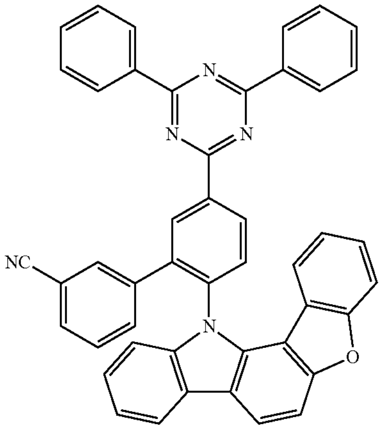

-continued
1-27
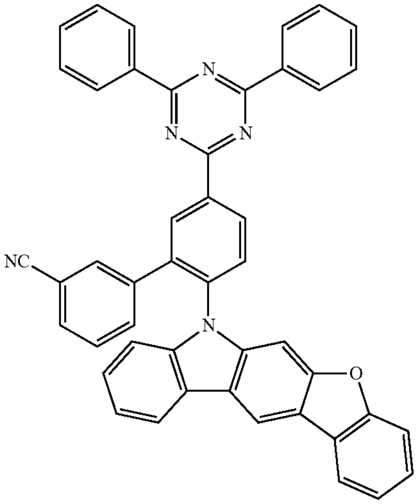
1-28
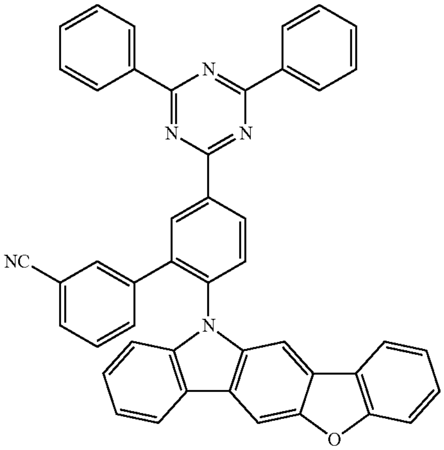
1-29
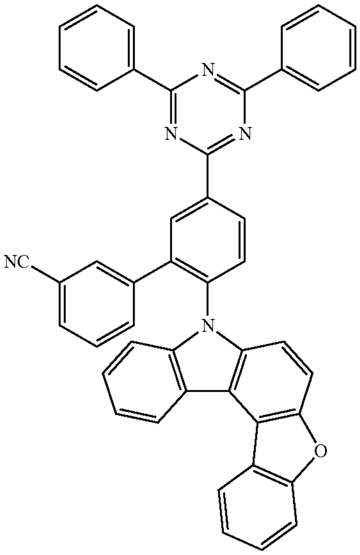
-continued
1-30
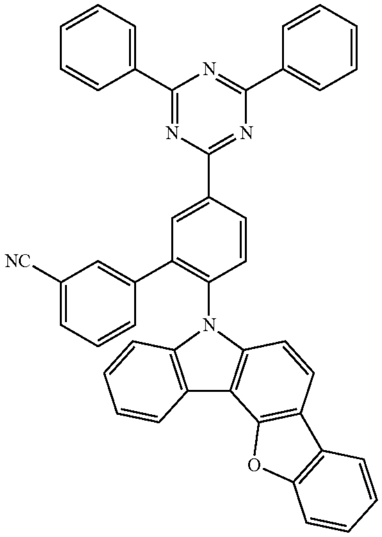
1-31
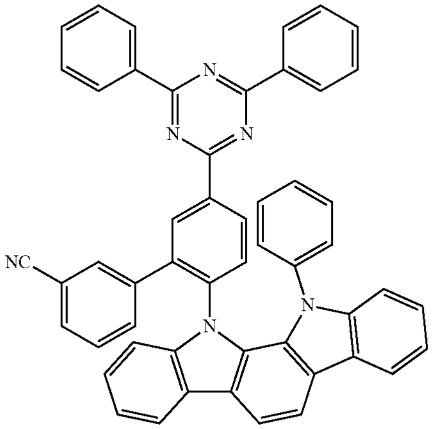
1-32
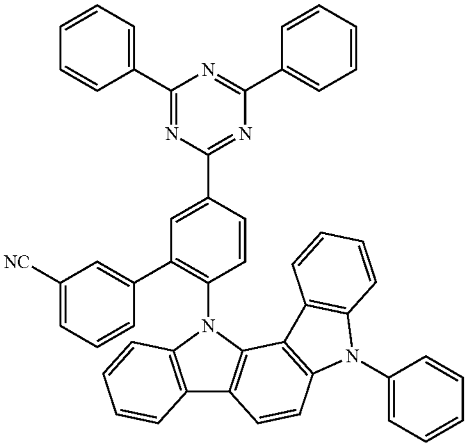

-continued
1-33
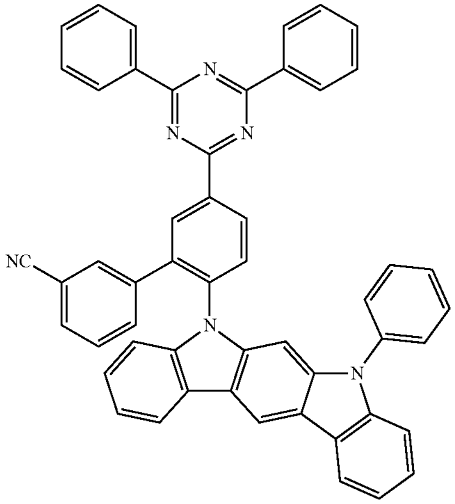
1-34
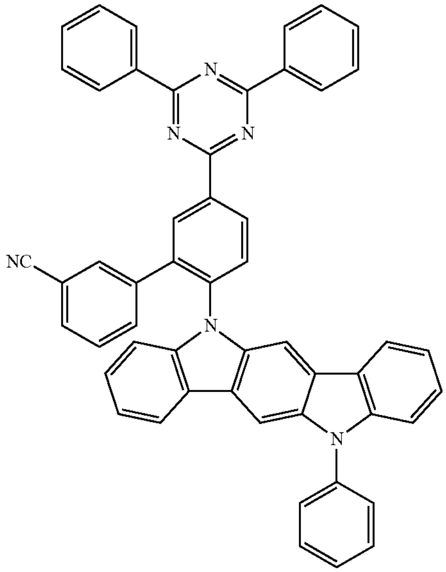
-continued
1-35
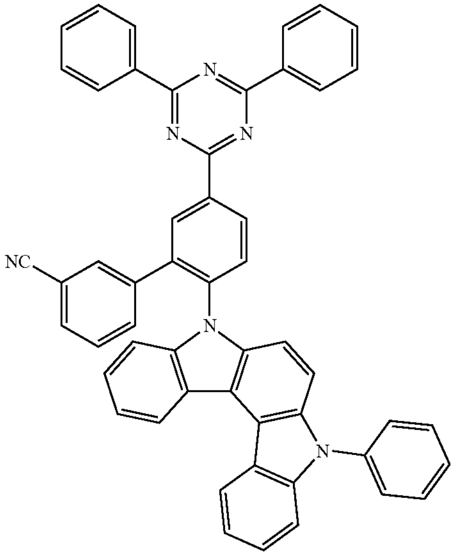
1-36
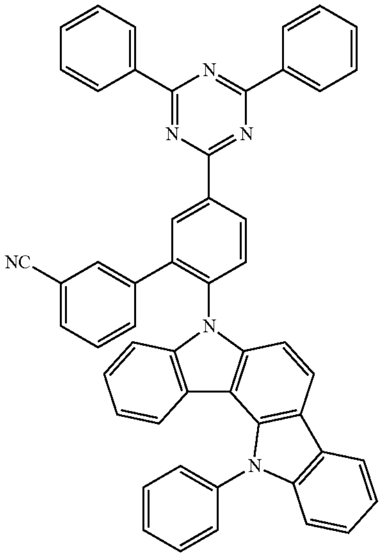
1-37
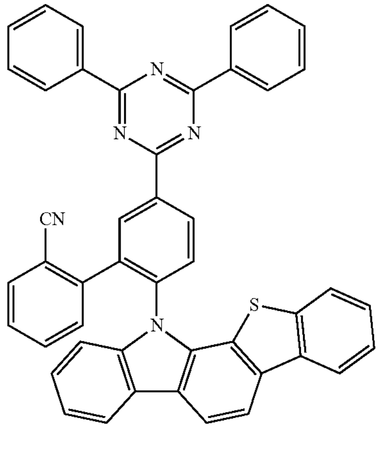

-continued
1-38
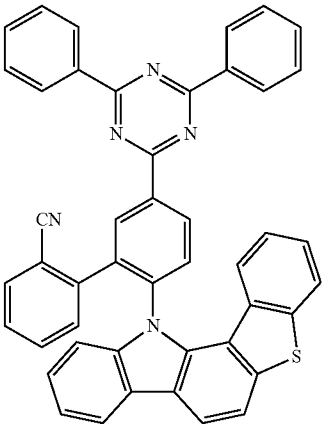
1-39
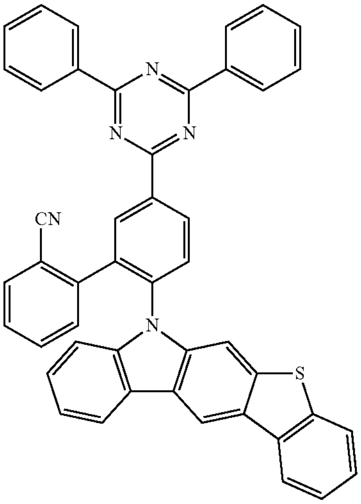
1-40
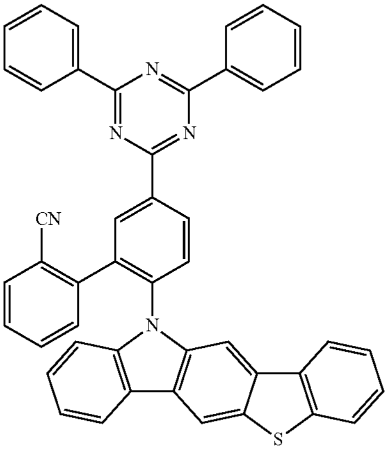
-continued
1-41
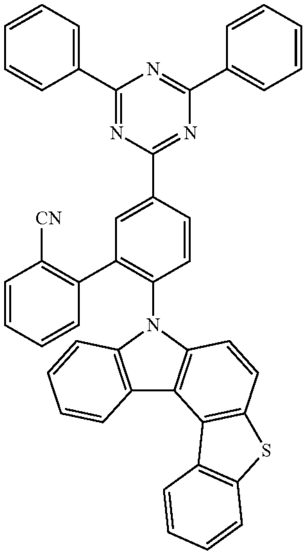
1-42
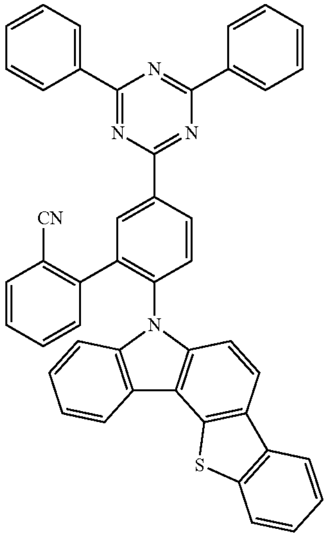
1-43
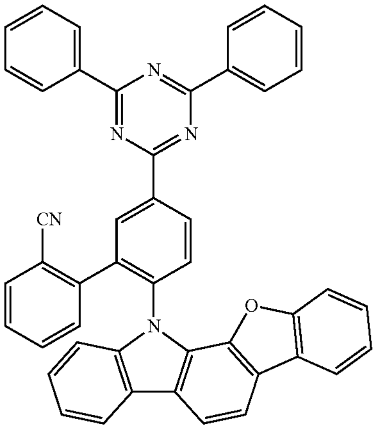

-continued
1-44
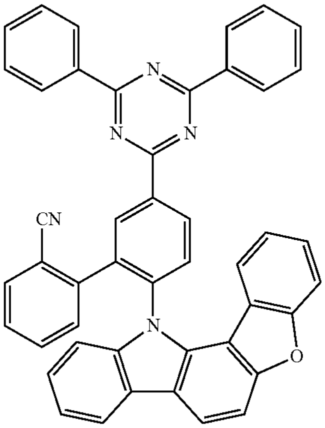
1-45
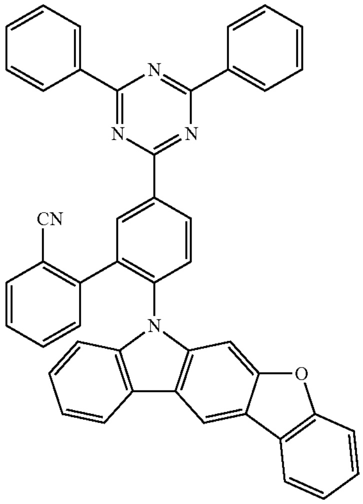
1-46
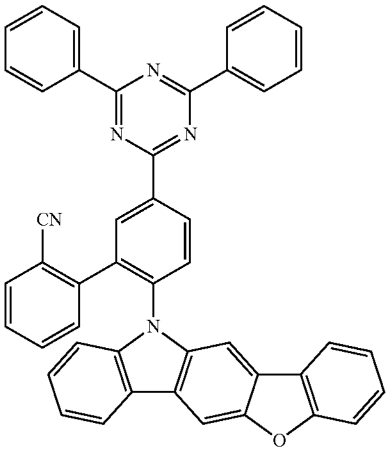
-continued
1-47
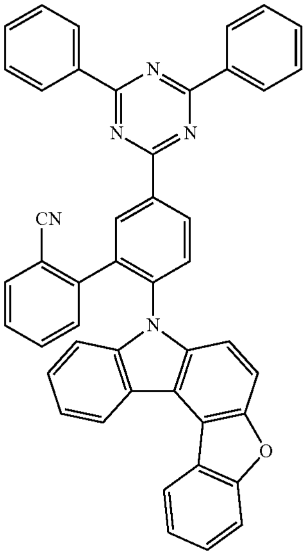
1-48
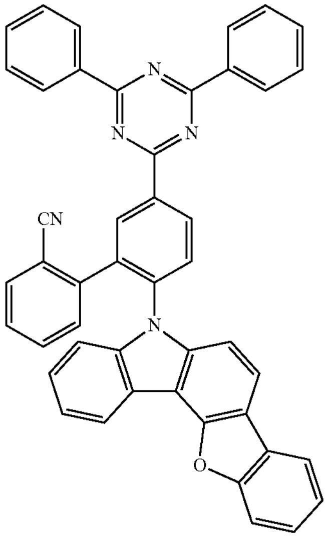
1-49
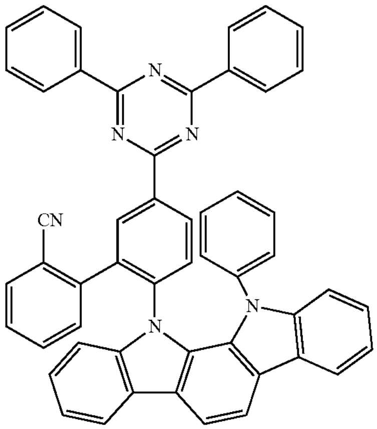

-continued
1-50
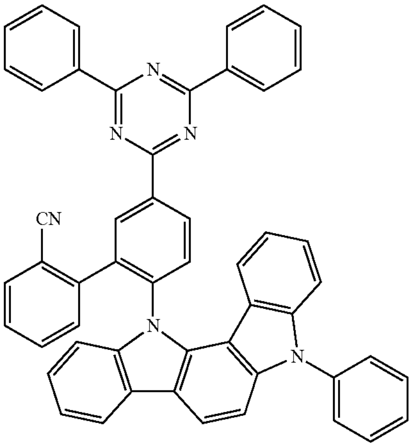
1-51
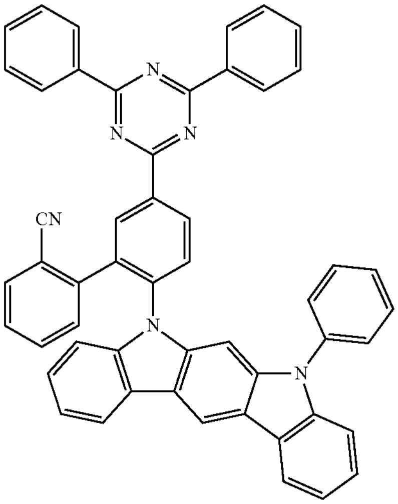
1-52
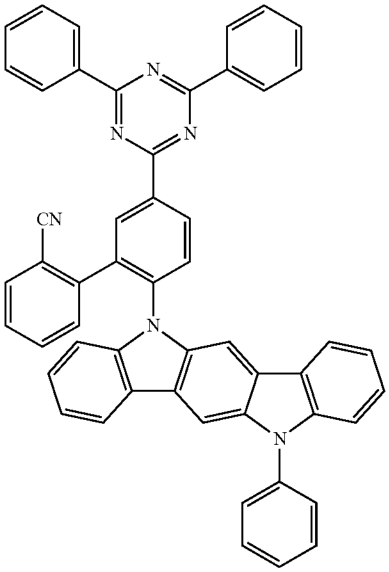
-continued
1-53
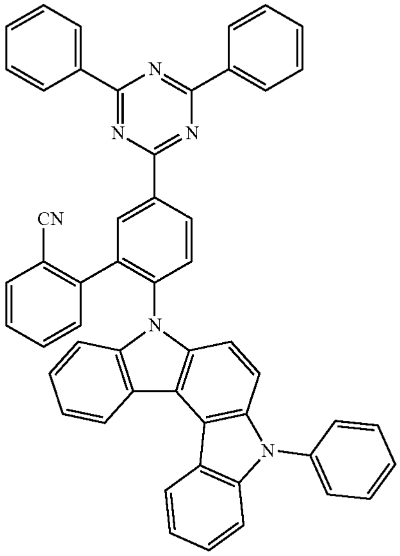
1-54
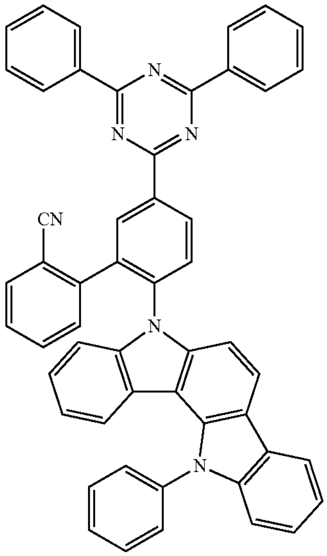
1-55
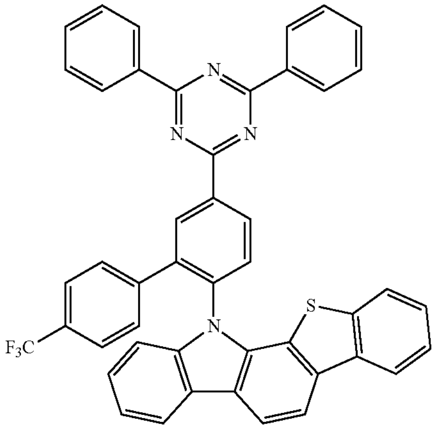

-continued
1-56
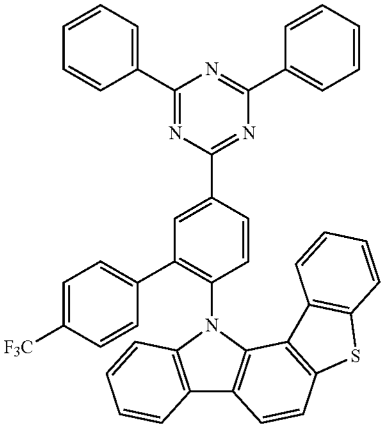
1-57
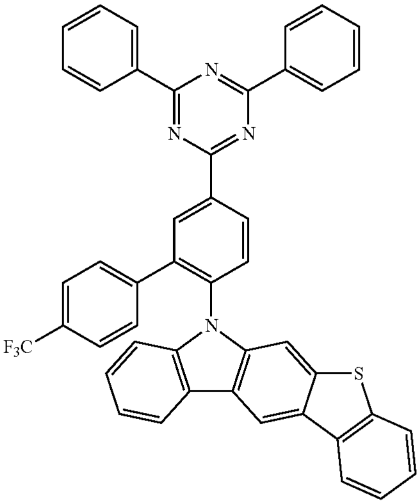
1-58
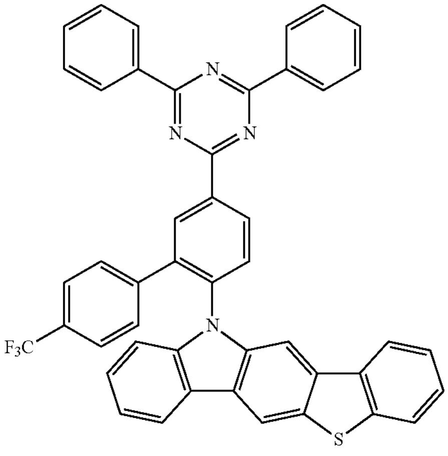
-continued
1-59
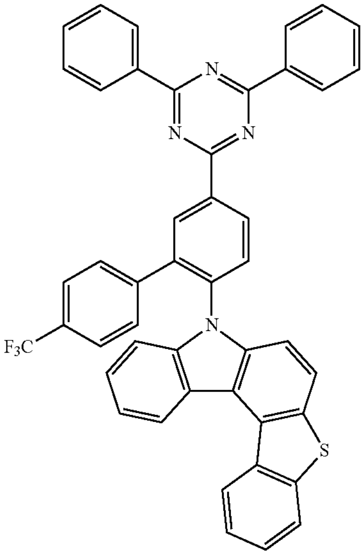
1-60
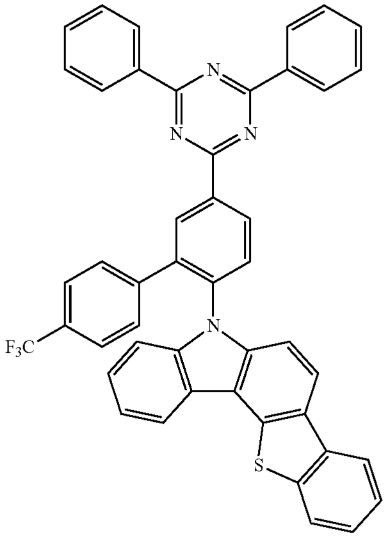
1-61
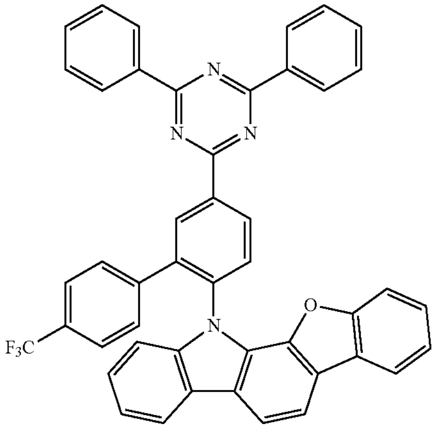

-continued
1-62
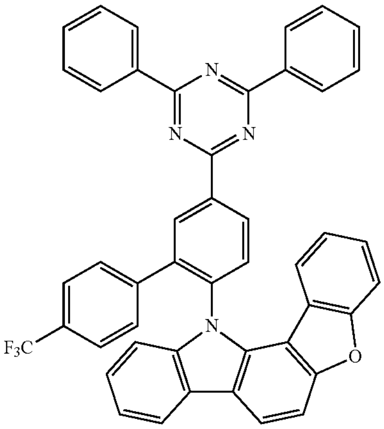
1-63
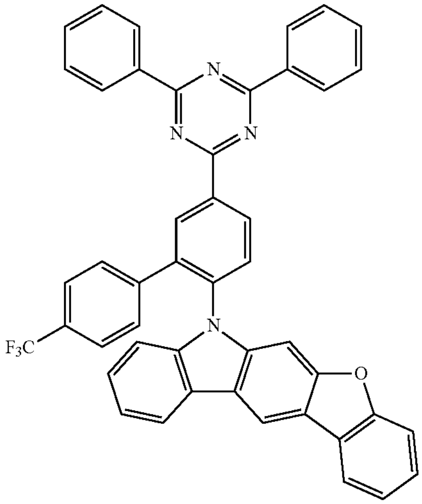
1-64
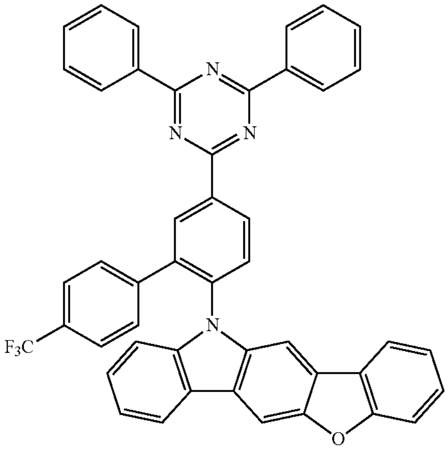
-continued
1-65
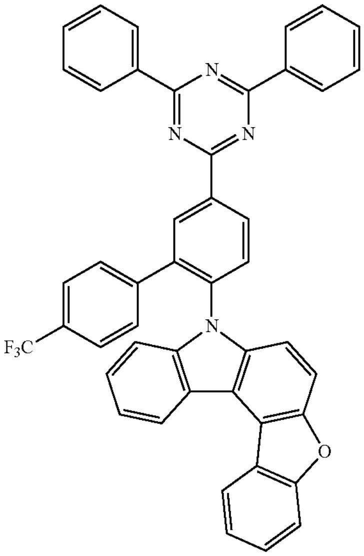
1-66
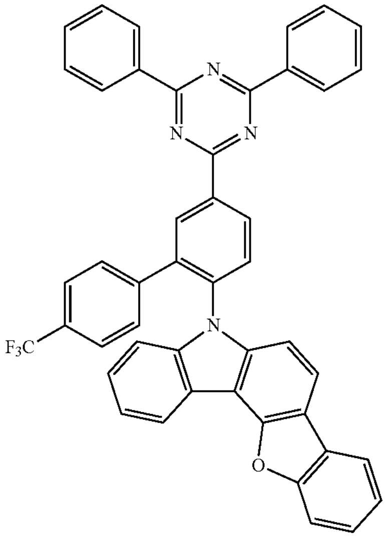
1-67
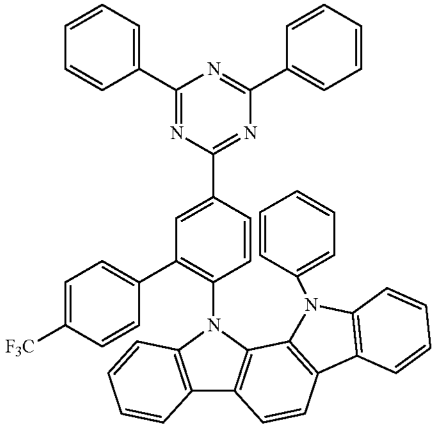

-continued
1-68
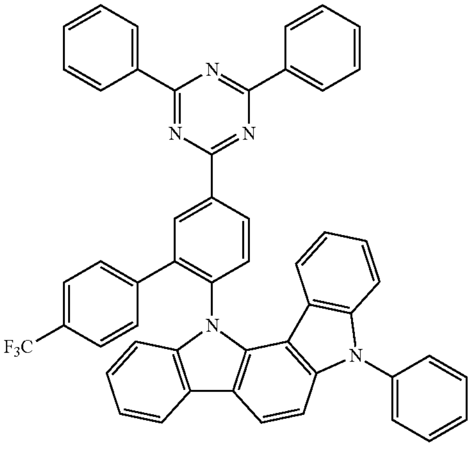
1-69
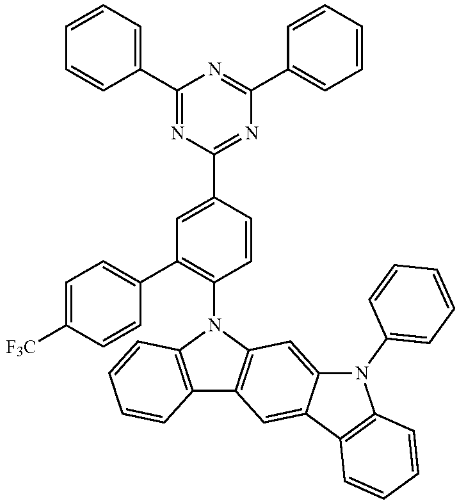
1-70
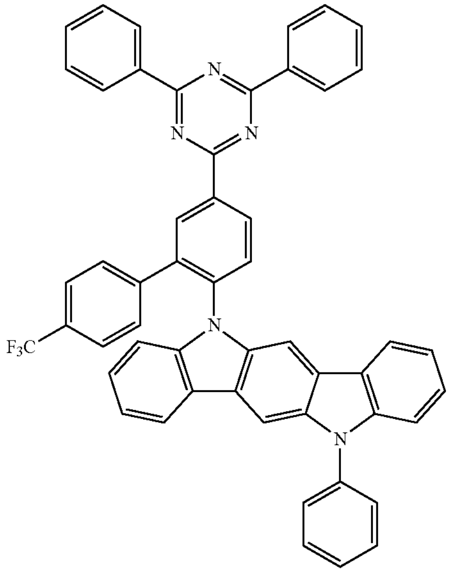
-continued
1-71
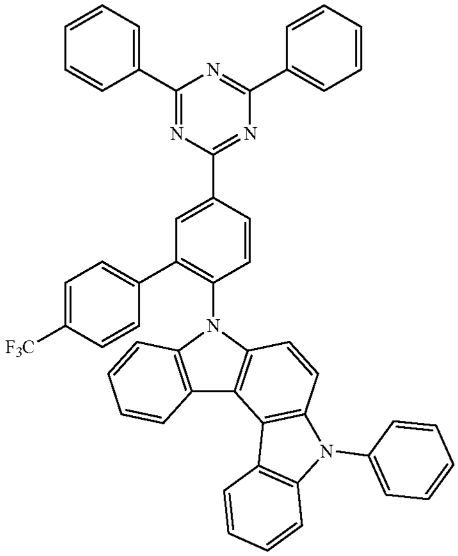
1-72
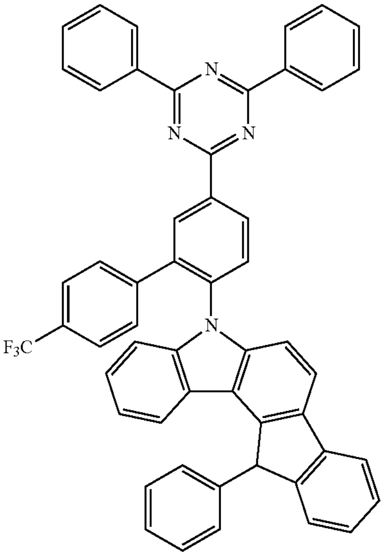
1-73
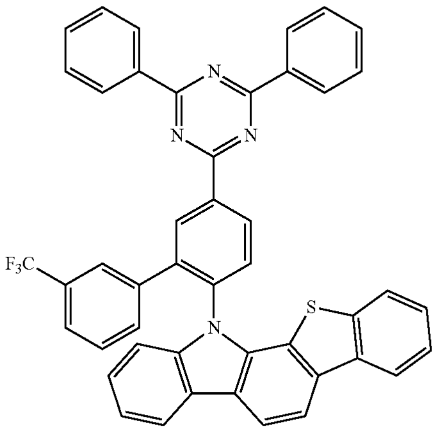

-continued
1-74
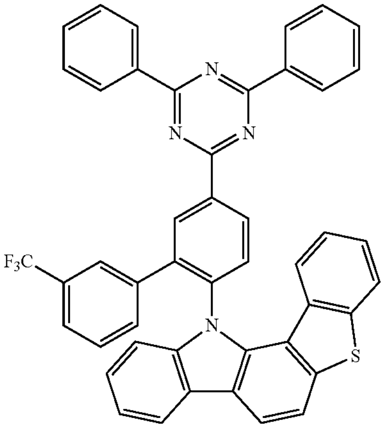
1-75
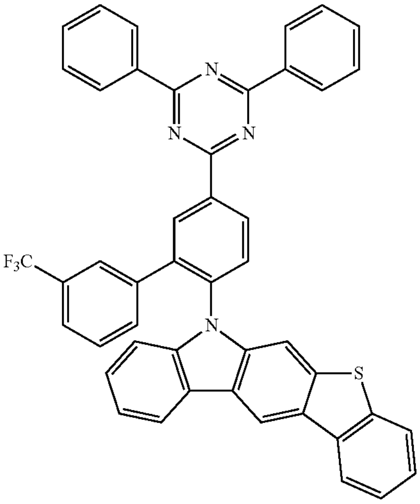
1-76
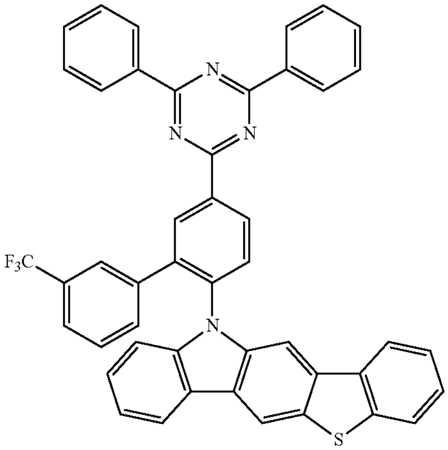
-continued
1-77
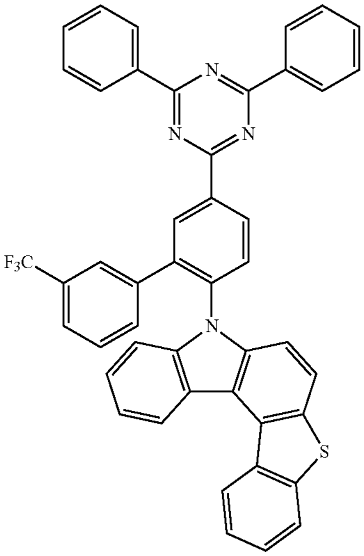
1-78
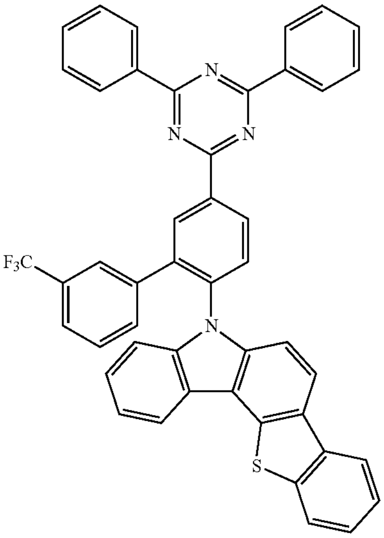
1-79
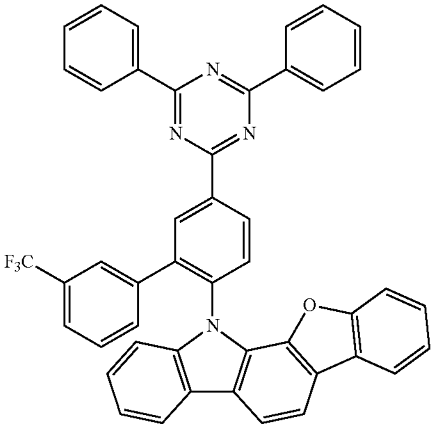

-continued
1-80
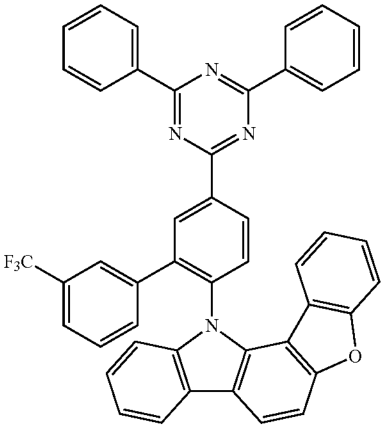
1-81
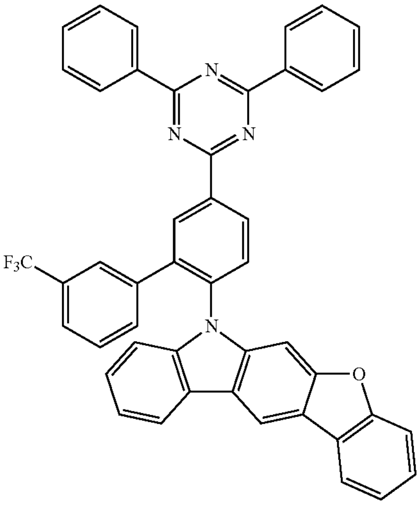
1-82
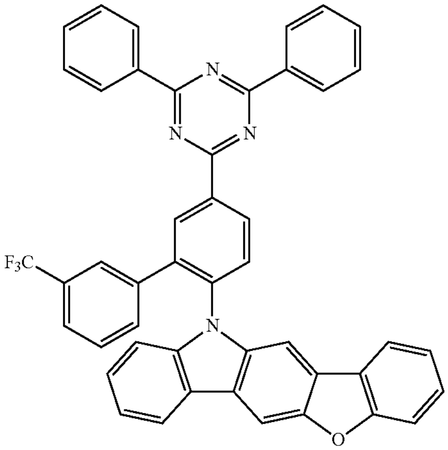
-continued
1-83
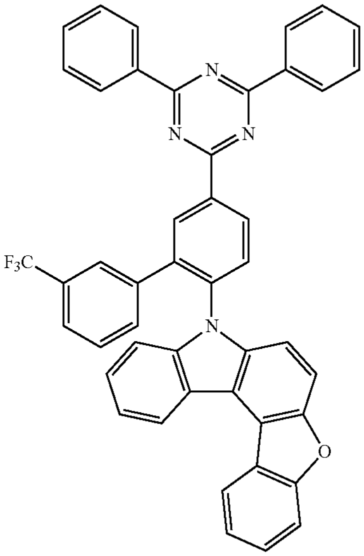
1-84
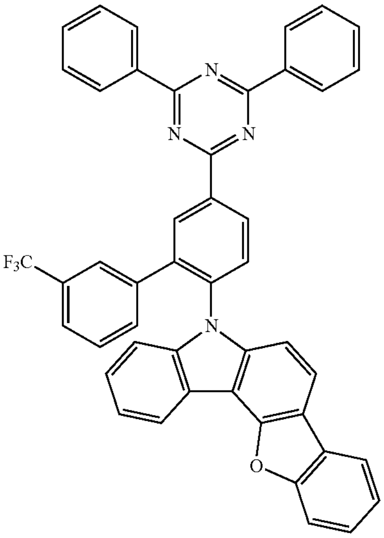
1-85
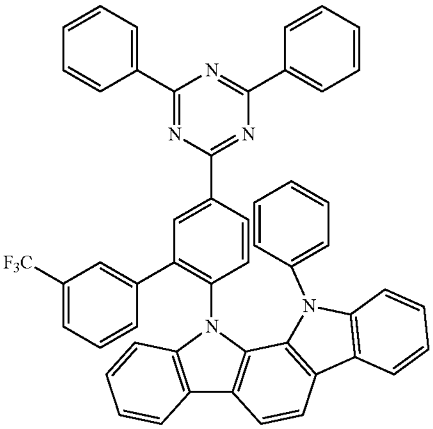

-continued
1-86
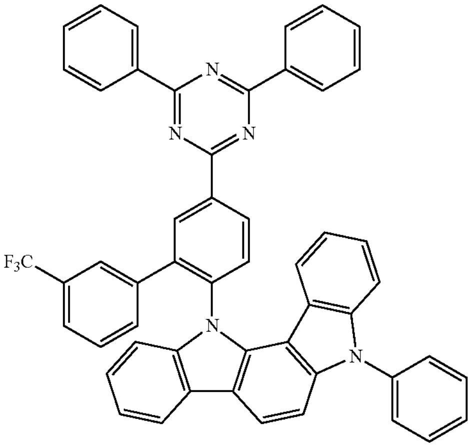
1-87
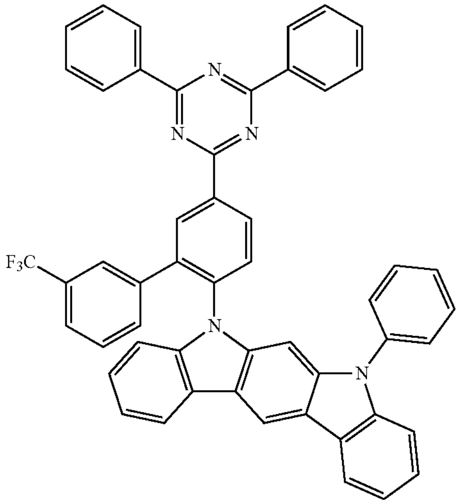
1-88
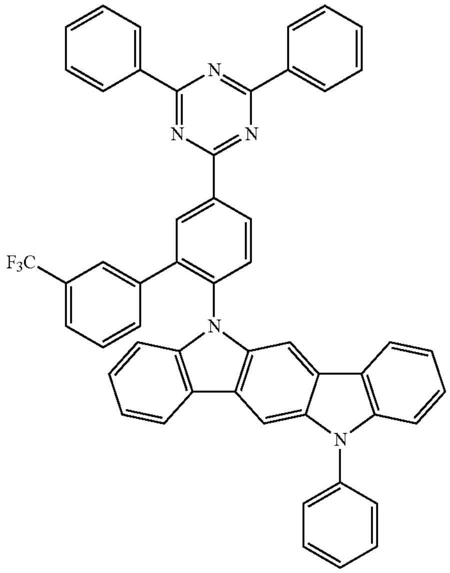
-continued
1-89
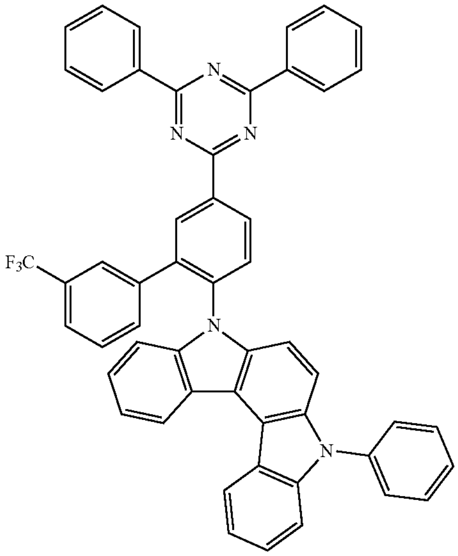
1-90
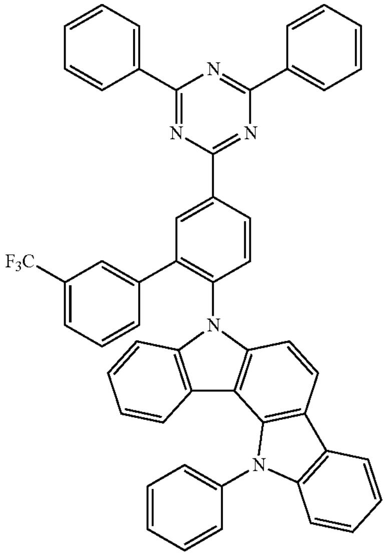
1-91
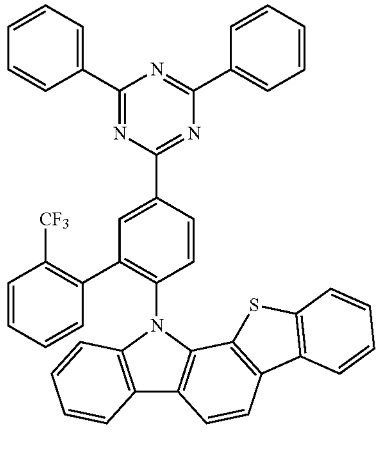

-continued
1-92
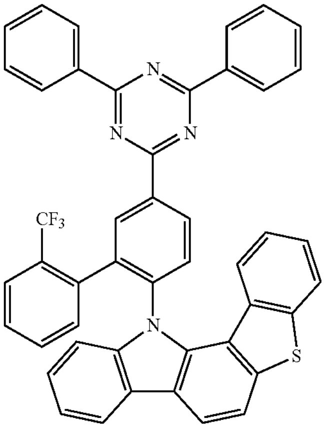
1-93
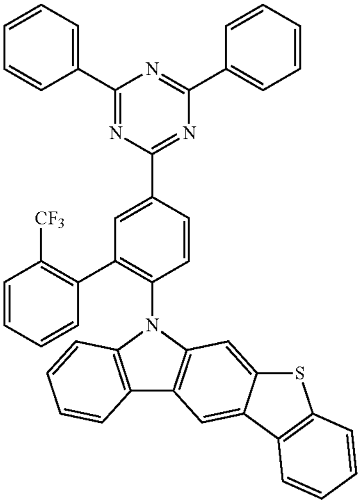
1-94
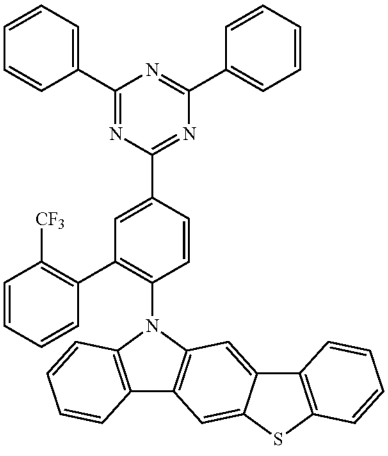
-continued
1-95
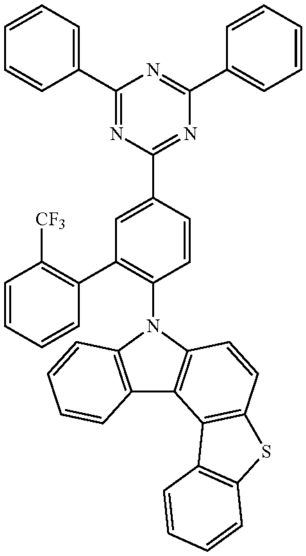
1-96
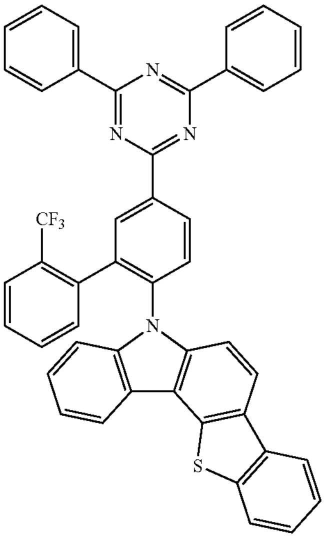
1-97
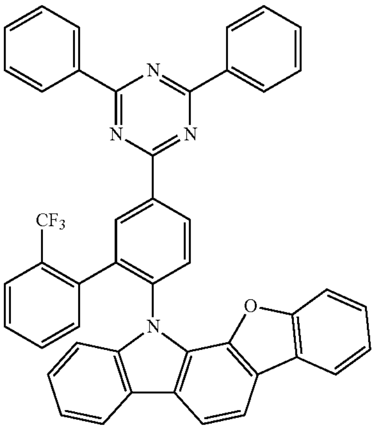

-continued
1-98
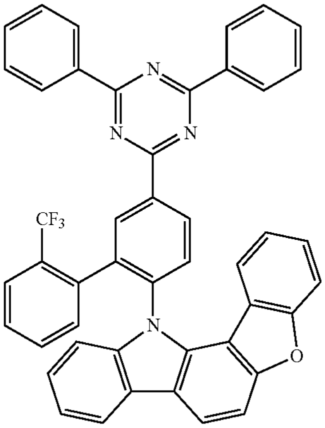
1-99
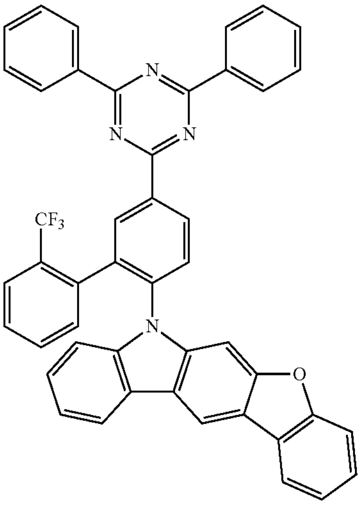
1-100
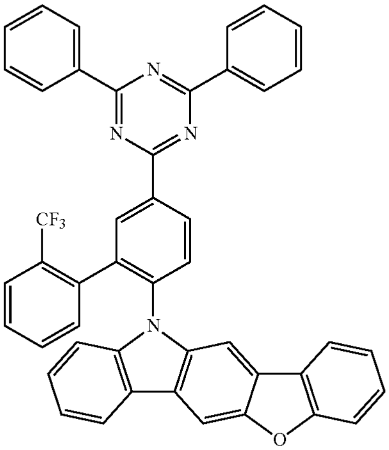
-continued
1-101
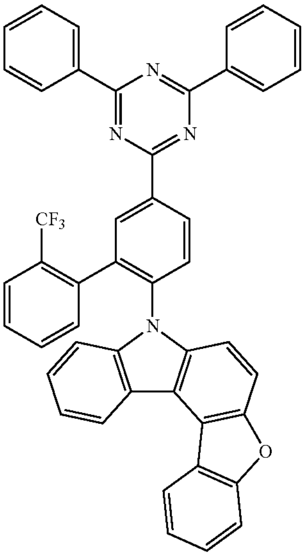
1-102
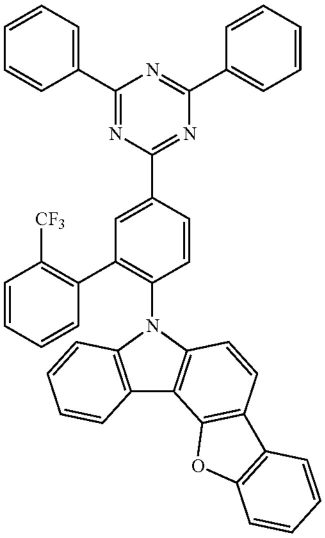
1-103
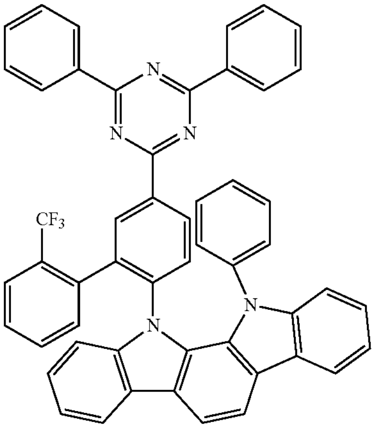

-continued
1-104
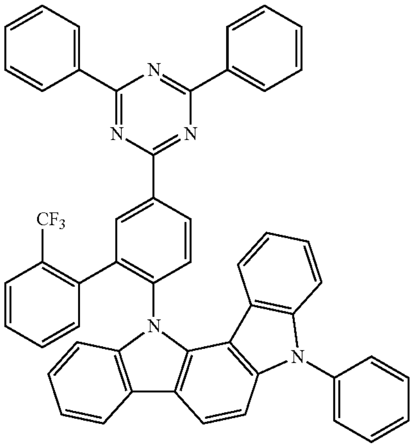
1-105
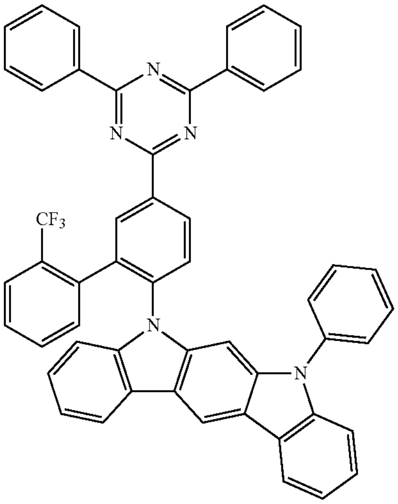
1-106
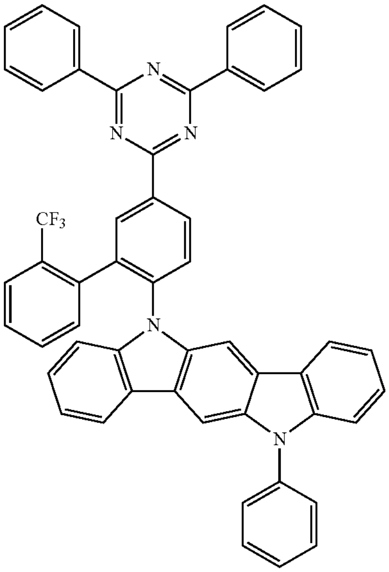
-continued
1-107
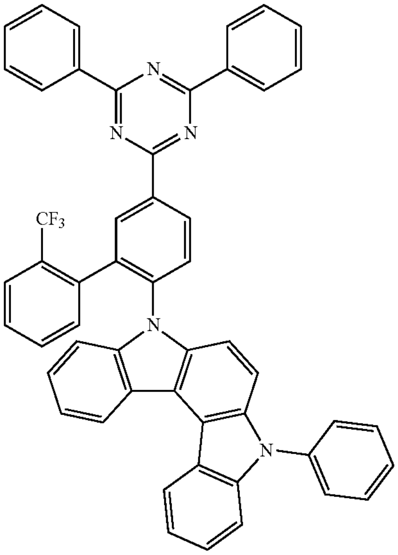
1-108
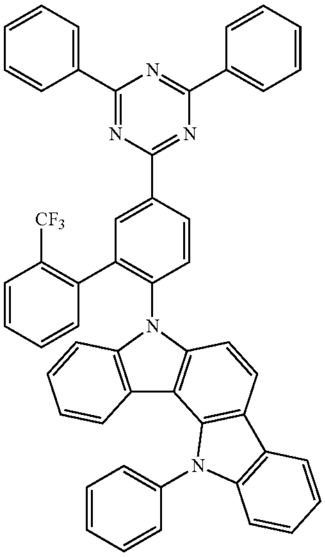
1-109
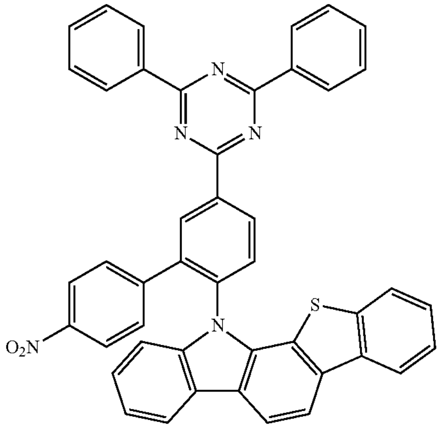

-continued
1-110
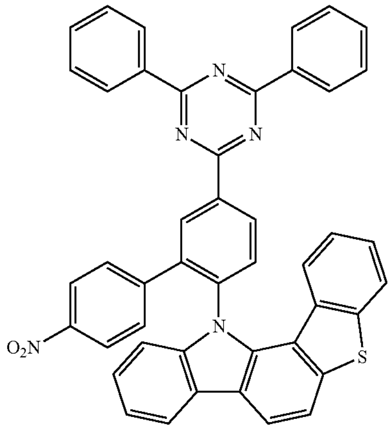
1-111
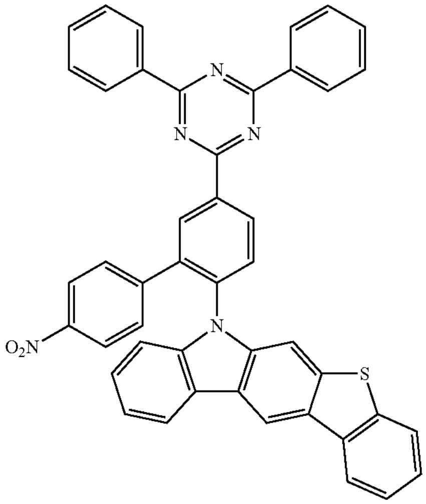
1-112
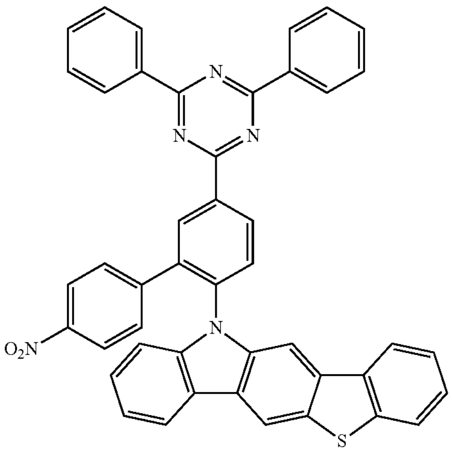
-continued
1-113
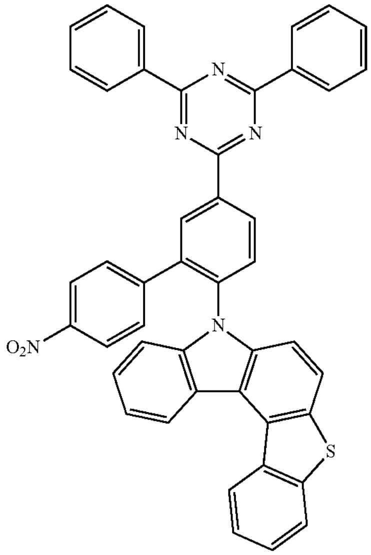
1-114
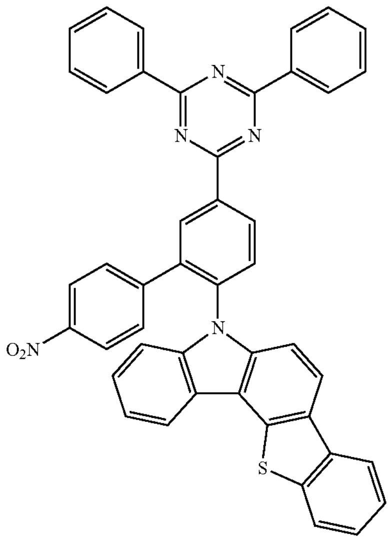
1-115
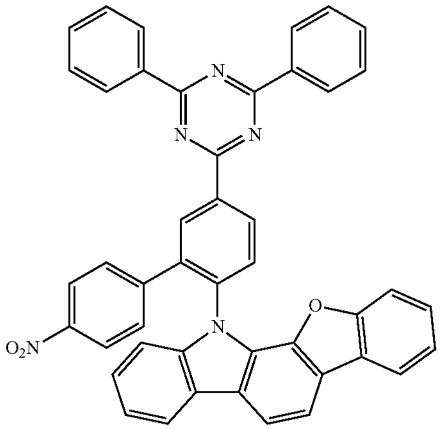

-continued
1-116
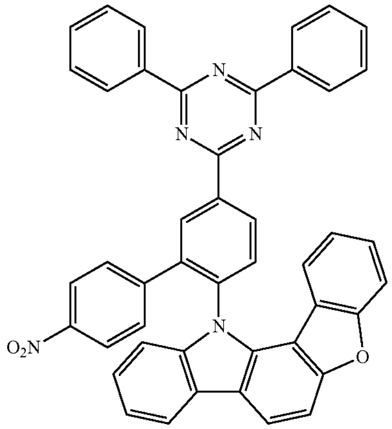
1-117
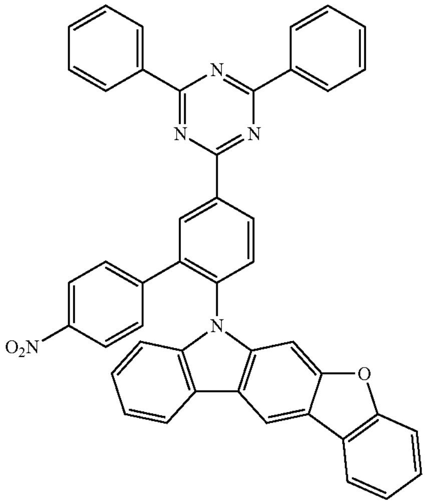
1-118
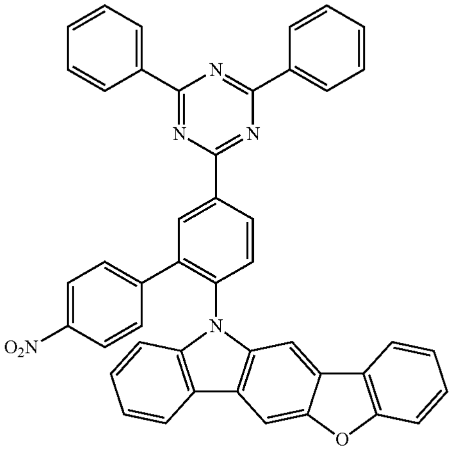
-continued
1-119
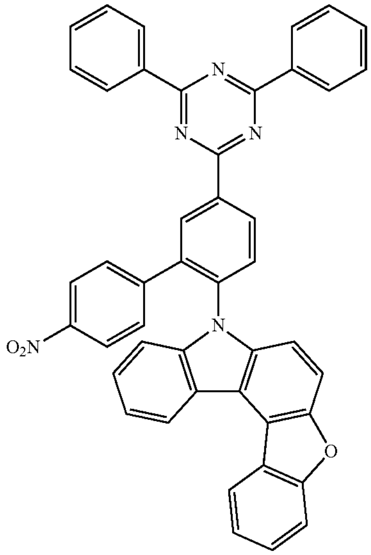
1-120
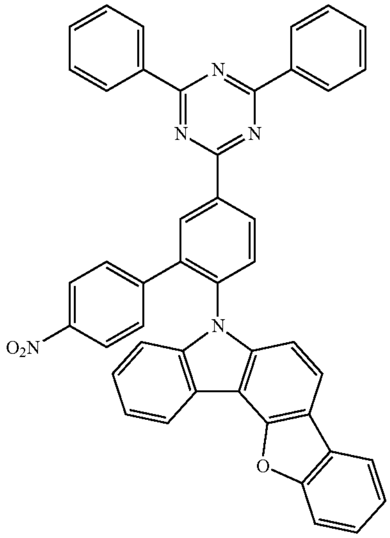
1-121
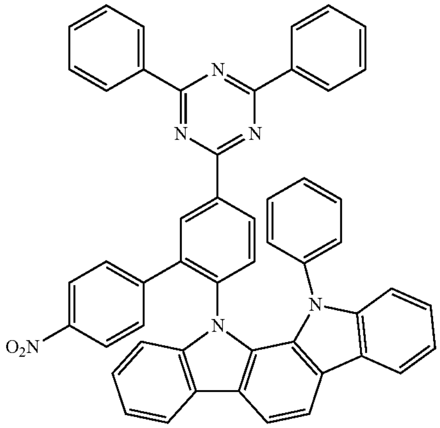

-continued
1-122
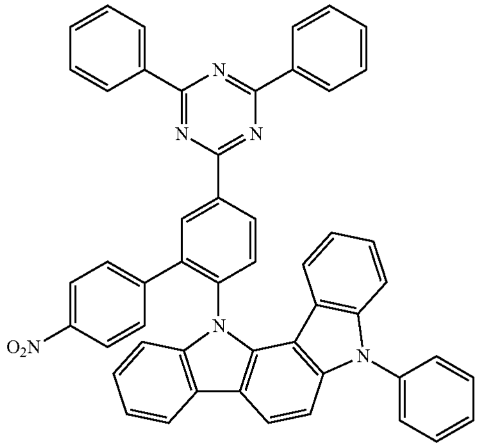
1-123
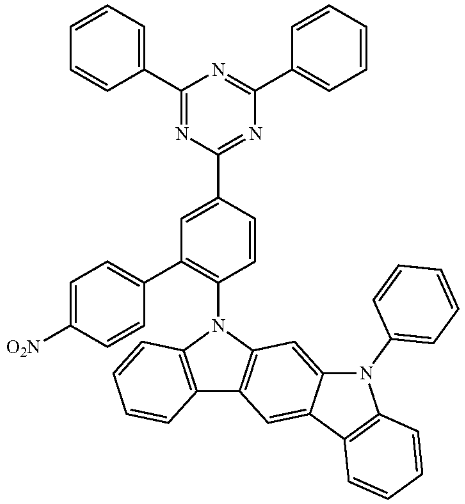
1-124
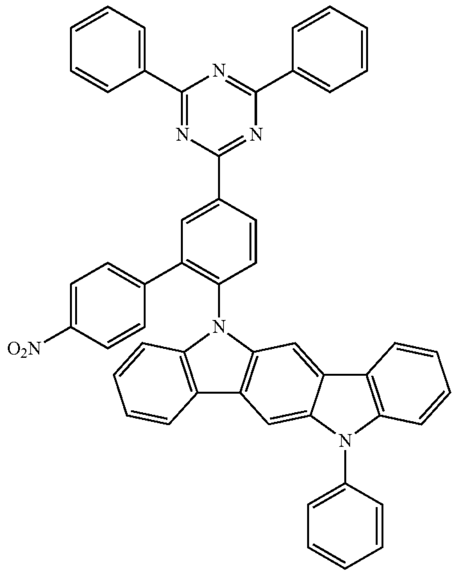
-continued
1-125
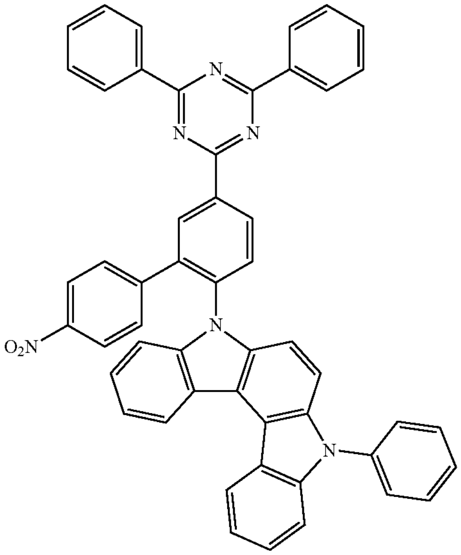
1-126
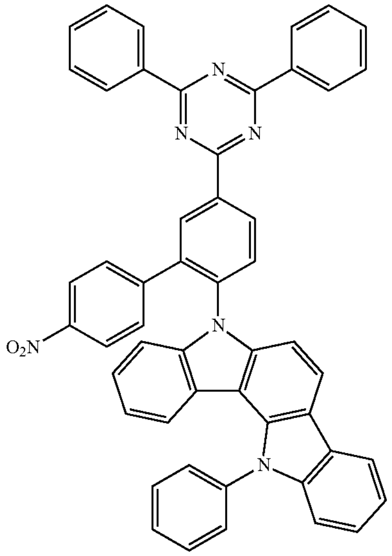
1-127
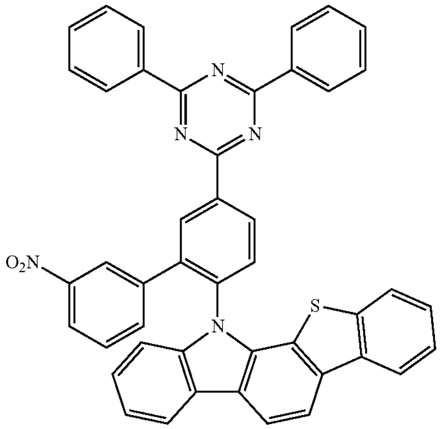

-continued
1-128
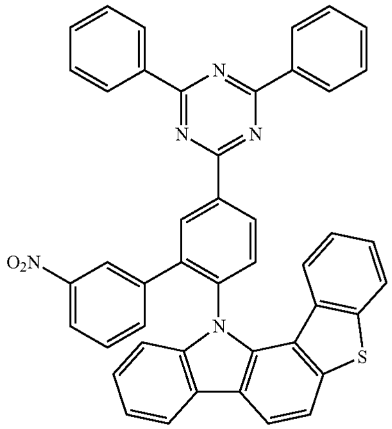
1-129
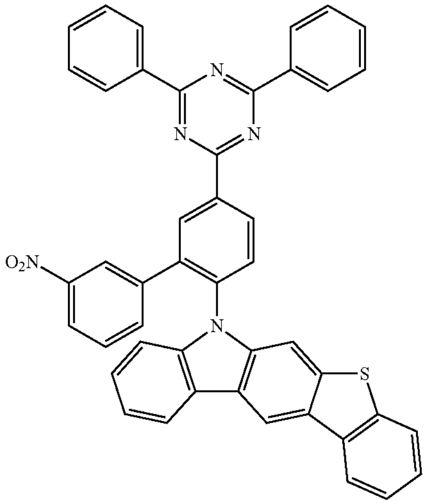
1-130
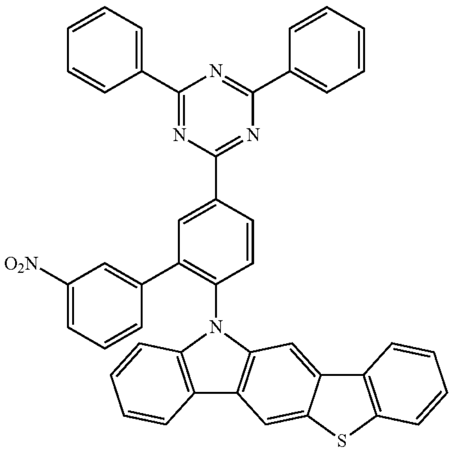
-continued
1-131
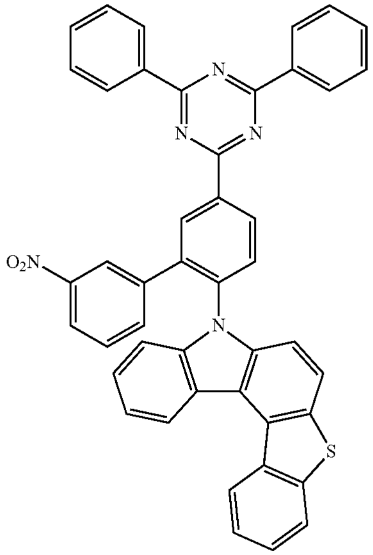
1-132
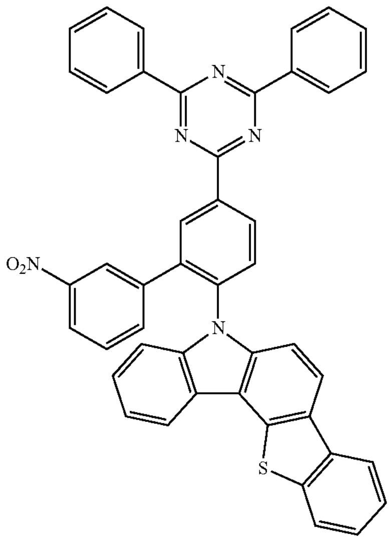
1-133
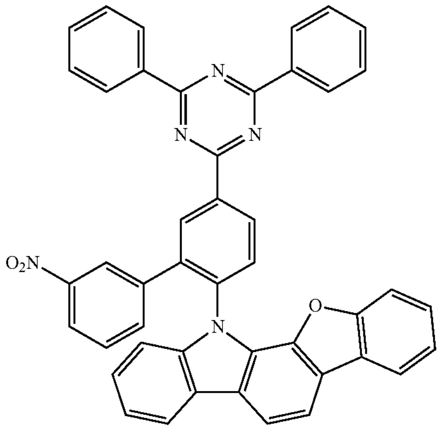

-continued
1-134
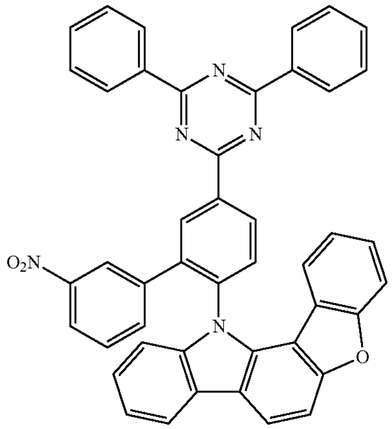
1-135
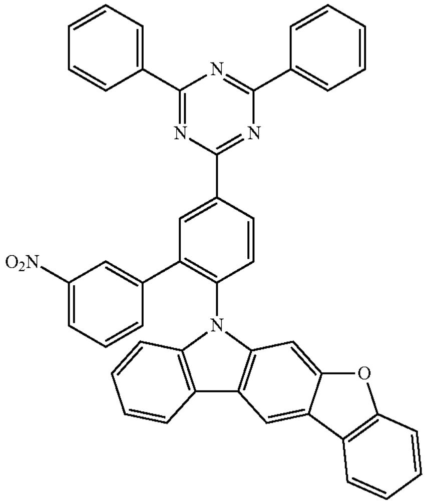
1-136
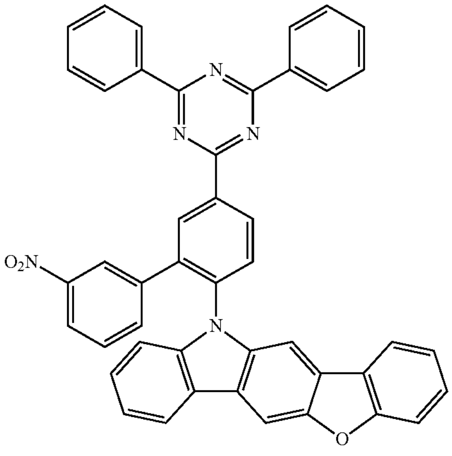
-continued
1-137
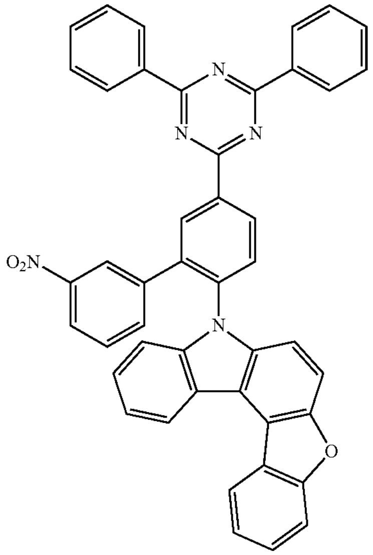
1-138
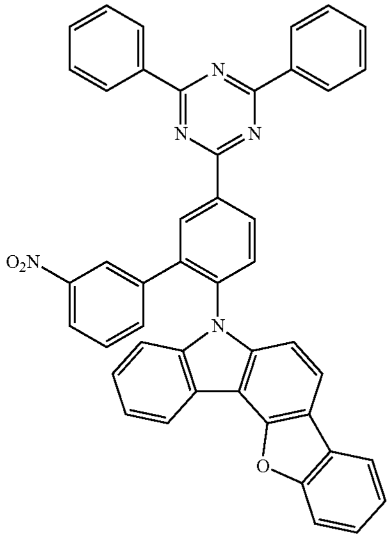
1-139
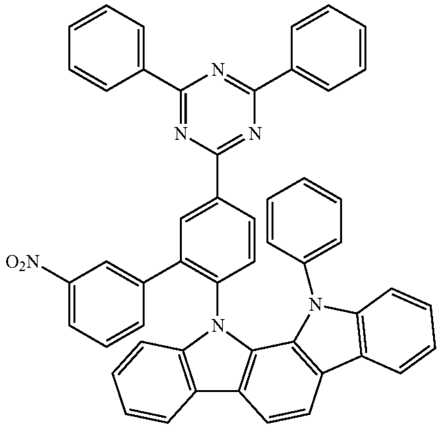

-continued
1-140
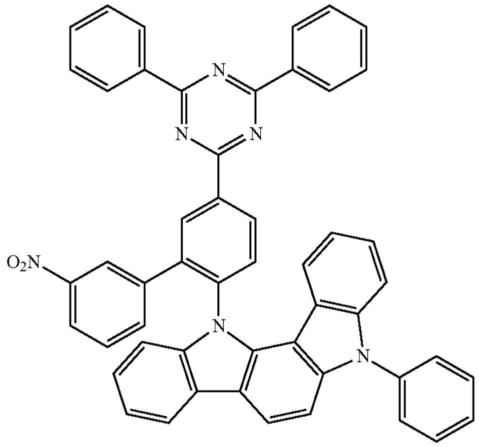
1-141
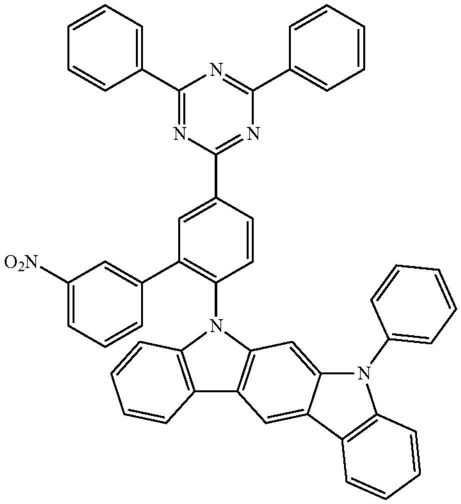
1-142
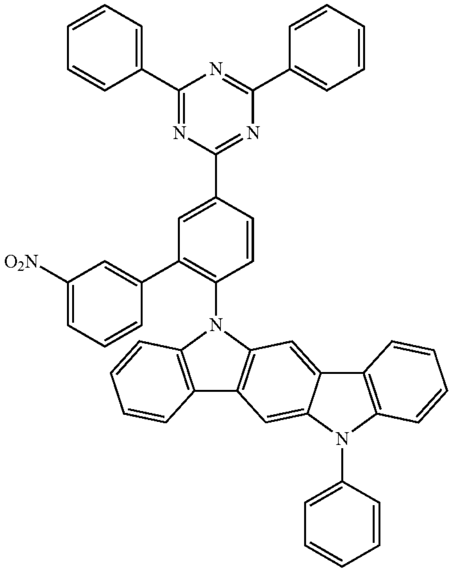
-continued
1-143
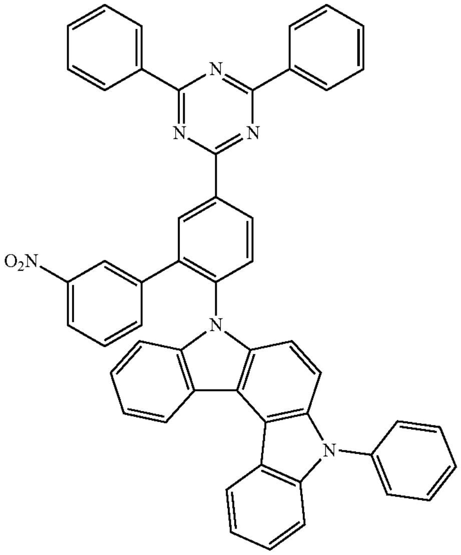
1-144
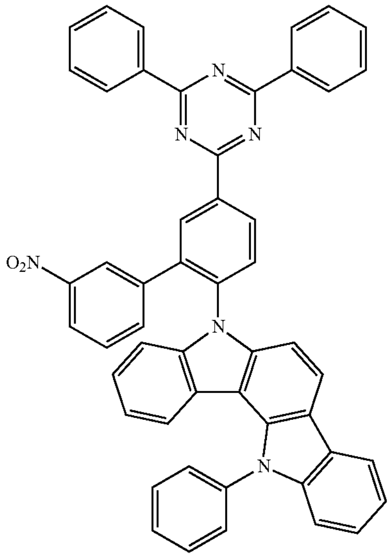
1-145
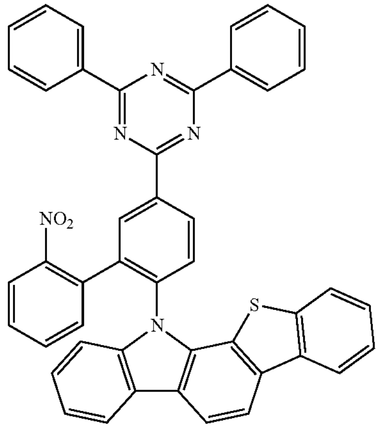

-continued
1-146
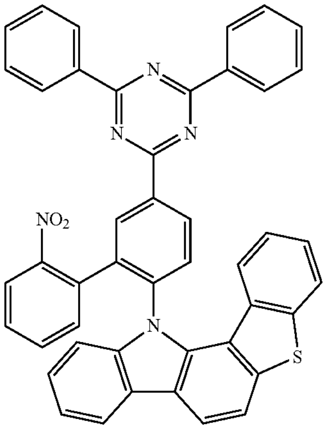
1-147
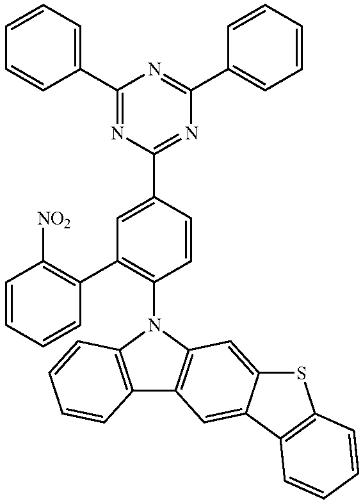
1-148
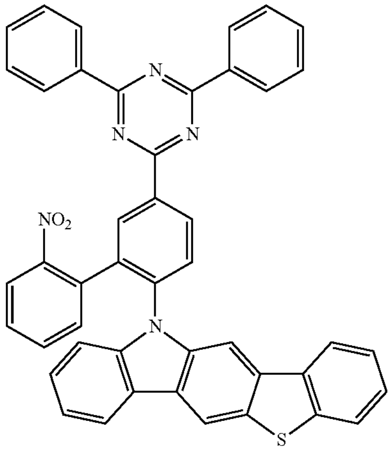
-continued
1-149
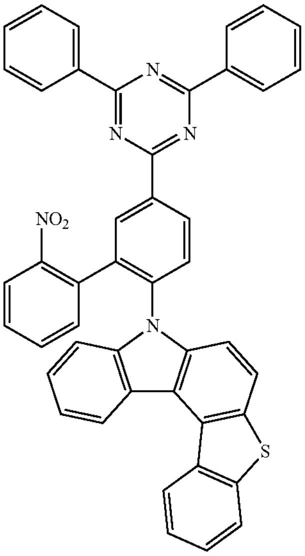
1-150
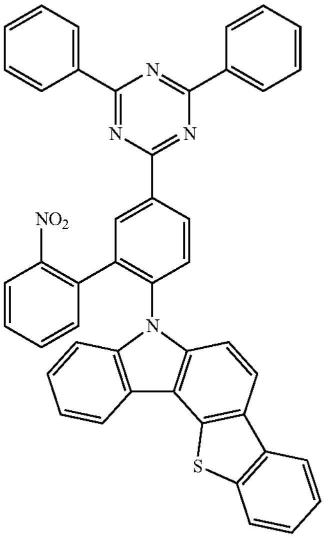
1-151
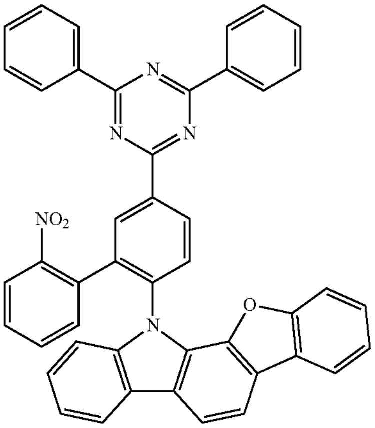

-continued
1-152
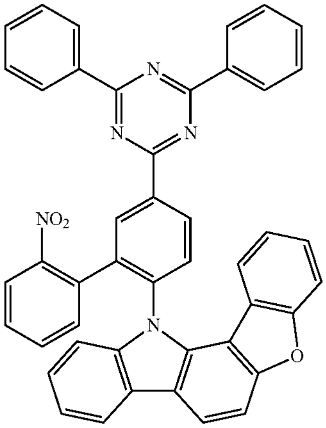
1-153
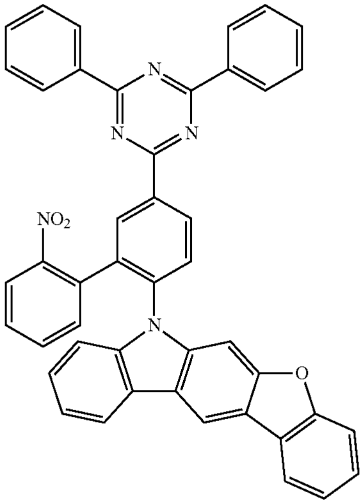
1-154
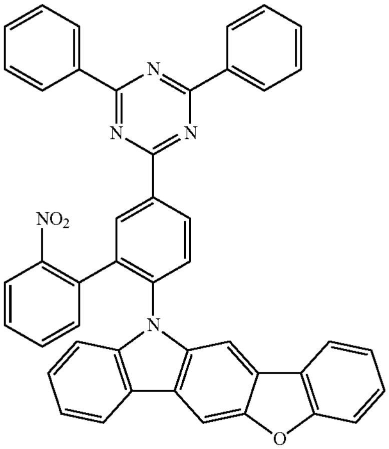
-continued
1-155
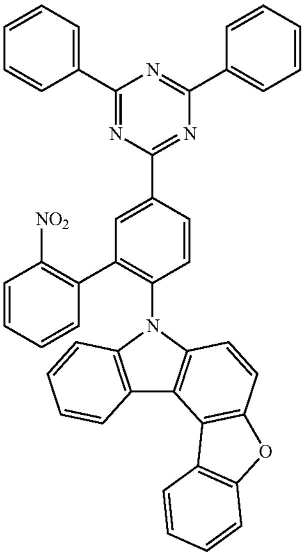
1-156
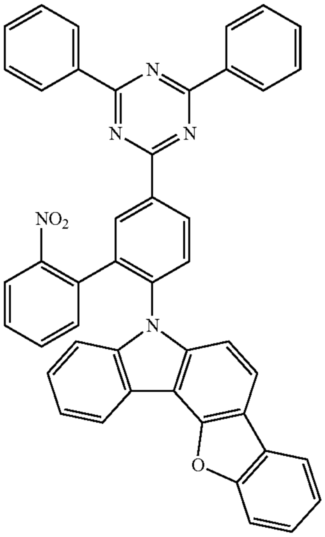
1-157
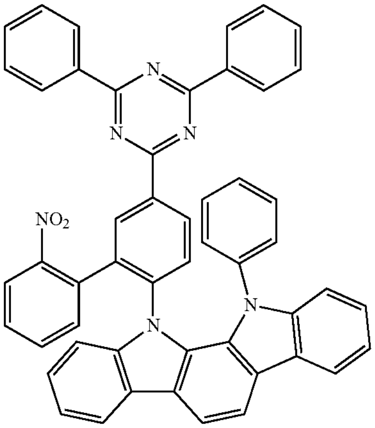

-continued
1-158
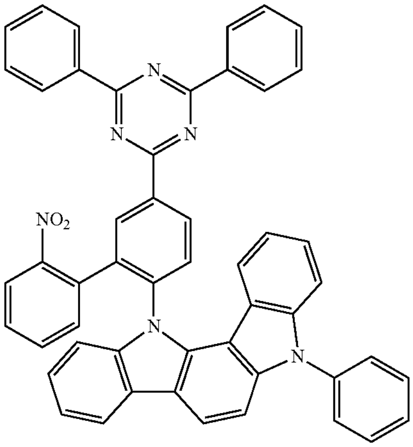
1-159
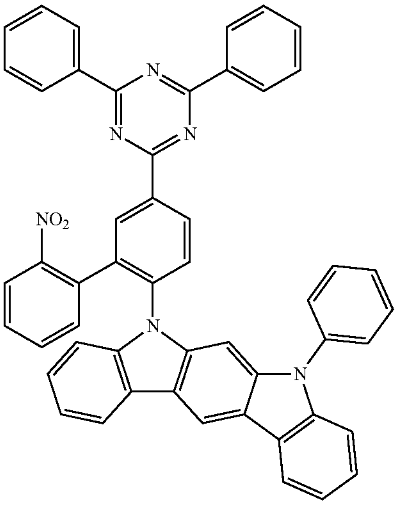
1-160
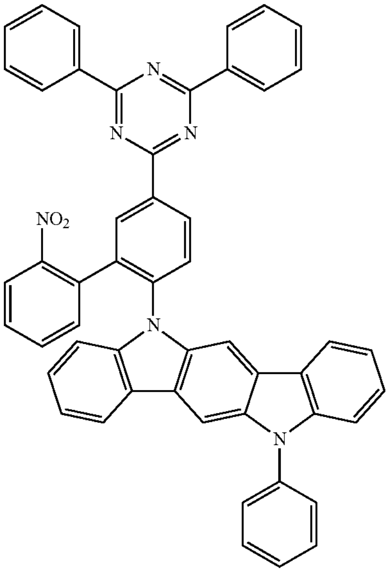
-continued
1-161
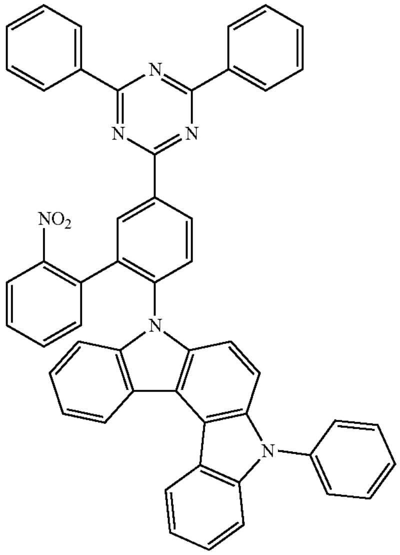
1-162
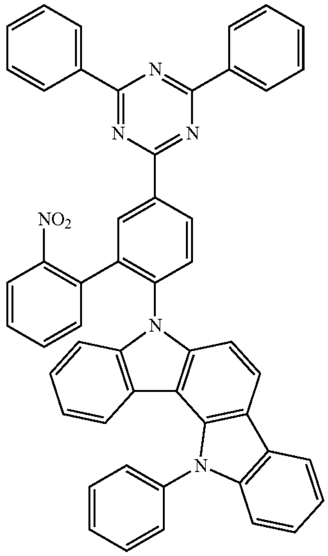
1-163
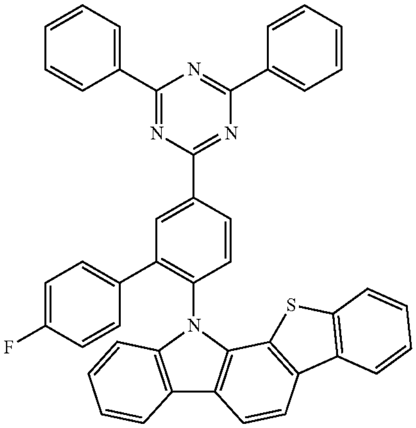

-continued
1-164
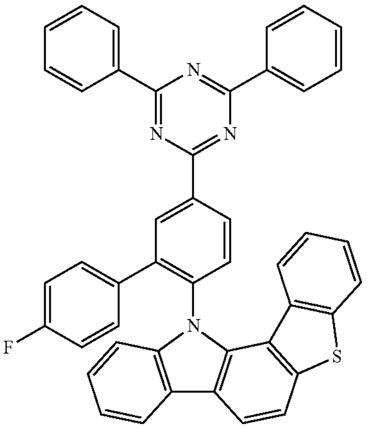
1-165
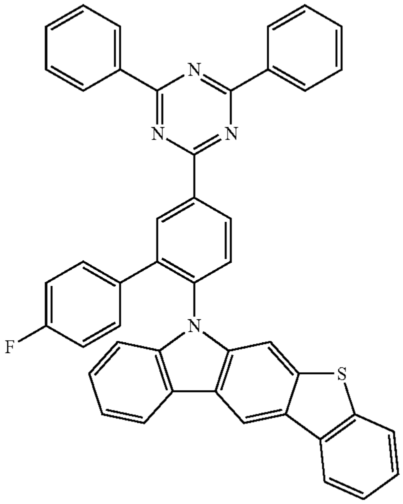
1-166
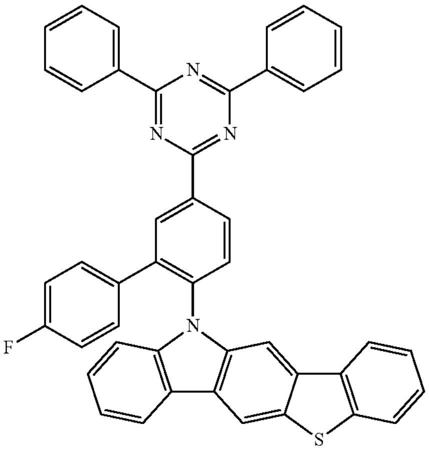
-continued
1-167
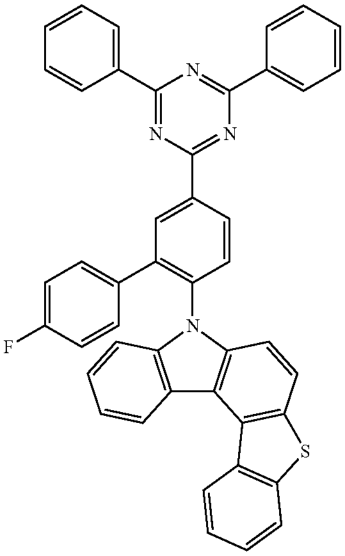
1-168
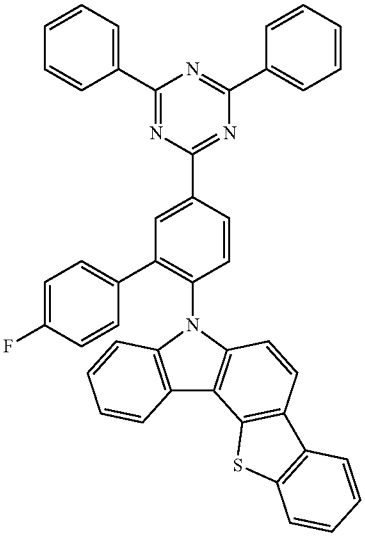
1-169
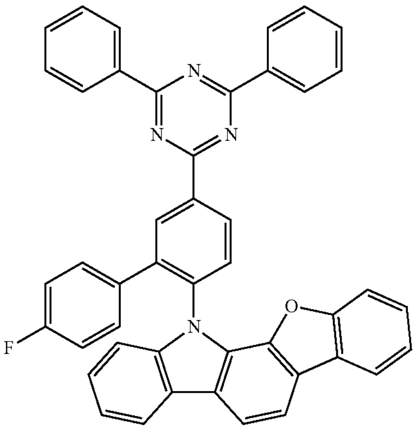

-continued
1-170
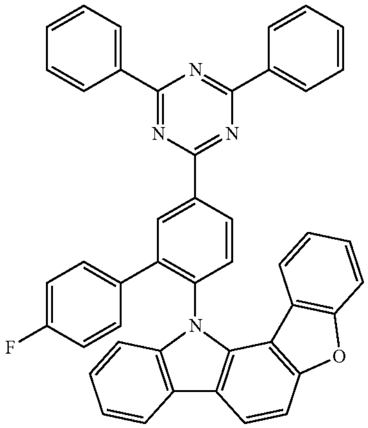
1-171
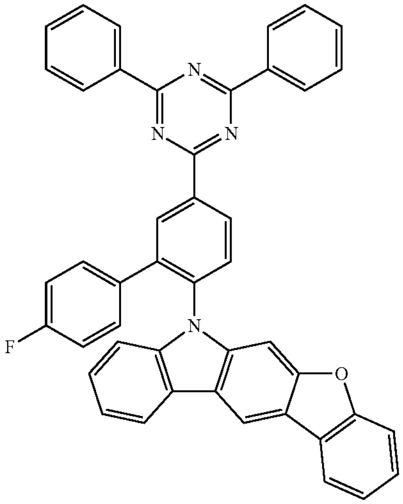
1-172
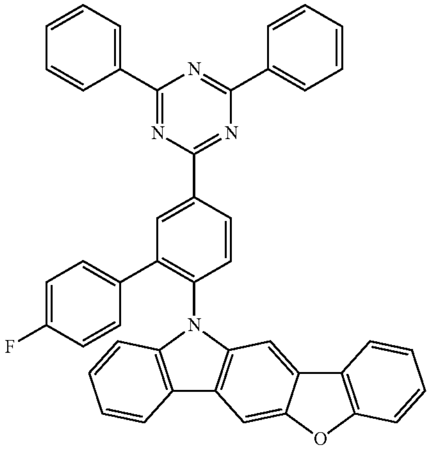
-continued
1-173
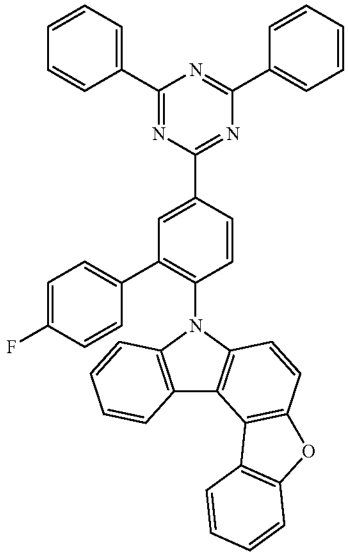
1-174
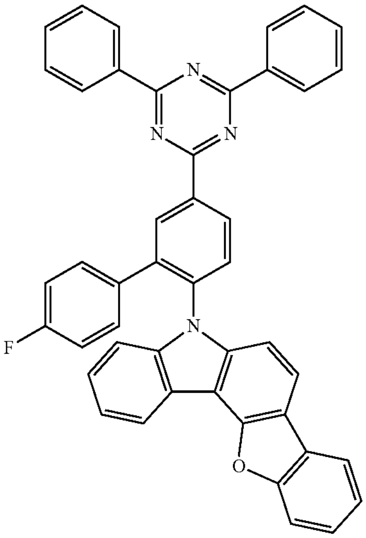
1-175
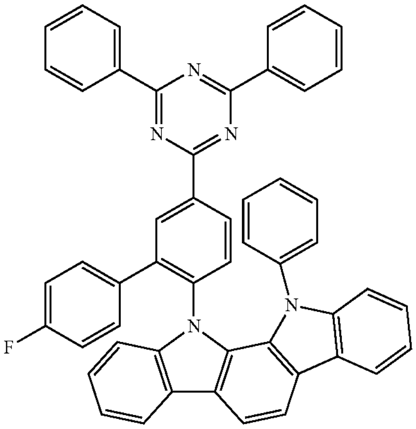

-continued
1-176
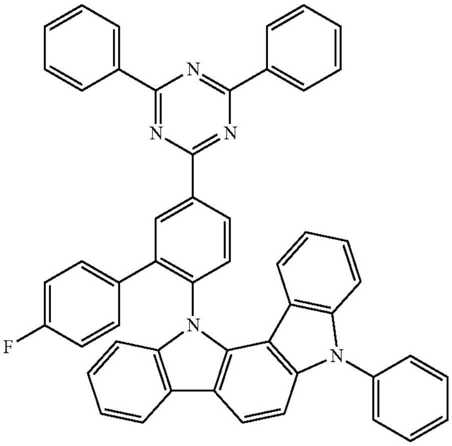
1-177
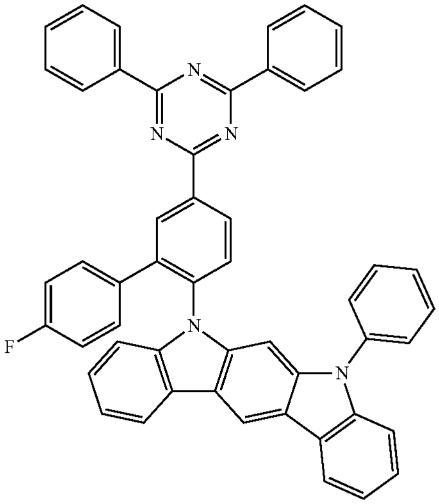
1-178
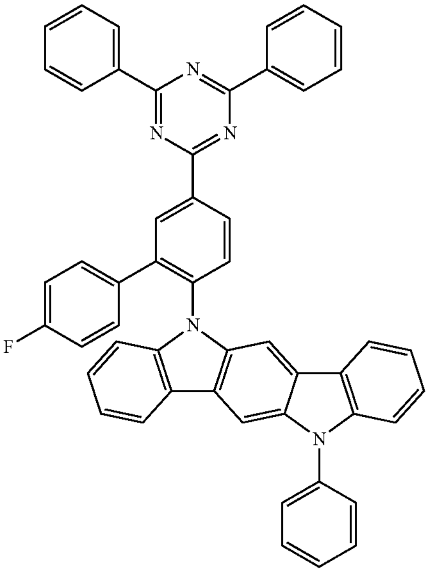
-continued
1-179
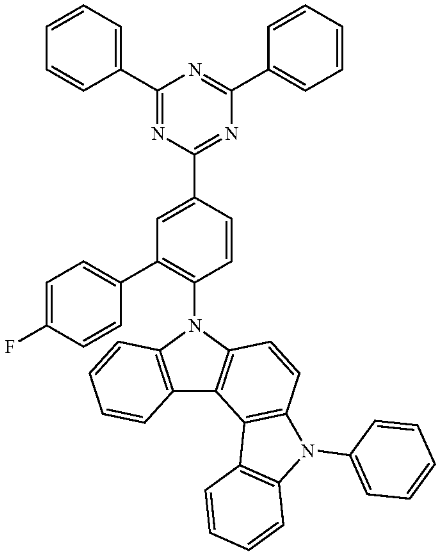
1-180
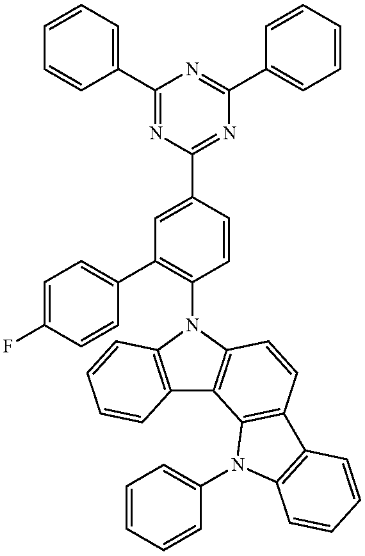
1-181
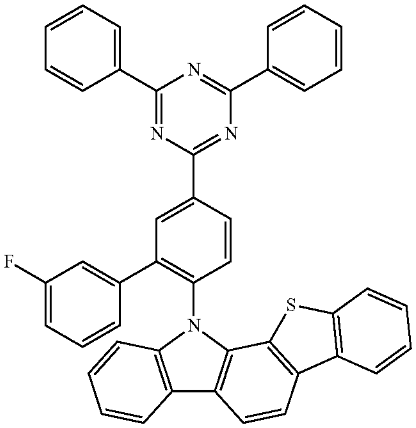

-continued
1-182
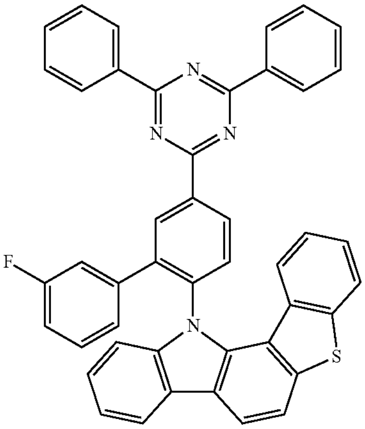
1-183
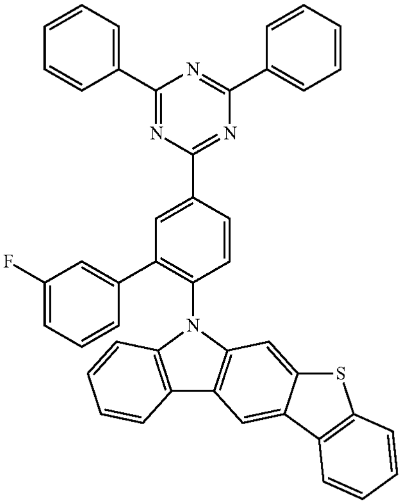
1-184
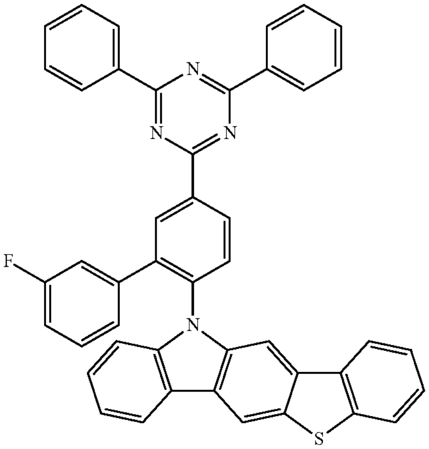
-continued
1-185
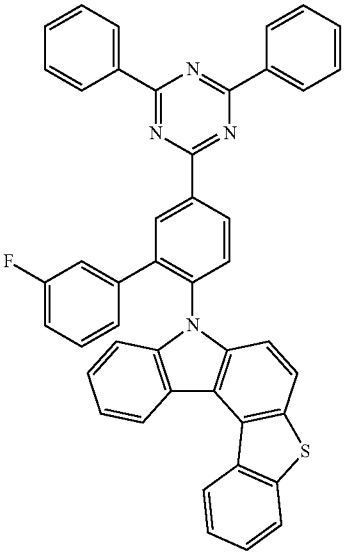
1-186
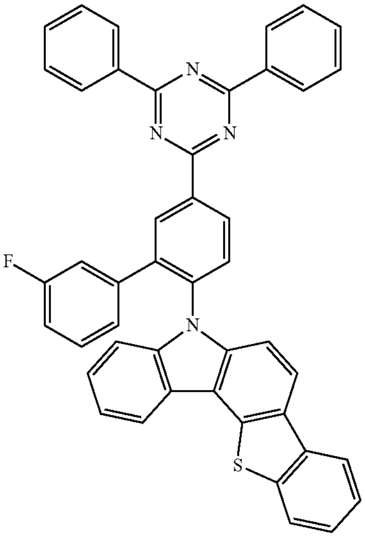
1-187
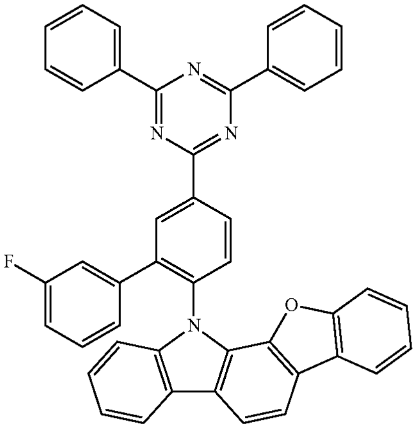

-continued
1-188
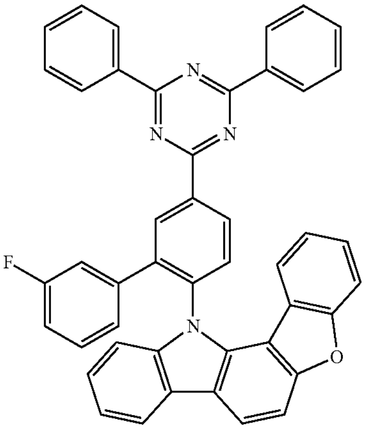
1-189
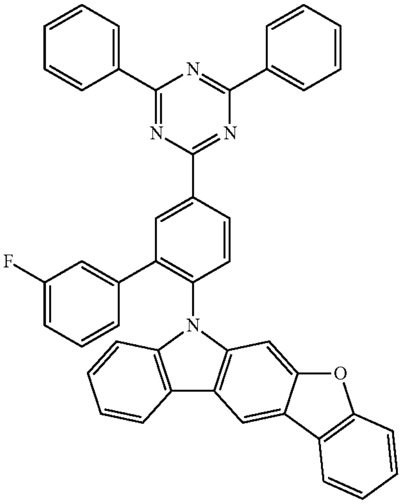
1-190
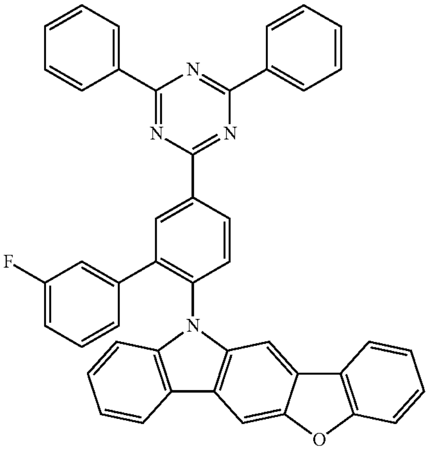
-continued
1-191
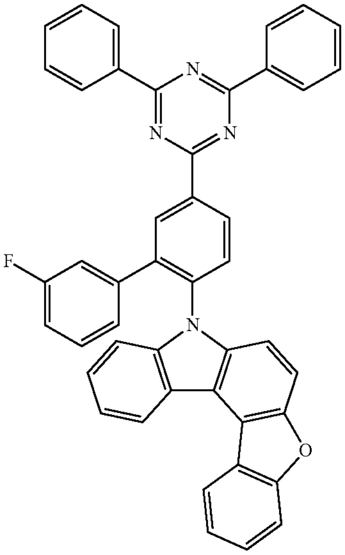
1-192
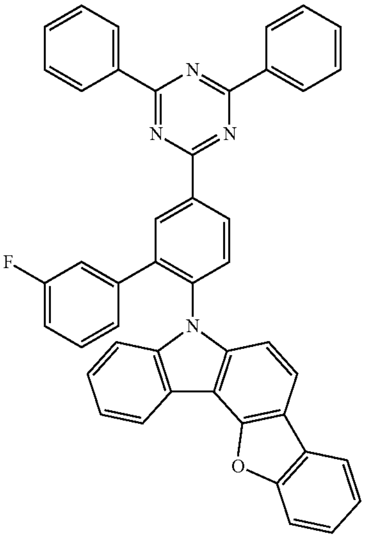
1-193
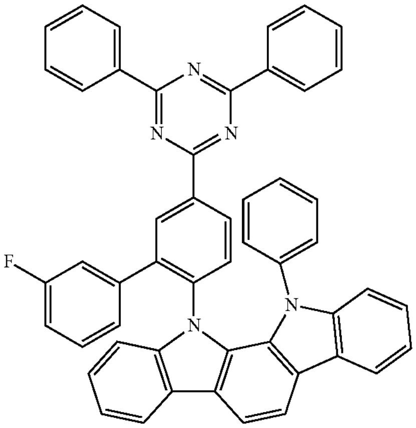

-continued
1-194
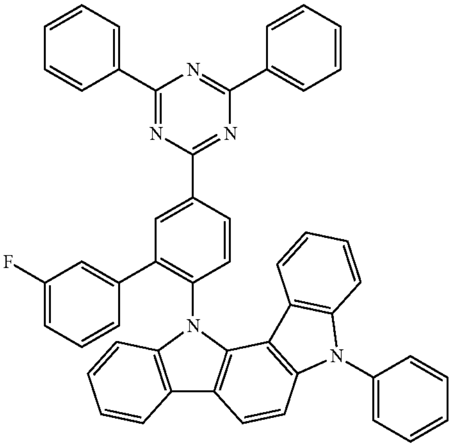
1-195
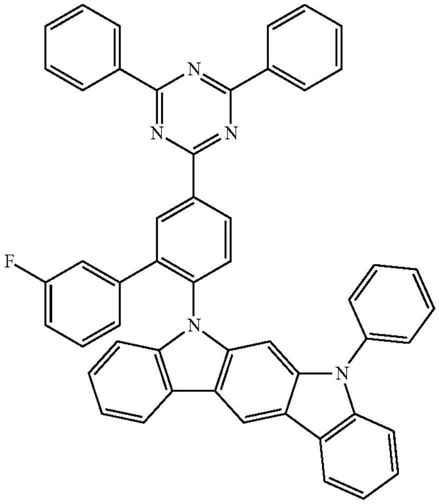
1-196
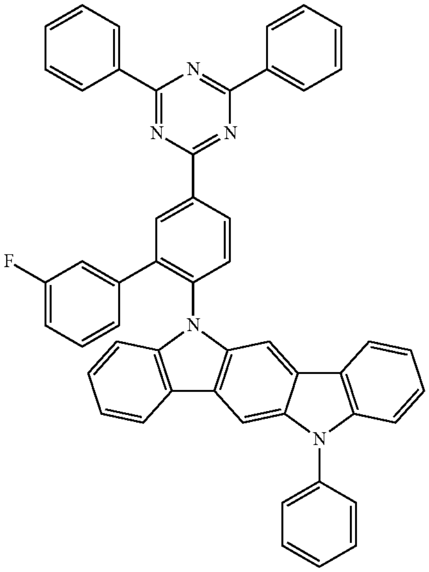
-continued
1-197
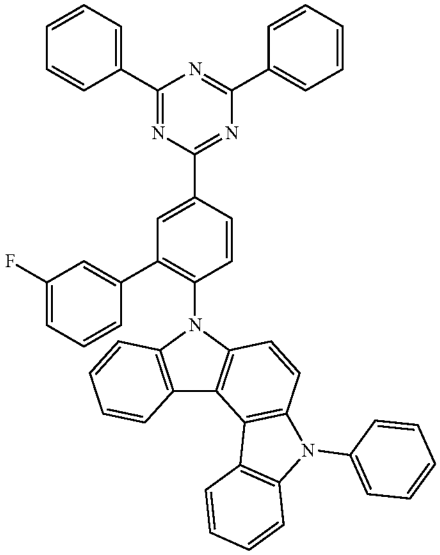
1-198
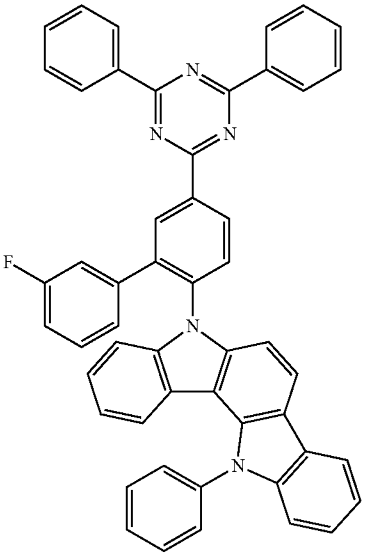
1-199
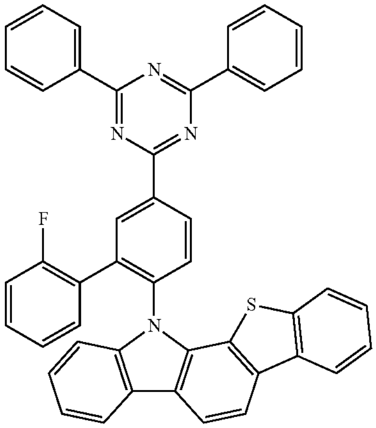

-continued
1-200
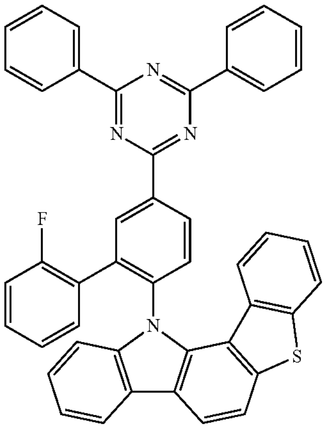
1-201
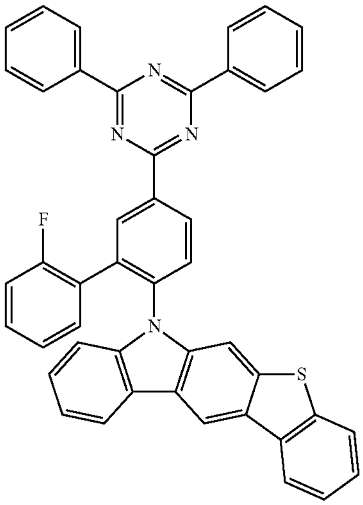
1-202
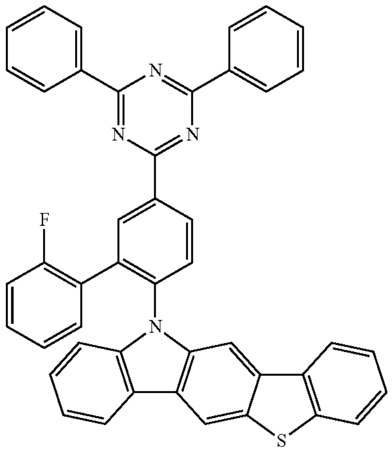
-continued
1-203
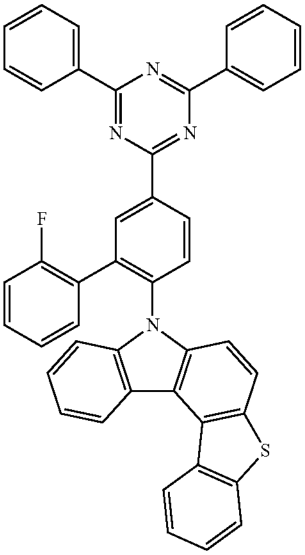
1-204
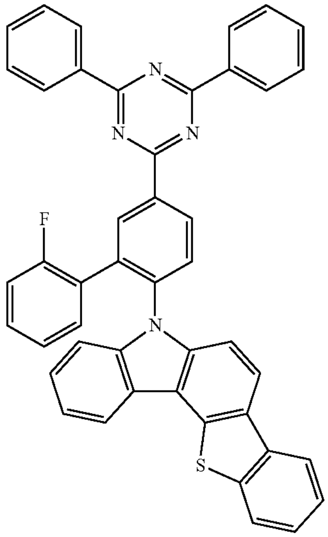
1-205
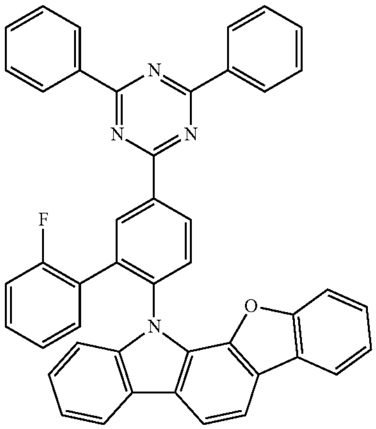

-continued
1-206
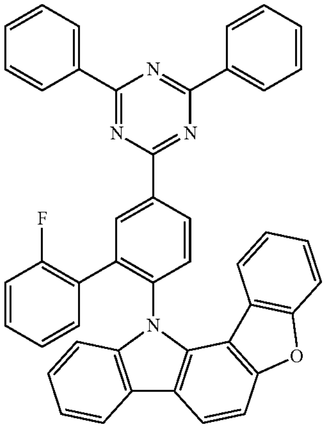
1-207
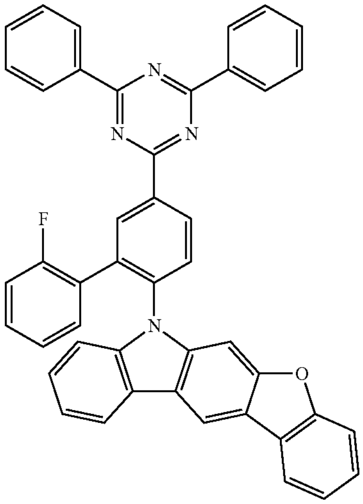
1-208
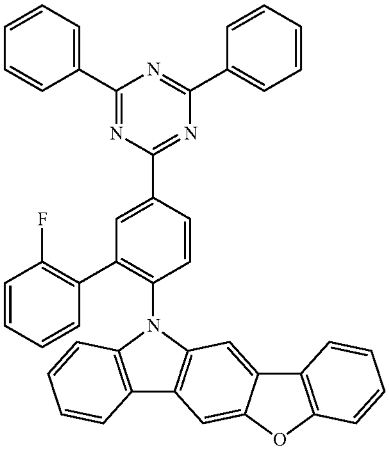
-continued
1-209
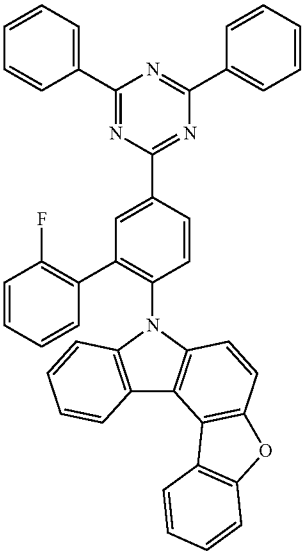
1-210
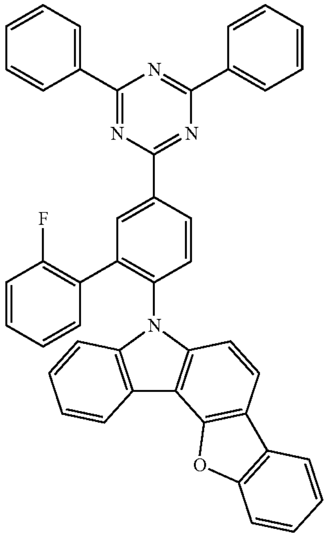
1-211
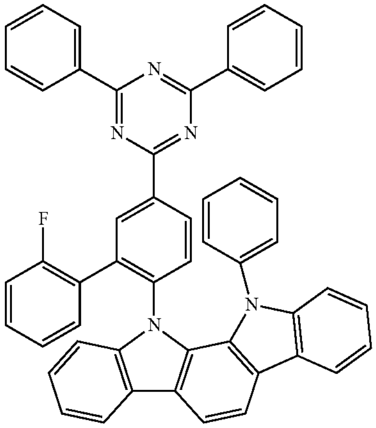

-continued
1-212
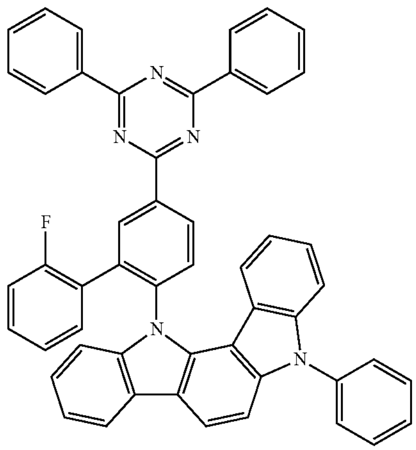
1-213
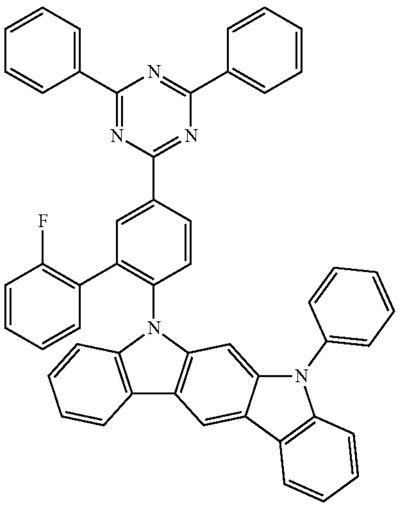
1-214
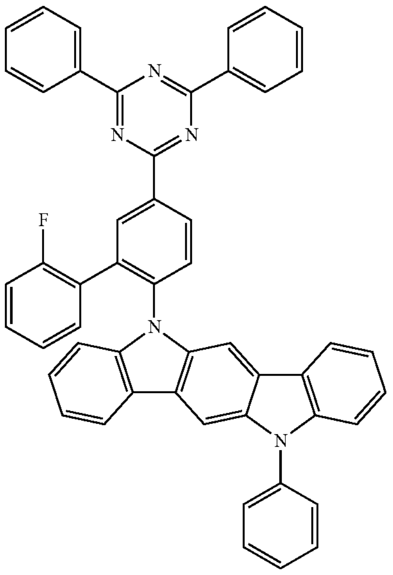
-continued
1-215
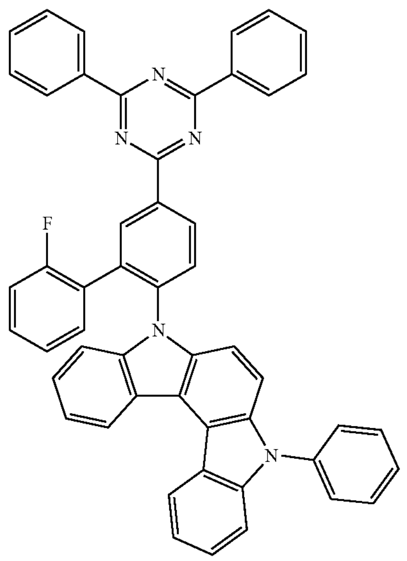
1-216
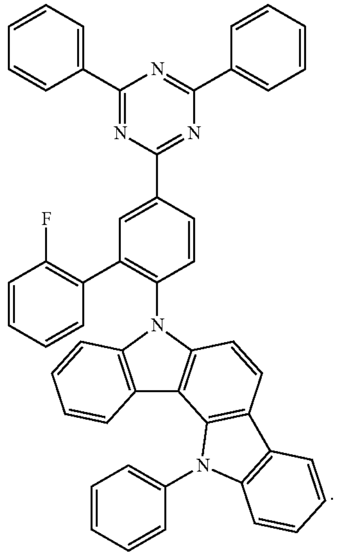
18. The organic light emitting device according to claim 14, wherein the second compound is one of compounds in Formula 2-2:

[Formula 2-2]
2-1
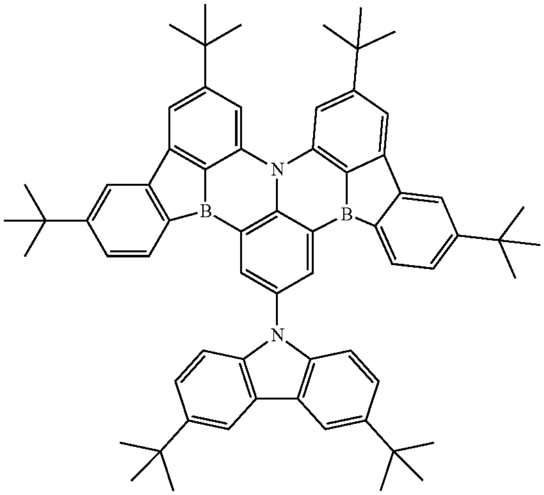
2-2
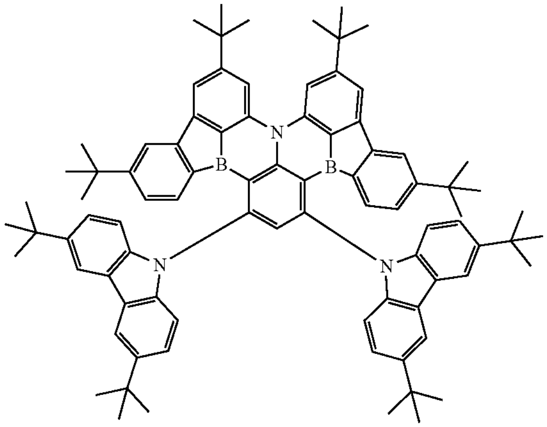
2-3
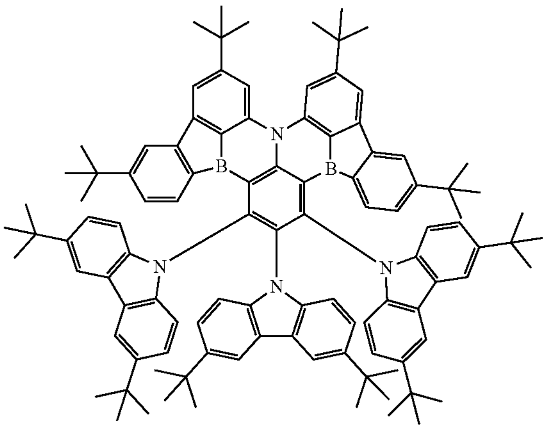
2-4
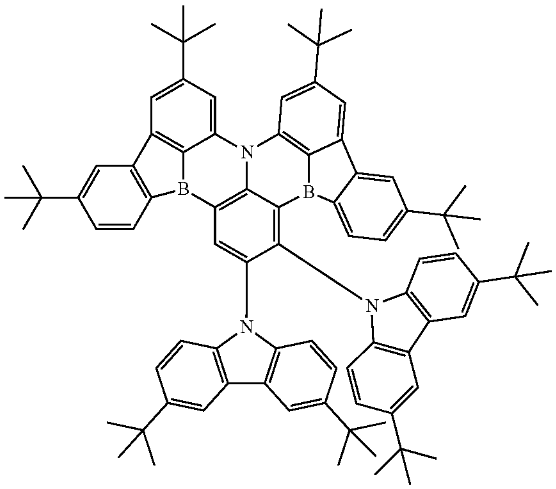
2-5
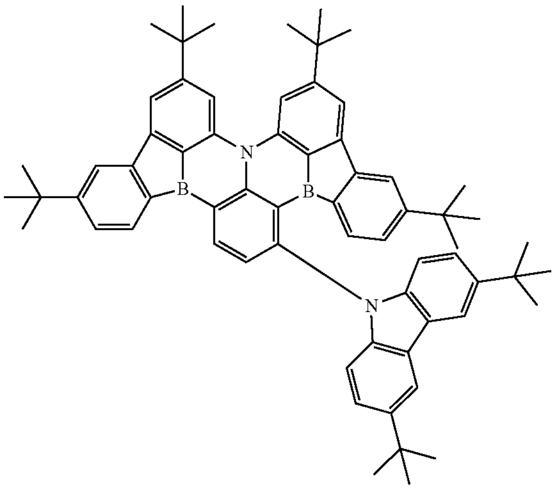
2-6
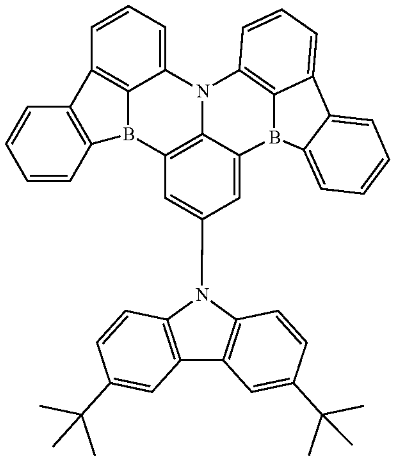

-continued
2-7
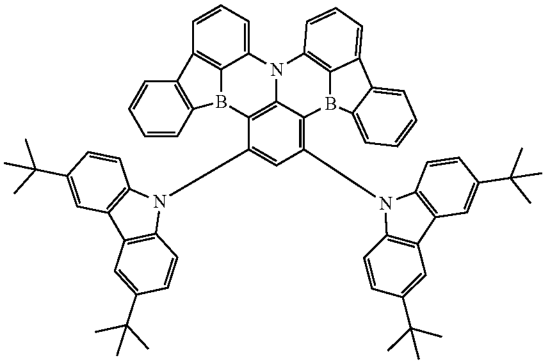
2-8
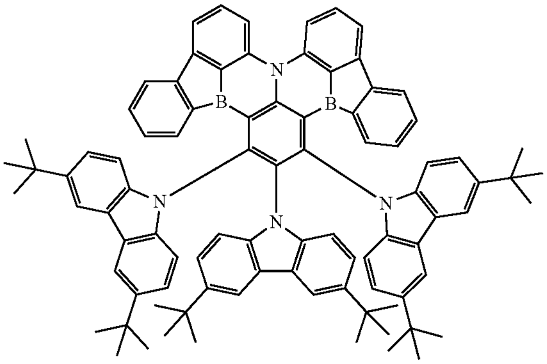
2-9
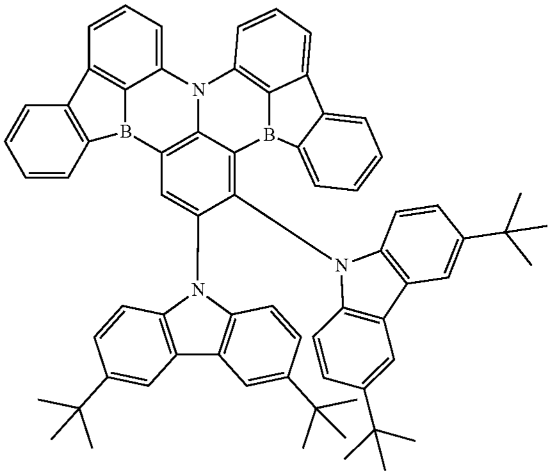
2-10
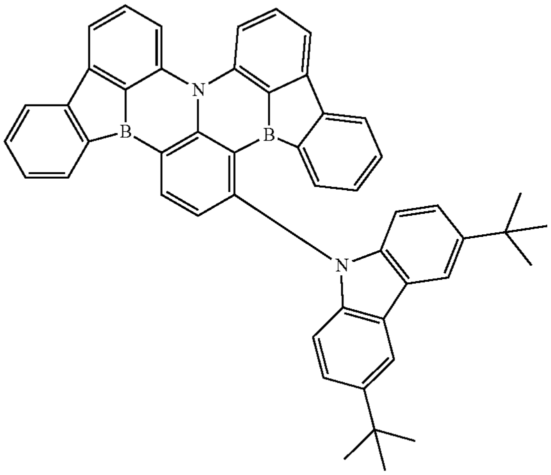
2-11
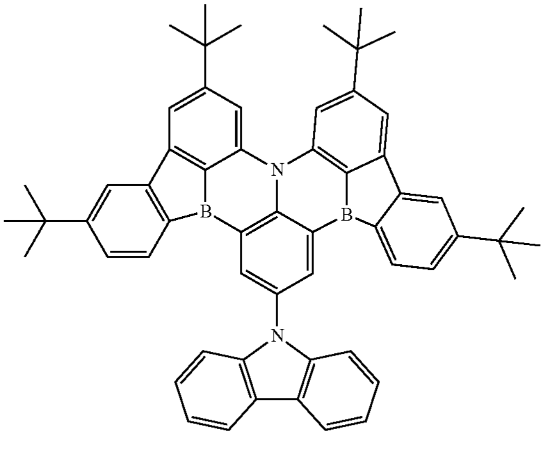
2-12
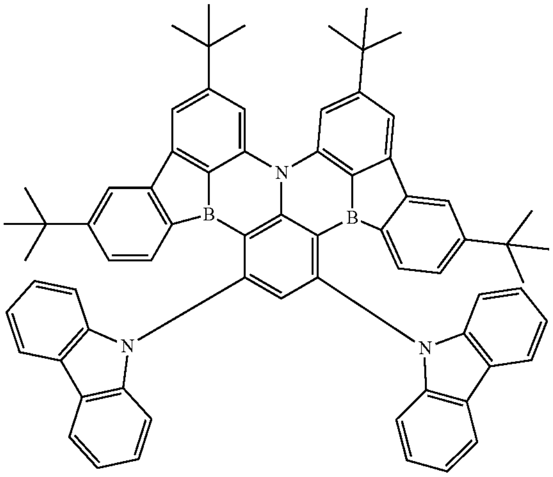

-continued
2-13
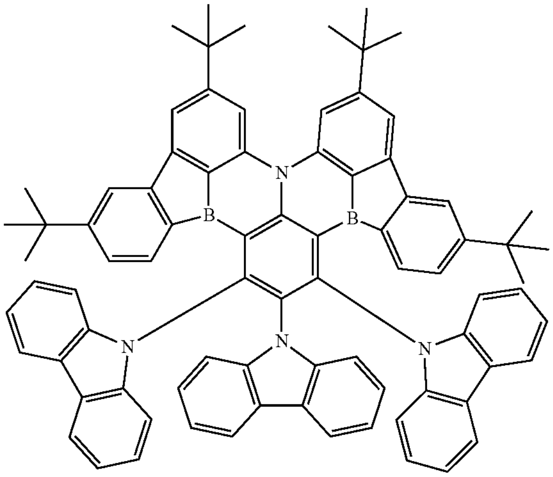
2-14
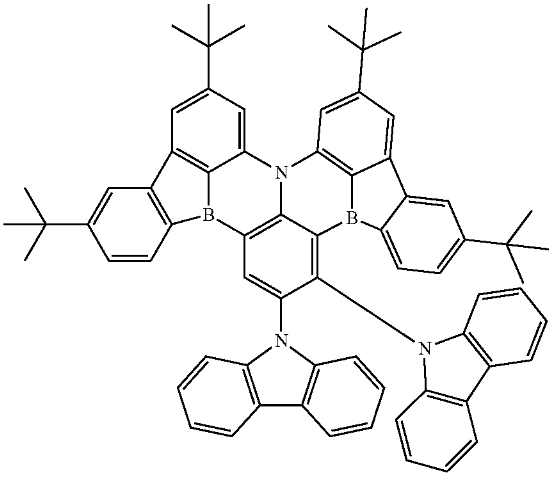
2-15
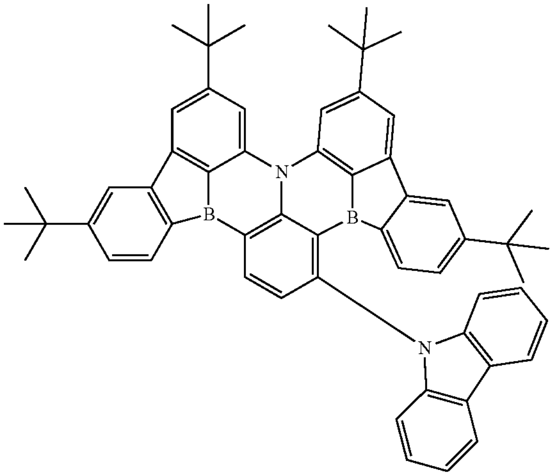
2-16
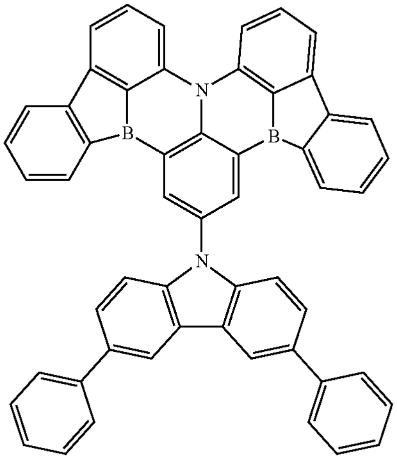
2-17
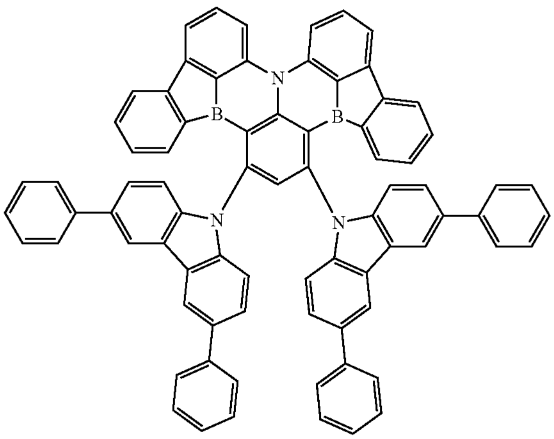

-continued
2-18
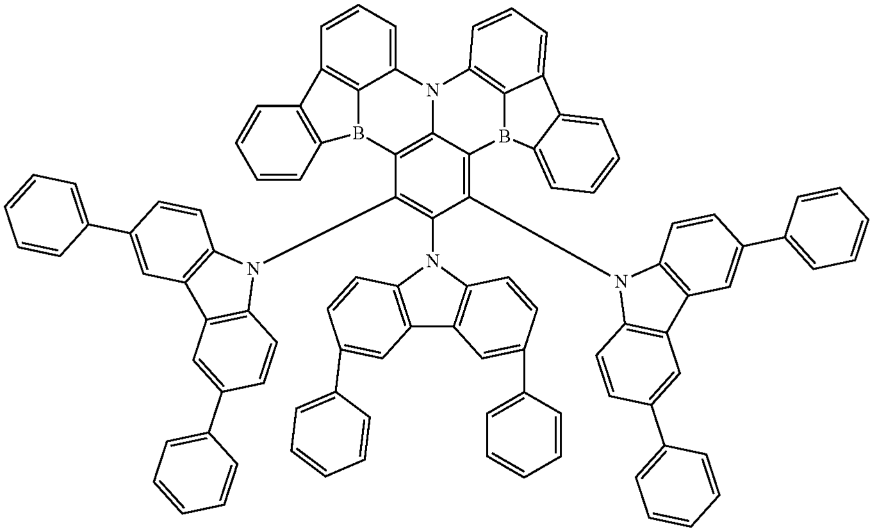
2-19
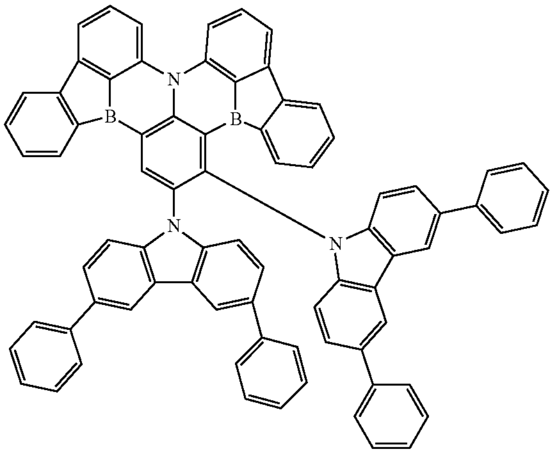
2-20
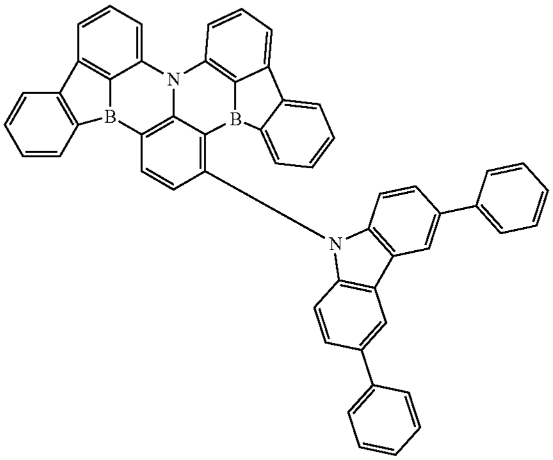
-21
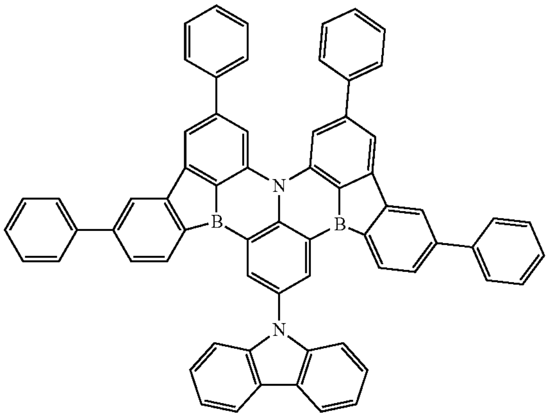
2-22
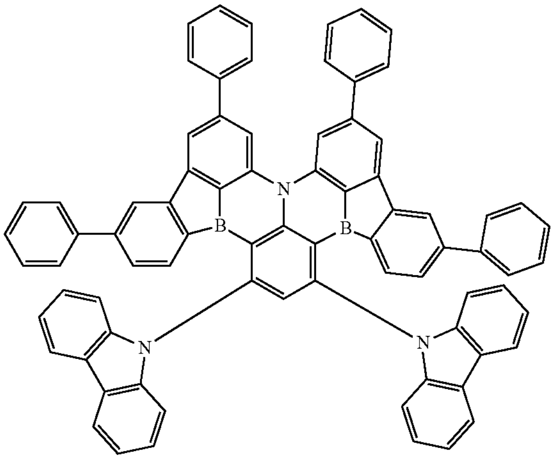

-continued
2-23
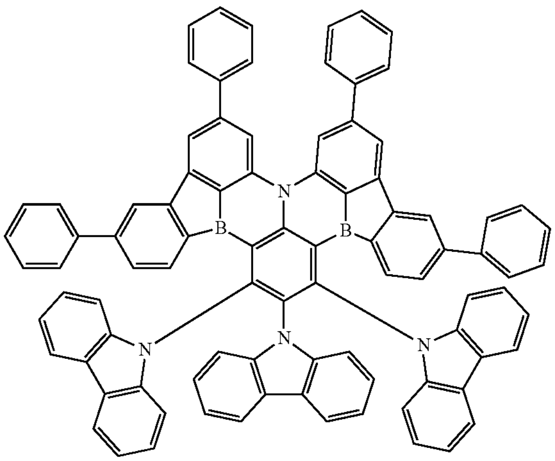
2-24
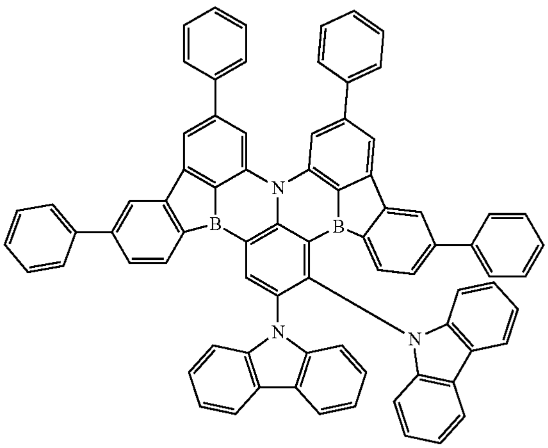
2-25
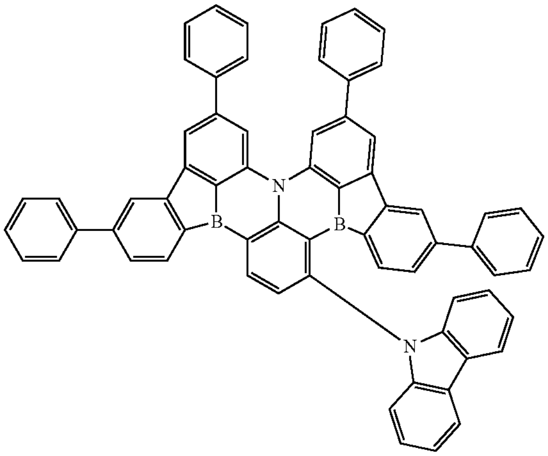
2-26
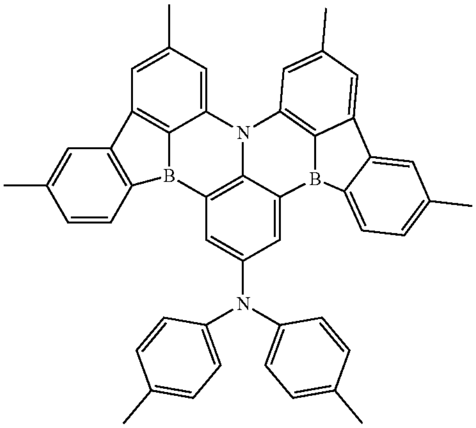
2-27
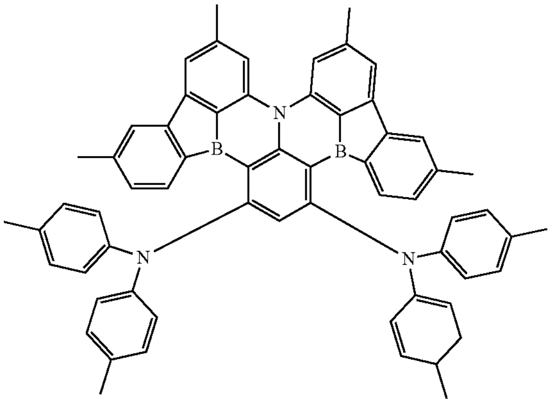
2-28
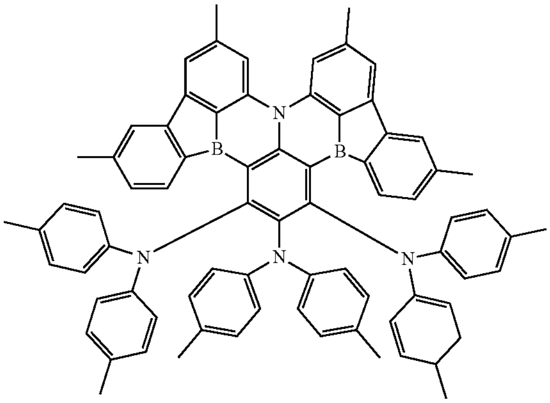

-continued
2-29
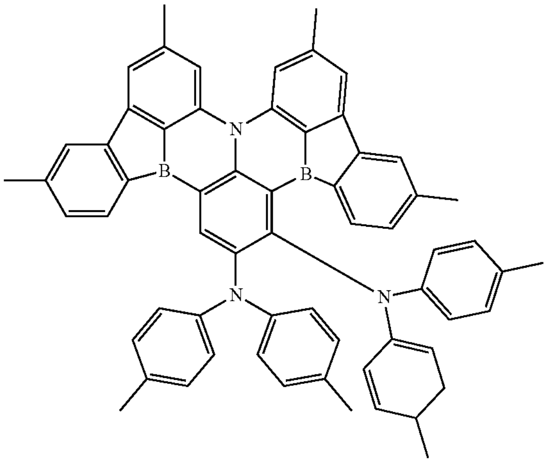
2-30
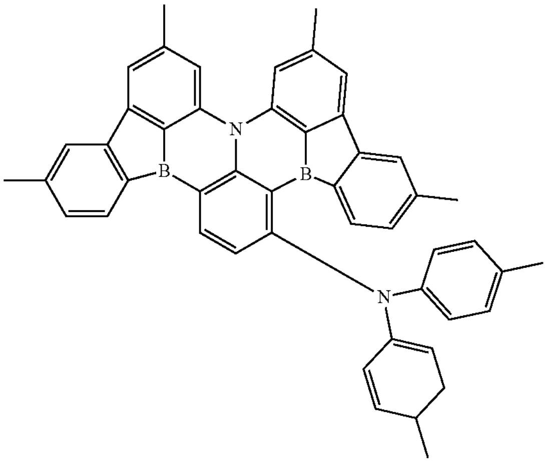
2-31
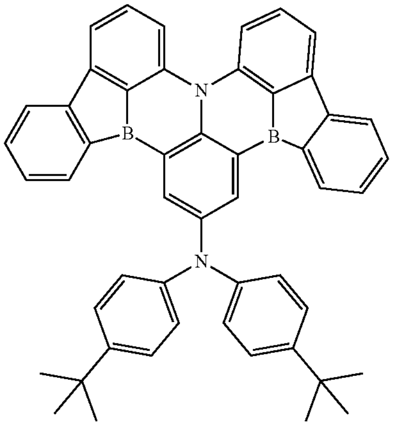
2-32
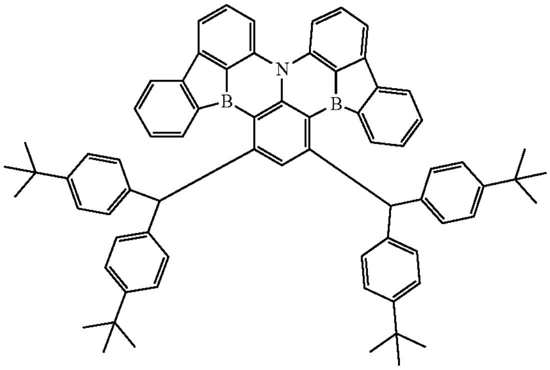
2-33
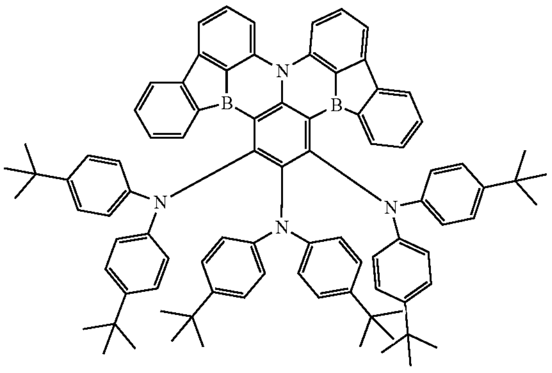
2-34
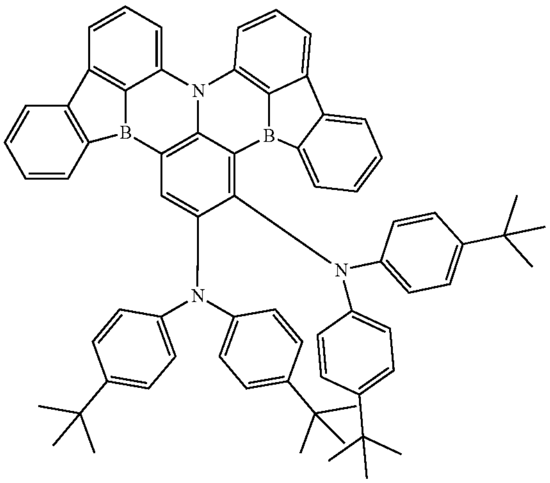

-continued
2-35
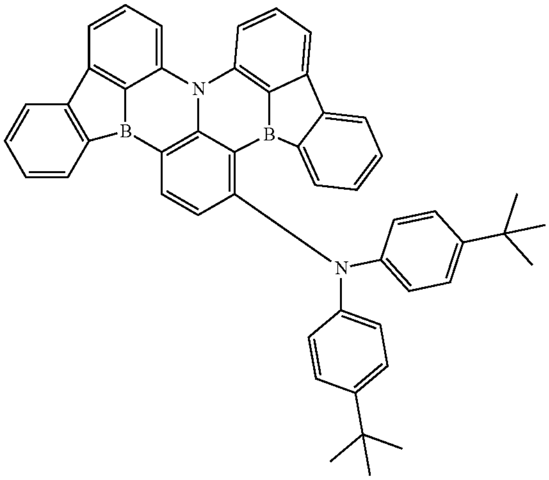
2-36
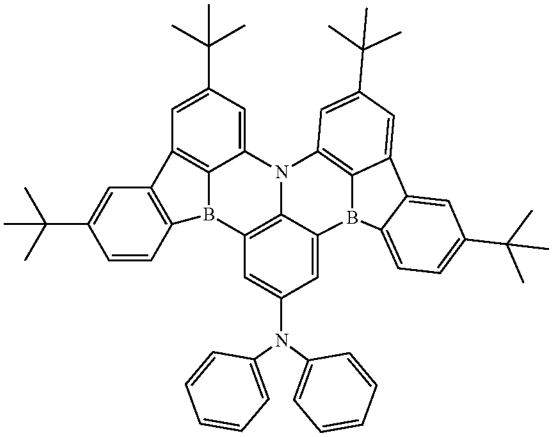
-continued
2-37
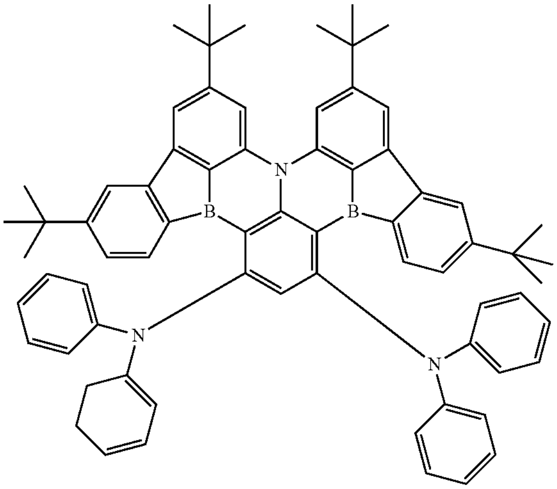
2-38
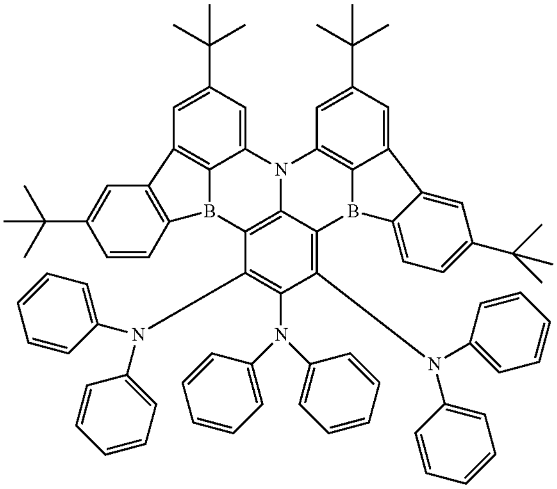
2-39
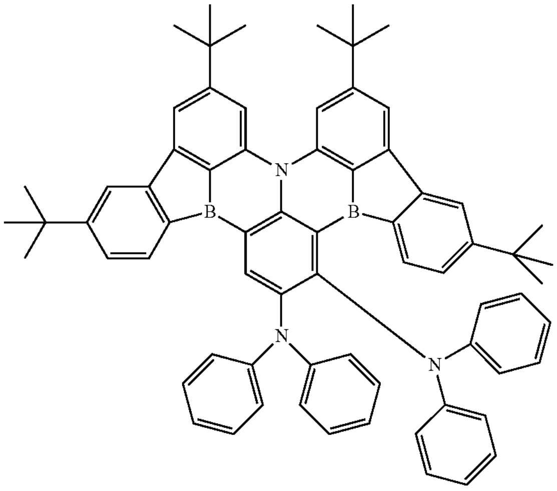
2-40
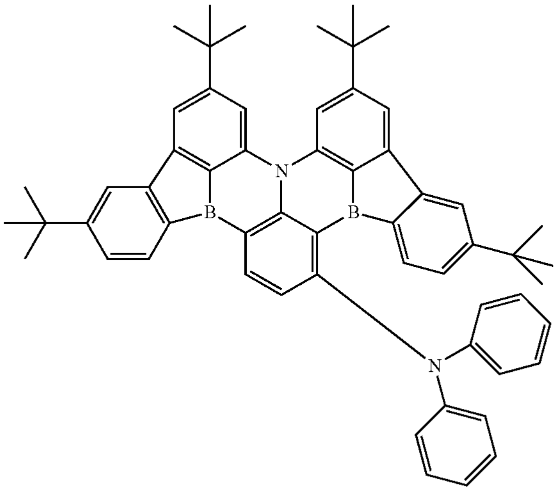

-continued
2-41
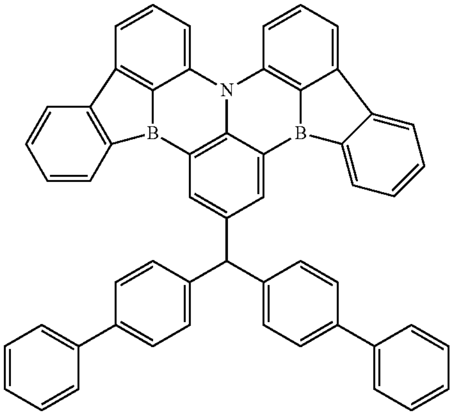
2-42
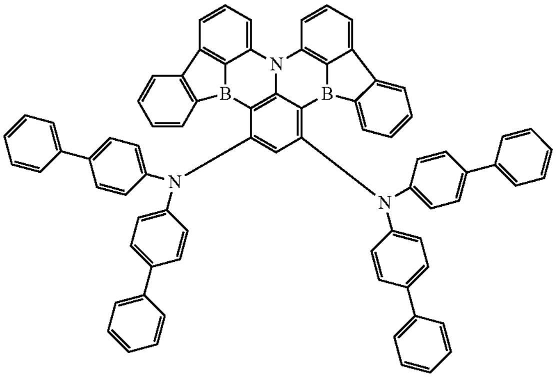
2-43
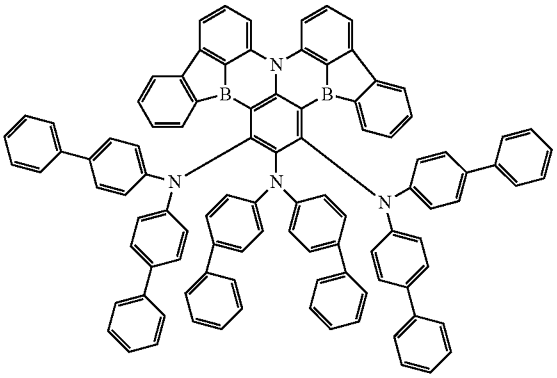
-continued
2-44
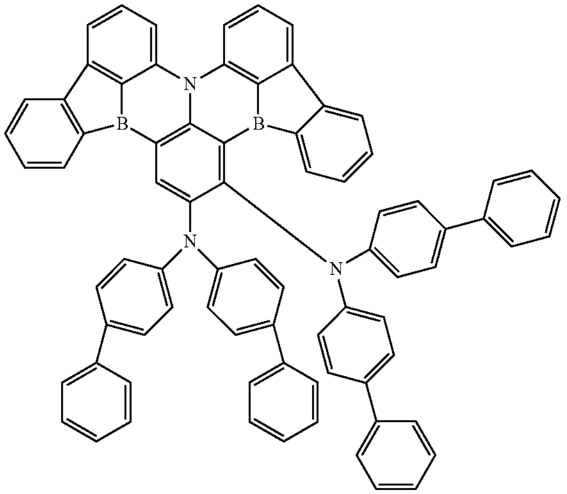
2-45
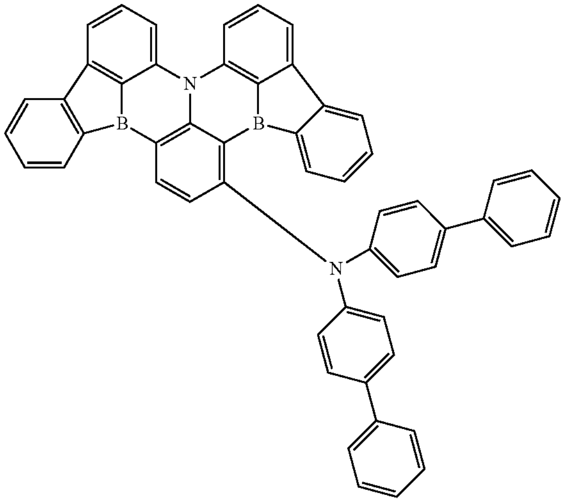
2-46
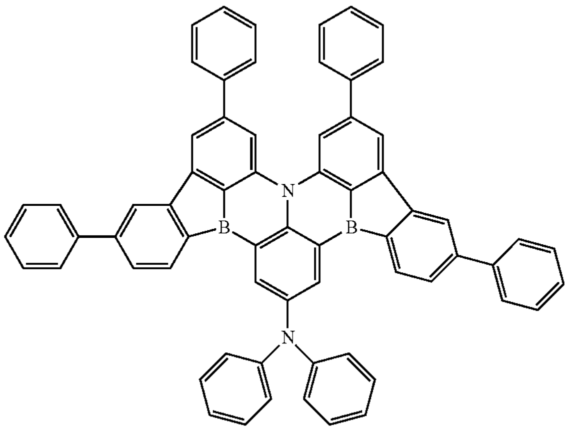

-continued
2-47
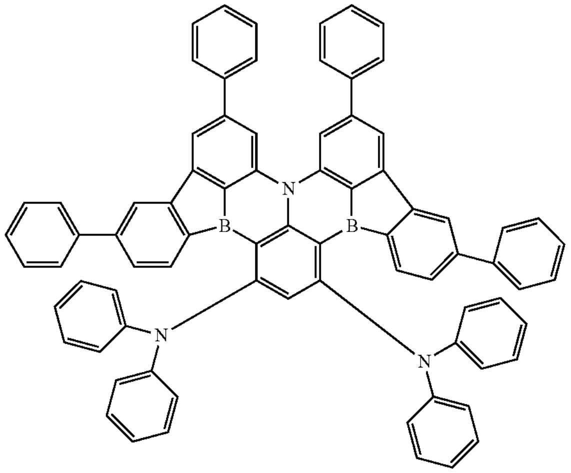
2-48
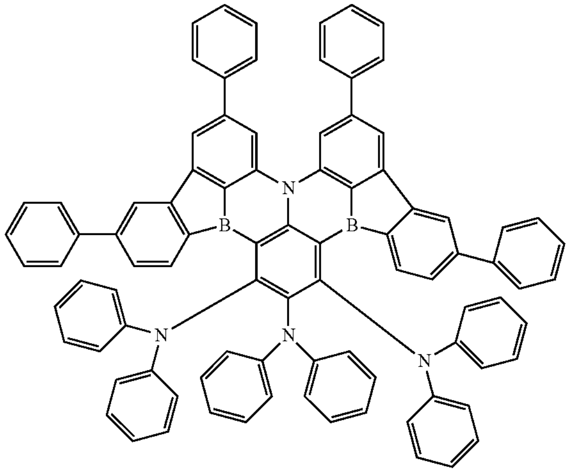
2-49
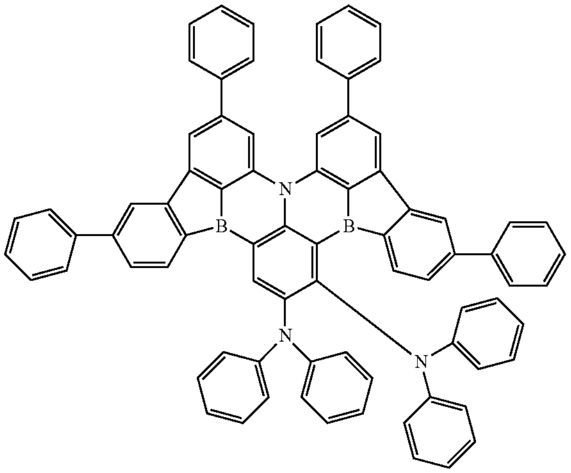
-continued
2-50
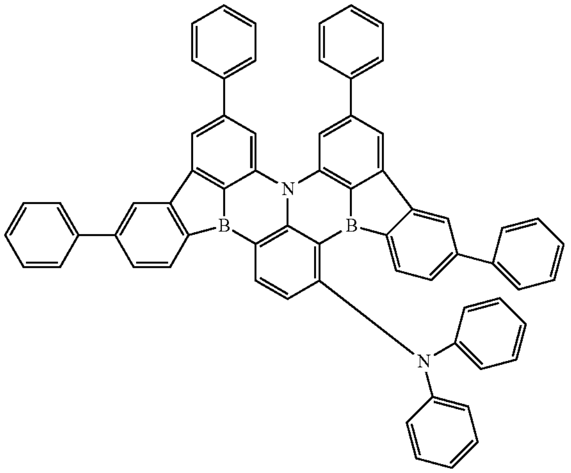
2-51
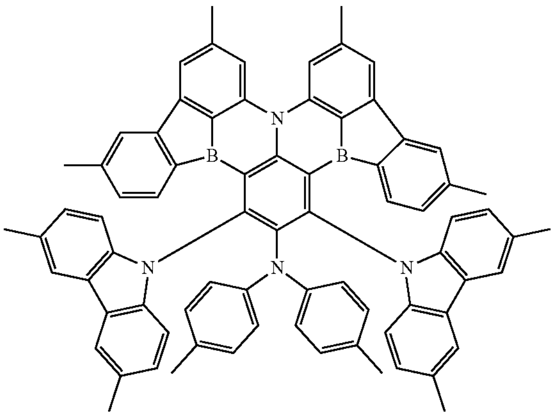
2-52
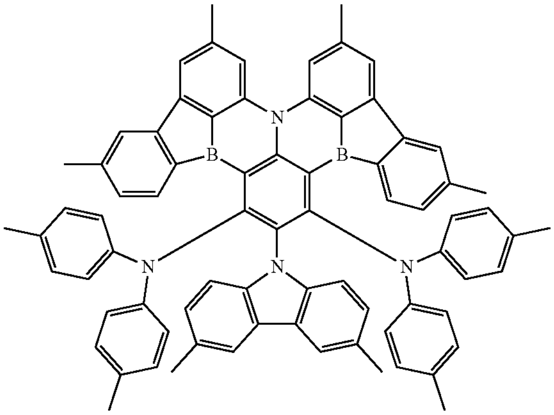

-continued
2-53
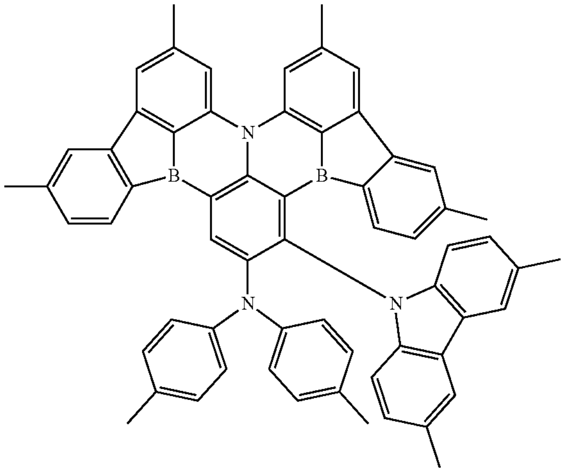
2-54
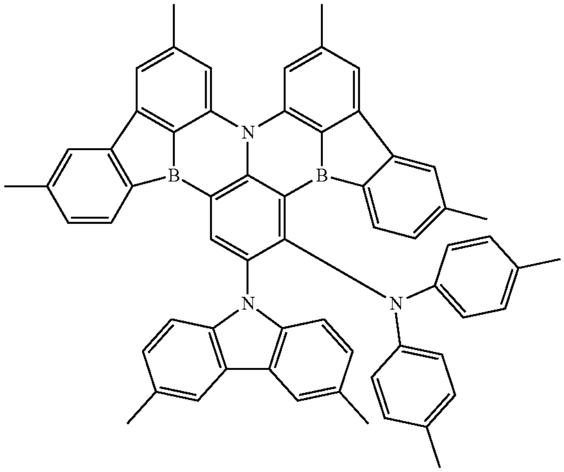
2-55
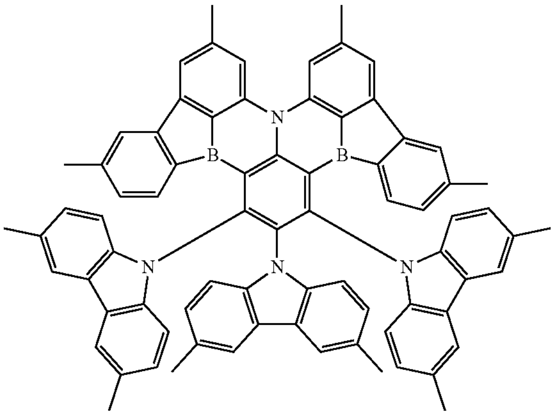
-continued
2-56
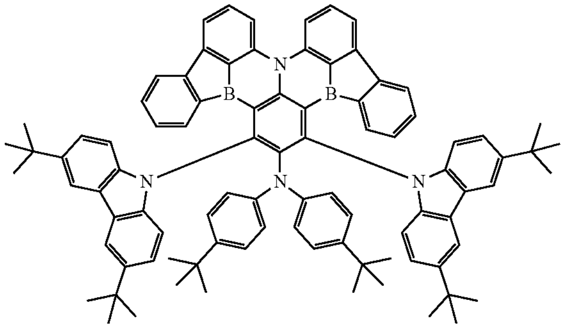
2-57
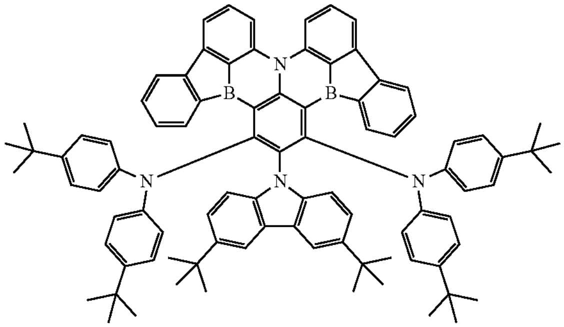
2-58
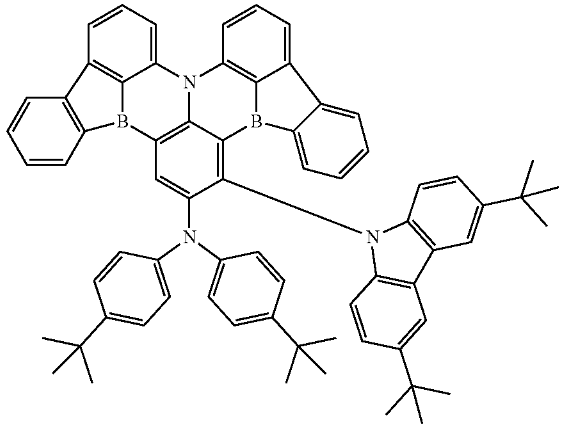
2-59
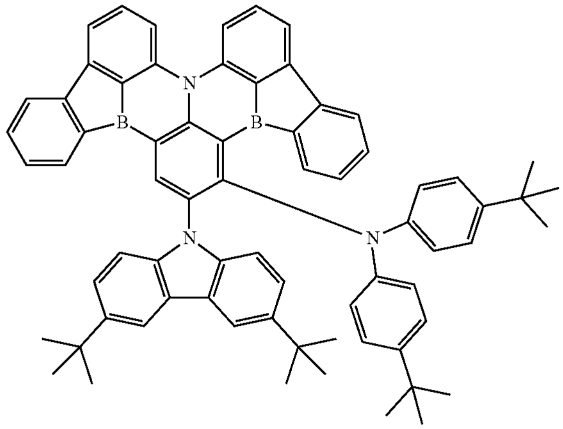

-continued
2-60
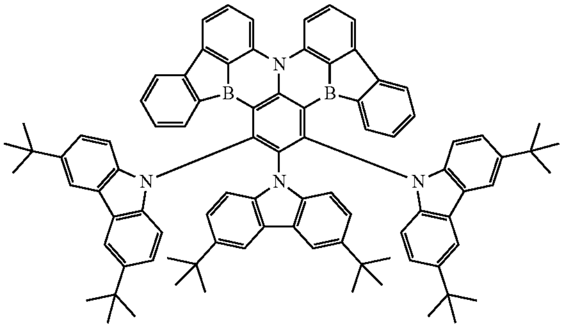
2-61
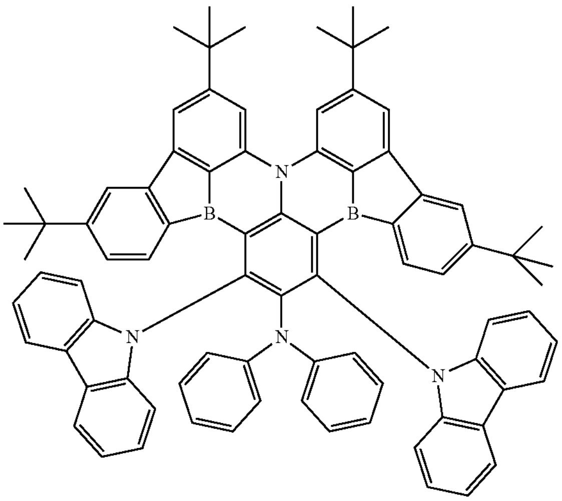
2-62
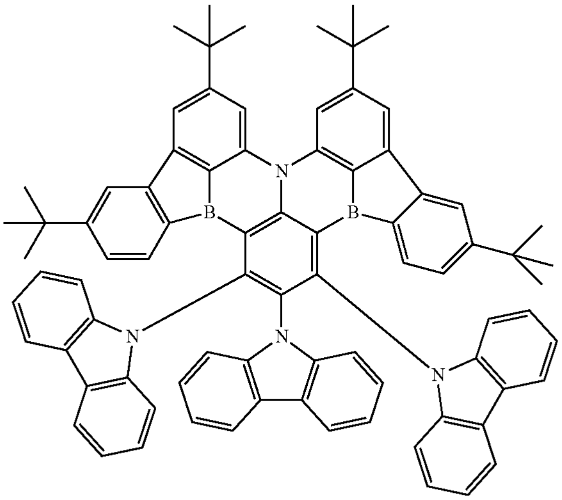
-continued
2-63
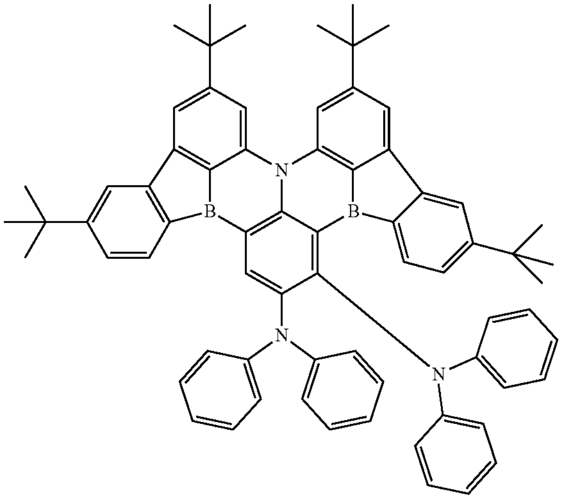
2-64
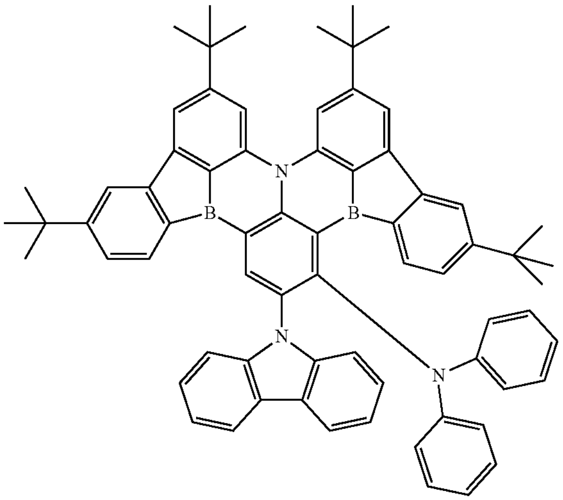
2-65
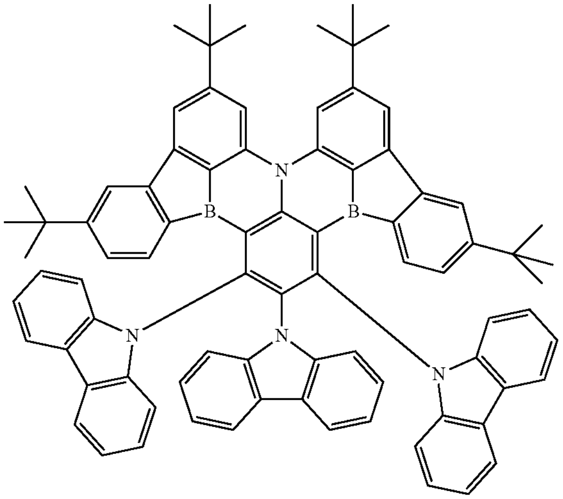

-continued
2-66
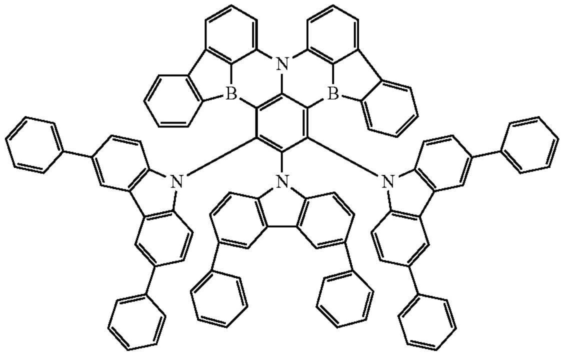
2-67
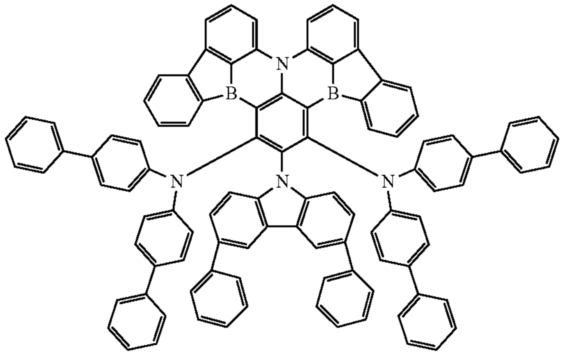
2-68
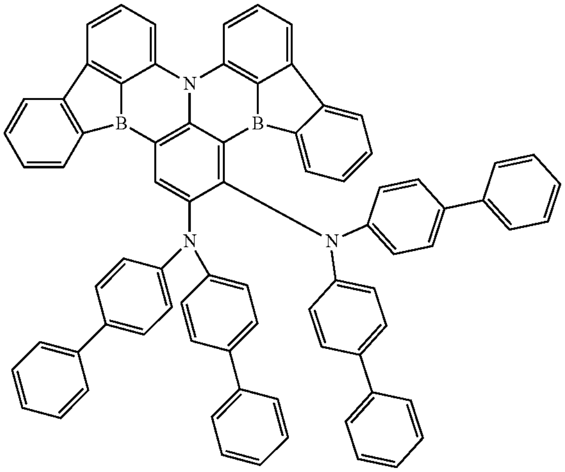
-continued
2-69
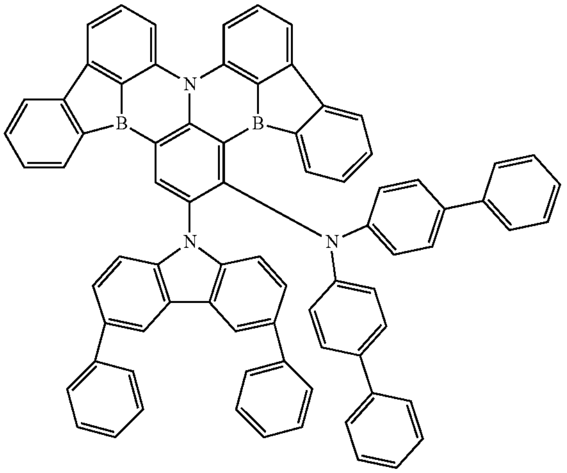
2-70
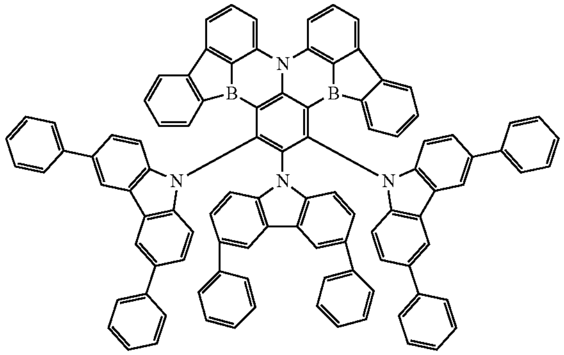
2-71
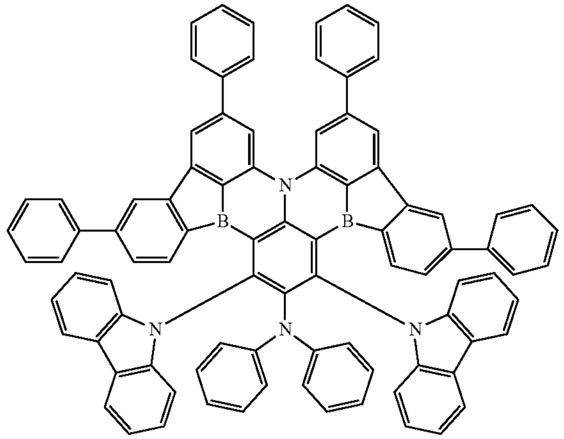

-continued
2-72
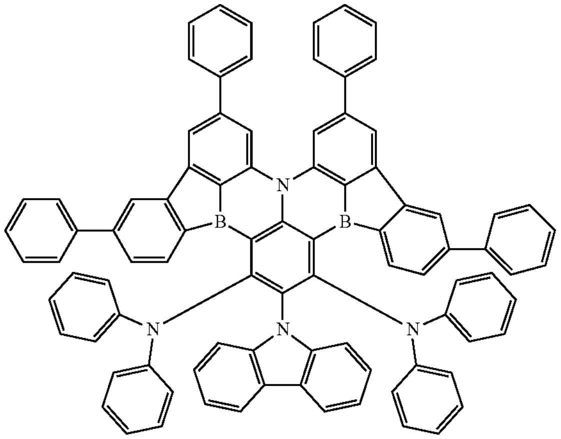
2-73
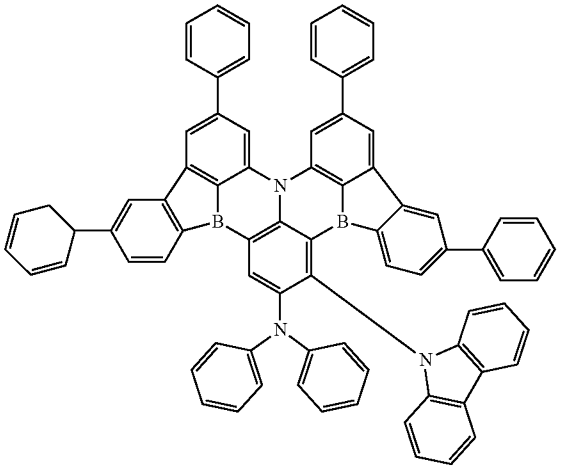
2-74
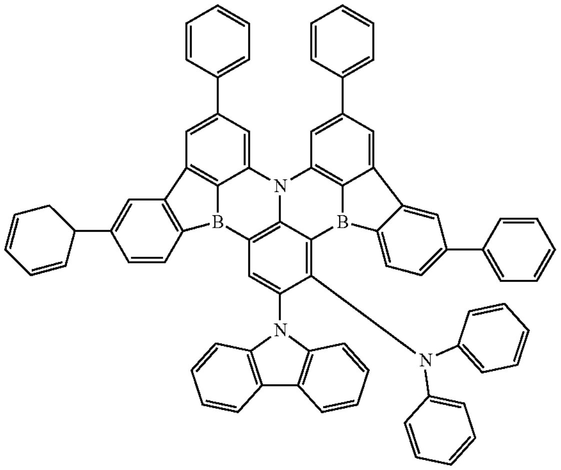
-continued
2-75
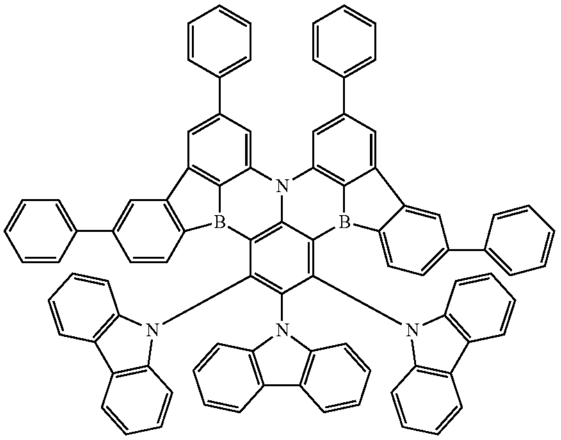
2-76
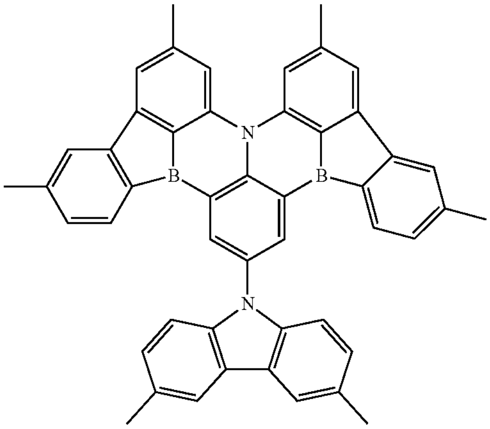
2-77
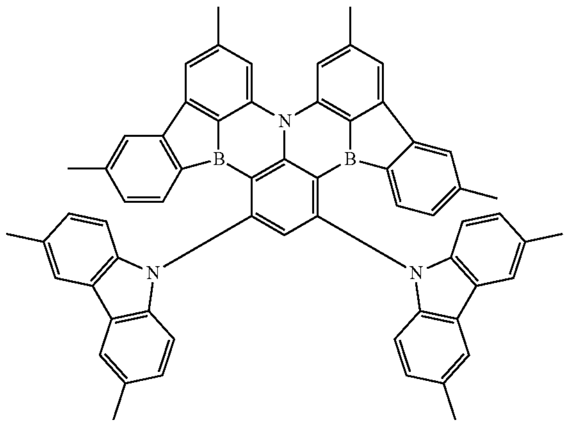

-continued
2-78
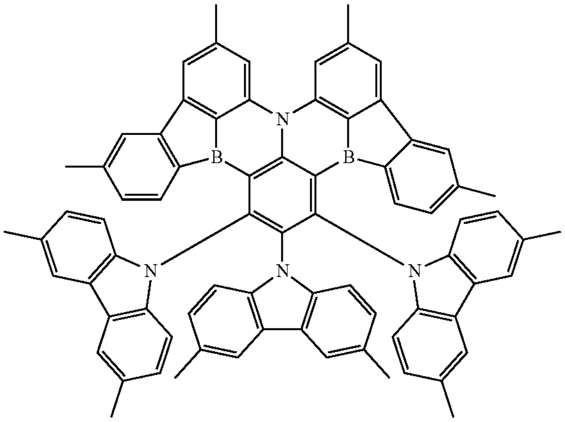
2-79
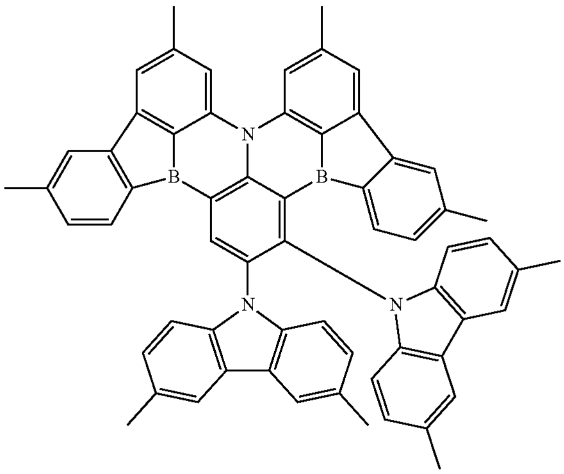
-continued
2-80
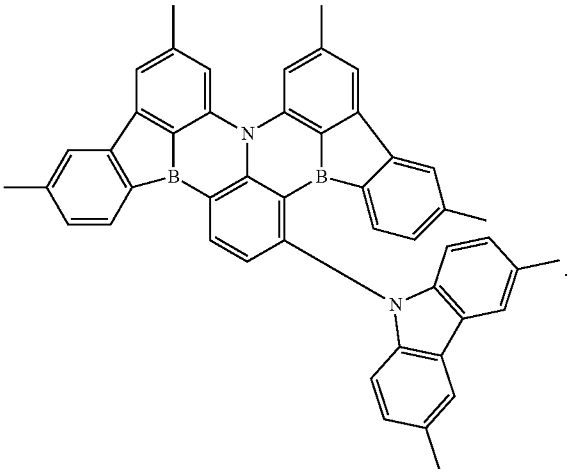
19. The organic light emitting device according to claim 14, wherein a weight % of the first compound is greater than a weight % of the second compound.
20. The organic light emitting device according to claim 14, wherein the first emitting material layer further includes a third compound as a first host.
* * * * *